(12) United States Patent
Umezaki

(10) Patent No.: US 9,461,071 B2
(45) Date of Patent: Oct. 4, 2016

(54) LIQUID CRYSTAL DISPLAY DEVICE AND ELECTRONIC DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/967,458

(22) Filed: Dec. 14, 2015

(65) Prior Publication Data
US 2016/0111452 A1    Apr. 21, 2016

Related U.S. Application Data

(63) Continuation of application No. 14/510,273, filed on Oct. 9, 2014, now Pat. No. 9,214,473, which is a continuation of application No. 13/675,066, filed on Nov. 13, 2012, now Pat. No. 9,070,593, which is a continuation of application No. 11/747,537, filed on May 11, 2007, now Pat. No. 8,330,492.

(30) Foreign Application Priority Data

Jun. 2, 2006    (JP) .................. 2006-155472

(51) Int. Cl.
H01L 25/00    (2006.01)
H03K 19/094    (2006.01)
(Continued)

(52) U.S. Cl.
CPC ......... *H01L 27/1222* (2013.01); *G02F 1/1368* (2013.01); *G02F 1/13306* (2013.01);
(Continued)

(58) Field of Classification Search
CPC ................ G09G 3/20; G09G 3/3677; G09G 2310/0286; H01L 27/3276; H01L 21/84; H01L 27/12; H01L 27/1222; H01L 27/156; H01L 27/124; H01L 27/1225; H01L 27/3262; G02F 1/1368; G02F 1/13306; G02F 1/13624; G02F 1/136286; G02F 2001/136245; H03K 19/0175; H03K 19/017509; H03K 19/017518; H03K 19/017554; H03K 19/01806; H03K 19/018507; H03K 19/082; H03K 19/09418; H03K 19/09448; H03K 19/212; H03K 2005/00163; H03K 5/2436
See application file for complete search history.

(56) References Cited

U.S. PATENT DOCUMENTS 3,506,851 A    4/1970    Polkinghorn et al.
4,090,096 A    5/1978    Nagami
(Continued)

FOREIGN PATENT DOCUMENTS

CN    001120210 A    4/1996
CN    001457059 A    11/2003
(Continued)

OTHER PUBLICATIONS

Yoon.S et al., "P-172L: Late-News Poster:Highliy Stable Integrated Gate Driver Circuit Using A-SI TFT With Dual Pull-Down Structure", SID Digest '05 : SID International Sympsiium Digest of Technical Papers, May 24, 2005, vol. 36, pp. 348-351.
(Continued)

*Primary Examiner* — Vibol Tan
(74) *Attorney, Agent, or Firm* — Fish & Richardson P.C.

(57) ABSTRACT

To provide a circuit used for a shift register or the like. The basic configuration includes first to fourth transistors and four wirings. The power supply potential VDD is supplied to the first wiring and the power supply potential VSS is supplied to the second wiring. A binary digital signal is supplied to each of the third wiring and the fourth wiring. An H level of the digital signal is equal to the power supply potential VDD, and an L level of the digital signal is equal to the power supply potential VSS. There are four combinations of the potentials of the third wiring and the fourth wiring. Each of the first transistor to the fourth transistor can be turned off by any combination of the potentials. That is, since there is no transistor that is constantly on, deterioration of the characteristics of the transistors can be suppressed.

14 Claims, 78 Drawing Sheets

(51) Int. Cl.
  *H01L 27/12*   (2006.01)
  *G09G 3/36*    (2006.01)
  *G09G 3/20*    (2006.01)
  *H01L 21/84*   (2006.01)
  *G02F 1/1368*  (2006.01)
  *H01L 27/15*   (2006.01)
  *G02F 1/133*   (2006.01)
  *G02F 1/1362*  (2006.01)
  *H01L 27/32*   (2006.01)

(52) U.S. Cl.
  CPC ..... *G02F1/13624* (2013.01); *G02F 1/136286* (2013.01); *G09G 3/20* (2013.01); *G09G 3/3677* (2013.01); *H01L 21/84* (2013.01); *H01L 27/12* (2013.01); *H01L 27/124* (2013.01); *H01L 27/1225* (2013.01); *H01L 27/156* (2013.01); *H01L 27/3262* (2013.01); *H01L 27/3276* (2013.01); *G02F 2001/136245* (2013.01); *G09G 2310/0267* (2013.01); *G09G 2310/0286* (2013.01)

(56) References Cited

U.S. PATENT DOCUMENTS

| | | |
|---|---|---|
| 4,302,690 A | 11/1981 | Gollinger et al. |
| 4,578,597 A | 3/1986 | Soneda et al. |
| 5,410,583 A | 4/1995 | Weisbrod et al. |
| 5,434,899 A | 7/1995 | Huq et al. |
| 5,517,543 A | 5/1996 | Schieupen et al. |
| 5,610,426 A | 3/1997 | Asai et al. |
| 5,949,271 A | 9/1999 | Fujikura |
| 5,949,398 A | 9/1999 | Kim |
| 6,301,323 B1 | 10/2001 | Czechanowski |
| 6,426,743 B1 | 7/2002 | Yeo et al. |
| 6,611,248 B2 | 8/2003 | Kanbara et al. |
| 6,690,347 B2 | 2/2004 | Jeon et al. |
| 6,756,816 B2 | 6/2004 | Miyake |
| 6,813,332 B2 | 11/2004 | Nagao et al. |
| 6,829,322 B2 | 12/2004 | Shih et al. |
| 6,845,140 B2 | 1/2005 | Moon et al. |
| 6,870,401 B1 | 3/2005 | Kasuga et al. |
| 6,891,422 B2 | 5/2005 | Shin |
| 6,958,750 B2 | 10/2005 | Azami et al. |
| 6,975,142 B2 | 12/2005 | Azami et al. |
| 7,005,909 B2 | 2/2006 | Shin |
| 7,023,410 B2 | 4/2006 | Lee et al. |
| 7,057,598 B2 | 6/2006 | Azami et al. |
| 7,068,076 B2 | 6/2006 | Azami |
| 7,081,786 B2 | 7/2006 | Shin |
| 7,098,882 B2 | 8/2006 | Kitani et al. |
| 7,116,748 B2 | 10/2006 | Nagao et al. |
| 7,145,545 B2 | 12/2006 | Zebedee et al. |
| 7,202,863 B2 | 4/2007 | Kimura et al. |
| 7,215,315 B2 | 5/2007 | Morosawa et al. |
| 7,289,096 B2 | 10/2007 | Jeon et al. |
| 7,403,038 B2 | 7/2008 | Azami |
| 7,405,716 B2 | 7/2008 | Lee et al. |
| 7,411,318 B2 | 8/2008 | Kimura |
| 7,420,536 B2 | 9/2008 | Jang et al. |
| 7,436,923 B2 | 10/2008 | Tobita |
| 7,446,748 B2 | 11/2008 | Jang et al. |
| 7,486,269 B2 | 2/2009 | Moon |
| RE40,673 E | 3/2009 | Kanbara et al. |
| 7,511,709 B2 | 3/2009 | Koyama et al. |
| 7,522,145 B2 | 4/2009 | Lee et al. |
| 7,696,974 B2 | 4/2010 | Moon et al. |
| 7,786,985 B2 | 8/2010 | Kimura et al. |
| 7,859,507 B2 | 12/2010 | Jang et al. |
| 7,978,274 B2 | 7/2011 | Umezaki et al. |
| 8,044,906 B2 | 10/2011 | Kimura et al. |
| 8,054,279 B2 * | 11/2011 | Umezaki ............ G09G 3/3677 345/100 |
| 8,059,078 B2 | 11/2011 | Kimura et al. |
| 8,102,340 B2 | 1/2012 | Lee et al. |
| 8,212,750 B2 | 7/2012 | Yamazaki et al. |
| 8,314,514 B2 | 11/2012 | Kimura |
| 8,520,159 B2 | 8/2013 | Umezaki et al. |
| 8,531,364 B2 | 9/2013 | Yamazaki et al. |
| 8,587,578 B2 | 11/2013 | Choi |
| 8,599,998 B2 | 12/2013 | Umezaki et al. |
| 8,624,656 B2 | 1/2014 | Koyama et al. |
| 8,654,056 B2 | 2/2014 | Otose et al. |
| 8,693,617 B2 * | 4/2014 | Amano ............... G11C 19/184 377/64 |
| 8,743,044 B2 * | 6/2014 | Umezaki ...................... 345/100 |
| 8,902,145 B2 * | 12/2014 | Umezaki ...................... 345/100 |
| 8,908,115 B2 | 12/2014 | Umezaki et al. |
| 8,988,152 B2 | 3/2015 | Ohmaru et al. |
| 8,988,400 B2 | 3/2015 | Shishido |
| 8,994,636 B2 * | 3/2015 | Umezaki ............... G09G 3/20 345/100 |
| 9,263,468 B2 | 2/2016 | Umezaki et al. |
| 2002/0149318 A1 | 10/2002 | Jeon et al. |
| 2003/0043104 A1 | 3/2003 | Lee et al. |
| 2003/0189542 A1 | 10/2003 | Lee et al. |
| 2003/0210220 A1 | 11/2003 | Hebiguchi |
| 2005/0201508 A1 | 9/2005 | Shin et al. |
| 2006/0280279 A1 | 12/2006 | Nagao et al. |
| 2008/0079001 A1 | 4/2008 | Umezaki et al. |
| 2008/0079685 A1 | 4/2008 | Umezaki et al. |
| 2010/0026619 A1 | 2/2010 | Umezaki |
| 2012/0032943 A1 | 2/2012 | Kimura et al. |
| 2013/0135550 A1 | 5/2013 | Kimura |
| 2013/0251091 A1 | 9/2013 | Nagao et al. |
| 2015/0137118 A1 | 5/2015 | Umezaki et al. |

FOREIGN PATENT DOCUMENTS

| | | |
|---|---|---|
| CN | 001472717 A | 2/2004 |
| CN | 001504989 A | 6/2004 |
| CN | 001518221 A | 8/2004 |
| CN | 001609939 A | 4/2005 |
| CN | 001637549 A | 7/2005 |
| CN | 001637796 A | 7/2005 |
| EP | 0696803 A | 2/1996 |
| EP | 1160796 A | 12/2001 |
| EP | 1231594 A | 8/2002 |
| EP | 1387491 A | 2/2004 |
| EP | 1445775 A | 8/2004 |
| EP | 1684310 A | 7/2006 |
| EP | 1906414 A | 4/2008 |
| JP | 55-156427 A | 12/1980 |
| JP | 08-037284 A | 2/1996 |
| JP | 2001-052494 A | 2/2001 |
| JP | 2001-350438 A | 12/2001 |
| JP | 2002-258819 A | 9/2002 |
| JP | 2003-076346 A | 3/2003 |
| JP | 2004-078172 A | 3/2004 |
| JP | 2004-093682 A | 3/2004 |
| JP | 2004-326999 A | 11/2004 |
| JP | 2005-522734 | 7/2005 |
| JP | 2005-251335 A | 9/2005 |
| JP | 2006-013433 A | 1/2006 |
| JP | 2006-058790 A | 3/2006 |
| JP | 2006-164477 A | 6/2006 |
| JP | 2008-089915 A | 4/2008 |
| JP | 2008-107807 A | 5/2008 |
| JP | 2008-217902 A | 9/2008 |
| JP | 2008-276849 A | 11/2008 |
| KR | 2004-0004906 A | 1/2004 |
| TW | I226506 | 1/2005 |
| WO | WO-02/065062 | 8/2002 |
| WO | WO-03/087921 | 10/2003 |
| WO | WO-03/107314 | 12/2003 |
| WO | WO-2004/059843 | 7/2004 |

OTHER PUBLICATIONS

Kim.B et al., "A-SI Gate Driver Integration With Time Shared Data Driving", IDW/AD '05(Proceedings of the 12th International Dis-

(56) References Cited

OTHER PUBLICATIONS play Workshops in conjunction with Asia Display ), 2005, vol. 2, pp. 1073-1076.

Chun.M et al., "Integrated Gate Driver Using Highly Stable A-SI TFT'S", IDW/AD '05(Proceedings of The 12th International Display Workshops in conjunction with Asia Display ), 2005, vol. 2, pp. 1077-1080.

Wei.C et al., "Integrated Gate Driver Circuit Using A-SI TFT", IDW/AD '05(Proceedings of the 12th International Display Workshops in conjunction with Asia Display ), 2005, vol. 2, pp. 1023-1026.

Jang.Y et al., "P-5: A-SI TFT Integrated Gate Driver With AC-Driven Single Pull-Down Structure", SID Digest '06 : SID International Symposium Digest of Technical Papers, Jun. 6, 2006, vol. 37, pp. 208-211.

Chinese Office Action (Application No. 200710106470.6) Dated Nov. 9, 2010.

Chinese Office Action (Application No. 201110192292.X) Dated Jun. 3, 2013.

Chinese Office Action (Application No. 201110192293.4) Dated Jul. 17, 2013.

Korean Office Action (Application No. 2007-0054022) Dated Aug. 29, 2013.

Chinese Office Action (Application No. 201110192293.4) Dated Feb. 17, 2014.

Taiwanese Office Action (Application No. 96119795) Dated Mar. 20, 2014.

\* cited by examiner

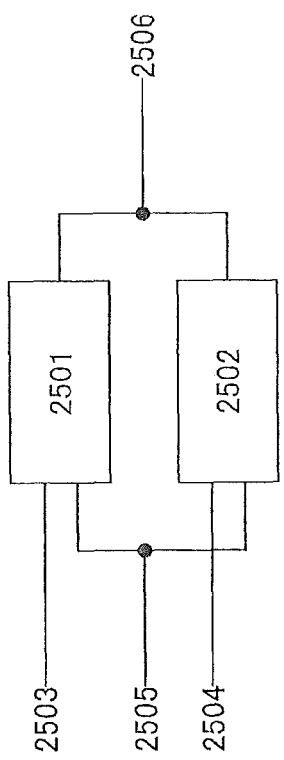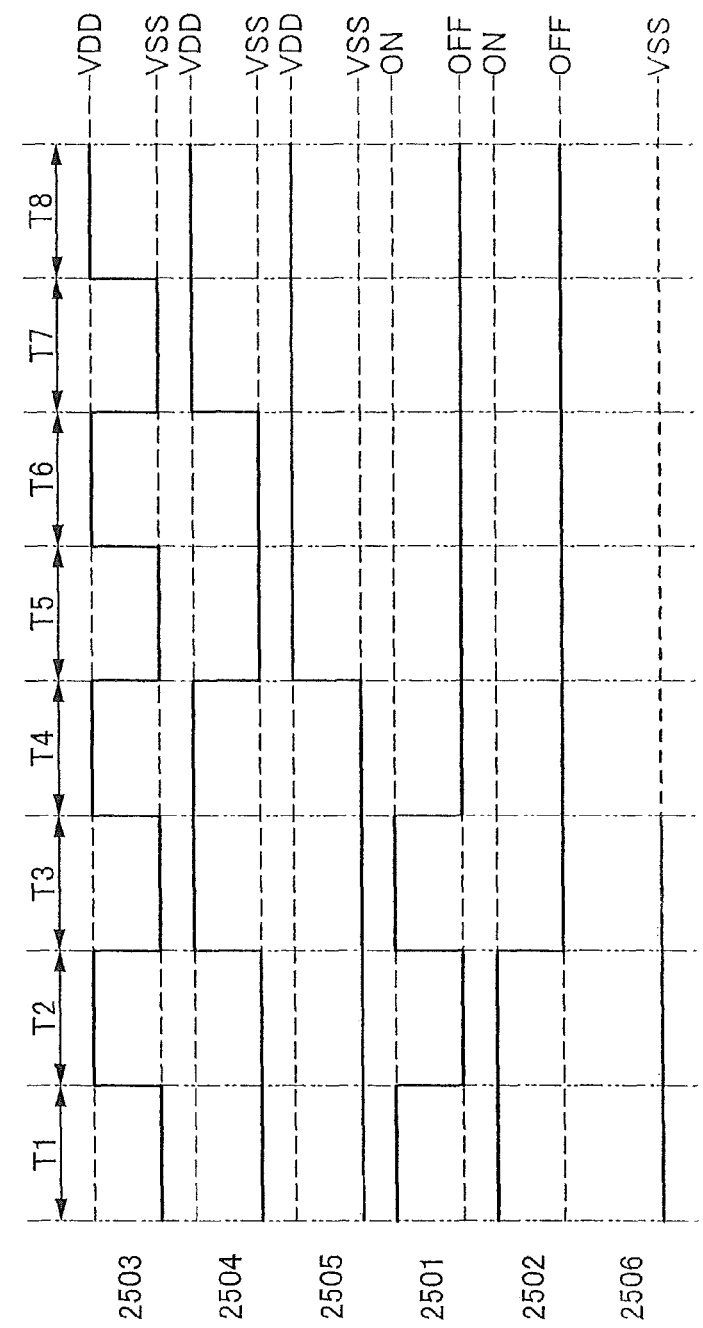
FIG. 25A
FIG. 25B

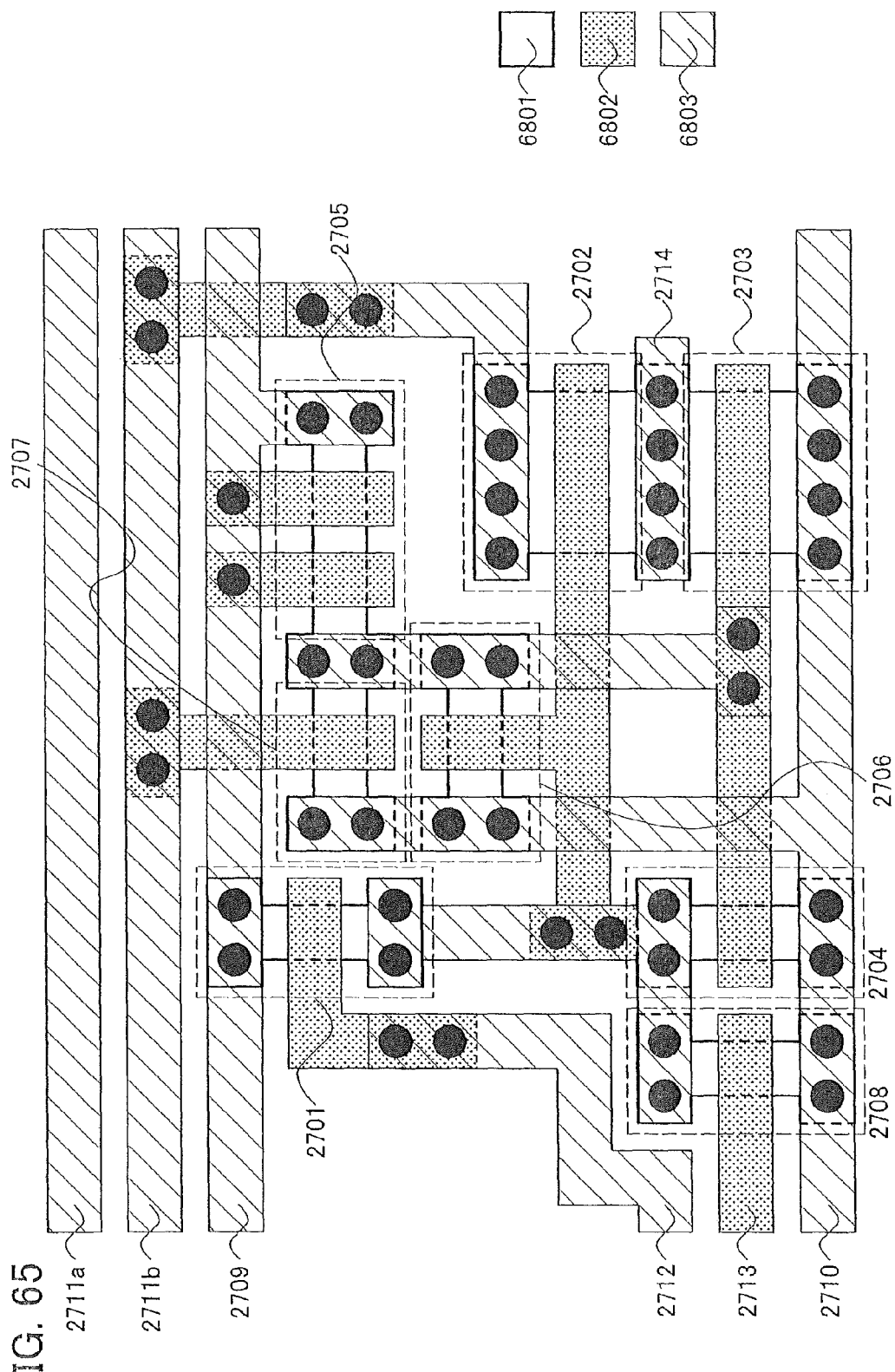

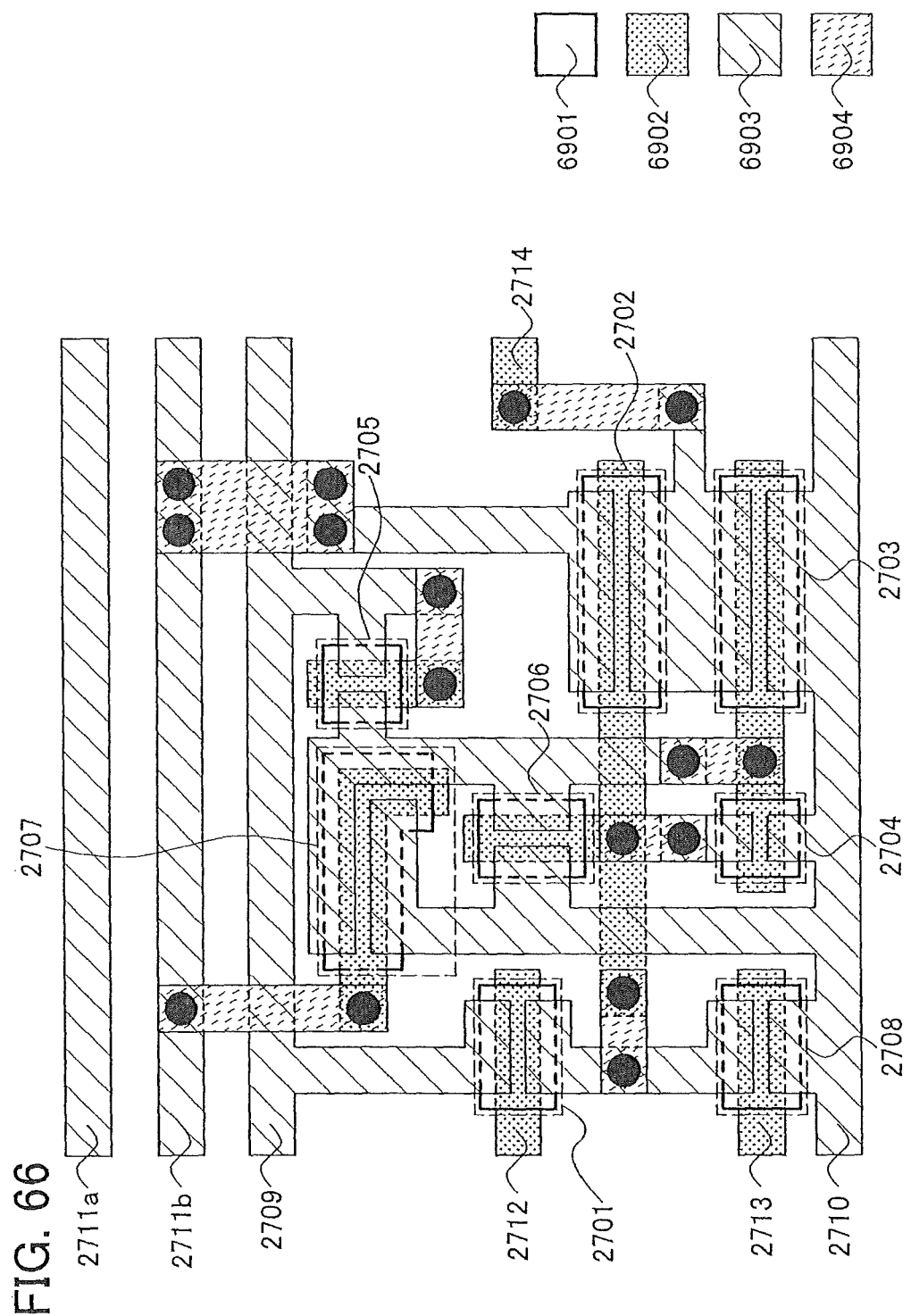

LIQUID CRYSTAL DISPLAY DEVICE AND ELECTRONIC DEVICE

CROSS-REFERENCE TO RELATED APPLICATIONS

This application is a continuation of U.S. application Ser. No. 14/510,273, filed Oct. 9, 2014, now allowed, which is a continuation of U.S. application Ser. No. 13/675,066, filed Nov. 13, 2012, now U.S. Pat. No. 9,070,593, which is a continuation of U.S. application Ser. No. 11/747,537, filed May 11, 2007, now U.S. Pat. No. 8,330,492, which claims the benefit of a foreign priority application filed in Japan as Serial No. 2006-155472 on Jun. 2, 2006, all of which are incorporated by reference.

BACKGROUND OF THE INVENTION

1. Field of the Invention

The present invention relates to a semiconductor device. In addition, the invention relates to a display device having the semiconductor device. In particular, the invention relates to a liquid crystal display device having the semiconductor device and an electronic device having the liquid crystal display device.

2. Description of the Related Art

In recent years, with the increase of large display devices such as liquid crystal televisions, display devices such as liquid crystal display devices and light-emitting devices have been actively developed. In particular, a technique for forming a pixel circuit and a driver circuit including a shift register or the like (hereinafter referred to as an internal circuit) over the same substrate by using transistors made of an amorphous semiconductor over an insulator has been actively developed, because the technique greatly contributes to low power consumption and low cost. The internal circuit formed over the insulator is connected to a controller IC or the like arranged outside the insulator (hereinafter referred to as an external circuit) through an FPC or the like, and its operation is controlled.

In addition, a shift register which is formed by using transistors made of an amorphous semiconductor has been devised as the internal circuit formed over the insulator (see Reference 1: Japanese Published Patent Application No. 2004-78172).

However, there has been a problem in that characteristics of transistors formed of an amorphous semiconductor deteriorate in accordance with an on time or a voltage applied. In order to solve this problem, suppression of characteristic deterioration of the transistors has been devised by connecting two transistors in parallel and sequentially turning on the transistors. (see Reference 2: SID '05 DIGEST PP. 348 to PP. 351).

SUMMARY OF THE INVENTION

A detailed driving method is not disclosed in above-described Reference 2. In addition, in order to control two transistors connected in parallel one by one, a control circuit having a large circuit size is necessary.

In view of the aforementioned problems, it is an object of the invention to provide a flip-flop circuit and a shift register each having a control circuit with a comparatively small circuit size, a semiconductor device and a display device each having such a shift register, and an electronic device having the display device.

In addition, it is another object of the invention to provide a flip-flop circuit and a shift register each using a driving method for suppressing characteristic deterioration of a transistor which is different from a conventional technique, a semiconductor device and a display device each having such a shift register, and an electronic device having the display device.

A semiconductor device in accordance with one aspect of the invention includes a first transistor, a second transistor, a third transistor, and a fourth transistor. A gate and a first terminal of the first transistor are electrically connected to a first wiring, and a second terminal of the first transistor is electrically connected to a gate of the fourth transistor. A gate of the second transistor is electrically connected to a second wiring, a first terminal of the second transistor is electrically connected to a fourth wiring, and a second terminal of the second transistor is electrically connected to the gate of the fourth transistor. A gate of the third transistor is electrically connected to a third wiring, a first terminal of the third transistor is electrically connected to the fourth wiring, and a second terminal of the third transistor is electrically connected to the gate of the fourth transistor. A first terminal of the fourth transistor is electrically connected to the fourth wiring, and a second terminal of the fourth transistor is electrically connected to a fifth wiring.

The first to fourth transistors may have the same conductivity type. In addition, an amorphous semiconductor may be used for a semiconductor layer of each of the first to fourth transistors.

Note that a ratio (W/L) of channel width W to channel length L of the first transistor may be higher than a ratio (W/L) of channel width W to channel length L of the second transistor.

Note that a ratio (W/L) of channel width W to channel length L of the first transistor may be higher than a ratio (W/L) of channel width W to channel length L of the third transistor.

A semiconductor device in accordance with one aspect of the invention includes a first transistor, a second transistor, a third transistor, a fourth transistor, a fifth transistor, a sixth transistor, a seventh transistor, and an eighth transistor. A gate of the first transistor is electrically connected to a first wiring, a first terminal of the first transistor is electrically connected to a second wiring, and a second terminal of the first transistor is electrically connected to a gate of the second transistor. A gate of the eighth transistor is electrically connected to a fourth wiring, a first terminal of the eighth transistor is electrically connected to a fifth wiring, and a second terminal of the eighth transistor is electrically connected to the gate of the second transistor. A gate of the sixth transistor is electrically connected to the gate of the second transistor, a first terminal of the sixth transistor is electrically connected to the fifth wiring, and a second terminal of the sixth transistor is electrically connected to a gate of the third transistor and a gate of the fourth transistor. A gate and a first terminal of the fifth transistor are electrically connected to the second wiring, and a second terminal of the fifth transistor is electrically connected to the gate of the third transistor and the gate of the fourth transistor. A gate of the seventh transistor is electrically connected to a third wiring, a first terminal of the seventh transistor is electrically connected to the fifth wiring, and a second terminal of the seventh transistor is electrically connected to the gate of the third transistor and the gate of the fourth transistor. A first terminal of the fourth transistor is electrically connected to the fifth wiring, and a second terminal of the fourth transistor is electrically connected to the gate of the second transistor. A first terminal of the third transistor is electrically connected to the fifth wiring, and a second terminal of the third transistor is electrically connected to a sixth wiring. A first terminal of the second transistor is electrically connected to the third wiring, and a second terminal of the second transistor is electrically connected to the sixth wiring.

The first to eighth transistors may have the same conductivity type. In addition, an amorphous semiconductor may be used for a semiconductor layer of each of the first to eighth transistors.

Note that a ratio (W/L) of channel width W to channel length L of the fifth transistor may be higher than a ratio (W/L) of channel width W to channel length L of the sixth transistor.

Note that a ratio (W/L) of channel width W to channel length L of the fifth transistor may be higher than a ratio (W/L) of channel width W to channel length L of the seventh transistor.

In addition, the semiconductor device of the invention may be used for a liquid crystal display device.

A liquid crystal display device in accordance with one aspect of the invention includes a driver circuit and a pixel having a liquid crystal element. The driver circuit includes a first transistor, a second transistor, a third transistor, and a fourth transistor. A gate and a first terminal of the first transistor are electrically connected to a first wiring, and a second terminal of the first transistor is electrically connected to a gate of the fourth transistor. A gate of the second transistor is electrically connected to a second wiring, a first terminal of the second transistor is electrically connected to a fourth wiring, and a second terminal of the second transistor is electrically connected to the gate of the fourth transistor. A gate of the third transistor is electrically connected to a third wiring, a first terminal of the third transistor is electrically connected to the fourth wiring, and a second terminal of the third transistor is electrically connected to the gate of the fourth transistor. A first terminal of the fourth transistor is electrically connected to the fourth wiring, and a second terminal of the fourth transistor is electrically connected to a fifth wiring.

The first to fourth transistors may have the same conductivity type. In addition, an amorphous semiconductor may be used for a semiconductor layer of each of the first to fourth transistors.

Note that a ratio (W/L) of channel width W to channel length L of the first transistor may be higher than a ratio (W/L) of channel width W to channel length L of the second transistor.

Note that a ratio (W/L) of channel width W to channel length L of the first transistor may be higher than a ratio (W/L) of channel width W to channel length L of the third transistor.

A liquid crystal display device in accordance with one aspect of the invention includes a driver circuit and a pixel having a liquid crystal element. The driver circuit includes a first transistor, a second transistor, a third transistor, a fourth transistor, a fifth transistor, a sixth transistor, a seventh transistor, and an eighth transistor. A gate of the first transistor is electrically connected to a first wiring, a first terminal of the first transistor is electrically connected to a second wiring, and a second terminal of the first transistor is electrically connected to a gate of the second transistor. A gate of the eighth transistor is electrically connected to a fourth wiring, a first terminal of the eighth transistor is electrically connected to a fifth wiring, and a second terminal of the eighth transistor is electrically connected to the gate of the second transistor. A gate of the sixth transistor is electrically connected to the gate of the second transistor, a first terminal of the sixth transistor is electrically connected to the fifth wiring, and a second terminal of the sixth transistor is electrically connected to a gate of the third transistor and a gate of the fourth transistor. A gate and a first terminal of the fifth transistor are electrically connected to the second wiring, and a second terminal of the fifth transistor is electrically connected to the gate of the third transistor and the gate of the fourth transistor. A gate of the seventh transistor is electrically connected to a third wiring, a first terminal of the seventh transistor is electrically connected to the fifth wiring, and a second terminal of the seventh transistor is electrically connected to the gate of the third transistor and the gate of the fourth transistor. A first terminal of the fourth transistor is electrically connected to the fifth wiring, and a second terminal of the fourth transistor is electrically connected to the gate of the second transistor. A first terminal of the third transistor is electrically connected to the fifth wiring, and a second terminal of the third transistor is electrically connected to a sixth wiring. A first terminal of the second transistor is electrically connected to the third wiring, and a second terminal of the second transistor is electrically connected to the sixth wiring.

The first to eighth transistors may have the same conductivity type. In addition, an amorphous semiconductor may be used for a semiconductor layer of each of the first to eighth transistors.

Note that a ratio (W/L) of channel width W to channel length L of the fifth transistor may be higher than a ratio (W/L) of channel width W to channel length L of the sixth transistor.

Note that a ratio (W/L) of channel width W to channel length L of the fifth transistor may be higher than a ratio (W/L) of channel width W to channel length L of the seventh transistor.

Note that various types of switches can be used as a switch shown in the invention, and an electrical switch, a mechanical switch, and the like are given as examples. That is, any element can be used as long as it can control a current flow, without limiting to a certain element. For example, it may be a transistor, a diode (e.g., a PN diode, a PIN diode, a Schottky diode, or a diode-connected transistor), a thyristor, or a logic circuit combining such elements. In the case of using a transistor as a switch, the polarity (the conductivity type) of the transistor is not particularly limited to a certain type because it operates just as a switch. However, a transistor of polarity with smaller off-current is preferably used when off-current is preferably small. A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a low-potential-side power supply (e.g., Vss, GND, or 0 V), while a P-channel transistor be used when the potential of the source terminal is closer to a high-potential-side power supply (e.g., Vdd). This is because the absolute value of a gate-source voltage of the transistor is increased, so that the transistor can easily operate as a switch.

A CMOS switch may also be employed by using both N-channel and P-channel transistors. By employing the CMOS switch, the switch can efficiently operate as a switch since a current can flow through the switch when one of the P-channel switch and the N-channel switch is turned on. For example, a voltage can be appropriately output regardless of whether a voltage of an input signal of the switch is high or low. In addition, since a voltage amplitude value of a signal for turning on or off the switch can be made small, power consumption can be reduced.

When a transistor is employed as a switch, the switch includes an input terminal (one of a source terminal and a drain terminal), an output terminal (the other of the source terminal and the drain terminal), and a terminal for controlling electrical conduction (a gate terminal). On the other hand, when a diode is employed as a switch, the switch does not have a terminal for controlling electrical conduction in some cases. Therefore, the number of wirings for controlling terminals can be reduced.

Note that in the invention, the description "being connected" includes the case where elements are electrically connected, the case where elements are functionally connected, and the case where elements are directly connected. Accordingly, in the configurations disclosed in the invention, other elements may be interposed between elements having a predetermined connection relation. For example, one or more elements which enable electrical connection (e.g., a switch, a transistor, a capacitor, an inductor, a resistor, and/or a diode) may be provided between a certain portion and another portion. In addition, one or more circuits which enable functional connection may be provided between the portions, such as a logic circuit (e.g., an inverter, a NAND circuit, or a NOR circuit), a signal converter circuit (e.g., a DA converter circuit, an AD converter circuit, or a gamma correction circuit), a potential level converter circuit (e.g., a power supply circuit such as a boosting circuit or a voltage lower control circuit, or a level shifter circuit for changing a potential level of an H-level signal or an L-level signal), a voltage source, a current source, a switching circuit, or an amplifier circuit (e.g., a circuit which can increase the signal amplitude, the amount of current, or the like, such as an operational amplifier, a differential amplifier circuit, a source follower circuit, or a buffer circuit), a signal generating circuit, a memory circuit, or a control circuit. Alternatively, the elements may be directly connected without interposing another element or another circuit therebetween.

In the case where elements are connected without interposing another element or circuit therebetween, the description "being directly connected" is employed. In addition, in the case where the description "being electrically connected" is employed, the following cases are included therein: the case where elements are electrically connected (that is, the case where the elements are connected by interposing another element therebetween), the case where elements are functionally connected (that is, the elements are connected by interposing another circuit therebetween), and the case where elements are directly connected (that is, the elements are connected without interposing another element or another circuit therebetween).

Note that a display element, a display device, a light-emitting element, and a light-emitting device can apply various types and include various elements. For example, as a display element, a display device, a light-emitting element, and a light-emitting device, a display medium, the contrast of which changes by an electromagnetic action, such as an EL element (e.g., an organic EL element, an inorganic EL element, or an EL element including both organic and inorganic materials) an electron-emissive element, a liquid crystal, electronic ink, a grating light valve (GLV), a plasma display panel (PDP), a digital micromirror device (DMD), a piezoelectric ceramic display, or a carbon nanotube can be applied. Note that display devices using an EL element include an EL display; display devices using an electron-emissive element include a field emission display (FED), an SED-type flat panel display (SED: Surface-conduction Electron-emitter Display), and the like; display devices using a liquid crystal element include a liquid crystal display, a transmissive liquid crystal display, a semi-transmissive liquid crystal display, a reflective liquid crystal display, and the like; and display devices using electronic ink include electronic paper.

Note that in the invention, various types of transistors can be employed as a transistor without limiting to a certain type. Thus, for example, a thin film transistor (TFT) including a non-single crystalline semiconductor film typified by amorphous silicon or polycrystalline silicon can be employed. Accordingly, such a transistor can be formed at low temperature, can be formed at low cost, can be formed over a large substrate as well as a light-transmissive substrate, and further, such a transistor can transmit light. In addition, a transistor formed by using a semiconductor substrate or an SOI substrate, a MOS transistor, a junction transistor, a bipolar transistor, or the like can be employed. Accordingly, a transistor with few variations, a transistor with high current supply capacity, and a transistor with a small size can be formed, thereby a circuit with low power consumption can be formed by using such a transistor. In addition, a transistor including a compound semiconductor such as ZnO, a-InGaZnO, SiGe, or GaAs, or a thin film transistor obtained by thinning such a compound semiconductor can be employed. Therefore, such a transistor can be formed at low temperature, can be formed at room temperature, and can be formed directly over a low heat-resistant substrate such as a plastic substrate or a film substrate. A transistor or the like formed by an inkjet method or a printing method may also be employed. Accordingly, such a transistor can be formed at room temperature, can be formed at a low vacuum, or can be formed using a large substrate. In addition, since such a transistor can be formed without using a mask (a reticle), layout of the transistor can be easily changed. Further, a transistor including an organic semiconductor or a carbon nanotube, or other transistors can be employed. Accordingly, the transistor can be formed using a substrate which can be bent. Note that a non-single crystalline semiconductor film may include hydrogen or halogen. Moreover, a transistor can be formed using various types of substrates. The type of a substrate is not limited to a certain type. Therefore, for example, a single crystalline substrate, an SOI substrate, a glass substrate, a quartz substrate, a plastic substrate, a paper substrate, a cellophane substrate, a stone substrate, a stainless steel substrate, a substrate including a stainless steel foil, or the like can be used as a substrate. Furthermore, the transistor may be formed using one substrate, and then, the transistor may be transferred to another substrate. By using the aforementioned substrate, a transistor with excellent properties or a transistor with low power consumption can be formed, or a device with high durability or high heat resistance can be formed.

The structure of a transistor can be various modes without limiting to a certain structure. For example, a multi-gate structure having two or more gate electrodes may be used. When the multi-gate structure is used, a structure where a plurality of transistors are connected in series is provided because a structure where channel regions are connected in series is provided. By using the multi-gate structure, off-current can be reduced; the withstand voltage of the transistor can be increased to improve reliability; or a drain-source current does not fluctuate very much even if a drain-source voltage fluctuates when the transistor operates in the saturation region so that flat characteristics can be obtained. In addition, a structure where gate electrodes are formed above and below a channel may be used. By using the structure where gate electrodes are formed above and below the channel, a channel region is enlarged to increase the amount of a current flowing therethrough, or a depletion layer can be easily formed to decrease the S value. When the gate electrodes are formed above and below the channel, a structure where a plurality of transistors are connected in parallel is provided. Further, a structure where a gate electrode is formed above a channel, a structure where a gate electrode is formed below a channel, a staggered structure, or an inversely staggered structure may be used; or a channel region may be divided into a plurality of regions and the divided regions may be connected in parallel or in series. A source electrode or a drain electrode may overlap with a channel (or a part of it). By using the structure where the source electrode or the drain electrode may overlap with the channel (or a part of it), the case can be prevented in which electric charges are accumulated in a part of the channel, which would result in an unstable operation. Moreover, an LDD region may be provided. By providing the LDD region, off-current can be reduced; the withstand voltage of the transistor can be increased to improve reliability; or a drain-source current does not fluctuate very much even if a drain-source voltage fluctuates when the transistor operates in the saturation region so that flat characteristics can be obtained.

Note that various types of transistors can be used for a transistor in the invention and the transistor can be formed using various types of substrates. Accordingly, all of circuits may be formed using a glass substrate, a plastic substrate, a single crystalline substrate, an SOI substrate, or any other substrate. When all of the circuits are formed using the same substrate, the number of component parts can be reduced to cut cost, or the number of connections between circuit components can be reduced to improve reliability. Alternatively, a part of the circuits may be formed using one substrate and another part of the circuits may be formed using another substrate. That is, not all of the circuits are required to be formed using the same substrate. For example, a part of the circuits may be formed with transistors using a glass substrate and another part of the circuits may be formed using a single crystalline substrate, so that the IC chip may be connected to the glass substrate by COG (Chip On Glass). Alternatively, the IC chip may be connected to the glass substrate by TAB (Tape Automated Bonding) or a printed wiring board. When a part of the circuits is formed using the same substrate in this manner, the number of the component parts can be reduced to cut cost, or the number of connections between the circuit components can be reduced to improve reliability. In addition, by forming a portion with a high driving voltage or a portion with high driving frequency, which consumes large power, over another substrate, increase in power consumption can be prevented.

Note also that one pixel corresponds to one element whose brightness can be controlled in the invention. Therefore, for example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements of more than three colors may be used or a color other than RGB may be added. For example, RGBW (W means white) may be used by adding white. In addition, RGB plus one or more colors of yellow, cyan, magenta emerald green, vermilion, and the like may be used. Further, a color similar to at least one of R, and B may be added. For example, R, G, B1, and B2 may be used. Although both B1 and B2 are blue, they have slightly different frequency. By using such color elements, display which is closer to the real object can be performed or power consumption can be reduced. Alternatively, as another example, in the case of controlling brightness of one color element by using a plurality of regions, one region corresponds to one pixel. Therefore, for example, in the case of performing area gray scale display, a plurality of regions which control brightness are provided in each color element and gray scales are expressed with the whole regions. In this case, one region which controls brightness corresponds to one pixel. Thus, in that case, one color element includes a plurality of pixels. Further, in that case, regions which contribute to display may have different area dimensions depending on pixels. Moreover, in a plurality of regions which control brightness in each color element, that is, in a plurality of pixels which form one color element, signals supplied to the plurality of the pixels may be slightly varied so that the viewing angle can be widened. Note that the description "one pixel (for three colors)" corresponds to the case where three pixels of R, G, and B are considered as one pixel. Meanwhile, the description "one pixel (for one color)" corresponds to the case where a plurality of pixels are provided in each color element and collectively considered as one pixel.

Note also that in the invention, pixels may be provided (arranged) in matrix. Here, description that pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), the following cases are included therein: the case where the pixels are arranged in stripes and the case where dots of the three color elements are arranged in a so-called delta pattern. In addition, the case is also included therein in which dots of the three color elements are provided in Bayer arrangement. Note that the color elements are not limited to three colors, and color elements of more than three colors may be employed. RGBW (W means white), RGB plus one or more of yellow, cyan, magenta, and the like, or the like is given as an example. Further, the sizes of display regions may be different between respective dots of color elements. Thus, power consumption can be reduced or the life of a light-emitting element can be prolonged.

Note that a transistor is an element having at least three terminals of a gate, a drain, and a source. The transistor has a channel region between a drain region and a source region, and a current can flow through the drain region, the channel region, and the source region. Here, since the source and the drain of the transistor may change depending on the structure, the operating condition, and the like of the transistor, it is difficult to define which is a source or a drain. Therefore, in the invention, a region functioning as a source and a drain may not be called the source or the drain. In such a case, for example, one of the source and the drain may be called a first terminal and the other thereof may be called a second terminal.

Note also that a transistor may be an element having at least three terminals of a base, an emitter, and a collector. In this case also, one of the emitter and the collector may be similarly called a first terminal and the other terminal may be called a second terminal.

A gate means all of or a part of a gate electrode and a gate wiring (also called a gate line, a gate signal line, or the like). A gate electrode means a conductive film which overlaps with a semiconductor which forms a channel region, an LDD (Lightly Doped Drain) region, or the like with a gate insulating film interposed therebetween. A gate wiring means a wiring for connecting a gate electrode of each pixel to each other, or a wiring for connecting a gate electrode to another wiring.

However, there is a portion which functions as both a gate electrode and a gate wiring. Such a region may be called either a gate electrode or a gate wiring. That is, there is a region where a gate electrode and a gate wiring cannot be clearly distinguished from each other. For example, in the case where a channel region overlaps with an extended gate wiring, the overlapped region functions as both a gate wiring and a gate electrode. Accordingly, such a region may be called either a gate electrode or a gate wiring.

In addition, a region formed of the same material as a gate electrode and connected to the gate electrode may also be called a gate electrode. Similarly, a region formed of the same material as a gate wiring and connected to the gate wiring may also be called a gate wiring. In a strict sense, such a region does not overlap with a channel region, or does not have a function of connecting the gate electrode to another gate electrode in some cases. However, there is a region formed of the same material as the gate electrode or the gate wiring and connected to the gate electrode or the gate wiring because of the manufacturing condition or the like. Accordingly, such a region may also be called either a gate electrode or a gate wiring.

In a multi-gate transistor, for example, a gate electrode of one transistor is often connected to a gate electrode of another transistor by using a conductive film which is formed of the same material as the gate electrode. Since such a region is a region for connecting the gate electrode to another gate electrode, it may be called a gate wiring, and it may also be called a gate electrode because a multi-gate transistor can be considered as one transistor. That is, a region which is formed of the same material as the gate electrode or the gate wiring and connected thereto may be called either a gate electrode or a gate wiring. In addition, for example, a part of a conductive film which connects the gate electrode and the gate wiring may also be called either a gate electrode or a gate wiring.

Note that a gate terminal means a part of a region of a gate electrode or a part of a region which is electrically connected to the gate electrode.

Note also that a source means all of or a part of a source region, a source electrode, and a source wiring (also called a source line, a source signal line, or the like). A source region means a semiconductor region containing a large amount of P-type impurities (e.g., boron or gallium) or N-type impurities (e.g., phosphorus or arsenic). Accordingly, a region containing a small amount of P-type impurities or N-type impurities, namely, an LDD (Lightly Doped Drain) region is not included in the source region. A source electrode is a part of a conductive layer formed of a material different from that of a source region, and electrically connected to the source region. However, there is the case where a source electrode and a source region are collectively called a source electrode. A source wiring is a wiring for connecting a source electrode of each pixel to each other, or a wiring for connecting a source electrode to another wiring.

However, there is a portion functioning as both a source electrode and a source wiring. Such a region may be called either a source electrode or a source wiring. That is, there is a region where a source electrode and a source wiring cannot be clearly distinguished from each other. For example, in the case where a source region overlaps with an extended source wiring, the overlapped region functions as both a source wiring and a source electrode. Accordingly, such a region may be called either a source electrode or a source wiring.

In addition, a region formed of the same material as a source electrode and connected to the source electrode, or a portion for connecting a source electrode to another source electrode may also be called a source electrode. A portion which overlaps with a source region may also be called a source electrode. Similarly, a region formed of the same material as a source wiring and connected to the source wiring may be called a source wiring. In a strict sense, such a region may not have a function of connecting the source electrode to another source electrode. However, there is a region formed of the same material as the source electrode or the source wiring, and connected to the source electrode or the source wiring because of the manufacturing condition or the like. Accordingly, such a region may also be called either a source electrode or a source wiring.

In addition, for example, a part of a conductive film which connects a source electrode and a source wiring may be called either a source electrode or a source wiring.

Note that a source terminal means a part of a source region, a part of a source electrode, or a part of a region electrically connected to the source electrode.

Note also that the same can be said for a drain.

In the invention, a semiconductor device means a device having a circuit including a semiconductor element (e.g., a transistor or a diode). The semiconductor device may also include all devices that can function by utilizing semiconductor characteristics.

In addition, a display device means a device having a display element (e.g., a liquid crystal element or a light-emitting element). Note that the display device may also means a display panel itself where a plurality of pixels including display elements such as liquid crystal elements or EL elements are formed over the same substrate as a peripheral driver circuit for driving the pixels. In addition, the display device may also include a peripheral driver circuit provided over a substrate by wire bonding or bump bonding, namely, chip on glass (COG). Further, the display device may also include a flexible printed circuit (FPC) or a printed wiring board (PWB) attached to the display panel (e.g., an IC, a resistor, a capacitor, an inductor, or a transistor). The display device may also include an optical sheet such as a polarizing plate or a retardation plate. Moreover, the display device may include a backlight unit (a light guide plate, a prism sheet, a diffusion sheet, a reflective sheet, or a light source (e.g., an LED or a cold cathode tube)).

In addition, a light-emitting device means a display device having a self-luminous display element, particularly, such as an EL element or an element used for an FED. A liquid crystal display device means a display device having a liquid crystal element.

In the invention, description that an object is "formed on" or "formed over" another object does not necessarily mean that the object is in direct contact with another object. The description includes the case where two objects are not in direct contact with each other, that is, the case where another object is interposed therebetween. Accordingly, for example, when it is described that a layer B is formed on (or over) a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed above another object, it does not necessarily mean that the object is in direct contact with another object, and another object may be interposed therebetween. Accordingly, for example, when it is described that a layer B is formed above a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed below or under another object, it includes both of the case where the objects are in direct contact with each other, and the case where the objects are not in contact with each other.

By using the invention, a flip-flop circuit and a shift register each using a driving method for suppressing characteristic deterioration of a transistor, a semiconductor device and a display device each having such a shift register, and an electronic device having the display device can be provided.

For example, in the case of applying the invention to a shift register, because a transistor which supplies a power supply potential to an output terminal is not always on in a non-selection period, characteristics deterioration (e.g., a threshold potential shift) of the transistor can be suppressed. Therefore, a malfunction of the shift register due to the characteristic deterioration can be suppressed.

In addition, by using the invention, a flip-flop circuit and a shift register each having a control circuit with a comparatively small circuit size, a semiconductor device and a display device each having such a shift register, and an electronic device having the display device can be provided.

BRIEF DESCRIPTION OF THE DRAWINGS

In the accompanying drawings:
FIGS. 25A and 25B illustrate Embodiment Mode 4;
FIG. 65 illustrates Embodiment Mode 10;
FIG. 66 illustrates Embodiment Mode 10.

DETAILED DESCRIPTION OF THE INVENTION

Hereinafter, the invention will be described by way of embodiment modes with reference to the drawings. However, the invention can be implemented by various different ways and it will be easily understood by those skilled in the art that various changes and modifications are possible. Unless such changes and modifications depart from the spirit and the scope of the invention, they should be construed as being included therein. Therefore, the invention should not be construed as being limited to the description of the embodiment modes.

Embodiment Mode 1

In this embodiment mode, a basic principle of the invention is described with reference to FIG. 1A.

Figure 1A:
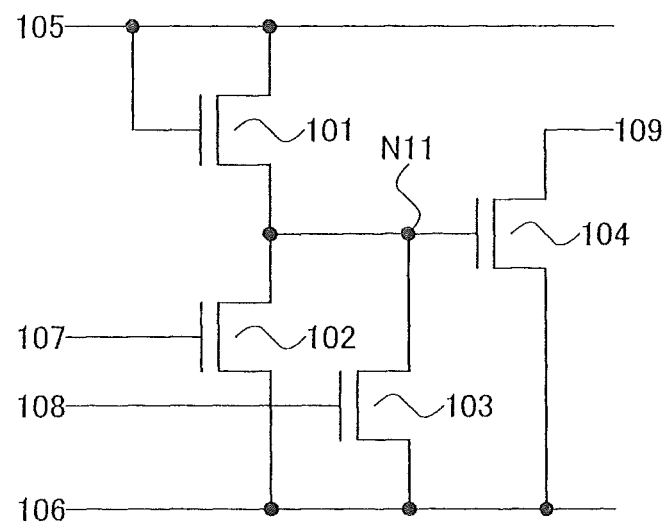
FIGS. 1A and 1B illustrate Embodiment Mode 1.

FIG. 1A shows a basic circuit which is based on the basic principle of the invention. The basic circuit in FIG. 1A includes a transistor 101, a transistor 102, a transistor 103, and a transistor 104.

Connection relations of the basic circuit in FIG. 1A are described. A gate of the transistor 101 is connected to a wiring 105, a first terminal of the transistor 101 is connected to the wiring 105, and a second terminal of the transistor 101 is connected to a gate of the transistor 104. A gate of the transistor 102 is connected to a wiring 107, a first terminal of the transistor 102 is connected to a wiring 106, and a second terminal of the transistor 102 is connected to the gate of the transistor 104. A gate of the transistor 103 is connected to a wiring 108, a first terminal of the transistor 103 is connected to the wiring 106, and a second terminal of the transistor 103 is connected to the gate of the transistor 104. A first terminal of the transistor 104 is connected to the wiring 106, and a second terminal of the transistor 104 is connected to a wiring 109. Note that a node of the second terminal of the transistor 101, the second terminal of the transistor 102, the second terminal of the transistor 103, and the gate of the transistor 104 is denoted by N11.

In addition, each of the transistors 101 to 104 is an N-channel transistor.

Accordingly, since the basic circuit in FIG. 1A can be formed by using only N-channel transistors, amorphous silicon can be used for a semiconductor layer of the basic circuit in FIG. 1A. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the basic circuit in FIG. 1A, the manufacturing process can also be simplified.

In addition, a power supply potential VDD is supplied to the wiring 105 and a power supply potential VSS is supplied to the wiring 106. Note that the power supply potential VDD is higher than the power supply potential VSS. Note also that a digital signal, an analog signal, or the like may be supplied to each of the wiring 105 and the wiring 106, or another power supply potential may be supplied thereto.

In addition, a signal is supplied to each of the wiring 107 and the wiring 108. Note that the signal supplied to each of the wiring 107 and the wiring 108 is a binary digital signal. When the digital signal is an H-level signal, it has the same potential as the power supply potential VDD (hereinafter also referred to as a potential VDD or an H level), and when the digital signal is an L-level signal, it has the same potential as the power supply potential VSS (hereinafter also referred to as a potential VSS or an L level). Note that the power supply potential VDD, the power supply potential VSS, or another power supply potential may be supplied to each of the wiring 107 and the wiring 108. Alternatively, an analog signal may be supplied to each of the wiring 107 and the wiring 108.

Next, operations of the basic circuit shown in FIG. 1A are described with reference to FIG. 1B.

Figure 1B:
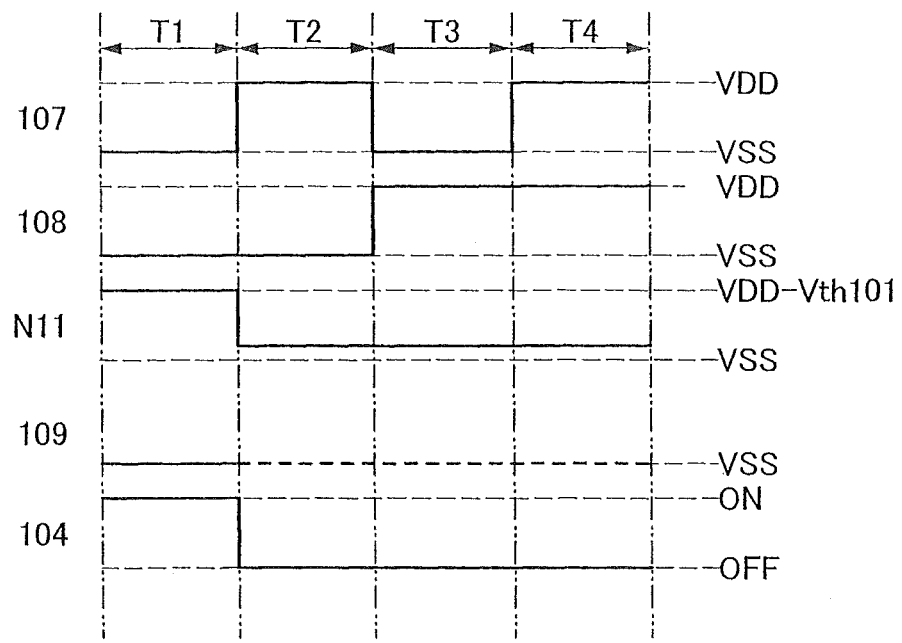

FIG. 1B is an example of a timing chart of the basic circuit shown in FIG. 1A. The timing chart in FIG. 1B shows a potential of the wiring 107, a potential of the wiring 108, a potential of the node N11, a potential of the wiring 109, and on/off of the transistor 104.

The timing chart in FIG. 1B is described by dividing the whole period into periods T1 to T4. In addition, FIGS. 2A to 3B show operations of the basic circuit in FIG. 1A in the periods T1 to T4, respectively.

Figure 2A:
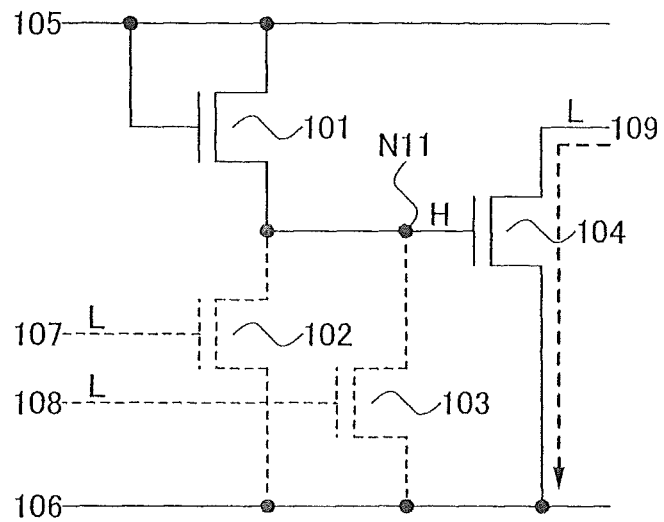
FIGS. 2A and 2B illustrate Embodiment Mode 1.

First, the operation in the period T1 is described with reference to FIG. 2A. In the period T1, an L-level signal is supplied to the wiring 107 and an L-level signal is supplied to the wiring 108. Accordingly, the transistor 102 is turned off and the transistor 103 is off.

In addition, since the transistor 101 is diode-connected, the potential of the node N11 starts to rise. This rise in the potential of the node N11 continues until the transistor 101 is turned off. The transistor 101 is turned off when the potential of the node N11 becomes a value obtained by subtracting a threshold voltage Vth101 of the transistor 101 from the power supply potential VDD (VDD−Vth101). Therefore, the potential of the node N11 becomes VDD−Vth101.

Accordingly, the transistor 104 is turned on and the potential of the wiring 109 becomes equal to the power supply potential VSS.

Figure 2B:
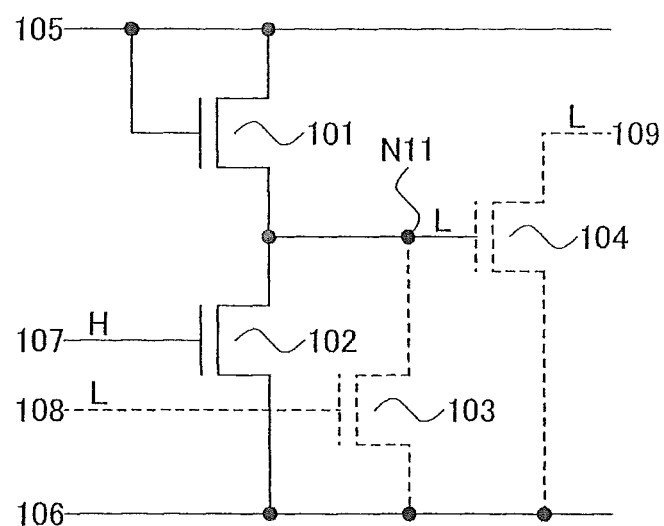

Next, the operation in the period T2 is described with reference to FIG. 2B. In the period T2, an H-level signal is supplied to the wiring 107 and an L-level signal is supplied to the wiring 108. Accordingly, the transistor 102 is turned on and the transistor 103 is off.

In addition, the potential of the node N11 is determined by the operating point of the transistor 101 and the transistor 102. Note that when a ratio (W/L) of the transistor 102 (W means channel width of a channel region and L means channel length of the channel region) is set sufficiently higher than a ratio (W/L) of the transistor 101, the potential of the node N11 becomes slightly higher than the power supply potential VSS.

Accordingly, the transistor 104 is turned off and the wiring 109 becomes a floating state. The potential of the wiring 109 remains equal to the power supply potential VSS because the wiring 109 is kept at the potential in the period T1.

Figure 3A:
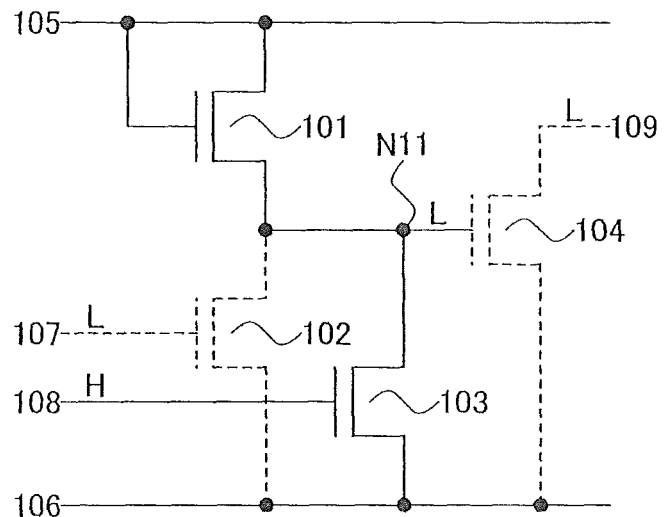
FIGS. 3A and 3B illustrate Embodiment Mode 1.

Next, the operation in the period T3 is described with reference to FIG. 3A. In the period T3, an L-level signal is supplied to the wiring 107 and an H-level signal is supplied to the wiring 108. Accordingly, the transistor 102 is turned off and the transistor 103 is on.

In addition, the potential of the node N11 is determined by the operating point of the transistor 101 and the transistor 103. Note that when a ratio (W/L) of the transistor 103 is set sufficiently higher than a ratio (W/L) of the transistor 101, the potential of the node N11 becomes slightly higher than the power supply potential VSS.

Accordingly, the transistor 104 is turned off and the wiring 109 becomes a floating state. The potential of the wiring 109 remains equal to the power supply potential VSS because the wiring 109 is kept at the potential in the periods T1 and T2.

Figure 3B:
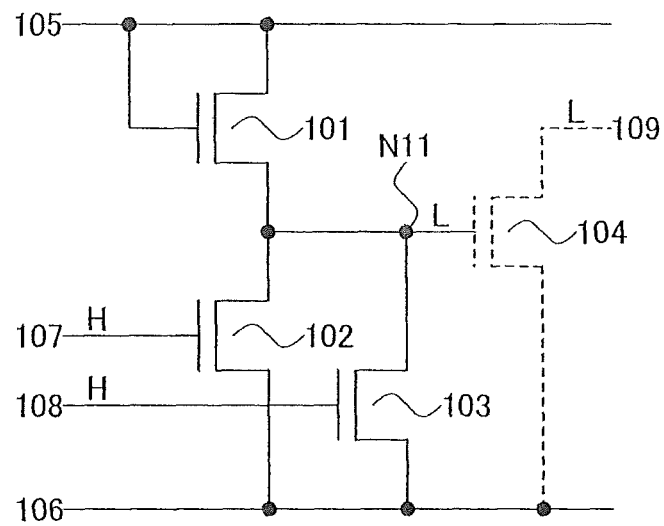

Next, the operation in the period T4 is described with reference to FIG. 3B. In the period T4, an H-level signal is supplied to the wiring 107 and an H-level signal is supplied to the wiring 108. Accordingly, the transistor 102 is turned on and the transistor 104 is on.

In addition, since the potential of the node N11 is determined by the operating point of the transistor 101, the transistor 102, and the transistor 103, the potential of the node N11 becomes slightly higher than the power supply potential VSS.

Accordingly, the transistor 104 is turned off and the wiring 109 becomes a floating state. The potential of the wiring 109 remains equal to the power supply potential VSS because the wiring 109 is kept at the potential in the periods T1 to T3.

By the above-described operations, the basic circuit in FIG. 1A supplies the power supply potential VSS to the wiring 109 in the period T1, so that the potential of the wiring 109 becomes equal to the power supply potential VSS. In the periods T2 to T4, the basic circuit in FIG. 1A makes the wiring 109 into a floating state, so that the potential of the wiring 109 is kept equal to the power supply potential VSS.

In addition, the basic circuit in FIG. 1A does not include a transistor which is on in all of the periods T1 to T4. That is, the basic circuit in FIG. 1A does not include a transistor which is always or almost always on. Accordingly, the basic circuit in FIG. 1A can suppress characteristic deterioration of a transistor and a threshold voltage shift due to the characteristic deterioration.

Further, the characteristics of a transistor which is formed of amorphous silicon easily deteriorate. Therefore, when the transistor included in the basic circuit in FIG. 1A is formed using amorphous silicon, not only can the advantages such as a reduction in manufacturing cost and improvement in a yield be obtained, but also the problem of the characteristic deterioration of the transistor can be solved.

Here, the functions of the transistors 101 to 104 are described. The transistor 101 has a function of a diode in which the first terminal and the gate correspond to an input terminal and the second terminal corresponds to an output terminal. The transistor 102 has a function of a switch which selects whether to connect the wiring 106 and the node N11 in accordance with the potential of the wiring 107. The transistor 103 has a function of a switch which selects whether to connect the wiring 106 and the node N11 in accordance with the potential of the wiring 108. The transistor 104 has a function of a switch which selects whether to connect the wiring 106 and the wiring 109 in accordance with the potential of the node N11.

Figure 4A:
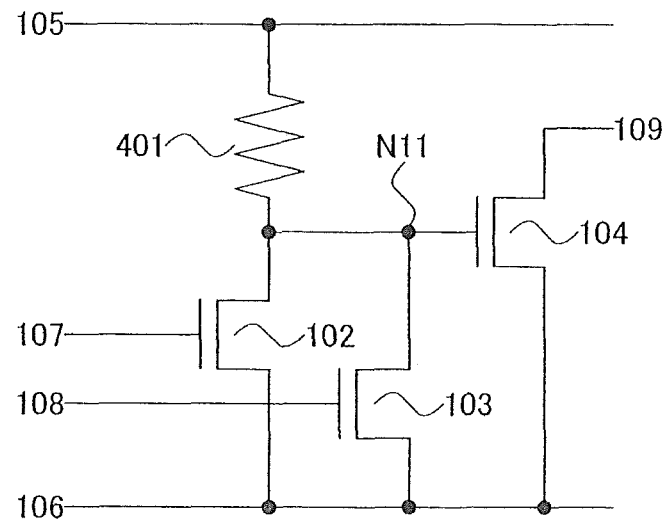
FIGS. 4A and 4B illustrate Embodiment Mode 1.
Figure 4B:
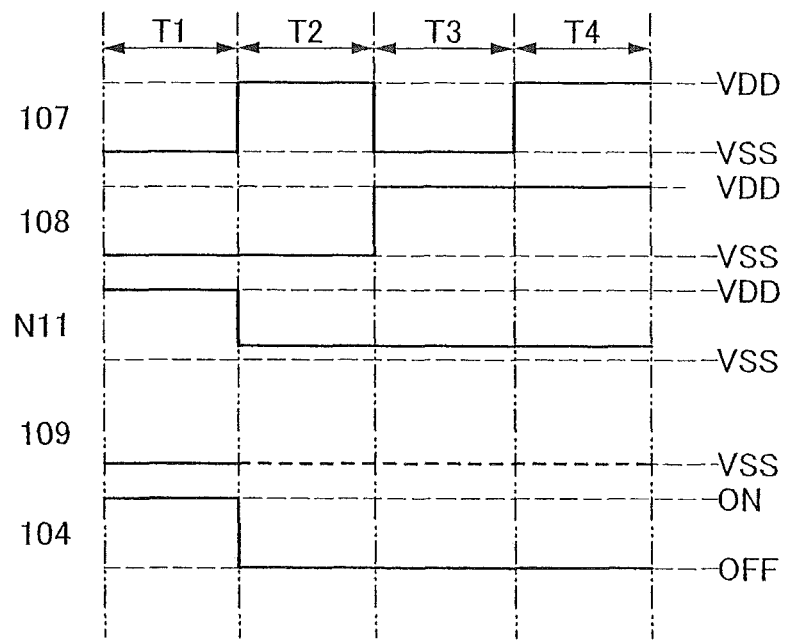

Note that the transistor 101 may be any element as long as it has a resistance component. For example, as shown in FIG. 4A, a resistor 401 can be used instead of the transistor 101. By using the resistor 401, the potential of the node N11 can be set equal to the power supply potential VDD in the period T1. In addition, a timing chart in FIG. 4A is shown in FIG. 4B.

Figure 13A:
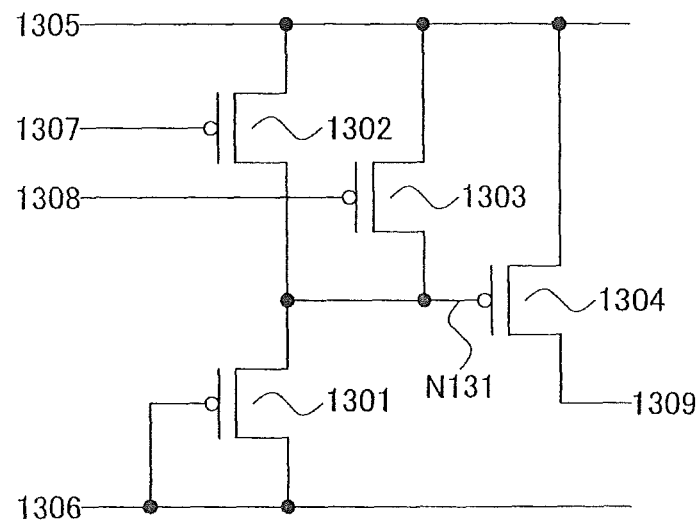
FIGS. 13A and 13B illustrate Embodiment Mode 1.

Next, the case is described in which the basic circuit shown in FIG. 1A is constructed from P-channel transistors, with reference to FIG. 13A.

FIG. 13A shows a basic circuit which is based on the basic principle of the invention. The basic circuit in FIG. 13A includes a transistor 1301, a transistor 1302, a transistor 1303, and a transistor 1304.

Connection relations of the basic circuit in FIG. 13A are described. A gate of the transistor 1301 is connected to a wiring 1306, a first terminal of the transistor 1301 is connected to the wiring 1306, and a second terminal of the transistor 1301 is connected to a gate of the transistor 1304. A gate of the transistor 1302 is connected to a wiring 1307, a first terminal of the transistor 1302 is connected to a wiring 1305, and a second terminal of the transistor 1302 is connected to the gate of the transistor 1304. A gate of the transistor 1303 is connected to a wiring 1308, a first terminal of the transistor 1303 is connected to the wiring 1305, and a second terminal of the transistor 1303 is connected to the gate of the transistor 1304. A first terminal of the transistor 1304 is connected to the wiring 1305, and a second terminal of the transistor 1304 is connected to a wiring 1309. Note that a node of the second terminal of the transistor 1301, the second terminal of the transistor 1302, the second terminal of the transistor 1303, and the gate of the transistor 1304 is denoted by N131.

In addition, each of the transistors 1301 to 1304 is a P-channel transistor.

Accordingly, since the basic circuit in FIG. 13A can be formed by using only P-channel transistors, a step of forming N-channel transistors is not necessary. Thus, in the basic circuit in FIG. 13A, a manufacturing process can be simplified, so that manufacturing cost can be reduced and a yield can be improved.

In addition, the power supply potential VDD is supplied to the wiring 1305 and the power supply potential VSS is supplied to the wiring 1306.

In addition, a signal is supplied to each of the wiring 1307 and the wiring 1308. Note that the signal supplied to each of the wiring 1307 and the wiring 1308 is a binary digital signal.

Next, operations of the basic circuit shown in FIG. 13A are described with reference to FIG. 13B.

Figure 13B:
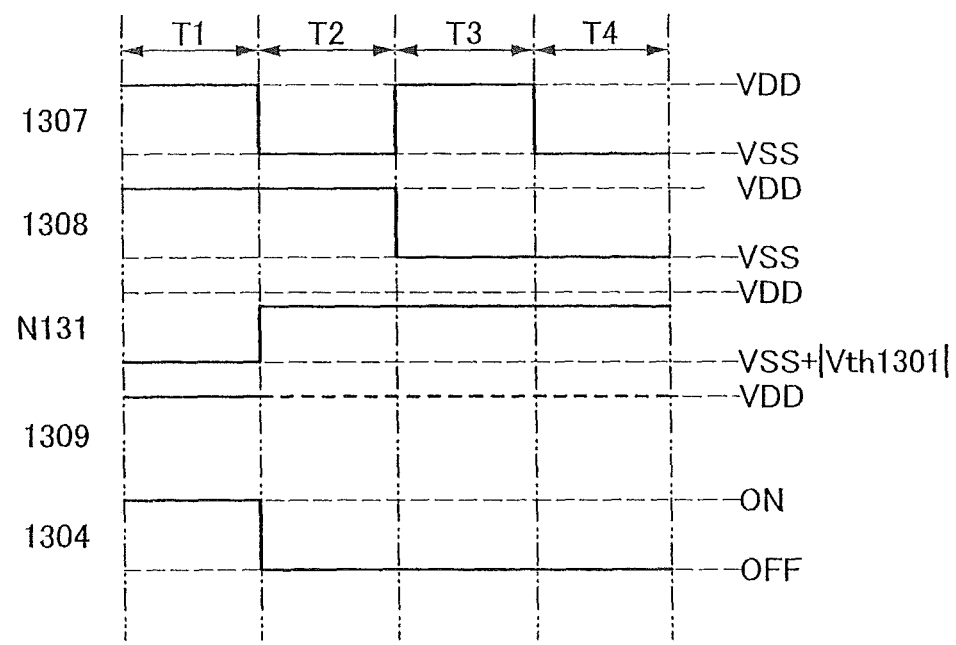

FIG. 13B is an example of a timing chart of the basic circuit shown in FIG. 13A. The timing chart in FIG. 13B shows a potential of the wiring 1307, a potential of the wiring 1308, a potential of the node N131, a potential of the wiring 1309, and on/off of the transistor 1304.

The timing chart in FIG. 13B is described by dividing the whole period into periods T1 to T4. In addition, FIGS. 14A to 15B show operations of the basic circuit in FIG. 13A in the periods T1 to T4, respectively.

Figure 14A:
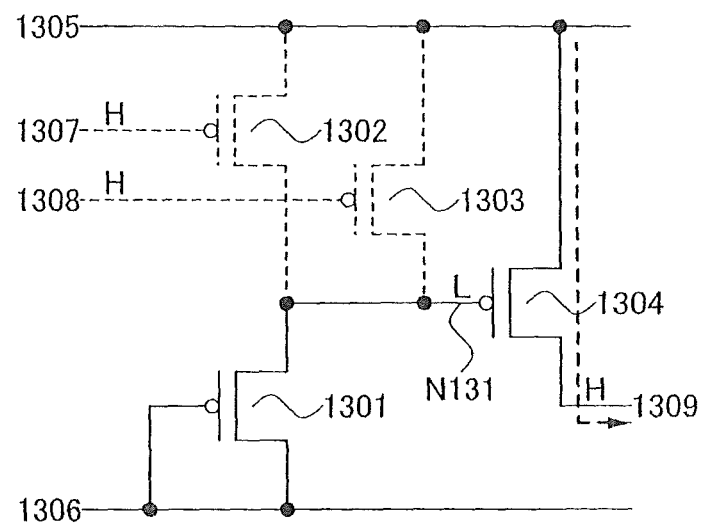
FIGS. 14A and 14B illustrate Embodiment Mode 1.

First, the operation in the period T1 is described with reference to FIG. 14A. In the period T1, an H-level signal is supplied to the wiring 1307 and an H-level signal is supplied to the wiring 1308. Accordingly, the transistor 1302 is turned off and the transistor 1303 is off.

In addition, since the transistor 1301 is diode-connected, the potential of the node N131 starts to decrease. This decrease in the potential of the node N131 continues until the transistor 1301 is turned off. The transistor 1301 is turned off when the potential of the node N131 becomes the sum of the power supply potential VSS and the absolute value of a threshold voltage Vth1301 of the transistor 1301 (VSS+|Vth1301|). Therefore, the potential of the node N131 becomes VSS+|Vth1301|.

Accordingly, the transistor 1304 is turned on and the potential of the wiring 1309 becomes equal to the power supply potential VDD.

Figure 14B:
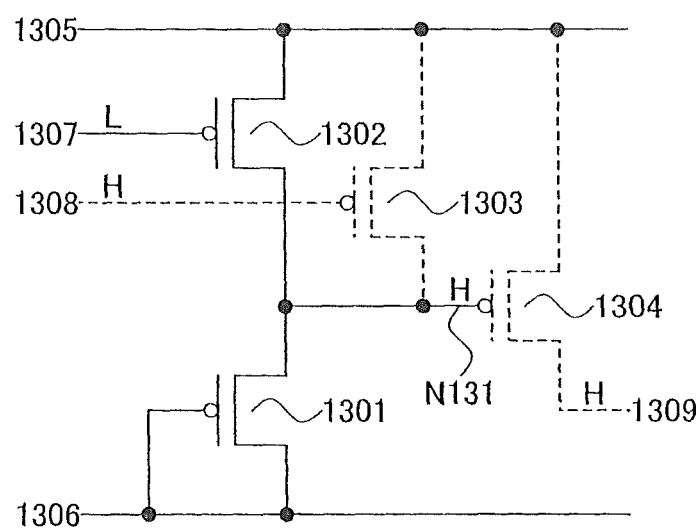

Next, the operation in the period T2 is described with reference to FIG. 14B. In the period T2, an L-level signal is supplied to the wiring 1307 and an H-level signal is supplied to the wiring 1308. Accordingly, the transistor 1302 is turned on and the transistor 1303 is off.

In addition, the potential of the node N131 is determined by the operating point of the transistor 1301 and the transistor 1302. Note that when a ratio (W/L) of the transistor 1302 (W means channel width of a channel region and L means channel length of the channel region) is set sufficiently higher than a ratio (W/L) of the transistor 1301, the potential of the node N131 becomes slightly lower than the power supply potential VDD.

Accordingly, the transistor 1304 is turned off and the wiring 1309 becomes a floating state. The potential of the wiring 1309 remains equal to the power supply potential VDD because the wiring 1309 is kept at the potential in the period T1.

Figure 15A:
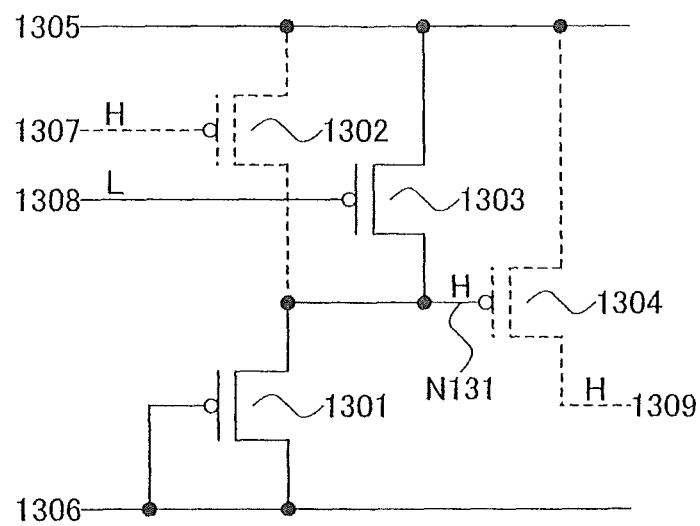
FIGS. 15A and 15B illustrate Embodiment Mode 1.

Next, the operation in the period T3 is described with reference to FIG. 15A. In the period T3, an H-level signal is supplied to the wiring 1307 and an L-level signal is supplied to the wiring 1308. Accordingly, the transistor 1302 is turned off and the transistor 1303 is on.

In addition, the potential of the node N131 is determined by the operating point of the transistor 1301 and the transistor 1303. Note that when a ratio (W/L) of the transistor 1303 is set sufficiently higher than a ratio (W/L) of the transistor 1301, the potential of the node N131 becomes slightly lower than the power supply potential VDD.

Accordingly, the transistor 1304 is turned off and the wiring 1309 becomes a floating state. The potential of the wiring 1309 remains equal to the power supply potential VDD because the wiring 1309 is kept at the potential in the periods T1 and T2.

Figure 15B:
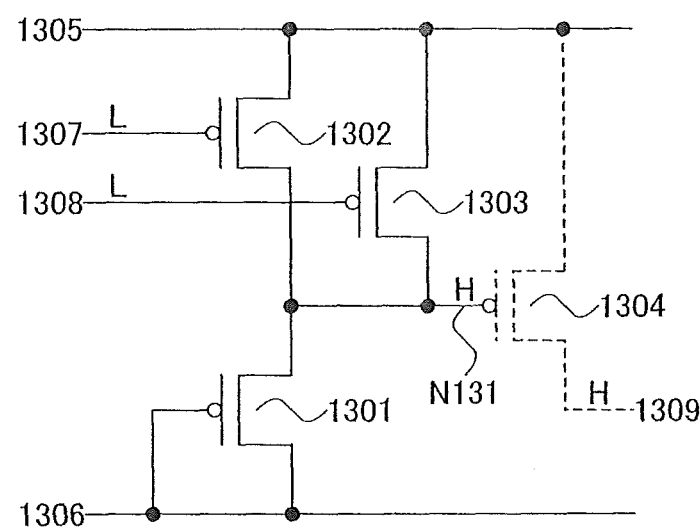

Next, the operation in the period T4 is described with reference to FIG. 15B. In the period T4, an L-level signal is supplied to the wiring 1307 and an L-level signal is supplied to the wiring 1308. Accordingly, the transistor 1302 is turned on and the transistor 1304 is on.

In addition, since the potential of the node N131 is determined by the operating point of the transistor 1301, the transistor 1302, and the transistor 1303, the potential of the node N131 becomes slightly lower than the power supply potential VDD.

Accordingly, the transistor 1304 is turned off and the wiring 1309 becomes a floating state. The potential of the wiring 1309 remains equal to the power supply potential VDD because the wiring 1309 is kept at the potential in the periods T1 to T3.

By the above-described operations, the basic circuit in FIG. 13A supplies the power supply potential VDD to the wiring 1309 in the period T1, so that the potential of the wiring 1309 becomes equal to the power supply potential VDD. In the periods T2 to T4, the basic circuit in FIG. 13A makes the wiring 1309 into a floating state, so that the potential of the wiring 1309 is kept equal to the power supply potential VDD.

In addition, the basic circuit in FIG. 13A does not include a transistor which is on in all of the periods T1 to T4. That is, the basic circuit in FIG. 13A does not include a transistor which is always or almost always on. Accordingly, the basic circuit in FIG. 13A can suppress characteristic deterioration of a transistor and a threshold voltage shift due to the characteristic deterioration.

Note that the transistors 1301 to 1304 have functions which are similar to those of the transistors 101 to 104.

Figure 16A:
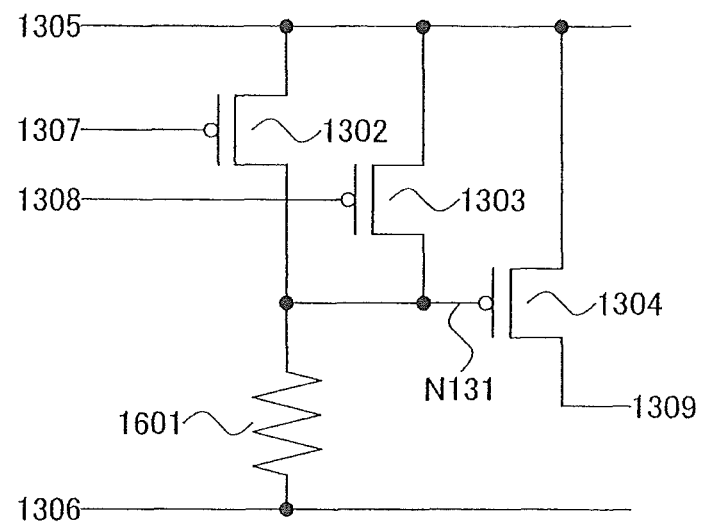
FIGS. 16A and 16B illustrate Embodiment Mode 1.
Figure 16B:
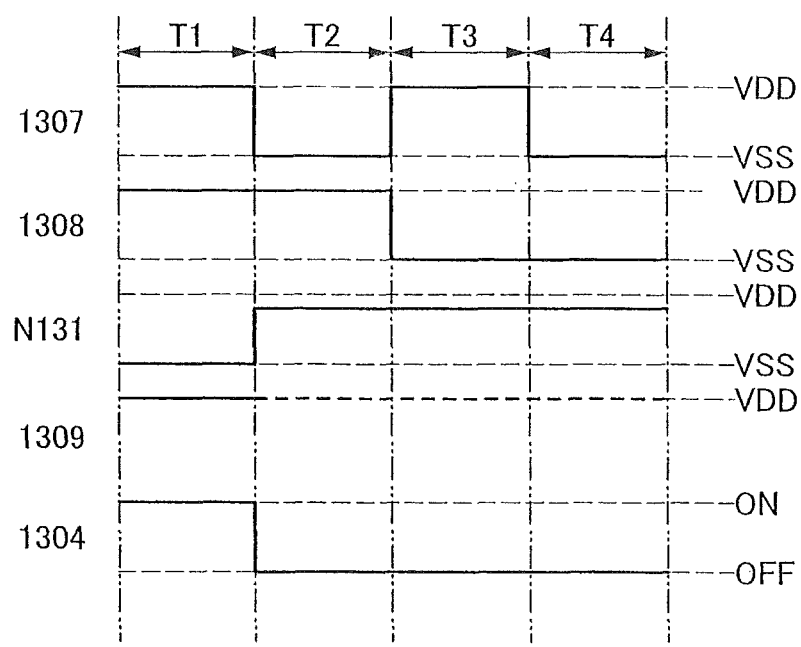

Note that the transistor 1301 may be any element as long as it has a resistance component. For example, as shown in FIG. 16A, a resistor 1601 can be used instead of the transistor 1301. By using the resistor 1601, the potential of the node N131 can be set equal to the power supply potential VSS in the period T1. In addition, a timing chart in FIG. 16A is shown in FIG. 16B.

Note that this embodiment mode can be freely combined with any description in other embodiment modes in this specification. Further, parts of the description in this embodiment mode can be combined with one another.

Embodiment Mode 2

In this embodiment mode, a basic principle of the invention which is different from that of Embodiment Mode 1 is described with reference to FIG. 5A.

Figure 5A:
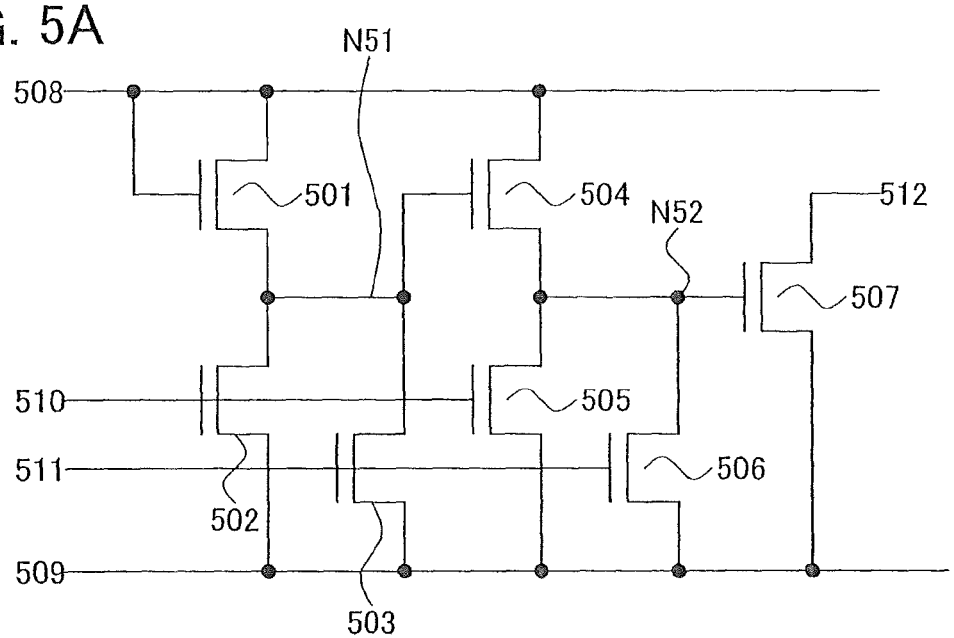
FIGS. 5A and 5B illustrate Embodiment Mode 2.

FIG. 5A shows a basic circuit which is based on the basic principle of the invention. The basic circuit in FIG. 5A includes a transistor 501, a transistor 502, a transistor 503, a transistor 504, a transistor 505, a transistor 506, and a transistor 507.

Connection relations of the basic circuit in FIG. 5A are described. A gate of the transistor 501 is connected to a wiring 508, a first terminal of the transistor 501 is connected to the wiring 508, and a second terminal of the transistor 501 is connected to a gate of the transistor 504. A gate of the transistor 502 is connected to a wiring 510, a first terminal of the transistor 502 is connected to a wiring 509, and a second terminal of the transistor 502 is connected to the gate of the transistor 504. A gate of the transistor 503 is connected to a wiring 511, a first terminal of the transistor 503 is connected to the wiring 509, and a second terminal of the transistor 503 is connected to the gate of the transistor 504. Note that a node of the second terminal of the transistor 501, the second terminal of the transistor 502, the second terminal of the transistor 503, and the gate of the transistor 504 is denoted by N51. A first terminal of the transistor 504 is connected to the wiring 508, and a second terminal of the transistor 504 is connected to a gate of the transistor 507. A gate of the transistor 505 is connected to the wiring 510, a first terminal of the transistor 505 is connected to the wiring 509, and a second terminal of the transistor 505 is connected to the gate of the transistor 507. A gate of the transistor 506 is connected to the wiring 511, a first terminal of the transistor 506 is connected to the wiring 509, and a second terminal of the transistor 506 is connected to the gate of the transistor 507. A first terminal of the transistor 507 is connected to the wiring 509, and a second terminal of the transistor 507 is connected to a wiring 512. Note that a node of the second terminal of the transistor 504, the second terminal of the transistor 505, the second terminal of the transistor 506, and the gate of the transistor 507 is denoted by N52.

In addition, each of the transistors 501 to 507 is an N-channel transistor.

Accordingly, since the basic circuit in FIG. 5A can be formed by using only N-channel transistors, amorphous silicon can be used for a semiconductor layer of the basic circuit in FIG. 5A. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the basic circuit in FIG. 5A, the manufacturing process can also be simplified.

In addition, the power supply potential VDD is supplied to the wiring 508 and the power supply potential VSS is supplied to the wiring 509. Note that the power supply potential VDD is higher than the power supply potential VSS. Note also that a digital signal, an analog signal, or the like may be supplied to each of the wiring 508 and the wiring 509, or another power supply potential may be supplied thereto.

In addition, a signal is supplied to each of the wiring 510 and the wiring 511. Note that the signal supplied to each of the wiring 510 and the wiring 511 is a binary digital signal. When the digital signal is an H-level signal, it has the same potential as the power supply potential VDD (hereinafter also referred to as a potential VDD or an H level), and when the digital signal is an L-level signal, it has the same potential as the power supply potential VSS (hereinafter also referred to as a potential VSS or an L level). Note also that the power supply potential VDD, the power supply potential VSS, or another power supply potential may be supplied to each of the wiring 510 and the wiring 511. Alternatively, an analog signal may be supplied to each of the wiring 510 and the wiring 511.

Next, operations of the basic circuit shown in FIG. 5A are described with reference to FIG. 5B.

Figure 5B:
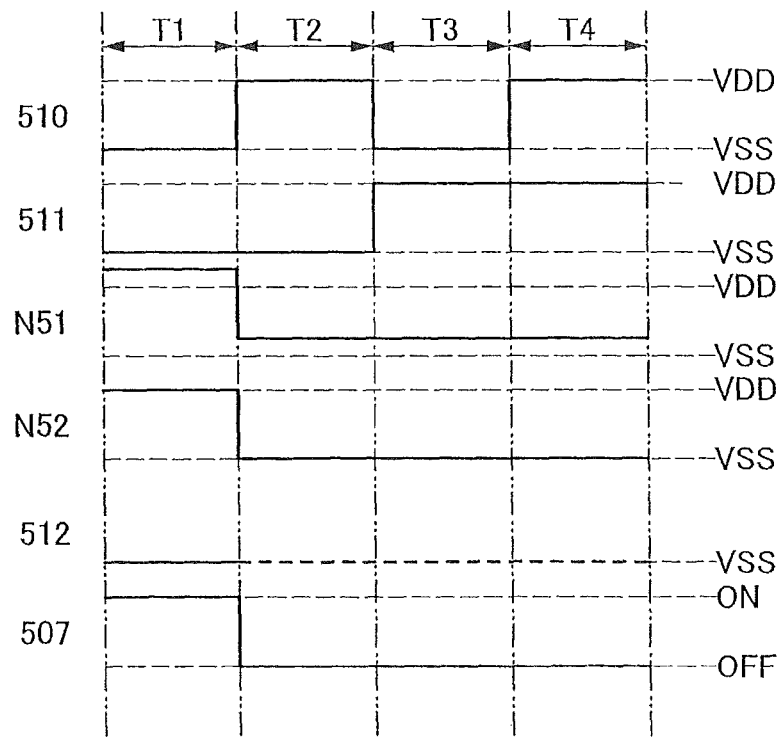

FIG. 5B is an example of a timing chart of the basic circuit shown in FIG. 5A. The timing chart in FIG. 5B shows a potential of the wiring 510, a potential of the wiring 511, a potential of the node N51, a potential of the node N52, a potential of the wiring 512, and on/off of the transistor 507.

The timing chart in FIG. 5B is described by dividing the whole period into periods T1 to T4. In addition, FIGS. 6A to 7B show operations of the basic circuit in FIG. 5A in the periods T1 to T4, respectively.

Figure 6A:
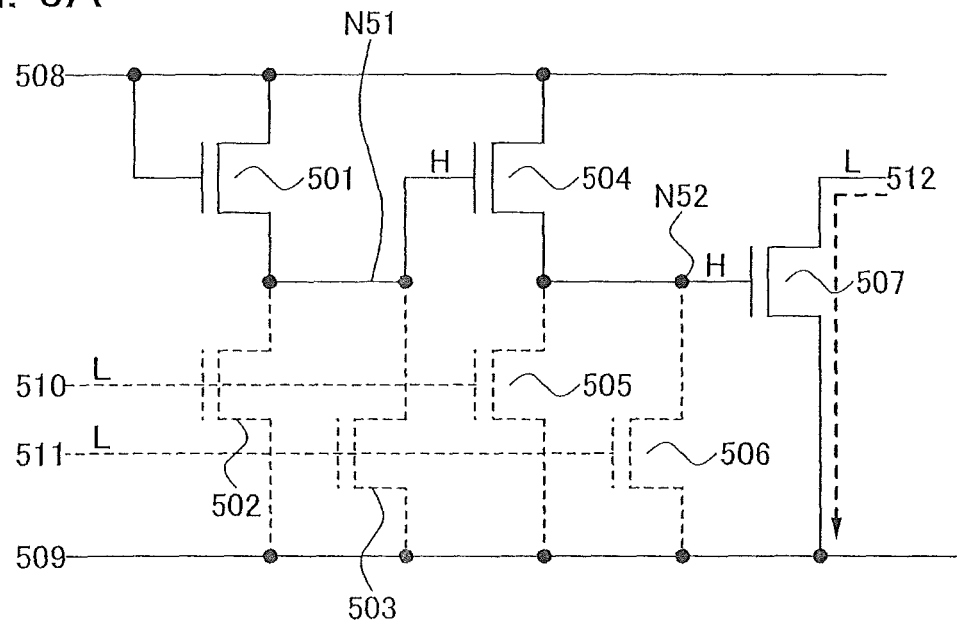
FIGS. 6A and 6B illustrate Embodiment Mode 2.

First, the operation in the period T1 is described with reference to FIG. 6A. In the period T1, an L-level signal is supplied to the wiring 510 and the transistors 502 and 505 are off. In addition, an L-level signal is supplied to the wiring 511 and the transistors 503 and 506 are off.

In addition, since the transistor 501 is diode-connected, the potential of the node N51 starts to rise. The transistor 501 is turned off when the potential of the node N51 becomes a value obtained by subtracting a threshold voltage Vth501 of the transistor 501 from the power supply potential VDD (VDD−Vth501). Therefore, the node N51 becomes a floating state.

At this time, the transistor 504 is on and the potential of the node N52 also rises. Accordingly, the potential of the node N51 which is in a floating state rises at the same time as the potential of the node N52 by parasitic capacitance between the gate (the node N51) and the second terminal (the node N52) of the transistor 504. This rise in the potential of the node N51 continues until the rise in the potential of the node N52 is terminated, and the potential of the node N51 becomes equal to or higher than the sum of the power supply potential VDD and a threshold voltage Vth504 of the transistor 504 (VDD+Vth504). That is, the rise in the potential of the node N51 continues until the potential of the node N52 becomes equal to the power supply potential VDD. The potential of the node N52 can be set equal to the power supply potential VDD by performing a so-called bootstrap operation.

Accordingly, the transistor 507 is turned on and the potential of the wiring 509 becomes equal to the power supply potential VSS. Here, by setting the potential of the node N52 to be equal to the power supply potential VDD, a potential difference between the gate and a source of the transistor 507 can be increased. Therefore, the transistor 507 can be easily turned on and the basic circuit can be operated under a wide range of operating conditions.

Figure 6B:
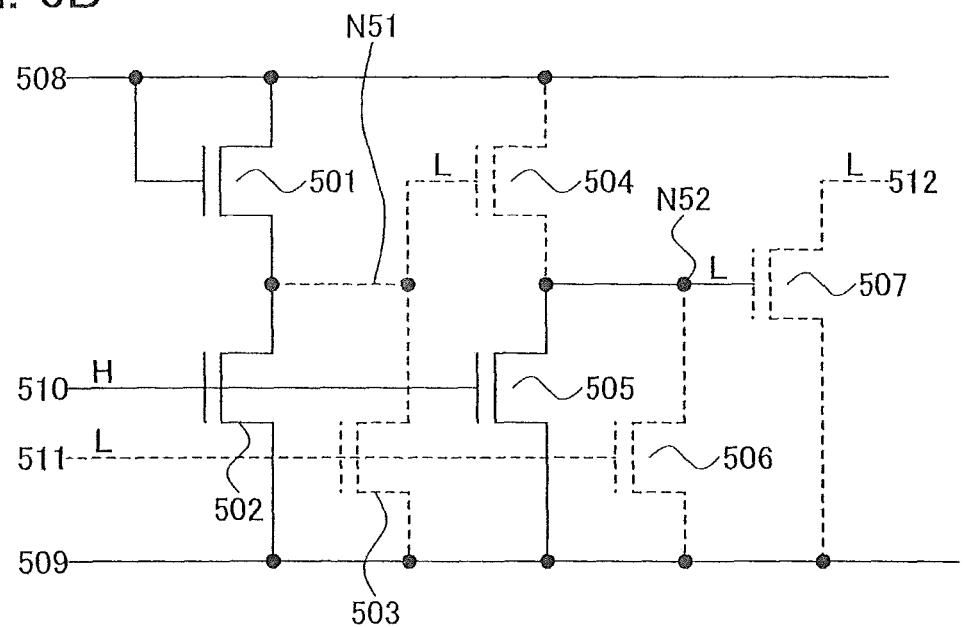

Next, the operation in the period T2 is described with reference to FIG. 6B. In the period T2, an H-level signal is supplied to the wiring 510 and the transistors 502 and 505 are on. In addition, an L-level signal is supplied to the wiring 511 and the transistors 503 and 506 are off.

In addition, the potential of the node N51 is determined by the operating point of the transistor 501 and the transistor 502. Note that when a ratio (W/L) of the transistor 502 is set sufficiently higher than a ratio (W/L) of the transistor 501, the potential of the node N51 becomes slightly higher than the power supply potential VSS.

Accordingly, since the transistor 504 is turned off and the transistor 505 is on, the potential of node N52 becomes equal to the power supply potential VSS. Therefore, the transistor 507 is turned off and the wiring 512 becomes a floating state. The potential of the wiring 512 remains equal to the power supply potential VSS because the wiring 512 is kept at the potential in the period T1.

Figure 7A:
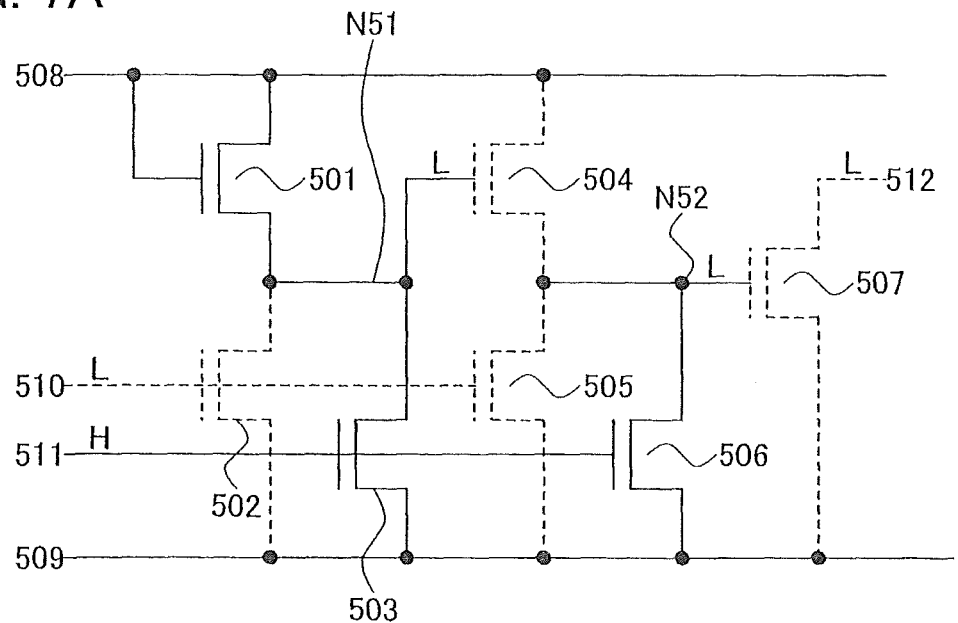
FIGS. 7A and 7B illustrate Embodiment Mode 2.

Next, the operation in the period T3 is described with reference to FIG. 7A. In the period T3, an L-level signal is supplied to the wiring 510 and the transistors 502 and 505 are off. In addition, an H-level signal is supplied to the wiring 511 and the transistors 503 and 506 are on.

In addition, the potential of the node N51 is determined by the operating point of the transistor 501 and the transistor 503. Note that when a ratio (W/L) of the transistor 503 is set sufficiently higher than a ratio (W/L) of the transistor 501, the potential of the node N51 becomes slightly higher than the power supply potential VSS.

Accordingly, since the transistor 504 is turned off and the transistor 506 is on, the potential of the node N52 becomes equal to the power supply potential VSS. Therefore, the transistor 507 is turned off and the wiring 512 becomes a floating state. The potential of the wiring 512 remains equal to the power supply potential VSS because the wiring 512 is kept at the potential in the periods T1 and T2.

Figure 7B:
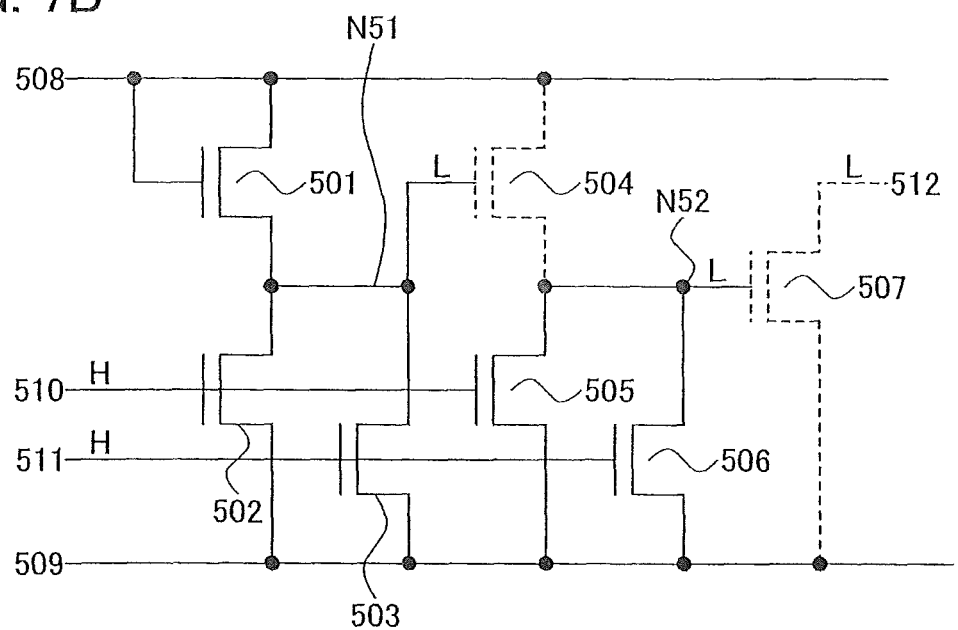

Next, the operation in the period T4 is described with reference to FIG. 7B. In the period T4, an H-level signal is supplied to the wiring 510 and the transistors 502 and 505 are on. In addition, an H-level signal is supplied to the wiring 511 and the transistors 503 and 506 are on.

In addition, since the potential of the node N51 is determined by the operating point of the transistor 501, the transistor 502, and the transistor 503, the potential of the node N51 becomes slightly higher than the power supply potential VSS.

Accordingly, since the transistor 504 is turned off and the transistors 505 and 506 are on, the potential of the node N52 becomes equal to the power supply potential VSS. Therefore, the transistor 507 is turned off and the wiring 512 becomes a floating state. The potential of the wiring 512 remains equal to the power supply potential VSS because the wiring 512 is kept at the potential in the periods T1 to T3.

By the above-described operations, the basic circuit in FIG. 5A supplies the power supply potential VSS to the wiring 512 in the period T1, so that the potential of the wiring 512 becomes equal to the power supply potential VSS. In the periods T2 to T4, the basic circuit in FIG. 5A makes the wiring 512 into a floating state, so that the potential of the wiring 512 is kept equal to the power supply potential VSS.

Note that the potential of the node N52 of the basic circuit in FIG. 5A can be set equal to the power supply potential VDD in the period T1. Therefore, the basic circuit in FIG. 5A can be operated under a wide range of operating conditions.

In addition, the basic circuit in FIG. 5A does not include a transistor which is on in all of the periods T1 to T4. That is, the basic circuit in FIG. 5A does not include a transistor which is always or almost always on. Accordingly, the basic circuit in FIG. 5A can suppress characteristic deterioration of a transistor and a threshold voltage shift due to the characteristic deterioration.

Further, the characteristics of a transistor which is formed of amorphous silicon easily deteriorate. Therefore, when the transistor included in the basic circuit in FIG. 5A is formed using amorphous silicon, not only can the advantages such as a reduction in manufacturing cost and improvement in a yield be obtained, but also the problem of the characteristic deterioration of the transistor can be solved.

Here, the functions of the transistors 501 to 507 are described. The transistor 501 has a function of a diode in which the first terminal and the gate correspond to an input terminal and the second terminal corresponds to an output terminal. The transistor 502 has a function of a switch which selects whether to connect the wiring 509 and the node N51 in accordance with the potential of the wiring 510. The transistor 503 has a function of a switch which selects whether to connect the wiring 509 and the node N51 in accordance with the potential of the wiring 511. The transistor 504 has a function of a switch which selects whether to connect the wiring 508 and the node N52 in accordance with the potential of the node N51. The transistor 505 has a function of a switch which selects whether to connect the wiring 509 and the node N52 in accordance with the potential of the wiring 510. The transistor 506 has a function of a switch which selects whether to connect the wiring 509 and the node N52 in accordance with the potential of the wiring 511. The transistor 507 has a function of a switch which selects whether to connect the wiring 509 and the wiring 512 in accordance with the potential of the node N52.

Note that a two-input NOR circuit in which the wirings 510 and 511 correspond to an input terminal and the node N52 corresponds to an output terminal is constructed from the transistors 501 to 506.

Figure 8A:
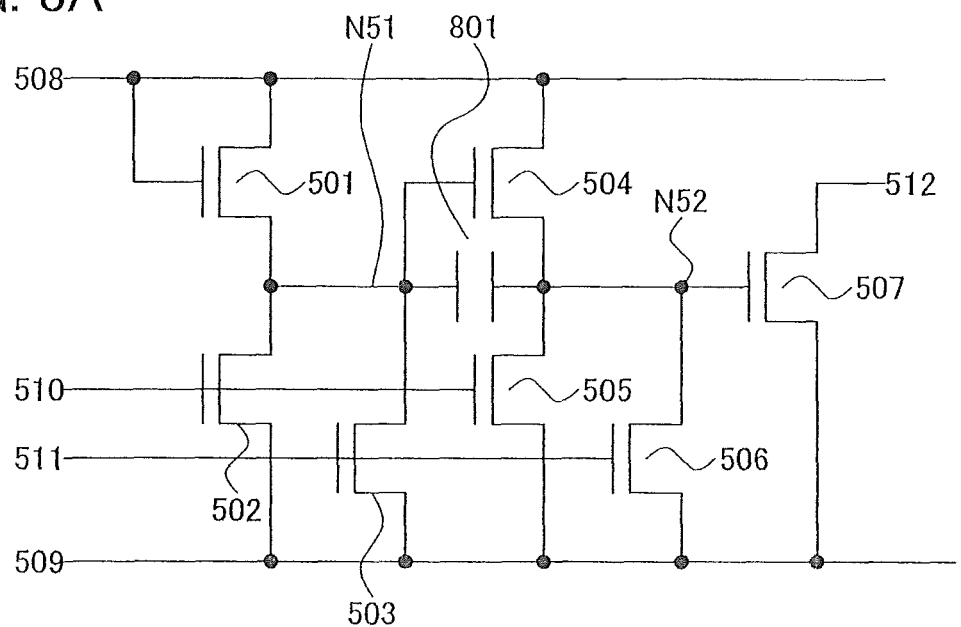
FIGS. 8A and 8B illustrate Embodiment Mode 2.

Note that as shown in FIG. 8A, a capacitor 801 may be provided between the gate (the node N51) and the second terminal (the node N52) of the transistor 504. This is because the potential of the node N51 and the potential of the node N52 are raised by the bootstrap operation, so that the basic circuit can easily perform the bootstrap operation by proving the capacitor 801.

Figure 8B:
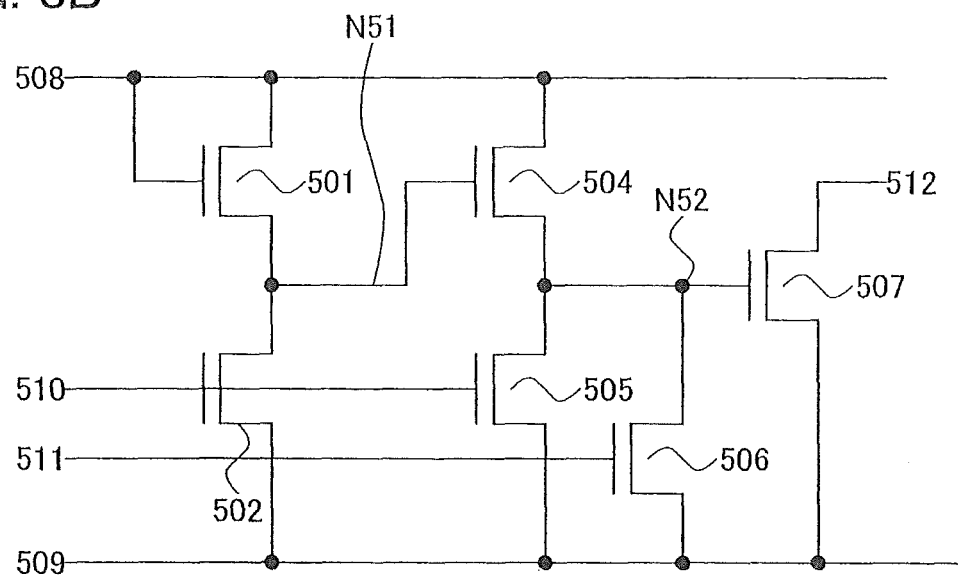

Note also that as shown in FIG. 8B, the transistor 503 is not necessarily provided. This is because when an H-level signal is supplied to the wiring 510, it is only necessary that the potential of the node N52 be decreased to turn off the transistor 507.

Figure 17A:
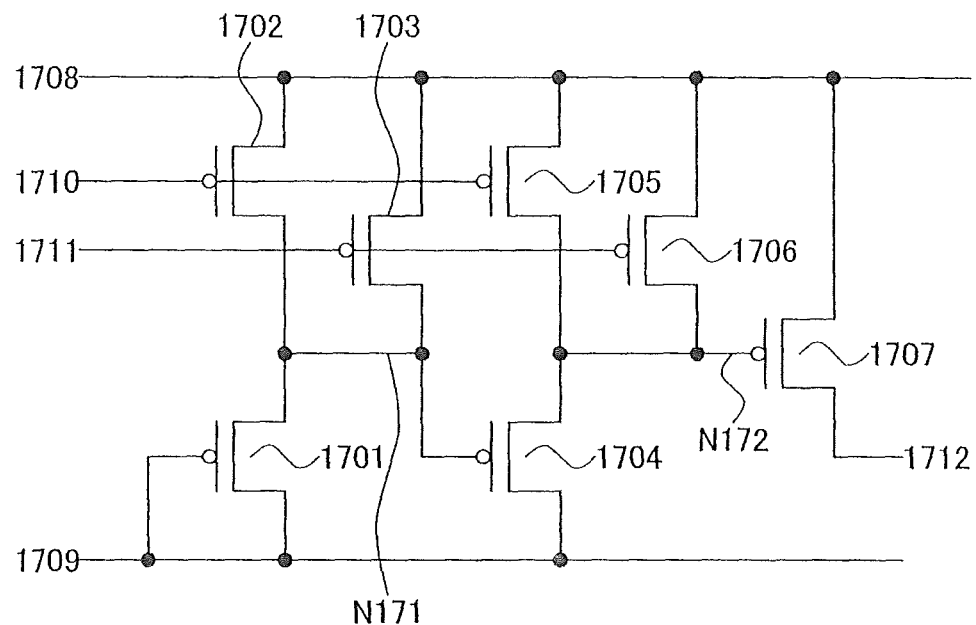
FIGS. 17A and 17B illustrate Embodiment Mode 2.

Next, the case is described in which the basic circuit shown in FIG. 5A is constructed from P-channel transistors, with reference to FIG. 17A.

FIG. 17A shows a basic circuit which is based on the basic principle of the invention. The basic circuit in FIG. 17A includes a transistor 1701, a transistor 1702, a transistor 1703, a transistor 1704, a transistor 1705, a transistor 1706, and a transistor 1707.

Connection relations of the basic circuit in FIG. 17A are described. A gate of the transistor 1701 is connected to a wiring 1709, a first terminal of the transistor 1701 is connected to the wiring 1709, and a second terminal of the transistor 1701 is connected to a gate of the transistor 1704. A gate of the transistor 1702 is connected to a wiring 1710, a first terminal of the transistor 1702 is connected to a wiring 1708, and a second terminal of the transistor 1702 is connected to the gate of the transistor 1704. A gate of the transistor 1703 is connected to a wiring 1711, a first terminal of the transistor 1703 is connected to the wiring 1708, and a second terminal of the transistor 1703 is connected to the gate of the transistor 1704. Note that a node of the second terminal of the transistor 1701, the second terminal of the transistor 1702, the second terminal of the transistor 1703, and the gate of the transistor 1704 is denoted by N171. A first terminal of the transistor 1704 is connected to the wiring 1709, and a second terminal of the transistor 1704 is connected to a gate of the transistor 1707. A gate of the transistor 1705 is connected to the wiring 1710, a first terminal of the transistor 1705 is connected to the wiring 1708, and a second terminal of the transistor 1705 is connected to the gate of the transistor 1707. A gate of the transistor 1706 is connected to the wiring 1711, a first terminal of the transistor 1706 is connected to the wiring 1708, and a second terminal of the transistor 1706 is connected to the gate of the transistor 1707. A first terminal of the transistor 1707 is connected to the wiring 1708, and a second terminal of the transistor 1707 is connected to a wiring 1712. Note that a node of the second terminal of the transistor 1704, the second terminal of the transistor 1705, the second terminal of the transistor 1706, and the gate of the transistor 1707 is denoted by N172.

In addition, each of the transistors 1701 to 1707 is a P-channel transistor.

Accordingly, since the basic circuit in FIG. 17A can be formed by using only P-channel transistors, a step of forming N-channel transistors is not necessary. Thus, in the basic circuit in FIG. 17A, a manufacturing process can be simplified, so that manufacturing cost can be reduced and a yield can be improved.

In addition, the power supply potential VDD is supplied to the wiring 1708 and the power supply potential VSS is supplied to the wiring 1709. Note that the power supply potential VDD is higher than the power supply potential VSS. Note also that a digital signal, an analog signal, or the like may be supplied to each of the wiring 1708 and the wiring 1709, or another power supply potential may be supplied thereto.

In addition, a signal is supplied to each of the wiring 1710 and the wiring 1711. Note that the signal supplied to each of the wiring 1710 and the wiring 1711 is a binary digital signal. Note also that the power supply potential VDD, the power supply potential VSS, or another power supply potential may be supplied to each of the wiring 1710 and the wiring 1711. Alternatively, an analog signal may be supplied to each of the wiring 1710 and the wiring 1711.

Next, operations of the basic circuit shown in FIG. 17A are described with reference to FIG. 17B.

Figure 17B:
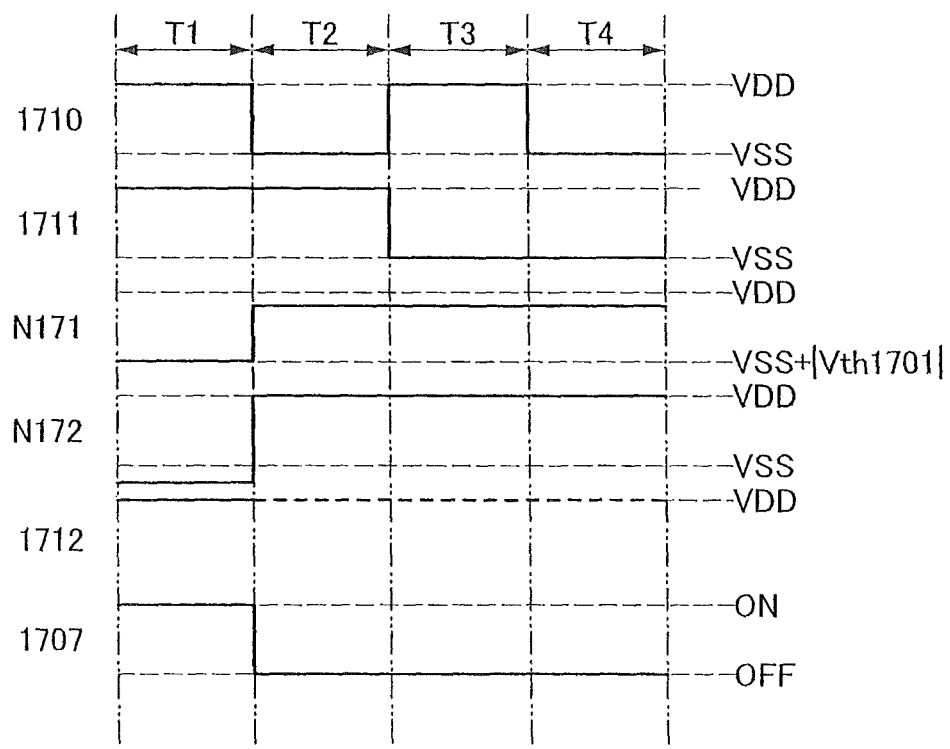

FIG. 17B is an example of a timing chart of the basic circuit shown in FIG. 17A. The timing chart in FIG. 17B shows a potential of the wiring 1710, a potential of the wiring 1711, a potential of the node N171, a potential of the node N172, a potential of the wiring 1712, and on/off of the transistor 1707.

The timing chart in FIG. 17B is described by dividing the whole period into periods T1 to T4. In addition, FIGS. 18A to 19B show operations of the basic circuit in FIG. 17A in the periods T1 to T4, respectively.

Figure 18A:
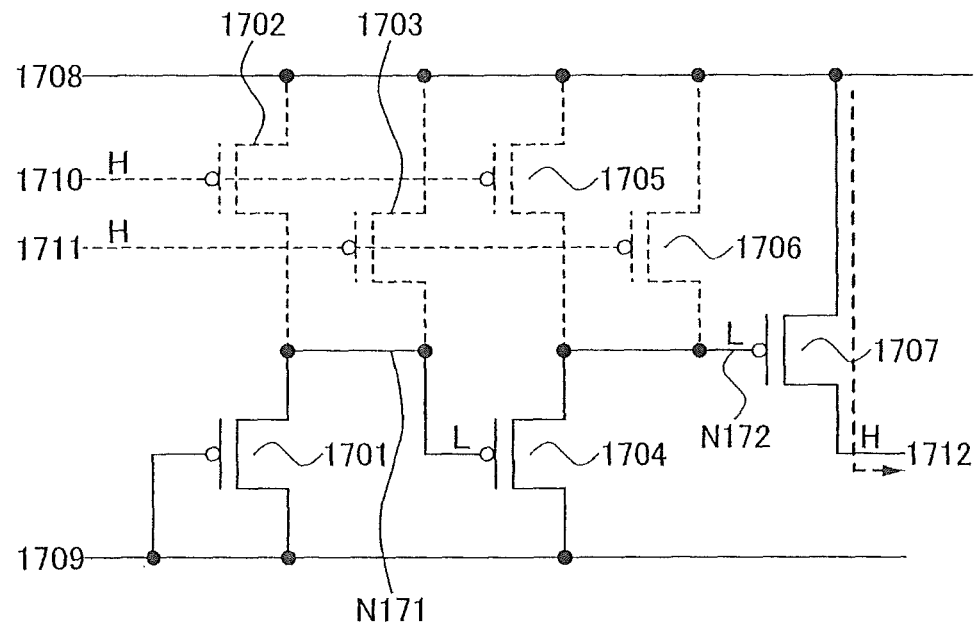
FIGS. 18A and 18B illustrate Embodiment Mode 2.

First, the operation in the period T1 is described with reference to FIG. 18A. In the period T1, an H-level signal is supplied to the wiring 1710 and the transistors 1702 and 1705 are off. In addition, an H-level signal is supplied to the wiring 1711 and the transistors 1703 and 1706 are off.

In addition, since the transistor 1701 is diode-connected, the potential of the node N171 starts to decrease. The transistor 1701 is turned off when the potential of the node N171 becomes the sum of the power supply potential VSS and the absolute value of a threshold voltage Vth1701 of the transistor 1701 (VSS+|Vth1701|). Therefore, the node N171 becomes a floating state.

At this time, the transistor 1704 is on and the potential of the node N172 also decreases. Accordingly, the potential of the node N171 which is in a floating state decreases at the same time as the potential of the node N172 by parasitic capacitance between the gate (the node N171) and the second terminal (the node N172) of the transistor 1704. This decrease in the potential of the node N171 continues until the decrease in the potential of the node N172 is terminated, and the potential of the node N171 becomes equal to or lower than a value obtained by subtracting the absolute value of a threshold voltage Vth1704 of the transistor 1704 from the power supply potential VSS (VSS−|Vth1704|). That is, the decrease in the potential of the node N171 continues until the potential of the node N172 becomes equal to the power supply potential VSS. The potential of the node N172 can be set equal to the power supply potential VSS by performing a so-called bootstrap operation.

Accordingly, the transistor 1707 is turned on and the potential of the wiring 1712 becomes equal to the power supply potential VSS. Here, by setting the potential of the node N172 to be equal to the power supply potential VSS, a potential difference between the gate and a source of the transistor 1707 can be increased. Therefore, the transistor 1707 can be easily turned on and the basic circuit can be operated under a wide range of operating conditions.

Figure 18B:
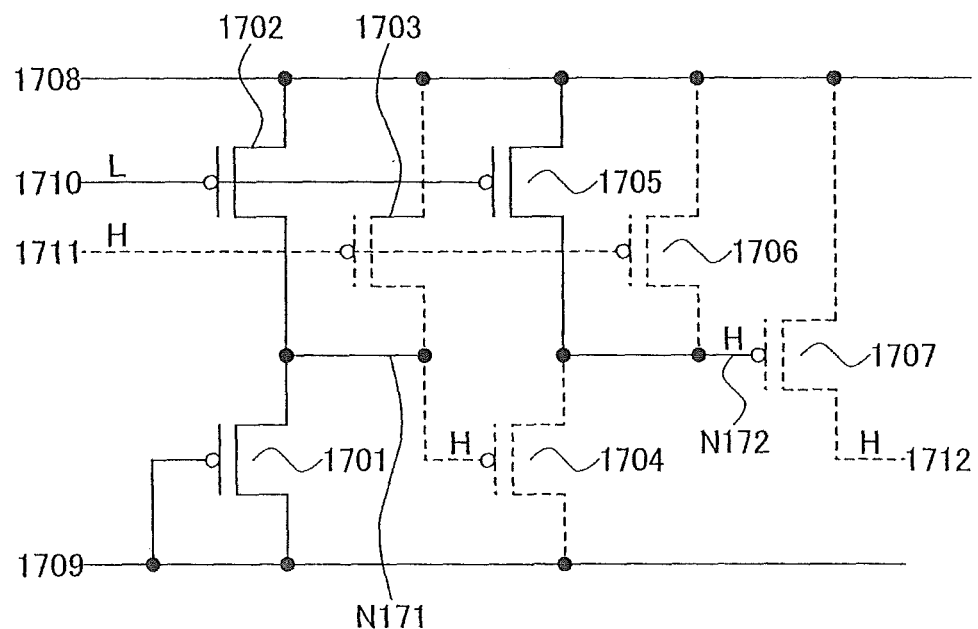

Next, the operation in the period T2 is described with reference to FIG. 18B. In the period T2, an L-level signal is supplied to the wiring 1710 and the transistors 1702 and 1705 are on. In addition, an H-level signal is supplied to the wiring 1711 and the transistors 1703 and 1706 are off.

In addition, the potential of the node N171 is determined by the operating point of the transistor 1701 and the transistor 1702. Note that when a ratio (W/L) of the transistor 1702 is set sufficiently higher than a ratio (W/L) of the transistor 1701, the potential of the node N171 becomes slightly lower than the power supply potential VDD.

Accordingly, since the transistor 1704 is turned off and the transistor 1705 is on, the potential of the node N172 becomes equal to the power supply potential VDD. Therefore, the transistor 1707 is turned off and the wiring 1712 becomes a floating state. The potential of the wiring 1712 remains equal to the power supply potential VDD because the wiring 1712 is kept at the potential in the period T1.

Figure 19A:
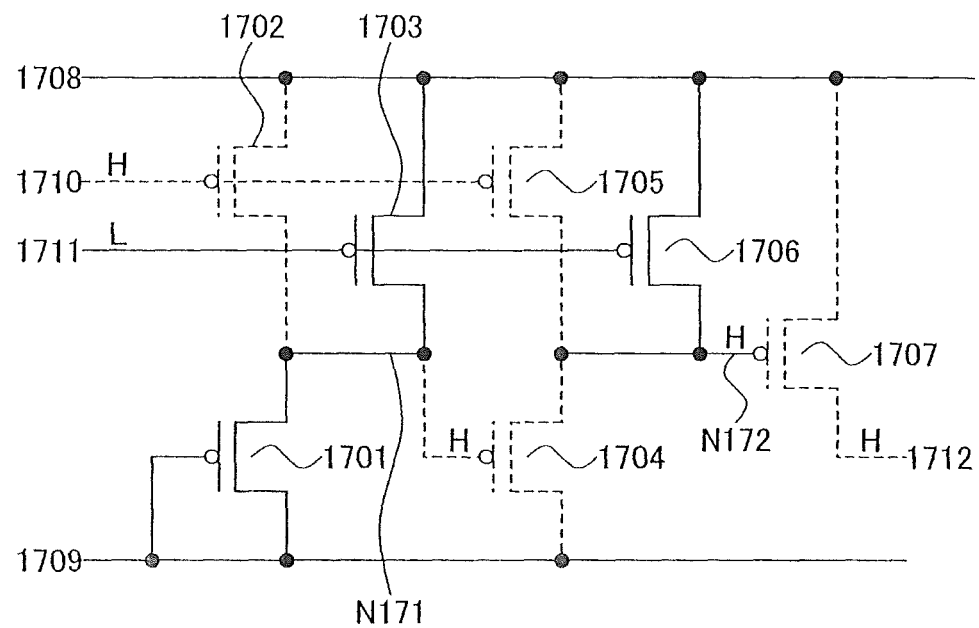
FIGS. 19A and 19B illustrate Embodiment Mode 2.

Next, the operation in the period T3 is described with reference to FIG. 19A. In the period T3, an H-level signal is supplied to the wiring 1710 and the transistors 1702 and 1705 are off. In addition, an L-level signal is supplied to the wiring 1711 and the transistors 1703 and 1706 are on.

In addition, the potential of the node N171 is determined by the operating point of the transistor 1701 and the transistor 1703. Note that when a ratio (W/L) of the transistor 1703 is set sufficiently higher than a ratio (W/L) of the transistor 1701, the potential of the node N171 becomes slightly lower than the power supply potential VDD.

Accordingly, since the transistor 1704 is turned off and the transistor 1706 is on, the potential of the node N172 becomes equal to the power supply potential VDD. Therefore, the transistor 1707 is turned off and the wiring 1712 becomes a floating state. The potential of the wiring 1712 remains equal to the power supply potential VDD because the wiring 1712 is kept at the potential in the periods T1 and T2.

Figure 19B:
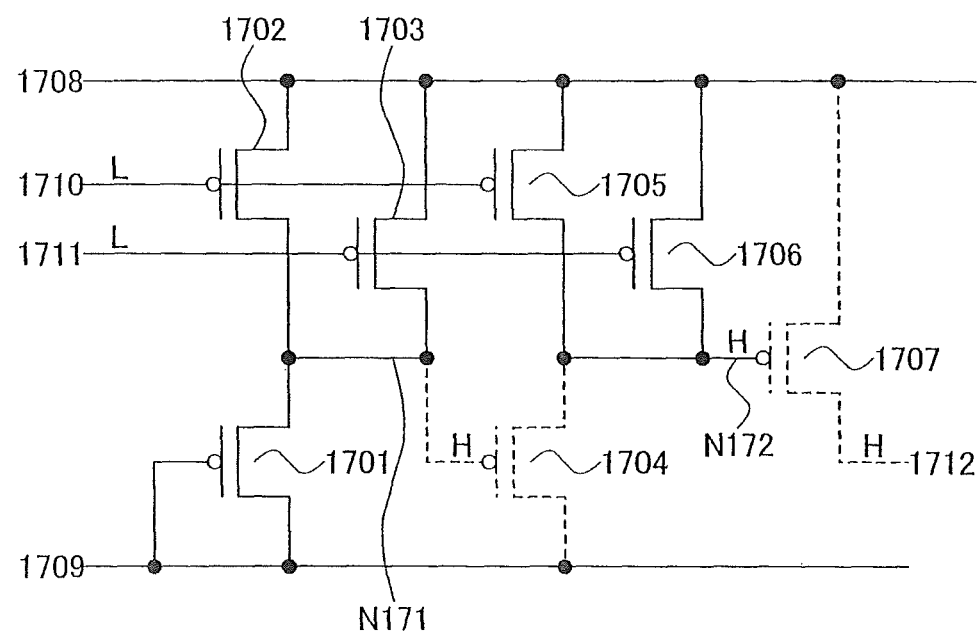

Next, the operation in the period T4 is described with reference to FIG. 19B. In the period T4, an L-level signal is supplied to the wiring 1710 and the transistors 1702 and 1705 are on. In addition, an L-level signal is supplied to the wiring 1711 and the transistors 1703 and 1706 are on.

In addition, since the potential of the node N171 is determined by the operating point of the transistor 1701, the transistor 1702, and the transistor 1703, the potential of the node N171 becomes slightly lower than the power supply potential VDD.

Accordingly, since the transistor 1704 is turned off and the transistors 1705 and 1706 are on, the potential of the node N172 becomes equal to the power supply potential VDD. Therefore, the transistor 1707 is turned off and the wiring 1712 becomes a floating state. The potential of the wiring 1712 remains equal to the power supply potential VDD because the wiring 1712 is kept at the potential in the periods T1 to T3.

By the above-described operations, the basic circuit in FIG. 17A supplies the power supply potential VDD to the wiring 1712 in the period T1, so that the potential of the wiring 1712 becomes equal to the power supply potential VDD. In the periods T2 to T4, the basic circuit in FIG. 17A makes the wiring 1712 into a floating state, so that the potential of the wiring 1712 is kept equal to the power supply potential VDD.

Note that the potential of the node N172 of the basic circuit in FIG. 17A can be set equal to the power supply potential VSS in the period T1. Therefore, the basic circuit in FIG. 17A can be operated under a wide range of operating conditions.

In addition, the basic circuit in FIG. 17A does not include a transistor which is on in all of the periods T1 to T4. That is, the basic circuit in FIG. 17A does not include a transistor which is always or almost always on. Accordingly, the basic circuit in FIG. 17A can suppress characteristic deterioration of a transistor and a threshold voltage shift due to the characteristic deterioration.

Note that the transistors 1701 to 1707 have functions which are similar to those of the transistors 501 to 507.

Note that a two-input NAND circuit in which the wirings 1710 and 1711 correspond to an input terminal and the node N172 corresponds to an output terminal is constructed from the transistors 1701 to 1706.

Figure 20A:
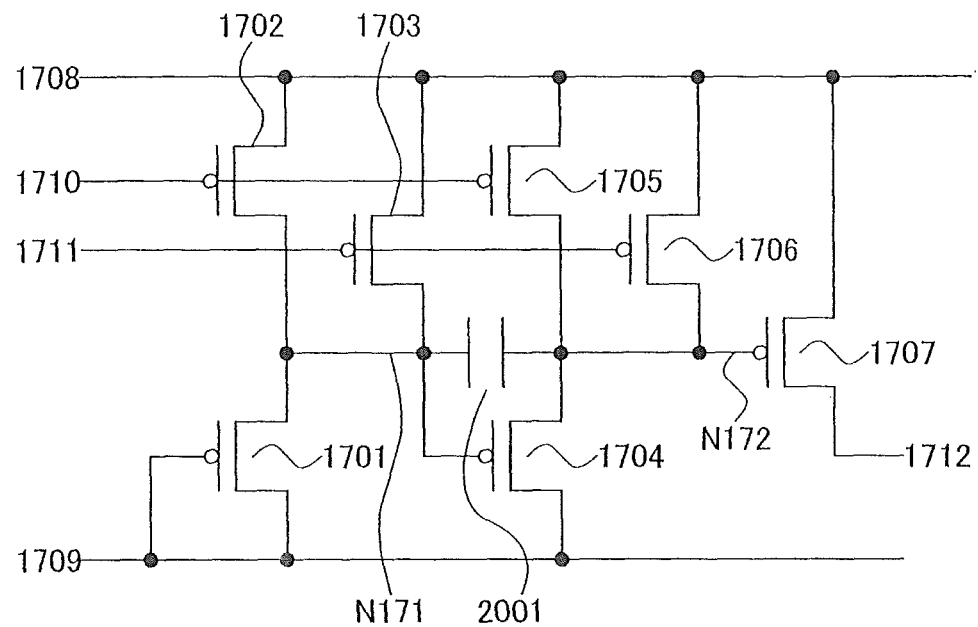
FIGS. 20A and 20B illustrate Embodiment Mode 2.

Note that as shown in FIG. 20A, a capacitor 2001 may be provided between the gate (the node N171) and the second terminal (the node N172) of the transistor 1704. This is because the potential of the node N171 and the potential of the node N172 are raised by the bootstrap operation, so that the basic circuit can easily perform the bootstrap operation by proving the capacitor 2001.

Figure 20B:
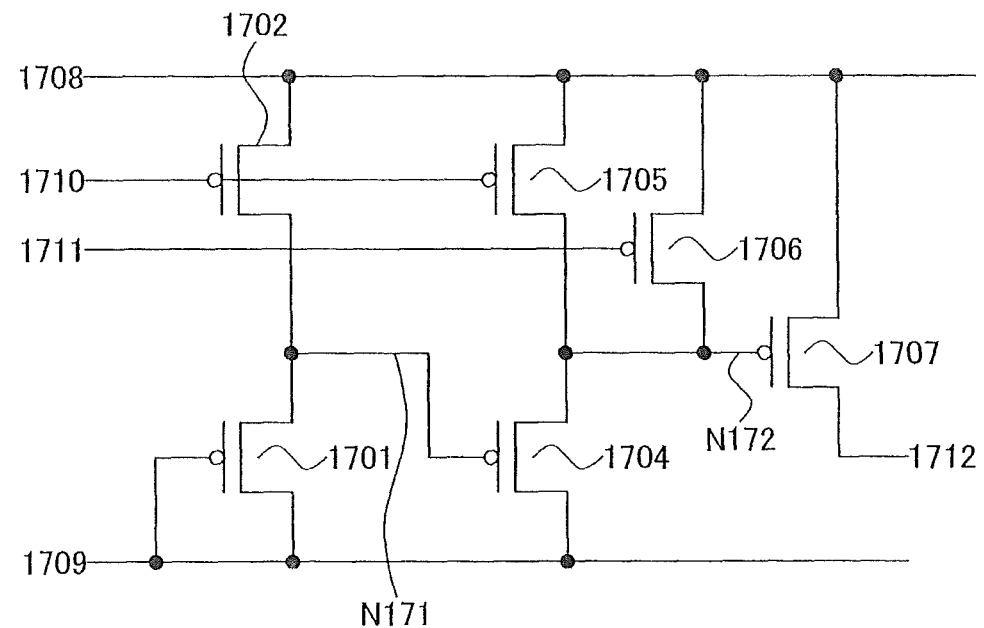

Note also that as shown in FIG. 20B, the transistor 1703 is not necessarily provided. This is because when an L-level signal is supplied to the wiring 1710, it is only necessary that the potential of the node N172 be raised to turn off the transistor 1707.

Note that this embodiment mode can be freely combined with any description in other embodiment modes in this specification. Further, parts of the description in this embodiment mode can be combined with one another.

Embodiment Mode 3

In this embodiment mode, a basic principle of the invention which is different from those of Embodiment Modes 1 and 2 is described with reference to FIG. 9A.

Figure 9A:
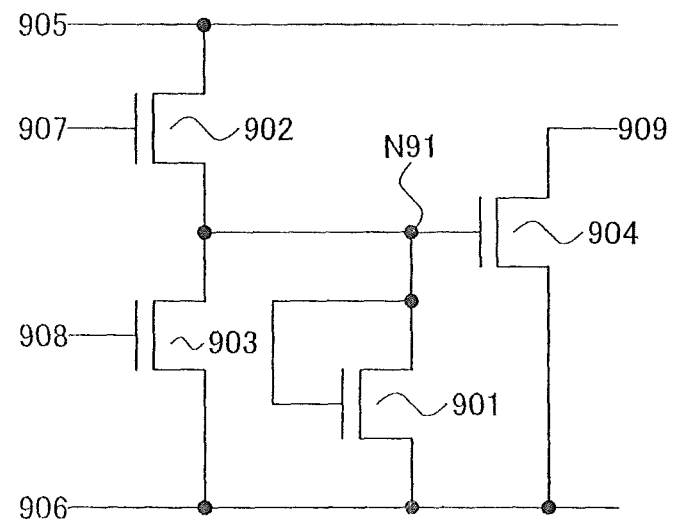
FIGS. 9A and 9B illustrate Embodiment Mode 3.

FIG. 9A shows a basic circuit which is based on the basic principle of the invention. The basic circuit in FIG. 9A includes a transistor 901, a transistor 902, a transistor 903, and a transistor 904.

Connection relations of the basic circuit in FIG. 9A are described. A gate of the transistor 901 is connected to a gate of the transistor 904, a first terminal of the transistor 901 is connected to a wiring 906, and a second terminal of the transistor 901 is connected to the gate of the transistor 904. A gate of the transistor 902 is connected to a wiring 907, a first terminal of the transistor 902 is connected to a wiring 905, and a second terminal of the transistor 902 is connected to the gate of the transistor 904. A gate of the transistor 903 is connected to a wiring 908, a first terminal of the transistor 903 is connected to the wiring 906, and a second terminal of the transistor 903 is connected to the gate of the transistor 904. A first terminal of the transistor 904 is connected to the wiring 906, and a second terminal of the transistor 904 is connected to a wiring 909. Note that a node of the second terminal of the transistor 901, the gate of the transistor 901, the second terminal of the transistor 902, the second terminal of the transistor 903, and the gate of the transistor 904 is denoted by N91.

In addition, each of the transistors 901 to 904 is an N-channel transistor.

Accordingly, since the basic circuit in FIG. 9A can be formed by using only N-channel transistors, amorphous silicon can be used for a semiconductor layer of the basic circuit in FIG. 9A. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the basic circuit in FIG. 9A, the manufacturing process can also be simplified.

In addition, the power supply potential VDD is supplied to the wiring 905 and the power supply potential VSS is supplied to the wiring 906. Note that the power supply potential VDD is higher than the power supply potential VSS. Note also that a digital signal, an analog signal, or the like may be supplied to each of the wiring 905 and the wiring 906, or another power supply potential may be supplied thereto.

In addition, a signal is supplied to each of the wiring 907 and the wiring 908. Note that the signal supplied to each of the wiring 907 and the wiring 908 is a binary digital signal. Note also that the power supply potential VDD, the power supply potential VSS, or another power supply potential may be supplied to each of the wiring 907 and the wiring 908. Alternatively, an analog signal may be supplied to each of the wiring 907 and the wiring 908.

Next, operations of the basic circuit shown in FIG. 9A are described with reference to FIG. 9B.

Figure 9B:
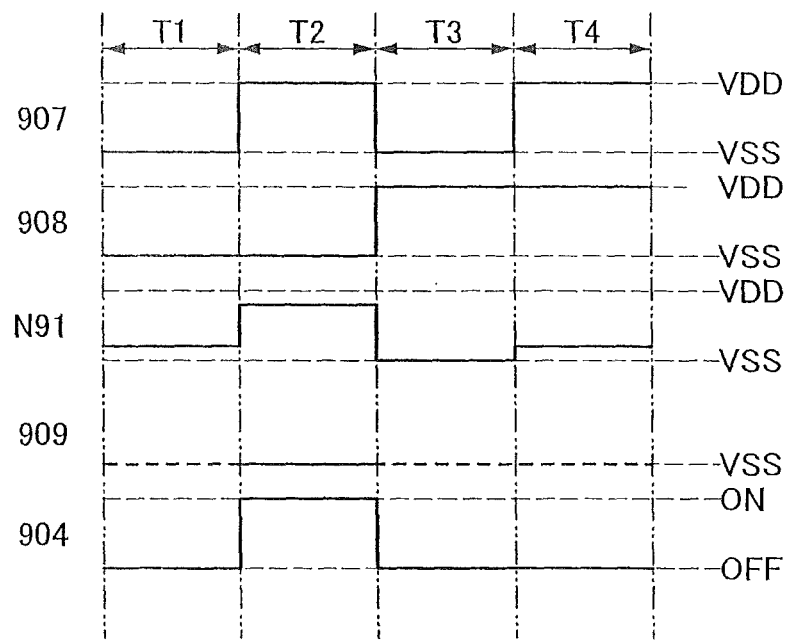

FIG. 9B is an example of a timing chart of the basic circuit shown in FIG. 9A. The timing chart in FIG. 9B shows a potential of the wiring 907, a potential of the wiring 908, a potential of the node N91, a potential of the wiring 909, and on/off of the transistor 904.

The timing chart in FIG. 9B is described by dividing the whole period into periods T1 to T4. In addition, FIGS. 10A to 11B show operations of the basic circuit in FIG. 9A in the periods T1 to T4, respectively.

Figure 10A:
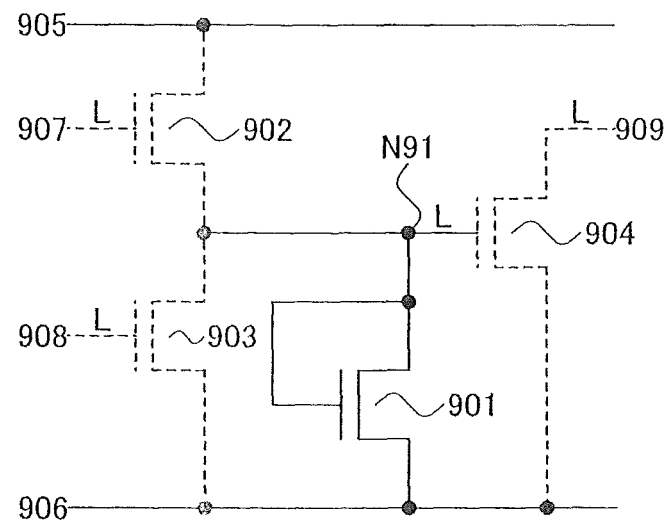
FIGS. 10A and 10B illustrate Embodiment Mode 3.

First, the operation in the period T1 is described with reference to FIG. 10A. In the period T1, an L-level signal is supplied to the wiring 907 and an L-level signal is supplied to the wiring 908. Accordingly, the transistor 902 is turned off and the transistor 903 is off.

In addition, since the transistor 901 is diode-connected, the potential of the node N91 starts to decrease. This decrease in the potential of the node N91 continues until the transistor 901 is turned off. The transistor 901 is turned off when the potential of the node N91 becomes the sum of the power supply potential VSS and the absolute value of a threshold voltage Vth901 of the transistor 901 (VSS+|Vth901|). Therefore, the potential of the node N91 becomes VSS+|Vth901|.

Accordingly, the transistor 904 is turned off, and the potential of the wiring 909 remains equal to the power supply potential VSS because the wiring 909 is kept at a potential in the period T2. Note that the operation in the period T2 is described next.

Figure 10B:
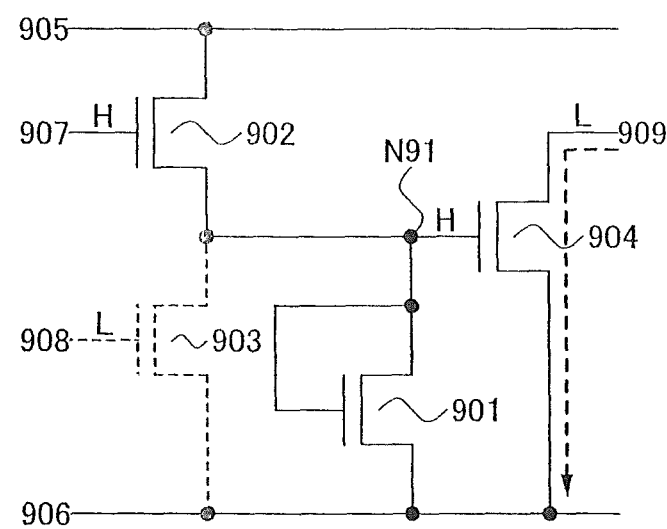

Next, the operation in the period T2 is described with reference to FIG. 10B. In the period T2, an H-level signal is supplied to the wiring 907 and an L-level signal is supplied to the wiring 908. Accordingly, the transistor 902 is turned on and the transistor 903 is off.

In addition, the potential of the node N91 is determined by the operating point of the transistor 901 and the transistor 902. Note that when a ratio (W/L) of the transistor 902 is set sufficiently higher than a ratio (W/L) of the transistor 901, the potential of the node N91 becomes slightly lower than the power supply potential VDD.

Accordingly, the transistor 904 is turned on and the potential of the wiring 909 becomes equal to the power supply potential VSS.

Figure 11A:
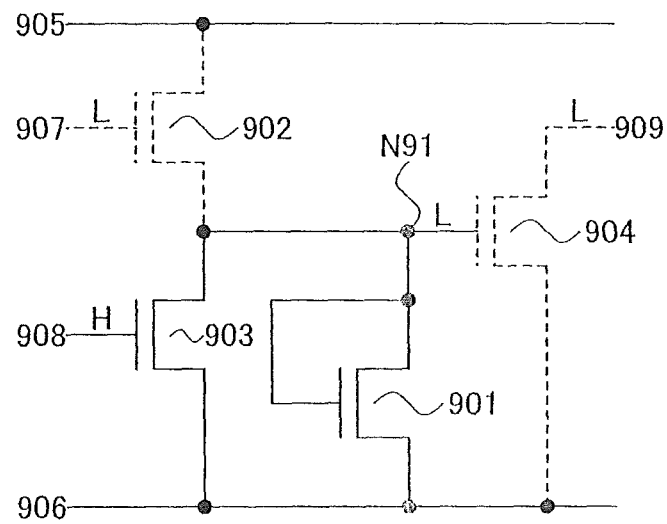
FIGS. 11A and 11B illustrate Embodiment Mode 3.

Next, the operation in the period T3 is described with reference to FIG. 11A. In the period T3, an L-level signal is supplied to the wiring 907 and an H-level signal is supplied to the wiring 908. Accordingly, the transistor 902 is turned off and the transistor 903 is on.

Accordingly, the potential of the node N91 becomes equal to the power supply potential VSS because the transistor 904 is off.

Accordingly, the transistor 904 is turned off and the wiring 909 becomes a floating state. The potential of the wiring 909 remains equal to the power supply potential VSS because the wiring 909 is kept at the potential in the periods T1 and T2.

Figure 11B:
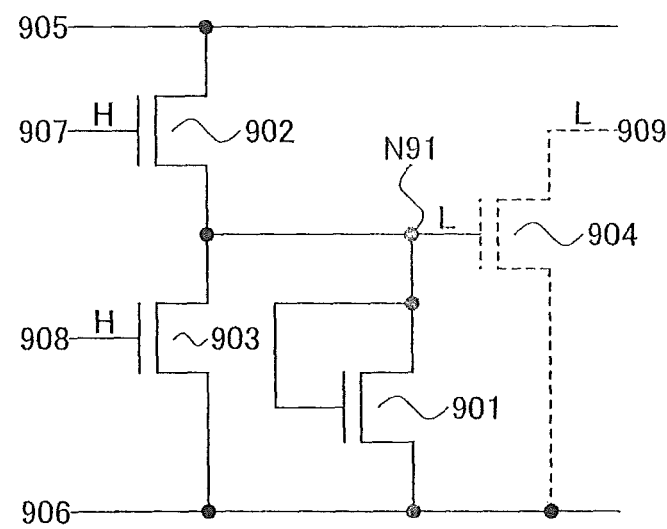

Next, the operation in the period T4 is described with reference to FIG. 11B. In the period T4, an H-level signal is supplied to the wiring 907 and an H-level signal is supplied to the wiring 908. Accordingly, the transistor 902 is turned on and the transistor 904 is on.

In addition, since the potential of the node N91 is determined by the operating point of the transistor 901, the transistor 902, and the transistor 903, the potential of the node N91 becomes slightly higher than the power supply potential VSS.

Accordingly, the transistor 904 is turned off and the wiring 909 becomes a floating state. The potential of the wiring 909 remains equal to the power supply potential VSS because the wiring 909 is kept at the potential in the periods T1 to T3.

By the above-described operations, the basic circuit in FIG. 9A supplies the power supply potential VSS to the wiring 909 in the period T2, so that the potential of the wiring 909 becomes equal to the power supply potential VSS. In the periods T1, T3, and T4, the basic circuit in FIG. 9A makes the wiring 909 into a floating state, so that the potential of the wiring 909 is kept equal to the power supply potential VSS.

In addition, the basic circuit in FIG. 9A does not include a transistor which is on in all of the periods T1 to T4. That is, the basic circuit in FIG. 9A does not include a transistor which is always or almost always on. Accordingly, the basic circuit in FIG. 9A can suppress characteristic deterioration of a transistor and a threshold voltage shift due to the characteristic deterioration.

Further, the characteristics of a transistor which is formed of amorphous silicon easily deteriorate. Therefore, when the transistor included in the basic circuit in FIG. 9A is formed using amorphous silicon, not only can the advantages such as a reduction in manufacturing cost and improvement in a yield be obtained, but also the problem of the characteristic deterioration of the transistor can be solved.

Here, the functions of the transistors 901 to 904 are described. The transistor 901 has a function of a diode in which the second terminal and the gate correspond to an input terminal and the first terminal corresponds to an output terminal. The transistor 902 has a function of a switch which selects whether to connect the wiring 905 and the node N91 in accordance with the potential of the wiring 907. The transistor 903 has a function of a switch which selects whether to connect the wiring 906 and the node N91 in accordance with the potential of the wiring 908. The transistor 904 has a function of a switch which selects whether to connect the wiring 906 and the wiring 909 in accordance with the potential of the node N91.

Note that a two-input logic circuit in which the wirings 907 and 908 correspond to an input terminal and the node N91 corresponds to an output terminal is constructed from the transistors 901 to 904.

Figure 12A:
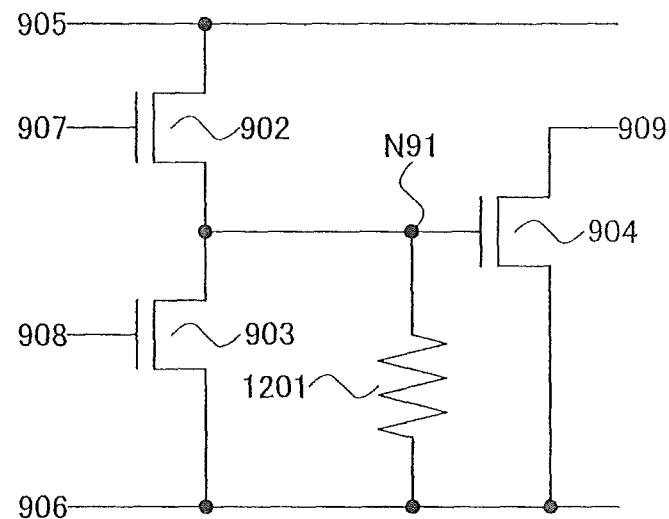
FIGS. 12A and 12B illustrate Embodiment Mode 3.
Figure 12B:
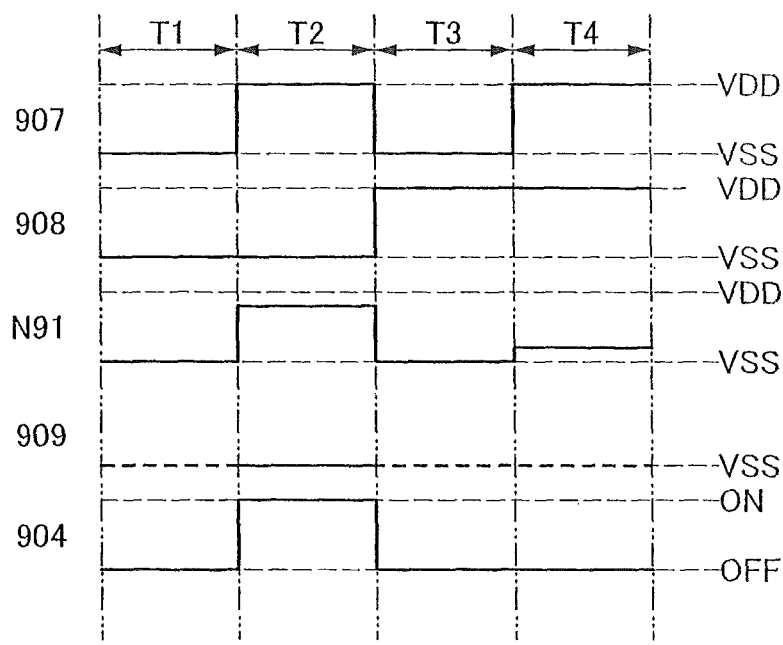

Note that the transistor 901 may be any element as long as it has a resistance component. For example, as shown in FIG. 12A, a resistor 1201 can be used instead of the transistor 901. In addition, a timing chart in FIG. 12A is shown in FIG. 12B.

Figure 21A:
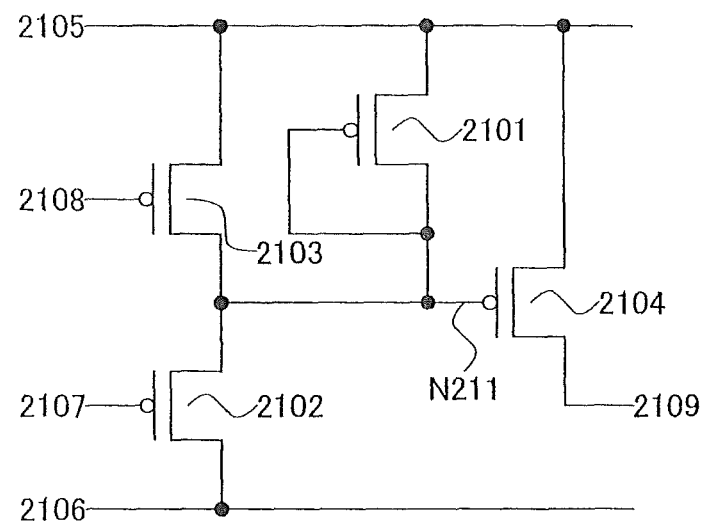
FIGS. 21A and 21B illustrate Embodiment Mode 3.

Next, the case is described in which the basic circuit shown in FIG. 9A is constructed from P-channel transistors, with reference to FIG. 21A.

FIG. 21A shows a basic circuit which is based on the basic principle of the invention. The basic circuit in FIG. 21A includes a transistor 2101, a transistor 2102, a transistor 2103, and a transistor 2104.

Connection relations of the basic circuit in FIG. 21A are described. A gate of the transistor 2101 is connected to a gate of the transistor 2104, a first terminal of the transistor 2101 is connected to a wiring 2105, and a second terminal of the transistor 2101 is connected to the gate of the transistor 2104. A gate of the transistor 2102 is connected to a wiring 2107, a first terminal of the transistor 2102 is connected to a wiring 2106, and a second terminal of the transistor 2102 is connected to the gate of the transistor 2104. A gate of the transistor 2103 is connected to a wiring 2108, a first terminal of the transistor 2103 is connected to the wiring 2105, and a second terminal of the transistor 2103 is connected to the gate of the transistor 2104. A first terminal of the transistor 2104 is connected to a wiring 2105, and a second terminal of the transistor 2104 is connected to a wiring 2109. Note that a node of the gate of the transistor 2101, the second terminal of the transistor 2101, the second terminal of the transistor 2102, the second terminal of the transistor 2103, and the gate of the transistor 2104 is denoted by N211.

In addition, each of the transistors 2101 to 2104 is a P-channel transistor.

Accordingly; since the basic circuit in FIG. 21A can be formed by using only P-channel transistors, a step of forming N-channel transistors is not necessary. Thus, in the basic circuit in FIG. 21A, a manufacturing process can be simplified, so that manufacturing cost can be reduced and a yield can be improved.

In addition, the power supply potential VDD is supplied to the wiring 2105 and the power supply potential VSS is supplied to the wiring 2106. Note that the power supply potential VDD is higher than the power supply potential VSS. Note also that a digital signal, an analog signal, or the like may be supplied to each of the wiring 2105 and the wiring 2106, or another power supply potential may be supplied thereto.

In addition, a signal is supplied to each of the wiring 2107 and the wiring 2108. Note that the signal supplied to each of the wiring 2107 and the wiring 2108 is a binary digital signal. Note also that the power supply potential VDD, the power supply potential VSS, or another power supply potential may be supplied to each of the wiring 2107 and the wiring 2108. Alternatively, an analog signal may be supplied to each of the wiring 2107 and the wiring 2108.

Next, operations of the basic circuit shown in FIG. 21A are described with reference to FIG. 21B.

Figure 21B:
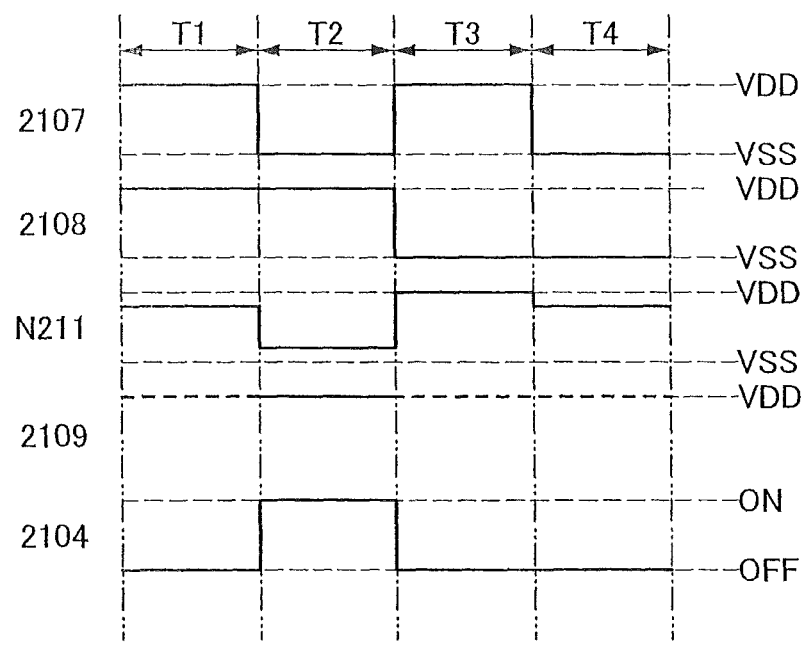

FIG. 21B is an example of a timing chart of the basic circuit shown in FIG. 21A. The timing chart in FIG. 21B shows a potential of the wiring 2107, a potential of the wiring 2108, a potential of the node N211, a potential of the wiring 2109, and on/off of the transistor 2104.

The timing chart in FIG. 21B is described by dividing the whole period into periods T1 to T4. In addition, FIGS. 22A to 23B show operations of the basic circuit in FIG. 21A in the periods T1 to T4, respectively.

Figure 22A:
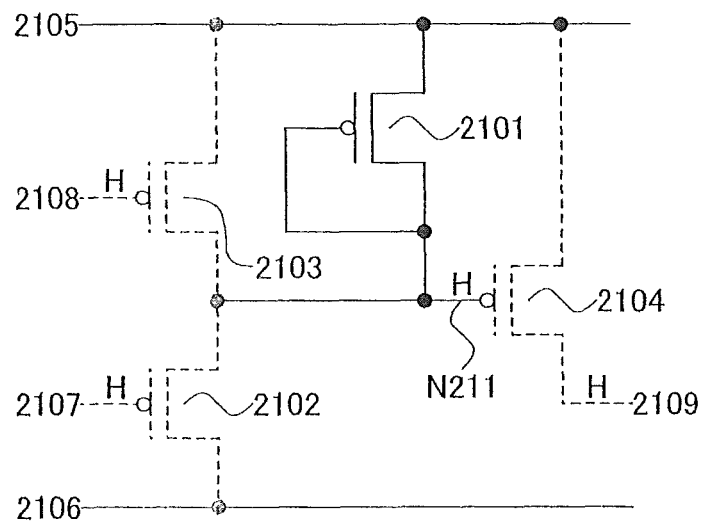
FIGS. 22A and 22B illustrate Embodiment Mode 3.

First, the operation in the period T1 is described with reference to FIG. 22A. In the period T1, an H-level signal is supplied to the wiring 2107 and an H-level signal is supplied to the wiring 2108. Accordingly, the transistor 2102 is turned off and the transistor 2103 is off.

In addition, since the transistor 2101 is diode-connected, the potential of the node N211 starts to rise. This rise in the potential of the node N211 continues until the transistor 2101 is turned off. The transistor 2101 is turned off when the potential of the node N211 becomes a value obtained by subtracting the absolute value of a threshold voltage Vth2101 of the transistor 2101 from the power supply potential VDD (VDD−|Vth2101|). Therefore, the potential of the node N211 becomes VDD−|Vth2101|.

Accordingly, the transistor 2104 is turned off, and the potential of the wiring 2109 remains slightly lower than the power supply potential VDD because the wiring 2109 is kept at a potential in the period T2. Note that the operation in the period T2 is described next.

Figure 22B:
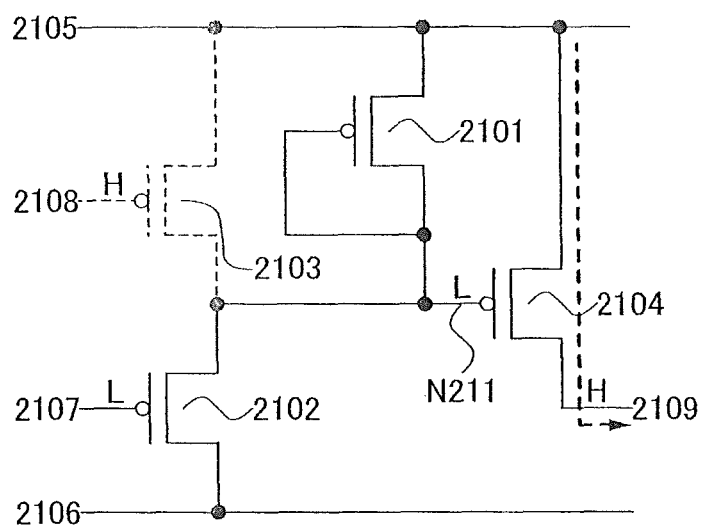

Next, the operation in the period T2 is described with reference to FIG. 22B. In the period T2, an L-level signal is supplied to the wiring 2107 and an H-level signal is supplied to the wiring 2108. Accordingly, the transistor 2102 is turned on and the transistor 2103 is off.

In addition, the potential of the node N211 is determined by the operating point of the transistor 2101 and the transistor 2102. Note that when a ratio (W/L) of the transistor 2102 is set sufficiently higher than a ratio (W/L) of the transistor 2101, the potential of the node N211 becomes slightly higher than the power supply potential VSS.

Accordingly, the transistor 2104 is turned on and the potential of the wiring 2109 becomes equal to the power supply potential VDD.

Figure 23A:
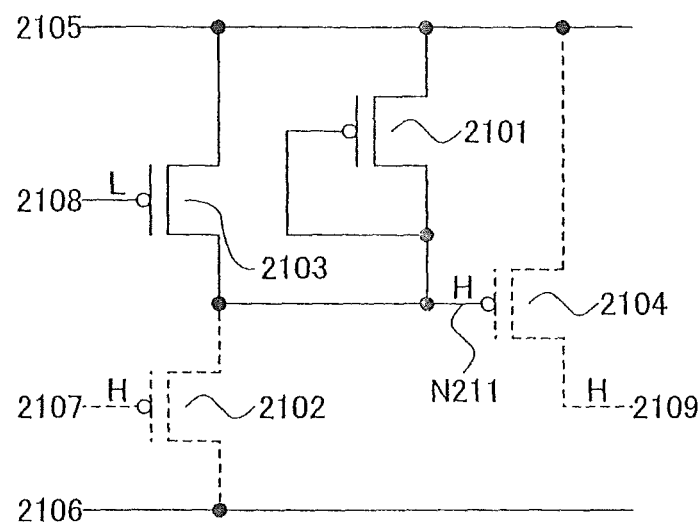
FIGS. 23A and 23B illustrate Embodiment Mode 3.

Next, the operation in the period T3 is described with reference to FIG. 23A. In the period T3, an H-level signal is supplied to the wiring 2107 and an L-level signal is supplied to the wiring 2108. Accordingly, the transistor 2102 is turned off and the transistor 2103 is on.

Accordingly, the potential of the node N211 becomes equal to the power supply potential VDD because the transistor 2102 is off.

Accordingly, the transistor 2104 is turned off and the wiring 2109 becomes a floating state. The potential of the wiring 2109 remains equal to the power supply potential VSS because the wiring 2109 is kept at the potential in the periods T1 and T2.

Figure 23B:
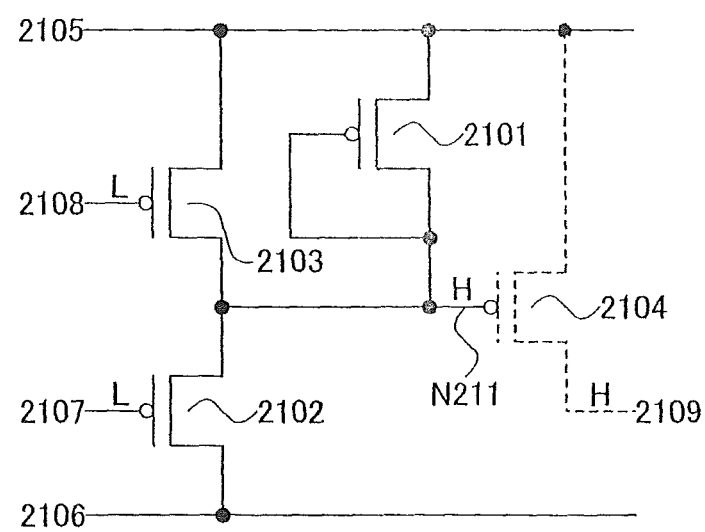

Next, the operation in the period T4 is described with reference to FIG. 23B. In the period T4, an L-level signal is supplied to the wiring 2107 and an L-level signal is supplied to the wiring 2108. Accordingly, the transistor 2102 is turned on and the transistor 2104 is on.

In addition, since the potential of the node N211 is determined by the operating point of the transistor 2101, the transistor 2102, and the transistor 2103, the potential of the node N211 becomes slightly lower than the power supply potential VDD.

Accordingly, the transistor 2104 is turned off and the wiring 2109 becomes a floating state. The potential of the wiring 2109 remains equal to the power supply potential VSS because the wiring 2109 is kept at the potential in the periods T1 to T3.

By the above-described operations, the basic circuit in FIG. 21A supplies the power supply potential VDD to the wiring 2109 in the period T2, so that the potential of the wiring 2109 becomes equal to the power supply potential VDD. In the periods T1, T3, and T4, the basic circuit in FIG. 21A makes the wiring 2109 into a floating state, so that the potential of the wiring 2109 is kept equal to the power supply potential VDD.

In addition, the basic circuit in FIG. 21A does not include a transistor which is on in all of the periods T1 to T4. That is, the basic circuit in FIG. 21A does not include a transistor which is always or almost always on. Accordingly, the basic circuit in FIG. 21A can suppress characteristic deterioration of a transistor and a threshold voltage shift due to the characteristic deterioration.

Note that the transistors 2101 to 2104 have functions which are similar to those of the transistors 901 to 904.

Note that a two-input logic circuit in which the wirings 2107 and 2108 correspond to an input terminal and the node N211 corresponds to an output terminal is constructed from the transistors 2101 to 2104.

Figure 24A:
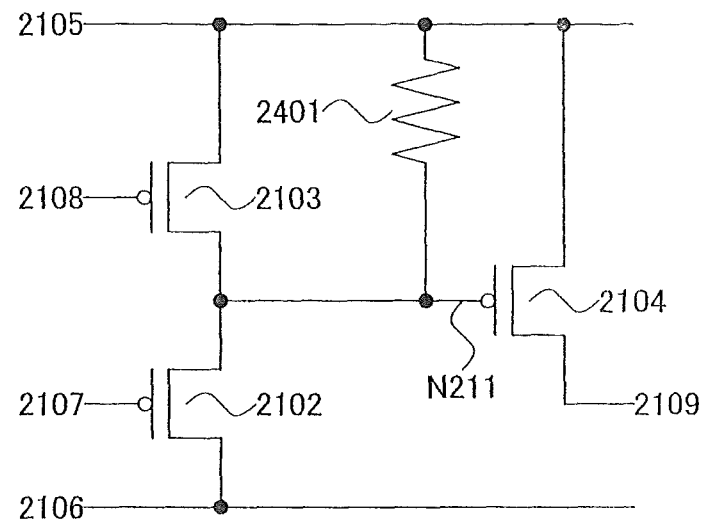
FIGS. 24A and 24B illustrate Embodiment Mode 3.
Figure 24B:
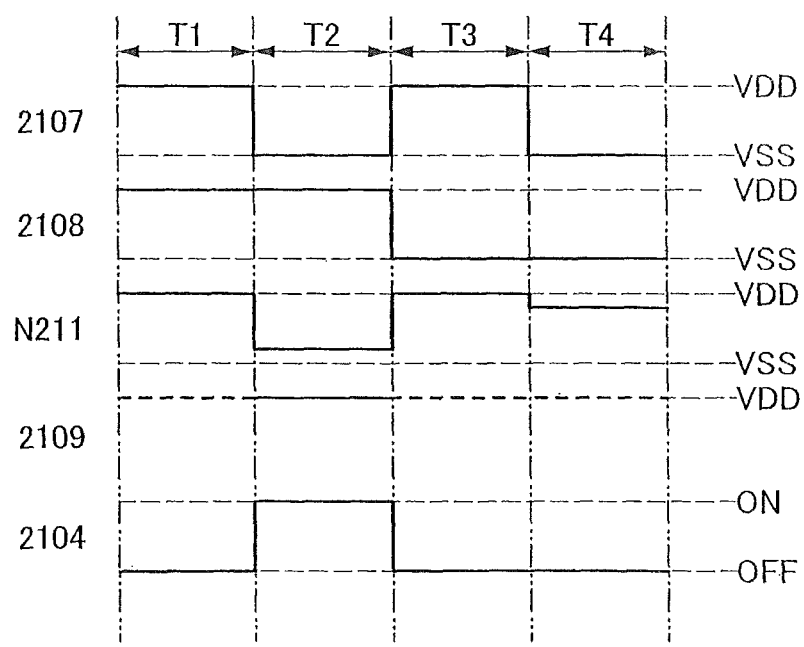

Note that the transistor 2101 may be any element as long as it has a resistance component. For example, as shown in FIG. 24A, a resistor 2401 can be used instead of the transistor 2101. In addition, a timing chart in FIG. 24A is shown in FIG. 24B.

Note that this embodiment mode can be freely combined with any description in other embodiment modes in this specification. Further, parts of the description in this embodiment mode can be combined with one another.

Embodiment Mode 4

In this embodiment mod; a basic principle of the invention which is different from those of Embodiment Modes 1 to 3 is described with reference to FIG. 25A.

FIG. 25A shows a basic circuit based on the basic principle of the invention. The basic circuit in FIG. 25A includes a circuit 2501 and a circuit 2502.

Note that as the circuit 2501 and the circuit 2502, the basic circuits shown in FIGS. 1A, 4A, 5A, 8A, 8B, 9A, and 12A can be used.

Therefore, a wiring 2503 and a wiring 2504 correspond to the wiring 107 in FIG. 1A, the wiring 107 in FIG. 4A, the wiring 510 in FIG. 5A, the wiring 510 in FIG. 8A, the wiring 510 in FIG. 8B, the wiring 907 in FIG. 9A, and the wiring 907 in FIG. 12A.

In addition, a wiring 2505 corresponds to the wiring 108 in FIG. 1A, the wiring 108 in FIG. 4A, the wiring 511 in FIG. 5A, the wiring 511 in FIG. 8A, the wiring 511 in FIG. 8B, the wiring 908 in FIG. 9A, and the wiring 908 in FIG. 12A.

In addition, a wiring 2506 corresponds to the wiring 109 in FIG. 1A, the wiring 109 in FIG. 4A, the wiring 512 in FIG. 5A, the wiring 512 in FIG. 8A, the wiring 512 in FIG. 8B, the wiring 909 in FIG. 9A, and the wiring 909 in FIG. 12A.

Accordingly, since the basic circuit in FIG. 25A can be formed by using only N-channel transistors, amorphous silicon can be used for a semiconductor layer of the basic circuit in FIG. 25A. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the basic circuit in FIG. 25A, the manufacturing process can also be simplified.

In addition, a wiring to which a power supply potential is supplied is omitted.

In addition, a signal is supplied to each of the wiring 2503, the wiring 2504, and the wiring 2505. Note that the signal supplied to each of the wiring 2503, the wiring 2504, and the wiring 2505 is a binary digital signal.

Note also that the power supply potential VDD, the power supply potential VSS, or another power supply potential may be supplied to each of the wiring 2503, the wiring 2504, and the wiring 2505. Alternatively, an analog signal may be supplied to each of the wiring 2503, the wiring 2504, and the wiring 2505.

Next, operations of the basic circuit shown in FIG. 25A are described with reference to FIG. 25B. Note that FIG. 25B shows the case in which the basic circuits shown in FIGS. 1A, 4A, 5A, and 8A are used as the circuit 2501 and the circuit 2502.

FIG. 25B is an example of a timing chart of the basic circuit shown in FIG. 25A. The timing chart in FIG. 25B shows a potential of the wiring 2503, a potential of the wiring 2504, a potential of the wiring 2505, whether the output of the circuit 2501 is in a floating state (described as OFF) or at the power supply potential VSS (described as ON), whether the output of the circuit 2502 is in a floating state (described as OFF) or at the power supply potential VSS (described as ON), and a potential of the wiring 2506.

The timing chart in FIG. 25B is described by dividing the whole period into periods T1 to T8.

First, an operation in the period T1 is described. In the period T1, an L-level signal is supplied to the wiring 2505, an L-level signal is supplied to the wiring 2503, and an L-level signal is supplied to the wiring 2504. Each of the circuit 2501 and the circuit 2502 supplies the power supply potential VSS to the wiring 2506. Therefore, the potential of the wiring 2506 becomes equal to the power supply potential VSS.

Next, an operation in the period T2 is described. In the period T2, an L-level signal is supplied to the wiring 2505, an H-level signal is supplied to the wiring 2503, and an L-level signal is supplied to the wiring 2504. The circuit 2501 supplies no potential to the wiring 2506 and the circuit 2502 supplies the power supply potential VSS to the wiring 2506. Therefore, the potential of the wiring 2506 becomes equal to the power supply potential VSS.

Next, an operation in the period T3 is described. In the period T3, an L-level signal is supplied to the wiring 2505, an L-level signal is supplied to the wiring 2503, and an H-level signal is supplied to the wiring 2504. The circuit 2501 supplies the power supply potential VSS to the wiring 2506 and the circuit 2502 supplies no potential to the wiring 2506. Therefore, the potential of the wiring 2506 becomes equal to the power supply potential VSS.

Next, an operation in the period T4 is described. In the period T4, an L-level signal is supplied to the wiring 2505, an H-level signal is supplied to the wiring 2503, and an H-level signal is supplied to the wiring 2504. Each of the circuit 2501 and the circuit 2502 supplies no potential to the wiring 2506. Therefore, the potential of the wiring 2506 remains equal to the power supply potential VSS because the wiring 2506 is kept at the potential in the period T3.

Next, an operation in the period T5 is described. In the period T5, an H-level signal is supplied to the wiring 2505, an L-level signal is supplied to the wiring 2503, and an L-level signal is supplied to the wiring 2504. Each of the circuit 2501 and the circuit 2502 supplies no potential to the wiring 2506. Therefore, the potential of the wiring 2506 remains equal to the power supply potential VSS because the wiring 2506 is kept at the potential in the period T3.

Next, an operation in the period T6 is described. In the period T6, an H-level signal is supplied to the wiring 2505, an H-level signal is supplied to the wiring 2503, and an L-level signal is supplied to the wiring 2504. Each of the circuit 2501 and the circuit 2502 supplies no potential to the wiring 2506. Therefore, the potential of the wiring 2506 remains equal to the power supply potential VSS because the wiring 2506 is kept at the potential in the period T3.

Next, an operation in the period 17 is described. In the period T7, an H-level signal is supplied to the wiring 2505, an L-level signal is supplied to the wiring 2503, and an H-level signal is supplied to the wiring 2504. Each of the circuit 2501 and the circuit 2502 supplies no potential to the wiring 2506. Therefore, the potential of the wiring 2506 remains equal to the power supply potential VSS because the wiring 2506 is kept at the potential in the period T3.

Next, an operation in the period T8 is described. In the period T8, an H-level signal is supplied to the wiring 2505, an H-level signal is supplied to the wiring 2503, and an H-level signal is supplied to the wiring 2504. Each of the circuit 2501 and the circuit 2502 supplies no potential to the wiring 2506. Therefore, the potential of the wiring 2506 remains equal to the power supply potential VSS because the wiring 2506 is kept at the potential in the period T3.

By the above-described operations, each of the circuit 2501 and the circuit 2502 supplies the power supply potential VSS to the wiring 2506 in the period T1, so that the potential of the wiring 2506 becomes equal to the power supply potential VSS. In the period T2, the circuit 2502 supplies the power supply potential VSS to the wiring 2506, so that the potential of the wiring 2506 becomes equal to the power supply potential VSS. In the period T3, the circuit 2501 supplies the power supply potential VSS to the wiring 2506, so that the potential of the wiring 2506 becomes equal to the power supply potential VSS. In the periods T4 to T8, the wiring 2506 is made into a floating state, so that the potential of the wiring 2506 is kept equal to the power supply potential VSS.

In addition, the basic circuit in FIG. 25A does not include a transistor which is on in all of the periods T1 to T8. That is, the basic circuit in FIG. 25A does not include a transistor which is always or almost always on. Accordingly, the basic circuit in FIG. 25A can suppress characteristic deterioration of a transistor and a threshold voltage shift due to the characteristic deterioration.

Further, the characteristics of a transistor which is formed of amorphous silicon easily deteriorate. Therefore, when the transistor included in the basic circuit in FIG. 25A is formed using amorphous silicon, not only can the advantages such as a reduction in manufacturing cost and improvement in a yield be obtained, but also the problem of the characteristic deterioration of the transistor can be solved.

Figure 26A:
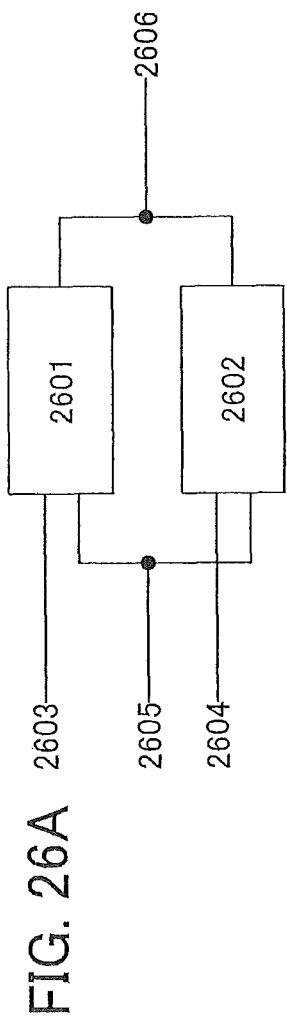
FIGS. 26A and 26B illustrate Embodiment Mode 4.

Next, the case is described in which the basic circuit shown in FIG. 25A is constructed from P-channel transistors, with reference to FIG. 26A.

FIG. 26A shows a basic circuit which is based on the basic principle of the invention. The basic circuit in FIG. 26A includes a circuit 2601 and a circuit 2602.

Note that as the circuit 2601 and the circuit 2602, the basic circuits shown in FIGS. 13A, 16A, 17A, 20A, 20B, 21A, and 24A can be used.

Therefore, a wiring 2603 and a wiring 2604 correspond to the wiring 1307 in FIG. 13A, the wiring 1307 in FIG. 16A, the wiring 1710 in FIG. 17A, the wiring 1710 in FIG. 20A, the wiring 1710 in FIG. 20B, the wiring 2108 in FIG. 21A, and the wiring 2108 in FIG. 24A.

In addition, a wiring 2605 corresponds to the wiring 1308 in FIG. 13A, the wiring 1308 in FIG. 16A, the wiring 1711 in FIG. 17A, the wiring 1711 in FIG. 20A, the wiring 1711 in FIG. 20B, the wiring 2107 in FIG. 21A, and the wiring 2107 in FIG. 24A.

In addition, a wiring 2606 corresponds to the wiring 1309 in FIG. 13A, the wiring 1309 in FIG. 16A, the wiring 1712 in FIG. 17A, the wiring 1712 in FIG. 20A, the wiring 1712 in FIG. 20B, the wiring 2109 in FIG. 21A, and the wiring 2109 in FIG. 24A.

Accordingly, since the basic circuit in FIG. 26A can be formed by using only P-channel transistors, a step of forming N-channel transistors is not necessary. Thus, in the basic circuit in FIG. 26A, a manufacturing process can be simplified, so that manufacturing cost can be reduced and a yield can be improved.

In addition, a wiring to which a power supply potential is supplied is omitted.

In addition, a signal is supplied to each of the wiring 2603, the wiring 2604, and the wiring 2605. Note that the signal supplied to each of the wiring 2603, the wiring 2604, and the wiring 2605 is a binary digital signal.

Note also that the power supply potential VDD, the power supply potential VSS, or another power supply potential may be supplied to each of the wiring 2603, the wiring 2604, and the wiring 2605. Alternatively, an analog signal may be supplied to each of the wiring 2603, the wiring 2604, and the wiring 2605.

Next, operations of the basic circuit shown in FIG. 26A are described with reference to FIG. 26B. Note that FIG. 26B shows the case in which the basic circuits shown in FIGS. 16A, 17A, 20A, and 20B are used as the circuit 2601 and the circuit 2602.

Figure 26B:
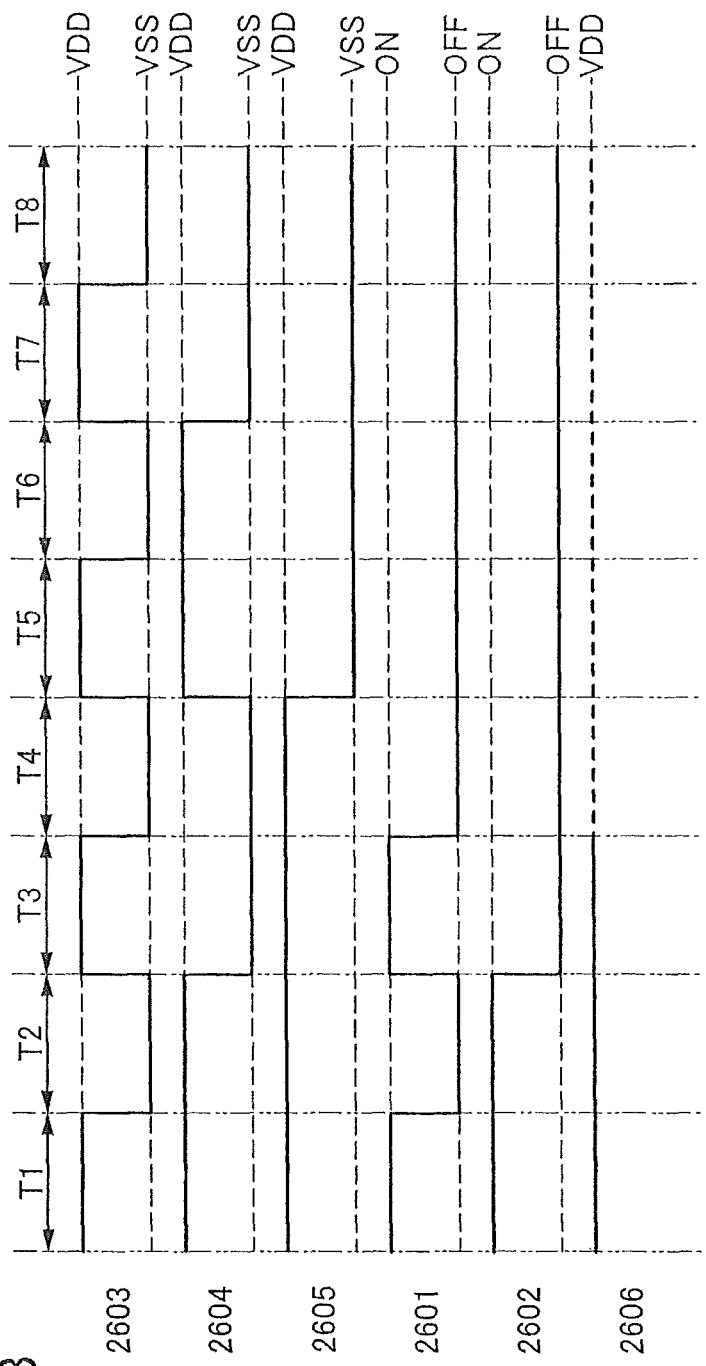

FIG. 26B is an example of a timing chart of the basic circuit shown in FIG. 26A. The timing chart in FIG. 26B shows a potential of the wiring 2603, a potential of the wiring 2604, a potential of the wiring 2605, whether the output of the circuit 2601 is in a floating state (described as OFF) or at the power supply potential VSS (described as ON), whether the output of the circuit 2602 is in a floating state (described as OFF) or at the power supply potential VSS (described as ON), and a potential of the wiring 2606.

The timing chart in FIG. 26B is described by dividing the whole period into periods T1 to T8.

First, an operation in the period T1 is described. In the period T1, an H-level signal is supplied to the wiring 2605, an H-level signal is supplied to the wiring 2603, and an H-level signal is supplied to the wiring 2604. Each of the circuit 2601 and the circuit 2602 supplies the power supply potential VDD to the wiring 2606. Therefore, the potential of the wiring 2606 becomes equal to the power supply potential VDD.

Next, an operation in the period T2 is described. In the period T2, an H-level signal is supplied to the wiring 2605, an L-level signal is supplied to the wiring 2603, and an H-level signal is supplied to the wiring 2604. The circuit 2601 supplies no potential to the wiring 2606 and the circuit 2602 supplies the power supply potential VDD to the wiring 2606. Therefore, the potential of the wiring 2606 becomes equal to the power supply potential VDD.

Next, an operation in the period T3 is described. In the period T3, an H-level signal is supplied to the wiring 2605, an H-level signal is supplied to the wiring 2603, and an L-level signal is supplied to the wiring 2604. The circuit 2601 supplies the power supply potential VDD to the wiring 2606 and the circuit 2602 supplies no potential to the wiring 2606. Therefore, the potential of the wiring 2606 becomes equal to the power supply potential VDD.

Next, an operation in the period T4 is described. In the period T4, an H-level signal is supplied to the wiring 2605, an L-level signal is supplied to the wiring 2603, and an L-level signal is supplied to the wiring 2604. Each of the circuit 2601 and the circuit 2602 supplies no potential to the wiring 2606. Therefore, the potential of the wiring 2606 remains equal to the power supply potential VDD because the wiring 2606 is kept at the potential in the period T3.

Next, an operation in the period T5 is described. In the period T5, an L-level signal is supplied to the wiring 2605, an H-level signal is supplied to the wiring 2603, and an H-level signal is supplied to the wiring 2604. Each of the circuit 2601 and the circuit 2602 supplies no potential to the wiring 2606. Therefore, the potential of the wiring 2606 remains equal to the power supply potential VDD because the wiring 2606 is kept at the potential in the period T3.

Next, an operation in the period T6 is described. In the period T6, an L-level signal is supplied to the wiring 2605, an L-level signal is supplied to the wiring 2603, and an H-level signal is supplied to the wiring 2604. Each of the circuit 2601 and the circuit 2602 supplies no potential to the wiring 2606. Therefore, the potential of the wiring 2606 remains equal to the power supply potential VDD because the wiring 2606 is kept at the potential in the period T3.

Next, an operation in the period T7 is described. In the period T7, an L-level signal is supplied to the wiring 2605, an H-level signal is supplied to the wiring 2603, and an L-level signal is supplied to the wiring 2604. Each of the circuit 2601 and the circuit 2602 supplies no potential to the wiring 2606. Therefore, the potential of the wiring 2606 remains equal to the power supply potential VDD because the wiring 2606 is kept at the potential in the period T3.

Next, an operation in the period T8 is described. In the period T8, an L-level signal is supplied to the wiring 2605, an L-level signal is supplied to the wiring 2603, and an L-level signal is supplied to the wiring 2604. Each of the circuit 2601 and the circuit 2602 supplies no potential to the wiring 2606. Therefore, the potential of the wiring 2606 remains equal to the power supply potential VDD because the wiring 2606 is kept at the potential in the period T3.

By the above-described operations, each of the circuit 2601 and the circuit 2602 supplies the power supply potential VDD to the wiring 2606 in the period T1, so that the potential of the wiring 2606 becomes equal to the power supply potential VDD. In the period T2, the circuit 2602 supplies the power supply potential VDD to the wiring 2606, so that the potential of the wiring 2606 becomes equal to the power supply potential VDD. In the period T3, the circuit 2601 supplies the power supply potential VDD to the wiring 2606, so that the potential of the wiring 2606 becomes equal to the power supply potential VDD. In the periods T4 to T8, the wiring 2606 is made into a floating state, so that the potential of the wiring 2606 is kept equal to the power supply potential VDD.

In addition, the basic circuit in FIG. 26A does not include a transistor which is on in all of the periods T1 to T8. That is, the basic circuit in FIG. 26A does not include a transistor which is always or almost always on. Accordingly, the basic circuit in FIG. 26A can suppress characteristic deterioration of a transistor and a threshold voltage shift due to the characteristic deterioration.

Note that this embodiment mode can be freely combined with any description in other embodiment modes in this specification. Further, parts of the description in this embodiment mode can be combined with one another.

Embodiment Mode 5

Figure 27:
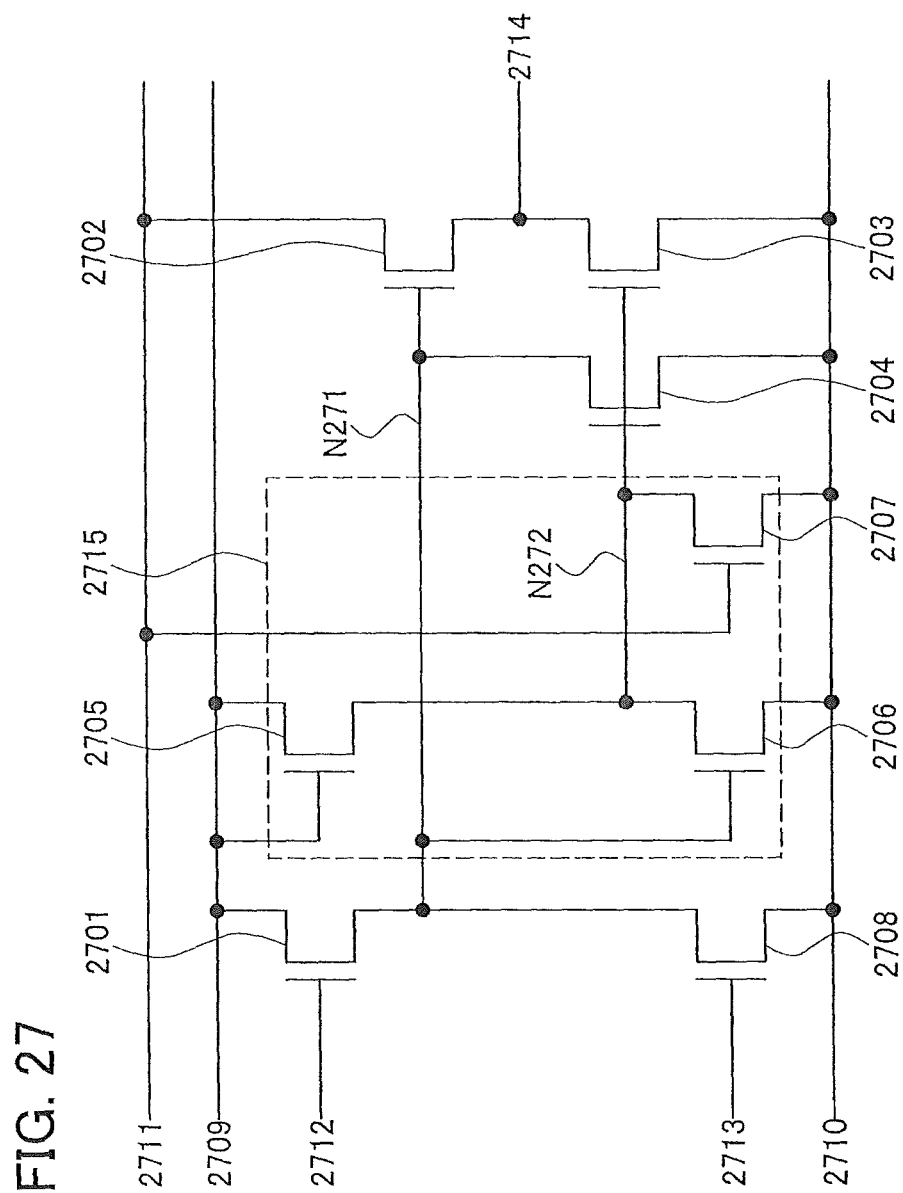
FIG. 27 illustrates Embodiment Mode 5.

In this embodiment mode, the case is described in which the basic circuit described in Embodiment Mode 1 is applied to a flip-flop circuit, with reference to FIG. 27.

FIG. 27 is an example of a flip-flop circuit to which the basic circuit in FIG. 1A described in Embodiment Mode 1 is applied. The flip-flop circuit in FIG. 27 includes a transistor 2701, a transistor 2702, a transistor 2703, a transistor 2704, a transistor 2705, a transistor 2706, a transistor 2707, and a transistor 2708.

Note that the transistor 2705 corresponds to the transistor 101 in FIG. 1A; the transistor 2707 corresponds to the transistor 103 in FIG. 1A, and the transistor 2706 corresponds to the transistor 102 in FIG. 1A. In addition, the transistor 2703 and the transistor 2704 correspond to the transistor 104 in FIG. 1A.

Connection relations of the flip-flop circuit in FIG. 27 are described. Note that a node of a second terminal of the transistor 2701, a second terminal of the transistor 2708, a gate of the transistor 2706, a second terminal of the transistor 2704, and a gate of the transistor 2702 is denoted by N271. In addition, a node of a second terminal of the transistor 2705, a second terminal of the transistor 2706, a second terminal of the transistor 2707, a gate of the transistor 2703, and a gate of the transistor 2704 is denoted by N272.

A gate of the transistor 2701 is connected to a wiring 2712, a first terminal of the transistor 2701 is connected to a wiring 2709, and the second terminal of the transistor 2701 is connected to the node N271. A gate of the transistor 2708 is connected to a wiring 2713, a first terminal of the transistor 2708 is connected to a wiring 2710, and the second terminal of the transistor 2708 is connected to the node N271. A gate of the transistor 2705 is connected to the wiring 2709, a first terminal of the transistor 2705 is connected to the wiring 2709, and the second terminal of the transistor 2705 is connected to the node N272. A gate of the transistor 2706 is connected to the node N271, a first terminal of the transistor 2706 is connected to the wiring 2710, and the second terminal of the transistor 2706 is connected to the node N272. A gate of the transistor 2707 is connected to a wiring 2711, a first terminal of the transistor 2707 is connected to the wiring 2710, and the second terminal of the transistor 2707 is connected to the node N272. The gate of the transistor 2704 is connected to the node N272, a first terminal of the transistor 2704 is connected to the wiring 2710, and the second terminal of the transistor 2704 is connected to the node N271. The gate of the transistor 2703 is connected to the node N272, a first terminal of the transistor 2703 is connected to the wiring 2710, and a second terminal of the transistor 2703 is connected to a wiring 2714. The gate of the transistor 2702 is connected to the node N271, a first terminal of the transistor 2702 is connected to the wiring 2711, and a second terminal of the transistor 2702 is connected to the wiring 2714.

In addition, each of the transistors 2701 to 2708 is an N-channel transistor.

Accordingly, since the flip-flop circuit in FIG. 27 can be formed by using only N-channel transistors, amorphous silicon can be used for a semiconductor layer of the flip-flop circuit in FIG. 27. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the flip-flop circuit in FIG. 27, the manufacturing process can also be simplified.

In addition, the power supply potential VDD is supplied to the wiring 2709 and the power supply potential VSS is supplied to the wiring 2710. Note that the power supply potential VDD is higher than the power supply potential VSS. Note also that a digital signal, an analog signal, or the like may be supplied to each of the wiring 2709 and the wiring 2710, or another power supply potential may be supplied thereto.

In addition, a signal is supplied to each of the wiring 2711, the wiring 2712, and the wiring 2713. Note that the signal supplied to each of the wiring 2711, the wiring 2712, and the wiring 2713 is a binary digital signal. Note also that the power supply potential VDD, the power supply potential VSS, or another power supply potential may be supplied to each of the wiring 2711, the wiring 2712, and the wiring 2713. Alternatively, an analog signal may be supplied to each of the wiring 2711, the wiring 2712, and the wiring 2713.

Next, operations of the flip-flop circuit shown in FIG. 27 are described with reference to FIG. 28.

Figure 28:
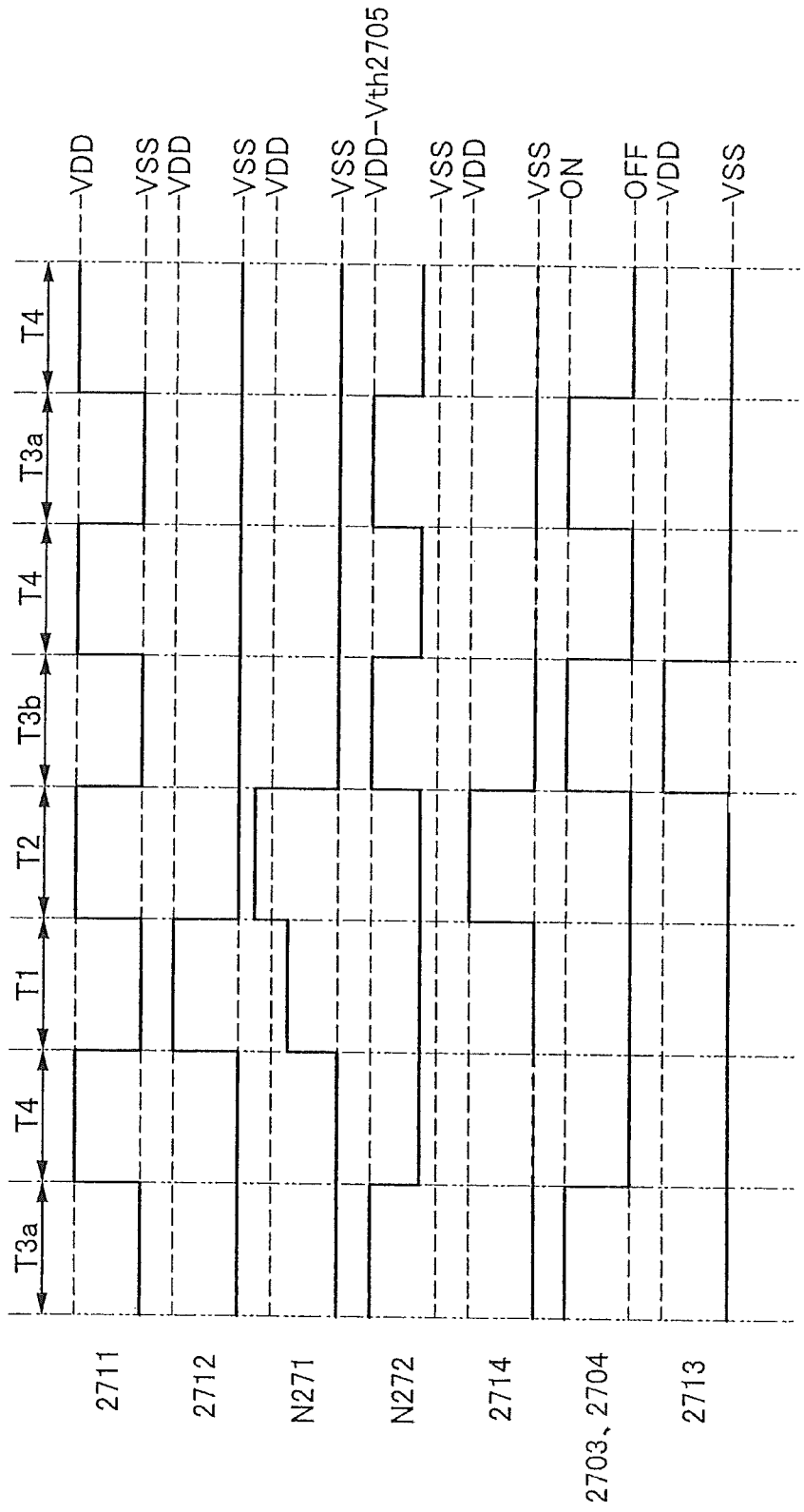
FIG. 28 illustrates Embodiment Mode 5.

FIG. 28 is an example of a timing chart of the flip-flop circuit shown in FIG. 27. The timing chart in FIG. 28 shows a potential of the wiring 2711, a potential of the wiring 2712, a potential of the node N271, a potential of the node N272, a potential of the wiring 2714, a relation of on/off of the transistor 2703 and the transistor 2704, and a potential of the wiring 2713.

The timing chart in FIG. 28 is described by dividing the whole period into periods T1 to T4. In addition, the period T3 is described by dividing the whole period into a period T3a and a period T3b. Further, FIGS. 29 to 33 show operations of the flip-flop circuit in FIG. 27 in the periods T1, T2, T3b, T4, and T3a, respectively.

Note that the period T3a and the period T4 are sequentially repeated in the periods other than the periods T1, T2, and T3b.

Figure 29:
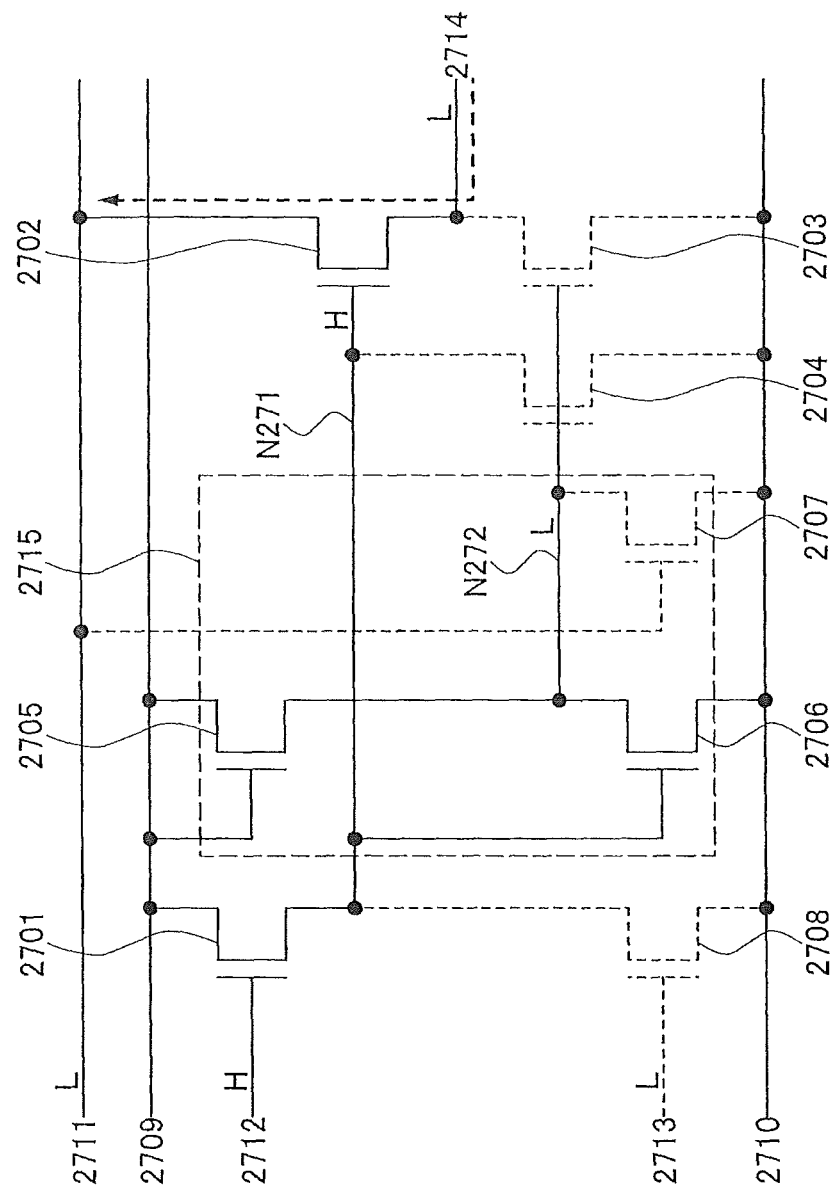
FIG. 29 illustrates Embodiment Mode 5.

First, an operation in the period T1 is described with reference to FIG. 29. In the period T1, an L-level signal is supplied to the wiring 2711, an H-level signal is supplied to the wiring 2712, and an L-level signal is supplied to the wiring 2713.

Accordingly, the transistor 2701 is turned on and the transistor 2708 and the transistor 2707 are turned off. At this time, the power supply potential VDD is supplied to the node N271 through the transistor 2701, so that the potential of the node N271 rises. In addition, the transistor 2706 is turned on by the rise in the potential of the node N271, so that the potential of the node N272 decreases. Further, the transistor 2703 and the transistor 2704 are turned off by the decrease in the potential of the node N272.

Here, the rise in the potential of the node N271 continues until the transistor 2701 is turned off. The transistor 2701 is turned off when the potential of the node N271 becomes a value obtained by subtracting a threshold voltage Vth2701 of the transistor 2701 from the power supply potential VDD (VDD−Vth2701). Therefore, the potential of the node N271 becomes VDD−Vth2701. In addition, the node N271 becomes a floating state.

Therefore, the transistor 2702 is turned on. In addition, since the L-level signal of the wiring 2711 is supplied to the wiring 2714, the potential of the wiring 2714 becomes equal to the power supply potential VSS.

Figure 30:
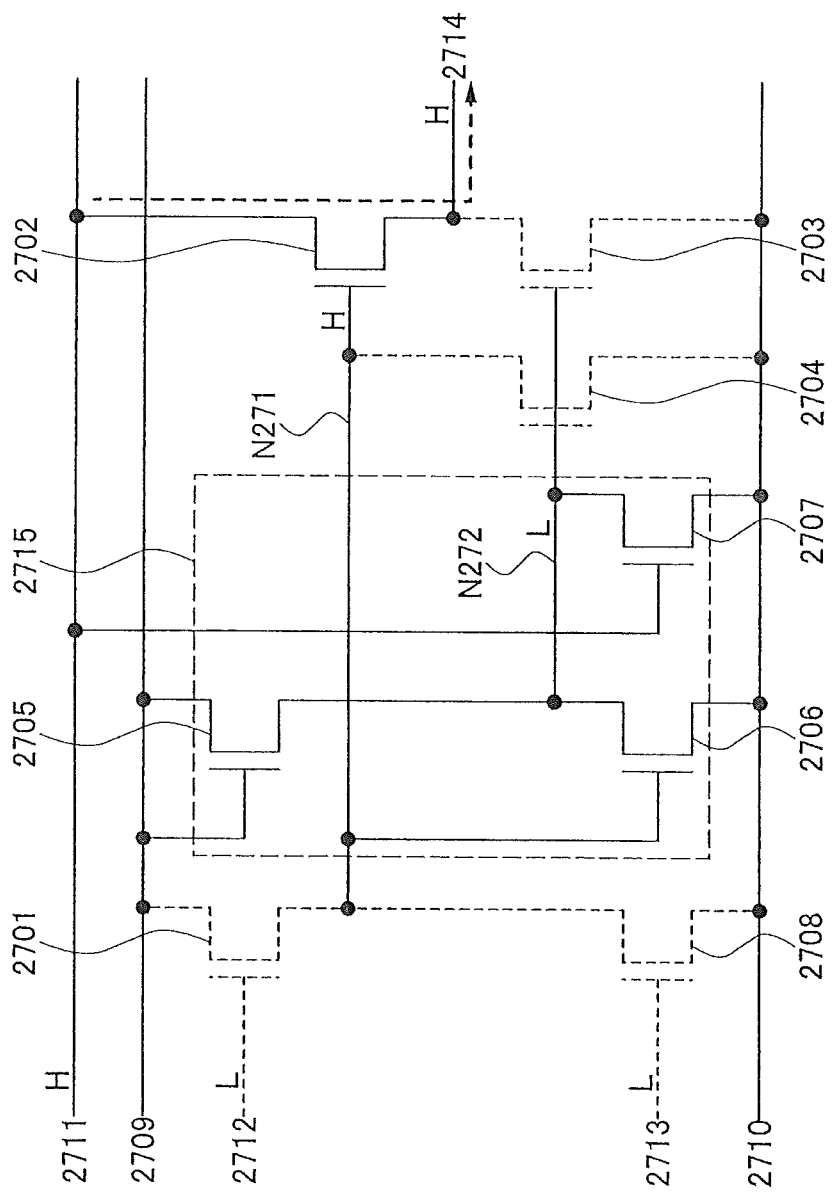
FIG. 30 illustrates Embodiment Mode 5.

Next, an operation in the period T2 is described with reference to FIG. 30. In the period T2, an H-level signal is supplied to the wiring 2711, an L-level signal is supplied to the wiring 2712, and an L-level signal is supplied to the wiring 2713.

Accordingly, the transistor 2701 is turned off, the transistor 2708 is kept off, and the transistor 2707 is turned on. At this time, the node N271 is in a floating state, and the potential of the node N271 is kept at VDD−Vth2701. In addition, the potential of the node N272 remains at an L level because the transistor 2706 and the transistor 2707 are on. Thus, since the node N272 is at the L level, the transistor 2703 and the transistor 2704 are kept off.

Here, the node N271 is in a floating state and kept at an H level. In addition, since the node N271 is kept at the H level, the transistor 2702 is kept on. Further, since the H-level signal of the wiring 2711 is supplied to the wiring 2714, the potential of the wiring 2714 rises. Therefore, the potential of the node N271 becomes equal to or higher than the sum of the power supply potential VDD and a threshold voltage Vth2702 of the transistor 2702 (VDD+Vth2702) by a bootstrap operation, so that the potential of the wiring 2714 becomes equal to the power supply potential VDD.

Figure 31:
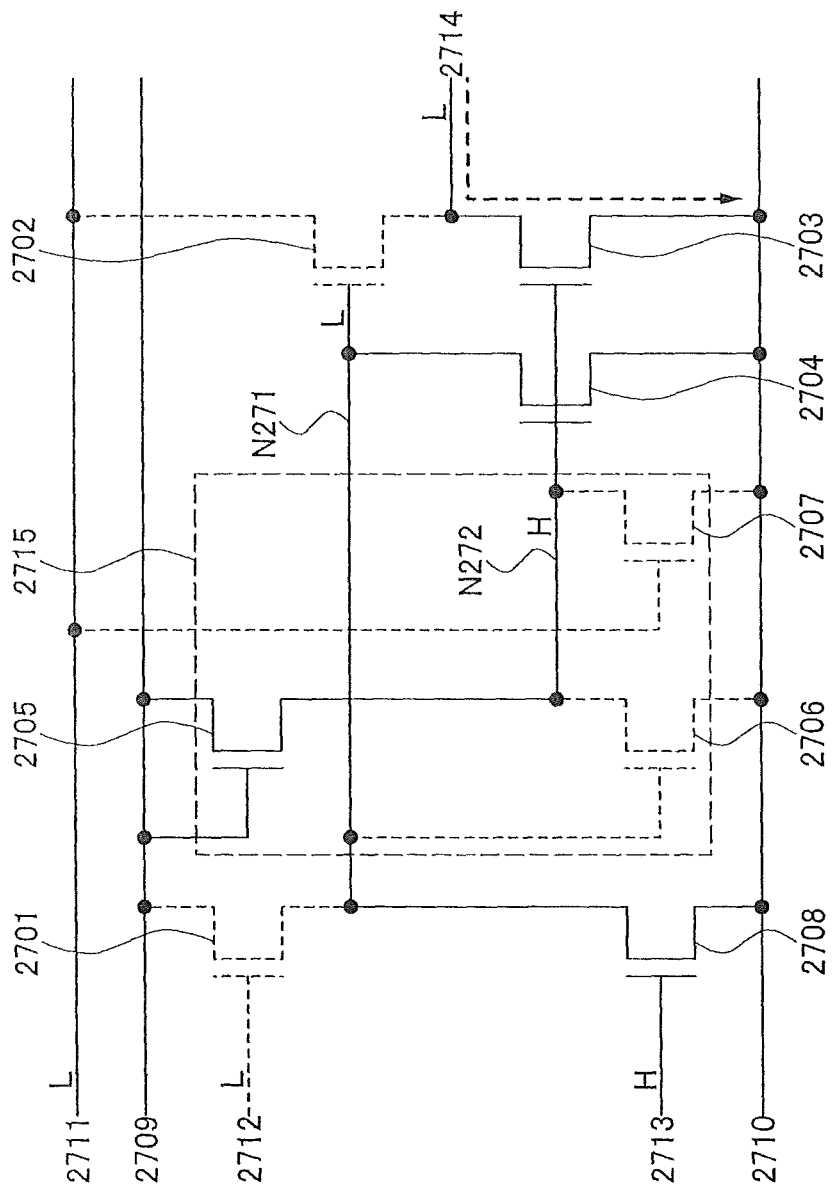
FIG. 31 illustrates Embodiment Mode 5.

Next, an operation in the period T3b is described with reference to FIG. 31. In the period T3b, an L-level signal is supplied to the wiring 2711, an L-level signal is supplied to the wiring 2712, and an H-level signal is supplied to the wiring 2713.

Accordingly, the transistor 2701 is kept off, the transistor 2708 is turned on, and the transistor 2707 is turned off. At this time, the power supply potential VSS is supplied to the node N271 through the transistor 2708, so that the potential of the node N271 decreases. In addition, the transistor 2706 is turned off by the decrease in the potential of the node N271, so that the potential of the node N272 rises. Further, the transistor 2703 and the transistor 2704 are turned on by the rise in the potential of the node N272.

In addition, the transistor 2702 is turned off by the decrease in the potential of the node N271. Therefore, since the power supply potential VSS is supplied to the wiring 2714 through the transistor 2703, the potential of the wiring 2714 becomes equal to the power supply potential VSS.

Figure 32:
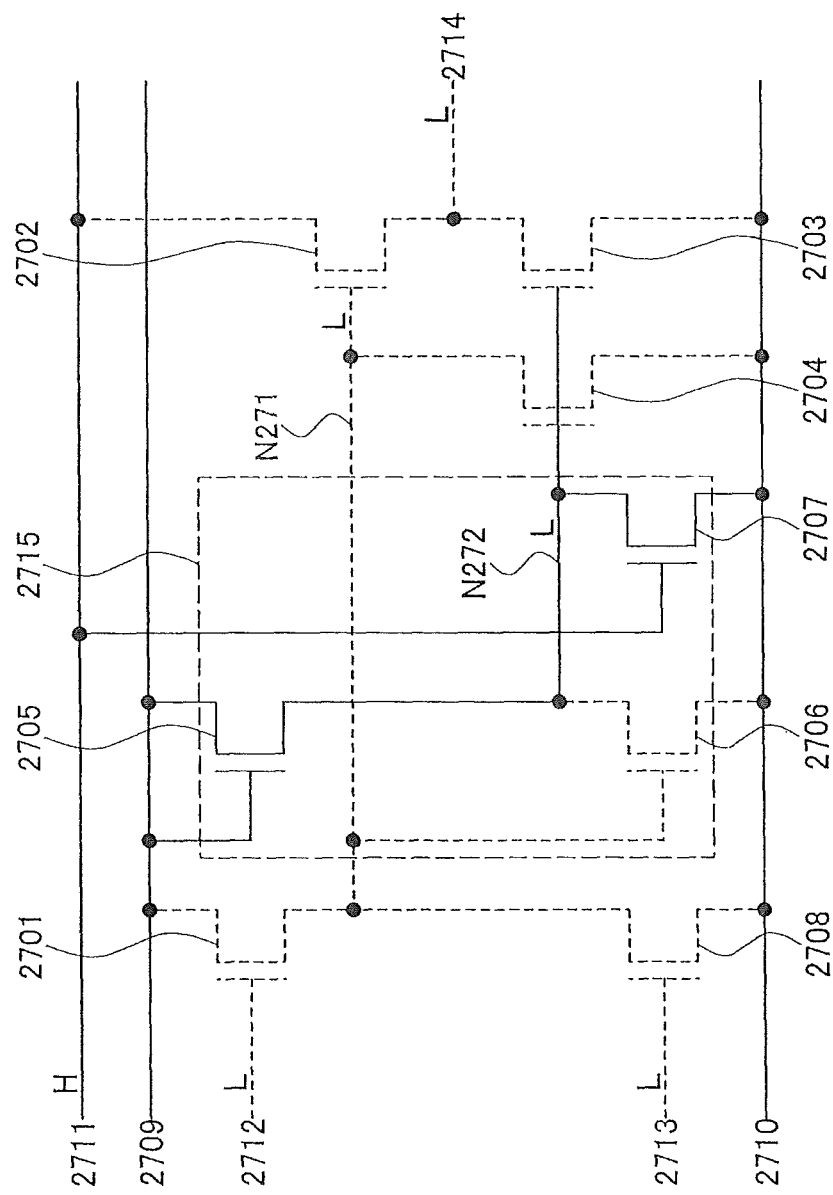
FIG. 32 illustrates Embodiment Mode 5.

Next, an operation in the period T4 is described with reference to FIG. 32. In the period T4, an H-level signal is supplied to the wiring 2711, an L-level signal is supplied to the wiring 2712, and an L-level signal is supplied to the wiring 2713.

Accordingly, the transistor 2701 is kept off, the transistor 2708 is turned off, and the transistor 2707 is turned on. At this time, the node N271 becomes a floating state, and the potential of the node N271 is kept at the power supply potential VSS. Thus, the transistor 2706 and the transistor 2702 are turned off. In addition, the potential of the node N272 becomes an L level because the power supply potential VSS is supplied thereto through the transistor 2707. Therefore, the transistor 2703 and the transistor 2704 are turned off.

Therefore, the wiring 2714 becomes a floating state, and the potential of the wiring 2714 is kept equal to the power supply potential VSS.

Figure 33:
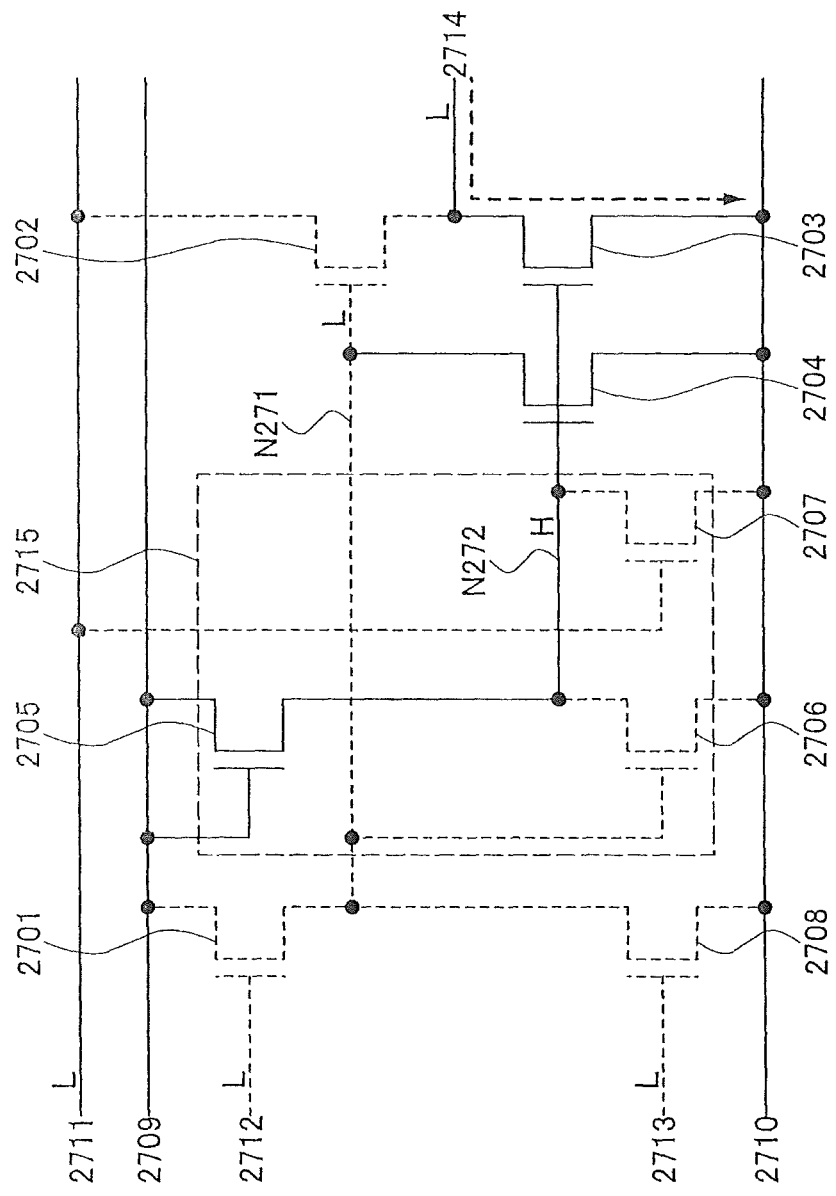
FIG. 33 illustrates Embodiment Mode 5.

Next, an operation in the period T3a is described with reference to FIG. 33. In the period T3a, an L-level signal is supplied to the wiring 2711, an L-level signal is supplied to the wiring 2712, and an L-level signal is supplied to the wiring 2713.

Accordingly, the transistor 2701 and the transistor 2708 are kept off, and the transistor 2707 is turned off. At this time, since the transistor 2707 is turned off, the potential of the node N272 rises. Thus, the transistor 2703 and the transistor 2704 are turned on. In addition, the power supply potential VSS is supplied to the node N271 through the transistor 2704, so that the potential of the node N271 becomes equal to the power supply potential VSS. Therefore, the transistor 2702 and the transistor 2706 are kept off.

Further, the power supply potential VSS is supplied to the wiring 2714 through the transistor 2703, and the potential of the wiring 2714 is kept equal to the power supply potential VSS.

By the above-described operations, the flip-flop circuit in FIG. 27 keeps the node N271 at an H level to be in a floating state in the period T1. In the period T2, the flip-flop circuit in FIG. 27 sets the potential of the node N271 to be equal to or higher than VDD+Vth2702 by the bootstrap operation, so that the potential of the wiring 2714 can be set equal to the power supply potential VDD.

Further, in the period T3a, the flip-flop circuit in FIG. 27 turns on the transistor 2703 and the transistor 2704, and supplies the power supply potential VSS to the wiring 2714 and the node N271. In the period T4, the flip-flop circuit in FIG. 27 turns off the transistor 2703 and the transistor 2704. Therefore, since the flip-flop circuit in FIG. 27 sequentially turns on the transistor 2703 and the transistor 2704, it can suppress characteristic deterioration of the transistor 2703 and the transistor 2704, so that the potential of each of the node N271 and the wiring 2714 can be stably kept equal to the power supply potential VSS.

In addition, the flip-flop circuit in FIG. 27 does not include a transistor which is on in all of the periods T1 to T4. That is, the flip-flop circuit in FIG. 27 does not include a transistor which is always or almost always on. Accordingly, the flip-flop circuit in FIG. 27 can suppress characteristic deterioration of a transistor and a threshold voltage shift due to the characteristic deterioration.

Further, the characteristics of a transistor which is formed of amorphous silicon easily deteriorate. Therefore, when the transistor included in the flip-flop circuit in FIG. 27 is formed using amorphous silicon, not only can the advantages such as a reduction in manufacturing cost and improvement in a yield be obtained, but also the problem of the characteristic deterioration of the transistor can be solved.

Here, the functions of the transistors 2701 to 2708 are described. The transistor 2701 has a function of a switch which selects whether to connect the wiring 2709 and the node N271 in accordance with the potential of the wiring 2712. The transistor 2702 has a function of a switch which selects whether to connect the wiring 2711 and the wiring 2714 in accordance with the potential of the node N271. The transistor 2703 has a function of a switch which selects whether to connect the wiring 2710 and the wiring 2714 in accordance with the potential of the node N272. The transistor 2704 has a function of a switch which selects whether to connect the wiring 2710 and the node N271 in accordance with the potential of the node N272. The transistor 2705 has a function of a diode in which the first terminal and the gate correspond to an input terminal and the second terminal corresponds to an output terminal. The transistor 2706 has a function of a switch which selects whether to connect the wiring 2710 and the node N272 in accordance with the potential of the node N271. The transistor 2707 has a function of a switch which selects whether to connect the wiring 2710 and the node N272 in accordance with the potential of the wiring 2711. The transistor 2708 has a function of a switch which selects whether to connect the wiring 2710 and the node N271 in accordance with the potential of the wiring 2713.

Note that a two-input NOR circuit in which the node N271 and the wiring 2711 correspond to an input terminal and the node N272 corresponds to an output terminal is constructed from the transistor 2705, the transistor 2706, and the transistor 2707.

Figure 34:
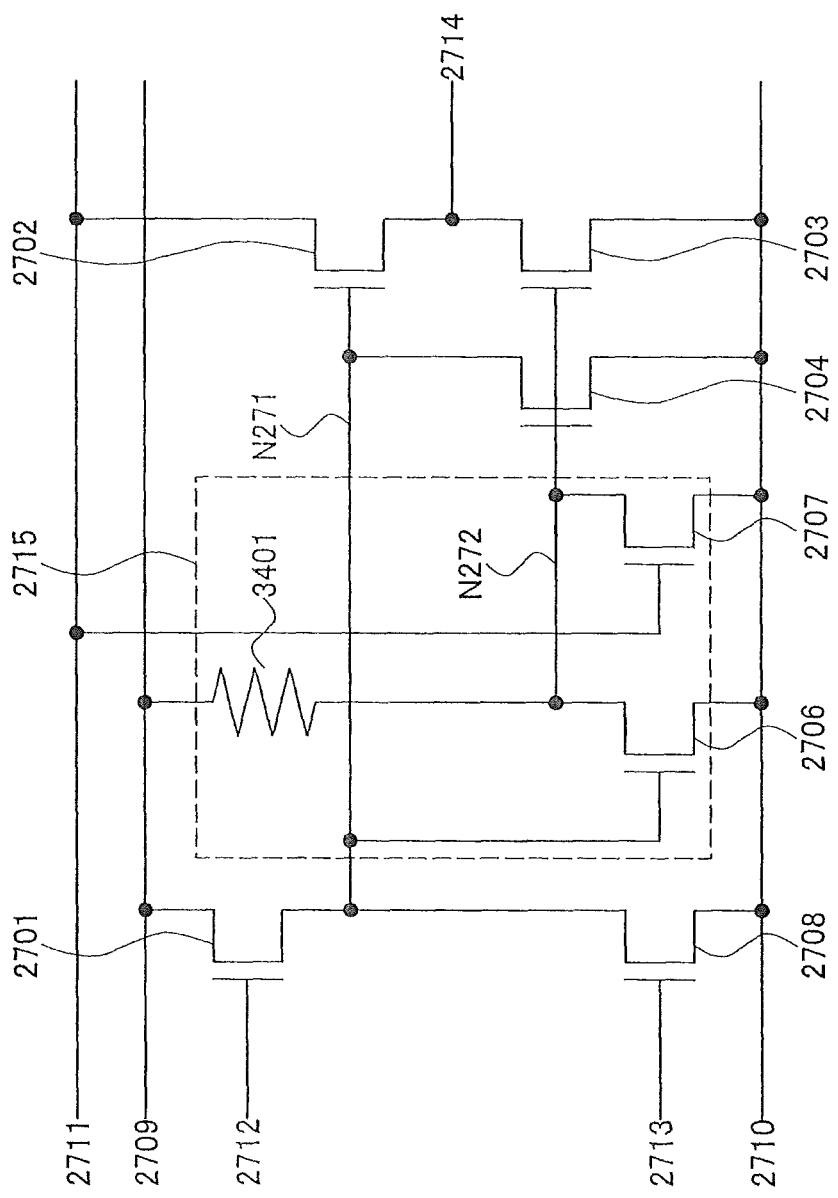
FIG. 34 illustrates Embodiment Mode 5.

Note that the transistor 2705 may be any element as long as it has a resistance component. For example, as shown in FIG. 34, a resistor 3401 can be used instead of the transistor 2705. By using the resistor 3401, the potential of the node N272 can be set equal to the power supply potential VDD.

Figure 35:
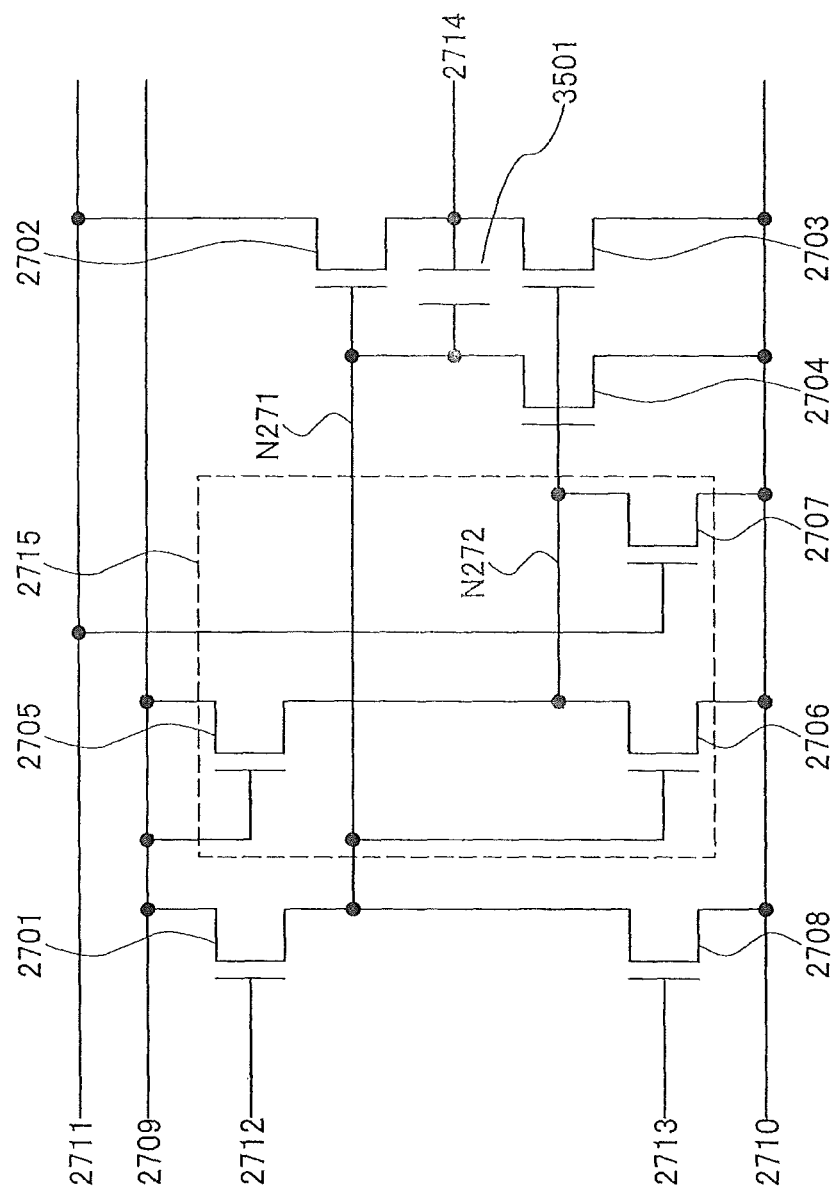
FIG. 35 illustrates Embodiment Mode 5.

Note that as shown in FIG. 35, a capacitor 3501 may be provided between the gate (the node N271) and the second terminal (the wiring 2714) of the transistor 2702. This is because the potential of the node N271 and the potential of the wiring 2714 are raised by the bootstrap operation in the period T2, so that the flip-flop circuit can easily perform the bootstrap operation by proving the capacitor 3501.

Note that it is only necessary that the transistor 2701 make the node N271 into a floating state in the period T1 so that the potential of the node N271 becomes an H level. Therefore, even when the first terminal of the transistor 2701 is connected to the wiring 2712, the transistor 2701 can make the node N271 into a floating state so that the potential of the node N271 becomes an H level.

Figure 44:
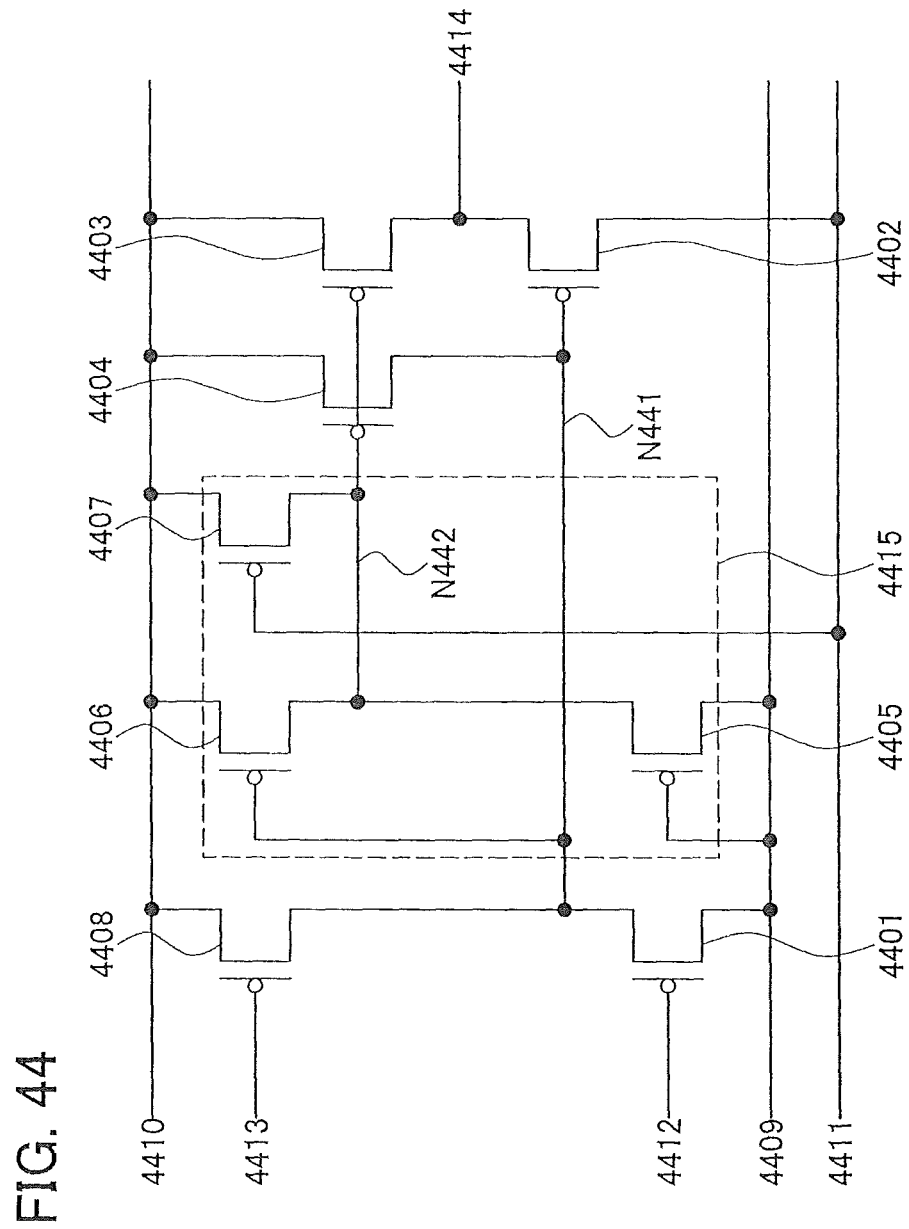
FIG. 44 illustrates Embodiment Mode 5.

Next, the case is described in which the flip-flop circuit shown in FIG. 27 is constructed from P-channel transistors, with reference to FIG. 44.

FIG. 44 is an example of a flip-flop circuit to which the basic circuit in FIG. 13A described in Embodiment Mode 1 is applied. The flip-flop circuit in FIG. 44 includes a transistor 4401, a transistor 4402, a transistor 4403, a transistor 4404, a transistor 4405, a transistor 4406, a transistor 4407, and a transistor 4408.

Note that the transistor 4405 corresponds to the transistor 1301 in FIG. 13A, the transistor 4407 corresponds to the transistor 1302 in FIG. 13A, and the transistor 4406 corresponds to the transistor 1303 in FIG. 13A. In addition, the transistor 4403 and the transistor 4404 correspond to the transistor 1304 in FIG. 13A.

Connection relations of the flip-flop circuit in FIG. 44 are described. Note that a node of a second terminal of the transistor 4401, a second terminal of the transistor 4408, a gate of the transistor 4406, a second terminal of the transistor 4404, and a gate of the transistor 4402 is denoted by N441. In addition, a node of a second terminal of the transistor 4405, a second terminal of the transistor 4406, a second terminal of the transistor 4407, a gate of the transistor 4403, and a gate of the transistor 4404 is denoted by N442.

A gate of the transistor 4401 is connected to a wiring 4412, a first terminal of the transistor 4401 is connected to a wiring 4409, and the second terminal of the transistor 4401 is connected to the node N441. A gate of the transistor 4408 is connected to a wiring 4413, a first terminal of the transistor 4408 is connected to a wiring 4410, and the second terminal of the transistor 4408 is connected to the node N441. A gate of the transistor 4405 is connected to the wiring 4409, a first terminal of the transistor 4405 is connected to the wiring 4409, and the second terminal of the transistor 4405 is connected to the node N442. A gate of the transistor 4406 is connected to the node N441, a first terminal of the transistor 4406 is connected to the wiring 4410, and the second terminal of the transistor 4406 is connected to the node N442. A gate of the transistor 4407 is connected to a wiring 4411, a first terminal of the transistor 4407 is connected to the wiring 4410, and the second terminal of the transistor 4407 is connected to the node 442. The gate of the transistor 4404 is connected to the node N442, a first terminal of the transistor 4404 is connected to the wiring 4410, and the second terminal of the transistor 4404 is connected to the node N441. The gate of the transistor 4403 is connected to the node N442, a first terminal of the transistor 4403 is connected to the wiring 4410, and a second terminal of the transistor 4403 is connected to a wiring 4414. The gate of the transistor 4402 is connected to the node N441, a first terminal of the transistor 4402 is connected to the wiring 4411, and a second terminal of the transistor 4402 is connected to the wiring 4414.

In addition, each of the transistors 4401 to 4408 is a P-channel transistor.

Accordingly, since the flip-flop circuit in FIG. 44 can be formed by using only P-channel transistors, a step of forming N-channel transistors is not necessary. Thus, in the flip-flop circuit in FIG. 44, a manufacturing process can be simplified, so that manufacturing cost can be reduced and a yield can be improved.

In addition, the power supply potential VDD is supplied to the wiring 4410 and the power supply potential VSS is supplied to the wiring 4409. Note that the power supply potential VDD is higher than the power supply potential VSS. Note also that a digital signal, an analog signal, or the like may be supplied to each of the wiring 4409 and the wiring 4410, or another power supply potential may be supplied thereto.

In addition, a signal is supplied to each of the wiring 4411, the wiring 4412, and the wiring 4413. Note that the signal supplied to each of the wiring 4411, the wiring 4412, and the wiring 4413 is a binary digital signal. Note also that the power supply potential VDD, the power supply potential VSS, or another power supply potential may be supplied to each of the wiring 4411, the wiring 4412, and the wiring 4413. Alternatively, an analog signal may be supplied to each of the wiring 4411, the wiring 4412, and the wiring 4413.

Next, operations of the flip-flop circuit shown in FIG. 44 are described with reference to FIG. 45.

Figure 45:
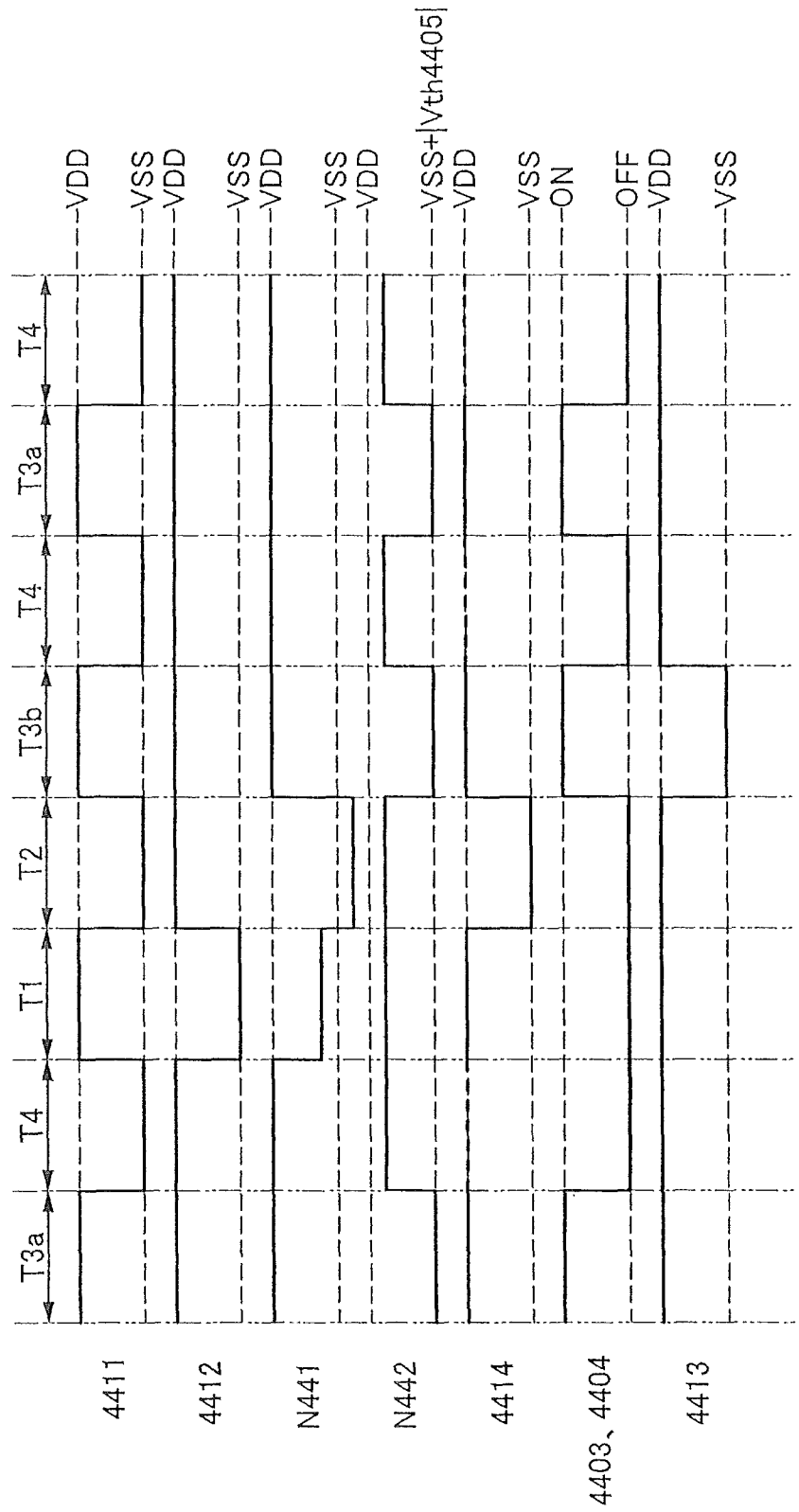
FIG. 45 illustrates Embodiment Mode 5.

FIG. 45 is an example of a timing chart of the flip-flop circuit shown in FIG. 44. The timing chart in FIG. 45 shows a potential of the wiring 4411, a potential of the wiring 4412, a potential of the node N441, a potential of the node N442, a potential of the wiring 4414, a relation of on/off of the transistor 4403 and the transistor 4404, and a potential of the wiring 4413.

The timing chart in FIG. 44 is described by dividing the whole period into periods T1 to T4. In addition, the period T3 is described by dividing the whole period into a period T3a and a period T3b.

Note that the period T3a and the period T4 are sequentially repeated in the periods other than the periods T1, T2, and T3b.

First, an operation in the period T1 is described. In the period T1, an H-level signal is supplied to the wiring 4411, an L-level signal is supplied to the wiring 4412, and an H-level signal is supplied to the wiring 4413.

Accordingly, the transistor 4401 is turned on and the transistor 4408 and the transistor 4407 are turned off. At this time, the power supply potential VSS is supplied to the node N441 through the transistor 4401, so that the potential of the node N441 decreases. In addition, the transistor 4406 is turned on by the decrease in the potential of the node N441, so that the potential of the node N442 rises. Further, the transistor 4403 and the transistor 4404 are turned off by the rise in the potential of the node N442.

Here, the decrease in the potential of the node N441 continues until the transistor 4401 is turned off. The transistor 4401 is turned off when the potential of the node N441 becomes the sum of the power supply potential VSS and the absolute value of a threshold voltage Vth4401 of the transistor 4401 (VSS+|Vth4401|). Therefore, the potential of the node N441 becomes VSS+|Vth4401| In addition, the node N441 becomes a floating state.

Therefore, the transistor 4402 is turned on. In addition, since the H-level signal of the wiring 4411 is supplied to the wiring 4414, the potential of the wiring 4414 becomes equal to the power supply potential VDD.

Next, an operation in the period T2 is described. In the period T2, an L-level signal is supplied to the wiring 4411, an H-level signal is supplied to the wiring 4412, and an H-level signal is supplied to the wiring 4413.

Accordingly, the transistor 4401 is turned off, the transistor 4408 is kept off, and the transistor 4407 is turned on. At this time, the node N441 is in a floating state, and the potential of the node N441 is kept at VSS+|Vth4401|. In addition, the potential of the node N442 remains at an H level because the transistor 4406 and the transistor 4407 are on. Thus, since the node N442 is at the H level, the transistor 4403 and the transistor 4404 are kept off.

Here, the node N441 is in a floating state and kept at an L level. In addition, since the node N441 is kept at the L level, the transistor 4402 is kept on. Further, since the L-level signal of the wiring 4411 is supplied to the wiring 4414, the potential of the wiring 4414 decreases. Therefore, the potential of the node N441 becomes equal to or lower than a value obtained by subtracting the absolute value of a threshold voltage Vth4402 of the transistor 4402 from the power supply potential VSS (VSS−|Vth4402|) by a bootstrap operation, so that the potential of the wiring 4414 becomes equal to the power supply potential VSS.

Next, an operation in the period T3b is described. In the period T3b, an H-level signal is supplied to the wiring 4411, an H-level signal is supplied to the wiring 4412, and an L-level signal is supplied to the wiring 4413.

Accordingly, the transistor 4401 is kept off, the transistor 4408 is turned on, and the transistor 4407 is turned off. At this time, the power supply potential VDD is supplied to the node N441 through the transistor 4408, so that the potential of the node N441 rises. In addition, the transistor 4406 is turned off by the rise in the potential of the node N441, so that the potential of the node N442 decreases. Further, the transistor 4403 and the transistor 4404 are turned on by the decrease in the potential of the node N442.

In addition, the transistor 4402 is turned off by the rise in the potential of the node N441. Therefore, since the power supply potential VDD is supplied to the wiring 4414 through the transistor 4403, the potential of the wiring 4414 becomes equal to the power supply potential VDD.

Next, an operation in the period T4 is described. In the period T4, an L-level signal is supplied to the wiring 4411, an H-level signal is supplied to the wiring 4412, and an H-level signal is supplied to the wiring 4413.

Accordingly, the transistor 4401 is kept off, the transistor 4408 is turned off, and the transistor 4407 is turned on. At this time, the node N441 becomes a floating state, and the potential of the node N441 is kept at the power supply potential VDD. Thus, the transistor 4406 and the transistor 4402 are turned off. In addition, the potential of the node N442 becomes an H level because the power supply potential VDD is supplied thereto through the transistor 4407. Therefore, the transistor 4403 and the transistor 4404 are turned off.

Therefore, the wiring 4414 becomes a floating state, and the potential of the wiring 4414 is kept equal to the power supply potential VDD.

Next, an operation in the period T3a is described. In the period T3a, an H-level signal is supplied to the wiring 4411, an H-level signal is supplied to the wiring 4412, and an H-level signal is supplied to the wiring 4413.

Accordingly, the transistor 4401 and the transistor 4408 are kept off, and the transistor 4407 is turned off. At this time, since the transistor 4407 is turned off, the potential of the node N442 decreases. Thus, the transistor 4403 and the transistor 4404 are turned on. In addition, the power supply potential VDD is supplied to the node N441 through the transistor 4404, so that the potential of the node N441 becomes equal to the power supply potential VDD. Therefore, the transistor 4402 and the transistor 4406 are kept off.

Further, the power supply potential VDD is supplied to the wiring 4414 through the transistor 4403, and the potential of the wiring 4414 is kept equal to the power supply potential VDD.

By the above-described operations, the flip-flop circuit in FIG. 44 keeps the node N441 at an H level to be in a floating state in the period T1. In the period T2, the flip-flop circuit in FIG. 44 sets the potential of the node N441 equal to or lower than VSS−|Vth4402| by the bootstrap operation, so that the potential of the wiring 4414 can be set equal to the power supply potential VSS.

Further, in the period T3a, the flip-flop circuit in FIG. 44 turns on the transistor 4403 and the transistor 4404, and supplies the power supply potential VDD to the wiring 4414 and the node N441. In the period T4, the flip-flop circuit in FIG. 44 turns off the transistor 4403 and the transistor 4404. Therefore, since the flip-flop circuit in FIG. 44 sequentially turns on the transistor 4403 and the transistor 4404, it can suppress characteristic deterioration of the transistor 4403 and the transistor 4404, so that the potential of each of the node N441 and the wiring 4414 can be stably kept equal to the power supply potential VDD.

In addition, the flip-flop circuit in FIG. 44 does not include a transistor which is on in all of the periods T1 to T4. That is, the flip-flop circuit in FIG. 44 does not include a transistor which is always or almost always on. Accordingly, the flip-flop circuit in FIG. 44 can suppress characteristic deterioration of a transistor and a threshold voltage shift due to the characteristic deterioration.

Note that the transistors 4401 to 4408 have functions which are similar to those of the transistors 2701 to 2708.

Note that a two-input NAND circuit in which the node N441 and the wirings 4411 correspond to an input terminal and the node N442 corresponds to an output terminal is constructed from the transistors 4405 to 4407.

Figure 46:
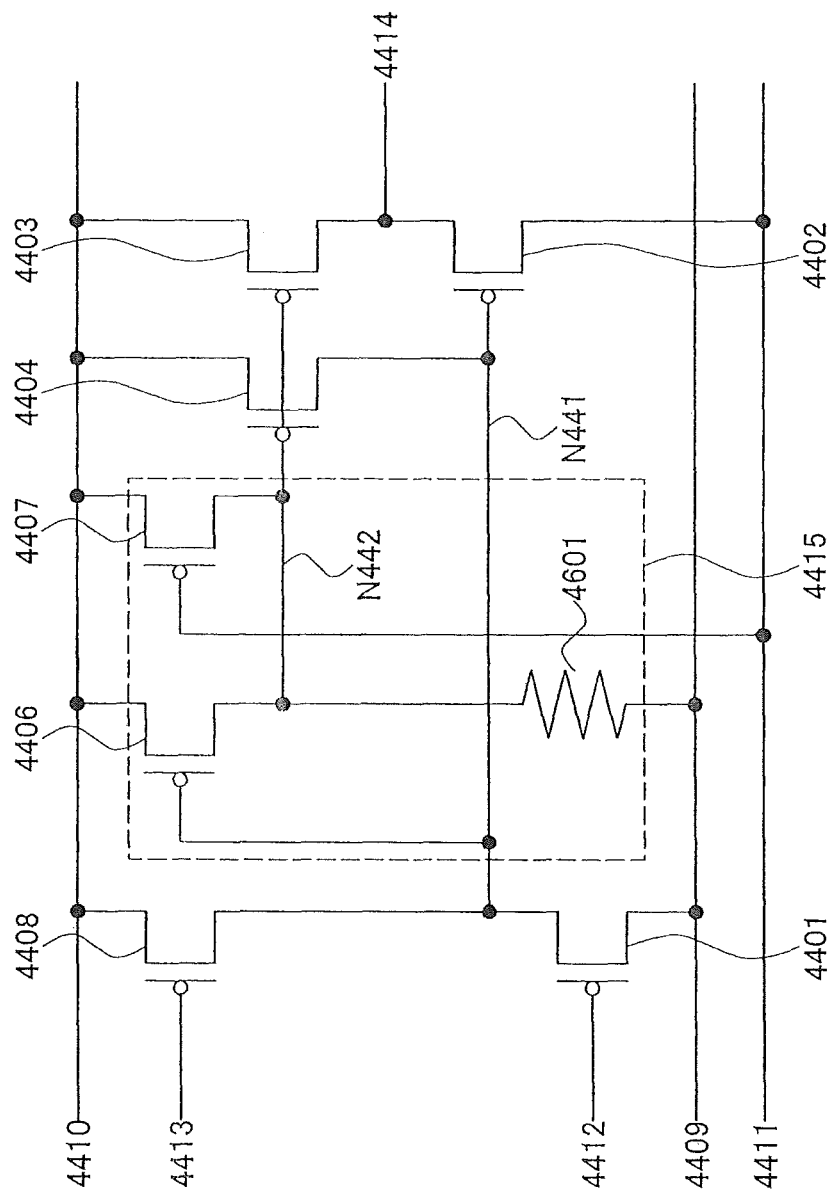
FIG. 46 illustrates Embodiment Mode 5.

Note that the transistor 4405 may be any element as long as it has a resistance component. For example, as shown in FIG. 46, a resistor 4601 can be used instead of the transistor 4405. By using the resistor 4601, the potential of the node N442 can be set equal to the power supply potential VSS.

Figure 47:
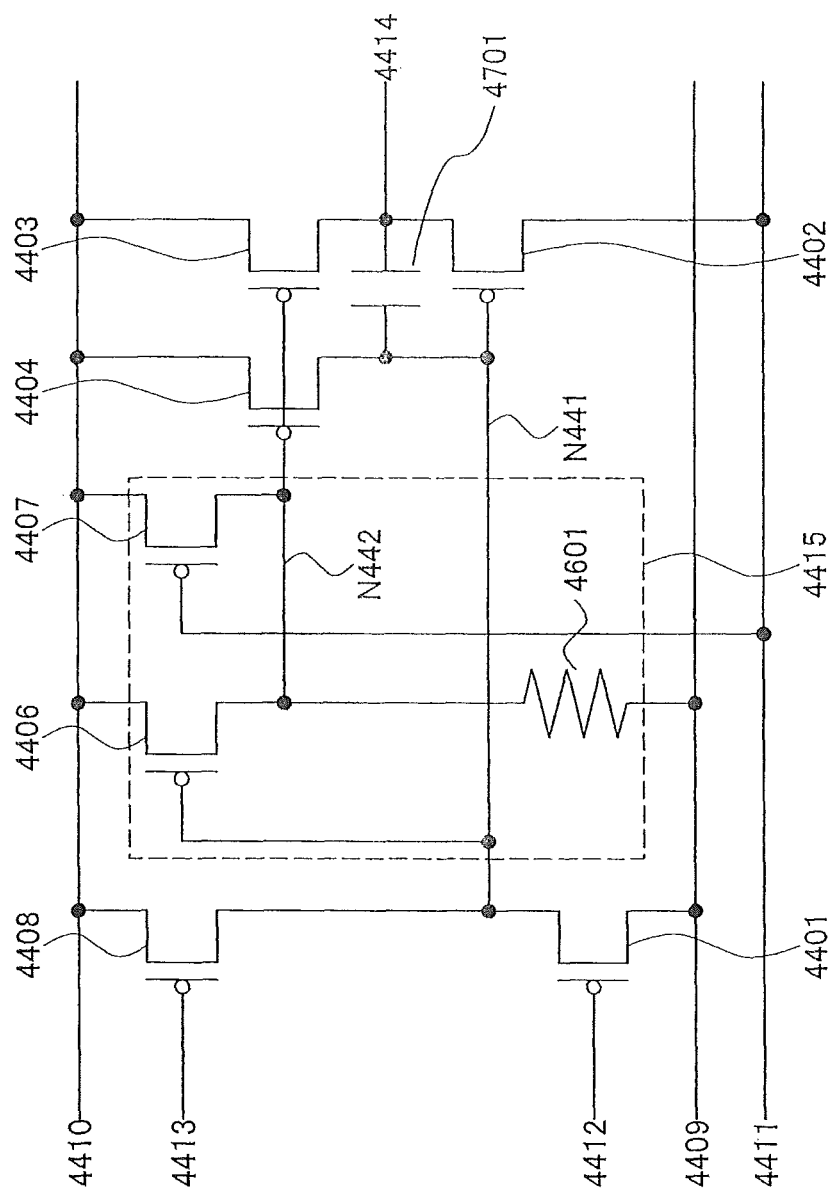
FIG. 47 illustrates Embodiment Mode 5.

Note that as shown in FIG. 47, a capacitor 4701 may be provided between the gate (the node N441) and the second terminal (the wiring 4414) of the transistor 4402. This is because the potential of the node N441 and the potential of the wiring 4414 are raised by the bootstrap operation in the period T2, so that the flip-flop circuit can easily perform the bootstrap operation by proving the capacitor 4701.

Note that it is only necessary that the transistor 4401 make the node N441 into a floating state in the period T1 so that the potential of the node N441 becomes an L level. Therefore, even when the first terminal of the transistor 4401 is connected to the wiring 4412, the transistor 4401 can make the node N441 into a floating state so that the potential of the node N441 becomes an L level.

Note that this embodiment mode can be freely combined with any description in other embodiment modes in this specification. Further, parts of the description in this embodiment mode can be combined with one another.

Embodiment Mode 6

Figure 36:
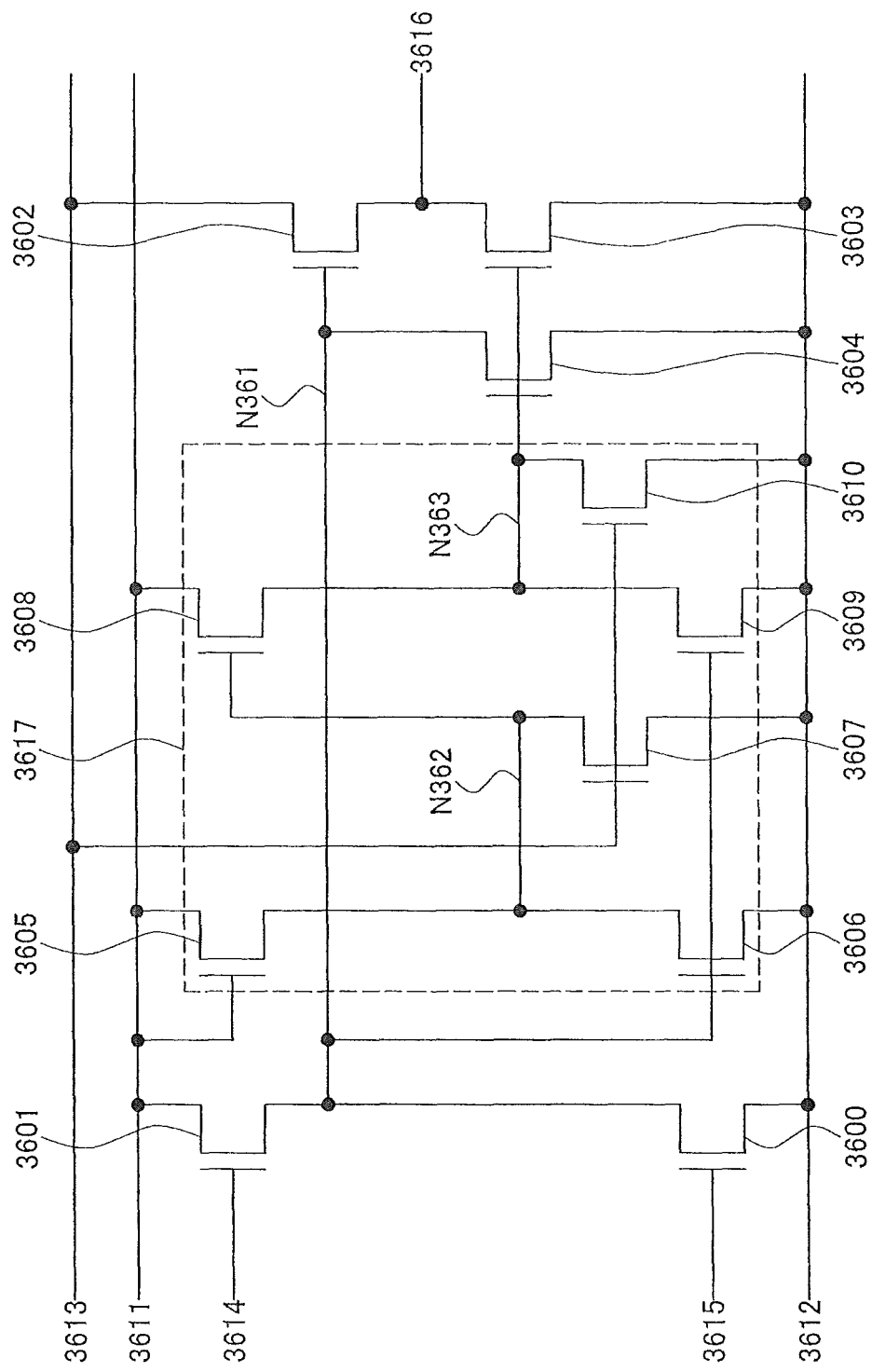
FIG. 36 illustrates Embodiment Mode 6.

In this embodiment mode, the case is described in which the basic circuit described in Embodiment Mode 2 is applied to a flip-flop circuit, with reference to FIG. 36.

FIG. 36 is an example of a flip-flop circuit to which the basic circuit in FIG. 5A described in Embodiment Mode 2 is applied. The flip-flop circuit in FIG. 36 includes a transistor 3600, a transistor 3601, a transistor 3602, a transistor 3603, a transistor 3604, a transistor 3605, a transistor 3606, a transistor 3607, and a transistor 3608, a transistor 3609, and a transistor 3610.

Note that the transistor 3605 corresponds to the transistor 501 in FIG. 5A, the transistor 3607 corresponds to the transistor 502 in FIG. 5A, the transistor 3606 corresponds to the transistor 503 in FIG. 5A, the transistor 3608 corresponds to the transistor 504 in FIG. 5A, and the transistor 3610 corresponds to the transistor 505 in FIG. 5A, and the transistor 3609 corresponds to the transistor 506 in FIG. 5A. In addition, the transistor 3603 and the transistor 3604 correspond to the transistor 507 in FIG. 5A.

Connection relations of the flip-flop circuit in FIG. 36 are described. Note that a node of a second terminal of the transistor 3601, a second terminal of the transistor 3600, a gate of the transistor 3606, a second terminal of the transistor 3604, and a gate of the transistor 3602 is denoted by N361. In addition, a node of a second terminal of the transistor 3605, a second terminal of the transistor 3606, a second terminal of the transistor 3607, and a gate of the transistor 3608 is denoted by N362. Further, a node of a second terminal of the transistor 3609, a second terminal of the transistor 3608, a second terminal of the transistor 3610, a gate of the transistor 3603, and a gate of the transistor 3604 is denoted by N363.

A gate of the transistor 3601 is connected to a wiring 3614, a first terminal of the transistor 3601 is connected to a wiring 3611, and the second terminal of the transistor 3601 is connected to the node N361. A gate of the transistor 3600 is connected to a wiring 3615, a first terminal of the transistor 3600 is connected to a wiring 3612, and the second terminal of the transistor 3600 is connected to the node N361. The gate of the transistor 3606 is connected to the node N361, a first terminal of the transistor 3606 is connected to the wiring 3612, and the second terminal of the transistor 3606 is connected to the node N362. A gate of the transistor 3605 is connected to the wiring 3611, a first terminal of the transistor 3605 is connected to the wiring 3611, and the second terminal of the transistor 3605 is connected to the node N362. A gate of the transistor 3607 is connected to a wiring 3613, a first terminal of the transistor 3607 is connected to the wiring 3612, and the second terminal of the transistor 3607 is connected to the node N362, The gate of the transistor 3608 is connected to the node N362, a first terminal of the transistor 3608 is connected to the wiring 3611, and the second terminal of the transistor 3608 is connected to the node N363. A gate of the transistor 3609 is connected to the node N361, a first terminal of the transistor 3609 is connected to the wiring 3612, and the second terminal of the transistor 3609 is connected to the node N363, A gate of the transistor 3610 is connected to the wiring 3613, a first terminal of the transistor 3610 is connected to the wiring 3612, and the second terminal of the transistor 3610 is connected to the node N363. The gate of the transistor 3604 is connected to the node N363, a first terminal of the transistor 3604 is connected to the wiring 3612, and the second terminal of the transistor 3604 is connected to the node N361. The gate of the transistor 3603 is connected to the node N363, a first terminal of the transistor 3603 is connected to the wiring 3612, and a second terminal of the transistor 3603 is connected to a wiring 3616. The gate of the transistor 3602 is connected to the node N361, a first terminal of the transistor 3602 is connected to the wiring 3613, and a second terminal of the transistor 3602 is connected to the wiring 3616.

In addition, each of the transistors 3600 to 3610 is an N-channel transistor.

Accordingly, since the flip-flop circuit in FIG. 36 can be formed by using only N-channel transistors, amorphous silicon can be used for a semiconductor layer of the flip-flop circuit in FIG. 36. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the flip-flop circuit in FIG. 36, the manufacturing process can also be simplified.

In addition, the power supply potential VDD is supplied to the wiring 3611 and the power supply potential VSS is supplied to the wiring 3612. Note that the power supply potential VDD is higher than the power supply potential VSS. Note also that a digital signal, an analog signal, or the like may be supplied to each of the wiring 3611 and the wiring 3612, or another power supply potential may be supplied thereto.

In addition, a signal is supplied to each of the wiring 3613, the wiring 3614, and the wiring 3615. Note that the signal supplied to each of the wiring 3613, the wiring 3614, and the wiring 3615 is a binary digital signal. Note also that the power supply potential VDD, the power supply potential VSS, or another power supply potential may be supplied to each of the wiring 3613, the wiring 3614, and the wiring 3615. Alternatively, an analog signal may be supplied to each of the wiring 3613, the wiring 3614, and the wiring 3615.

Next, operations of the flip-flop circuit shown in FIG. 36 are described with reference to FIG. 37.

Figure 37:
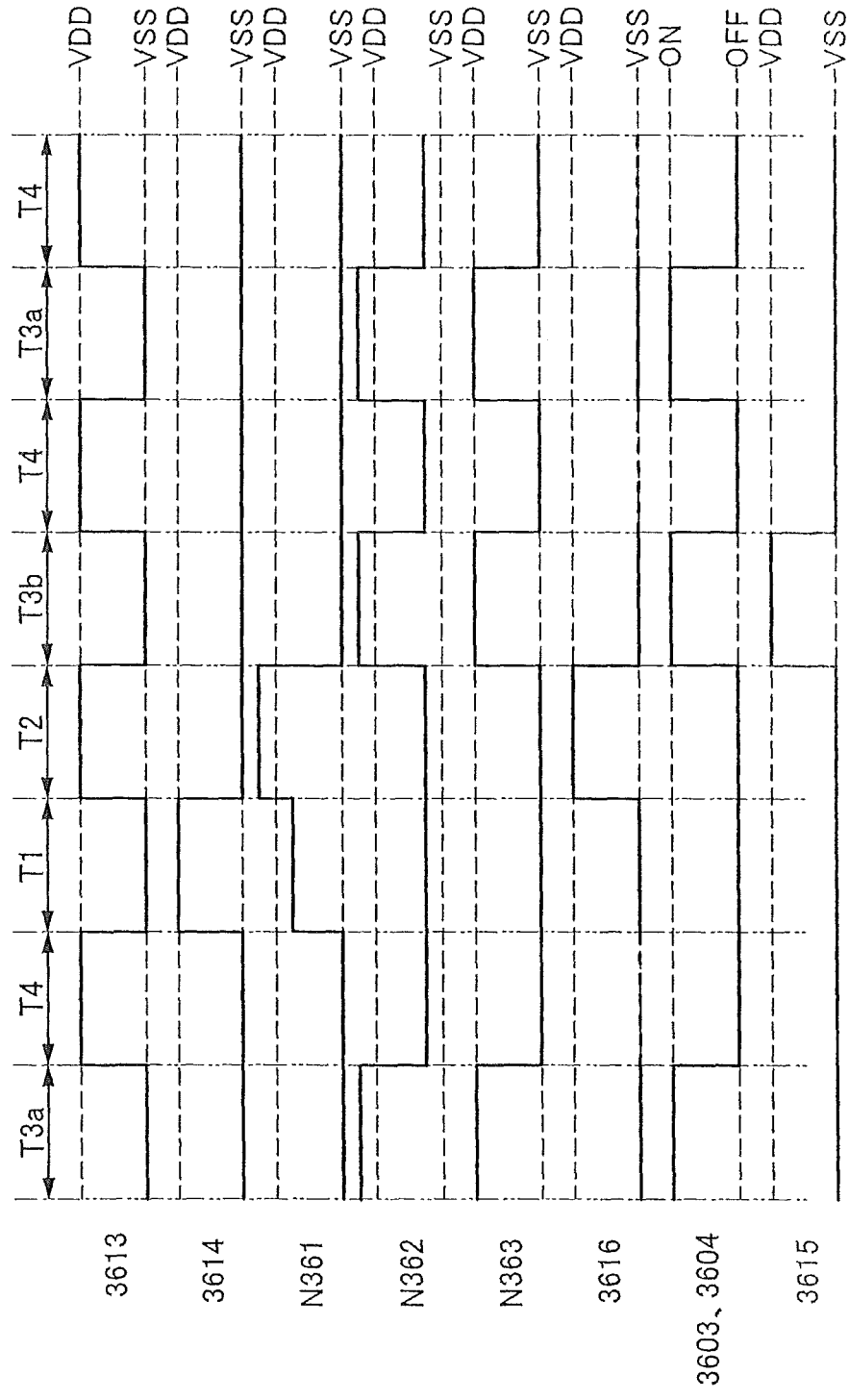
FIG. 37 illustrates Embodiment Mode 6.

FIG. 37 is an example of a timing chart of the flip-flop circuit shown in FIG. 36. The timing chart in FIG. 37 shows a potential of the wiring 3613, a potential of the wiring 3614, a potential of the node N361, a potential of the node N362, a potential of the node N363, a potential of the wiring 3616, a relation of on/off of the transistor 3603 and the transistor 3604, a potential of the wiring 3615.

The timing chart in FIG. 37 is described by dividing the whole period into periods T1 to T4. In addition, the period T3 is described by dividing the whole period into a period T3a and a period T3b.

Note that the period T3a and the period T4 are sequentially repeated in the periods other than the periods T1, T2, and T3b.

First, an operation in the period T1 is described. In the period T1, an L-level signal is supplied to the wiring 3613, an H-level signal is supplied to the wiring 3614, and an L-level signal is supplied to the wiring 3615.

Accordingly, the transistor 3601 is turned on, and the transistor 3600, the transistor 3607, and the transistor 3610 are turned off. At this time, the power supply potential VDD is supplied to the node N361 through the transistor 3601, so that the potential of the node N361 rises. In addition, the transistor 3606 and the transistor 3609 are turned on by the rise in the potential of the node N361, so that the potentials of the node N362 and the node N363 decrease. Further, the transistor 3608 is turned off by the decrease in the potential of the node N362. Moreover, the transistor 3603 and the transistor 3604 are turned off by the decrease in the potential of the node N363.

Here, the rise in the potential of the node N361 continues until the transistor 3601 is turned off. The transistor 3601 is turned off when the potential of the node N361 becomes a value obtained by subtracting a threshold voltage Vth3601 of the transistor 3601 from the power supply potential VDD (VDD−Vth3601). Therefore, the potential of the node N361 becomes VDD−Vth3601. In addition, the node N361 becomes a floating state.

Therefore, the transistor 3602 is turned on. In addition, since the L-level signal of the wiring 3613 is supplied to the wiring 3616, the potential of the wiring 3616 becomes equal to the power supply potential VSS.

Next, an operation in the period T2 is described. In the period T2, an H-level signal is supplied to the wiring 3613, an L-level signal is supplied to the wiring 3614, and an L-level signal is supplied to the wiring 3615.

Accordingly, the transistor 3601 is turned off, the transistor 3600 is kept off, and the transistor 3607 and the transistor 3610 are turned on. At this time, the node N361 is in a floating state, and the potential of the node N361 is kept at VDD−Vth3601. In addition, the potential of the node N362 remains at an L level because the transistor 3606 and the transistor 3607 are on. Further, the potential of the node N363 remains at an L level because the transistor 3609 and the transistor 3610 are on. Thus, since the node N363 is at the L level, the transistor 3603 and the transistor 3604 are kept off.

Here, the node N361 is in a floating state and kept at an H level. In addition, since the node N361 is kept at the H level, the transistor 3602 is kept on. Further, since the H-level signal of the wiring 3613 is supplied to the wiring 3616, the potential of the wiring 3616 rises. Therefore, the potential of the node N361 becomes equal to or higher than the sum of the power supply potential VDD and a threshold voltage Vth3602 of the transistor 3602 (VDD+Vth3602) by a bootstrap operation, so that the potential of the wiring 3616 becomes equal to the power supply potential VDD.

Next, an operation in the period T3b is described. In the period T3b, an L-level signal is supplied to the wiring 3613, an L-level signal is supplied to the wiring 3614, and an H-level signal is supplied to the wiring 3615.

Accordingly, the transistor 3601 is kept off, the transistor 3600 is turned on, and the transistor 3607 and the transistor 3610 are turned off. At this time, the power supply potential VSS is supplied to the node N361 through the transistor 3600, so that the potential of the node N361 decreases. In addition, the transistor 3606 and the transistor 3607 are turned off by the decrease in the potential of the node N361. Therefore, the potentials of the node N362 and the node N363 are raised by a bootstrap operation. The potential of the node N362 rises to be equal to or higher than the sum of the power supply potential VDD and a threshold voltage Vth3608 of the transistor 3608 (VDD+Vth3608). The potential of the node N363 rises to the power supply potential VDD. Therefore, the transistor 3603 and the transistor 3604 are turned on by the rise in the potential of the node N363.

In addition, the transistor 3602 is turned off by the decrease in the potential of the node N361. Therefore, since the power supply potential VSS is supplied to the wiring 3616 through the transistor 3603, the potential of the wiring 3616 becomes equal to the power supply potential VSS.

Next, an operation in the period T4 is described. In the period T4, an H-level signal is supplied to the wiring 3613, an L-level signal is supplied to the wiring 3614, and an L-level signal is supplied to the wiring 3615.

Accordingly, the transistor 3601 is kept off, the transistor 3600 is turned off, and the transistor 3607 and the transistor 3610 are turned on. At this time, the node N361 is in a floating state, and the potential of the node N361 is kept at the power supply potential VSS. Thus, the transistors 3602, 3606, and 3609 are kept off. In addition, the potential of the node N362 becomes an L level because the power supply potential VSS is supplied thereto through the transistor 3607. Further, the potential of the node N363 becomes an L level because the power supply potential VSS is supplied thereto through the transistor 3610. Therefore, the transistor 3603 and the transistor 3604 are turned off.

Therefore, the wiring 3616 becomes a floating state, and the potential of the wiring 3616 is kept equal to the power supply potential VSS.

Next, an operation in the period T3a is described. In the period T3a, an L-level signal is supplied to the wiring 3613, an L-level signal is supplied to the wiring 3614, and an L-level signal is supplied to the wiring 3615.

Accordingly, the transistor 3601 and the transistor 3600 are kept off, and the transistor 3607 and the transistor 3610 are turned off. At this time, the node N361 is in a floating state, and the potential of the node N361 remains at an L level. Thus, the transistors 3602, 3606, and 3609 are kept off. In addition, the potentials of the node N362 and the node N363 are raised by a bootstrap operation. The potential of the node N362 rises to be equal to or higher than the sum of the power supply potential VDD and the threshold voltage Vth3608 of the transistor 3608 (VDD+Vth3608). The potential of the node N363 rises to the power supply potential VDD. Therefore, the transistor 3603 and the transistor 3604 are turned on by the rise in the potential of the node N363.

Therefore, since the power supply potential VSS is supplied to the wiring 3616 through the transistor 3603, the potential of the wiring 3616 is kept equal to the power supply potential VSS.

By the above-described operations, the flip-flop circuit in FIG. 36 keeps the node N361 at an H level to be in a floating state in the period T1. In the period T2, the flip-flop circuit in FIG. 36 sets the potential of the node N361 equal to or higher than VDD+Vth3602 by the bootstrap operation, so that the potential of the wiring 3616 is made equal to the power supply potential VDD.

Further, in the period T3a, the flip-flop circuit in FIG. 36 turns on the transistor 3603 and the transistor 3604, and supplies the power supply potential VSS to the wiring 3616 and the node N361. In the period T4, the flip-flop circuit in FIG. 36 turns off the transistor 3603 and the transistor 3604. Therefore, since the flip-flop circuit in FIG. 36 sequentially turns on the transistor 3603 and the transistor 3604, it can suppress characteristic deterioration of the transistor 3603 and the transistor 3604, so that the potential of each of the node N361 and the wiring 3616 can be stably kept equal to the power supply potential VSS.

In addition, the flip-flop circuit in FIG. 36 can set the potential of the node N363 to be equal to the power supply potential VDD in the periods T3a and T3b. Therefore, even when the characteristics of the transistor 3603 and the transistor 3604 deteriorate, the flip-flop circuit in FIG. 36 can be operated under a wide range of operating conditions.

In addition, the flip-flop circuit in FIG. 36 does not include a transistor which is on in all of the periods T1 to T4. That is, the flip-flop circuit in FIG. 36 does not include a transistor which is always or almost always on. Accordingly, the flip-flop circuit in FIG. 36 can suppress characteristic deterioration of a transistor and a threshold voltage shift due to the characteristic deterioration.

Further, the characteristics of a transistor which is formed of amorphous silicon easily deteriorate. Therefore, when the transistor included in the flip-flop circuit in FIG. 36 is formed using amorphous silicon, not only can the advantages such as a reduction in manufacturing cost and improvement in a yield be obtained, but also the problem of the characteristic deterioration of the transistor can be solved.

Here, the functions of the transistors 3600 to 3610 are described. The transistor 3600 has a function of a switch which selects whether to connect the wiring 3612 and the node N361 in accordance with the potential of the wiring 3615. The transistor 3601 has a function of a switch which selects whether to connect the wiring 3611 and the node N361 in accordance with the potential of the wiring 3614. The transistor 3602 has a function of a switch which selects whether to connect the wiring 3613 and the wiring 3616 in accordance with the potential of the node N361. The transistor 3603 has a function of a switch which selects whether to connect the wiring 3612 and the wiring 3616 in accordance with the potential of the node N363. The transistor 3604 has a function of a switch which selects whether to connect the wiring 3612 and the node N361 in accordance with the potential of the node N363. The transistor 3605 has a function of a diode in which the first terminal and the gate correspond to an input terminal and the second terminal corresponds to an output terminal. The transistor 3606 has a function of a switch which selects whether to connect the wiring 3612 and the node N362 in accordance with the potential of the node N361. The transistor 3607 has a function of a switch which selects whether to connect the wiring 3612 and the node N362 in accordance with the potential of the wiring 3613. The transistor 3608 has a function of a switch which selects whether to connect the wiring 3611 and the node N363 in accordance with the potential of the node N362. The transistor 3609 has a function of a switch which selects whether to connect the wiring 3612 and the node N363 in accordance with the potential of the node N361. The transistor 3610 has a function of a switch which selects whether to connect the wiring 3612 and the node N363 in accordance with the potential of the wiring 3613.

Note that a two-input NOR circuit in which the node N361 and the wiring 3613 correspond to an input terminal and the node N363 corresponds to an output terminal is constructed from the transistors 3605 to 3610.

Figure 38:
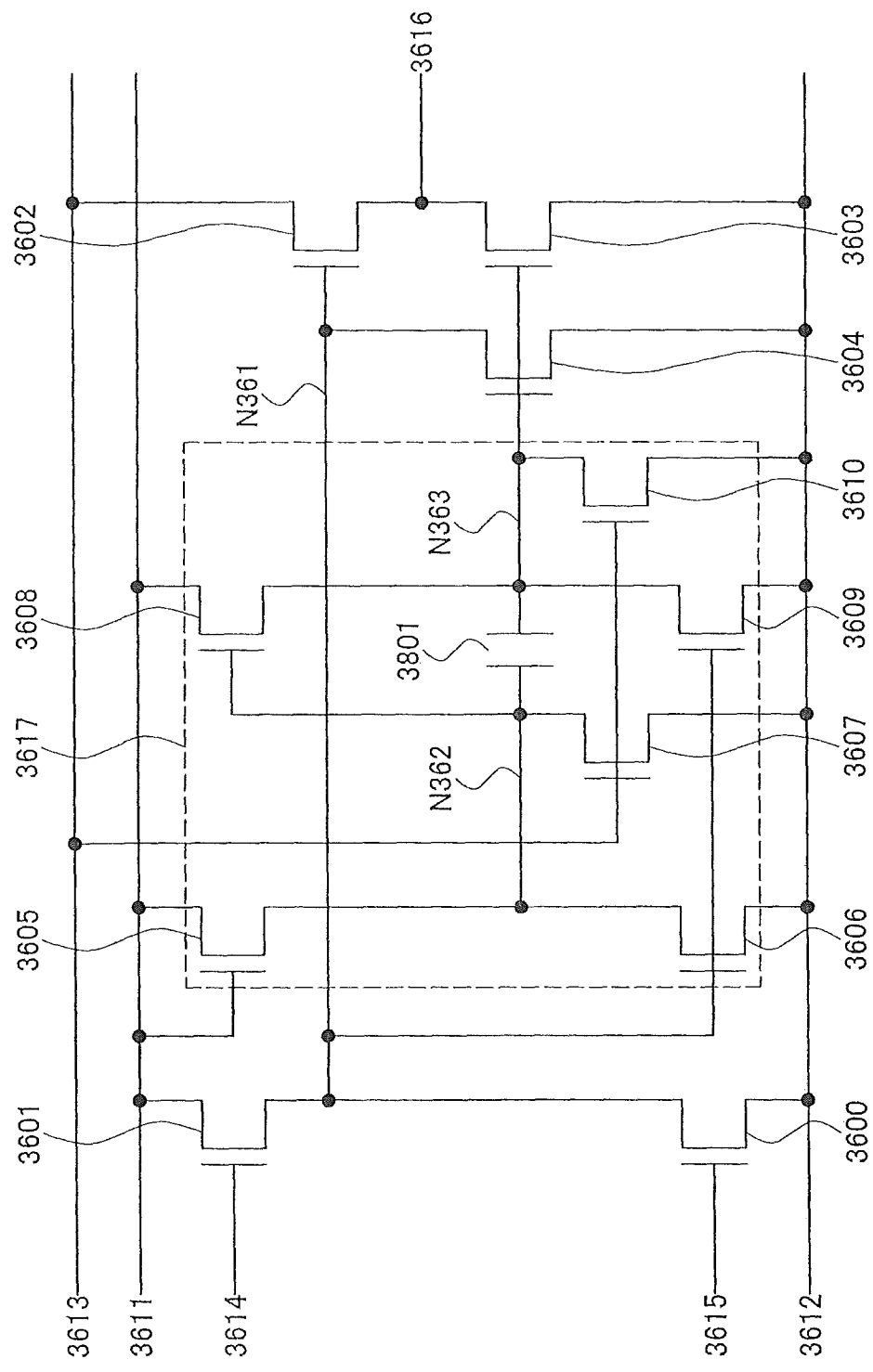
FIG. 38 illustrates Embodiment Mode 6.

Note that as shown in FIG. 38, a capacitor 3801 may be provided between the gate (the node N362) and the second terminal (the node N363) of the transistor 3608. This is because the potential of the node N362 and the potential of the node N363 are raised by the bootstrap operation in the periods T3*a* and T3*b*, so that the flip-flop circuit can easily perform the bootstrap operation by proving the capacitor 3801.

Figure 39:
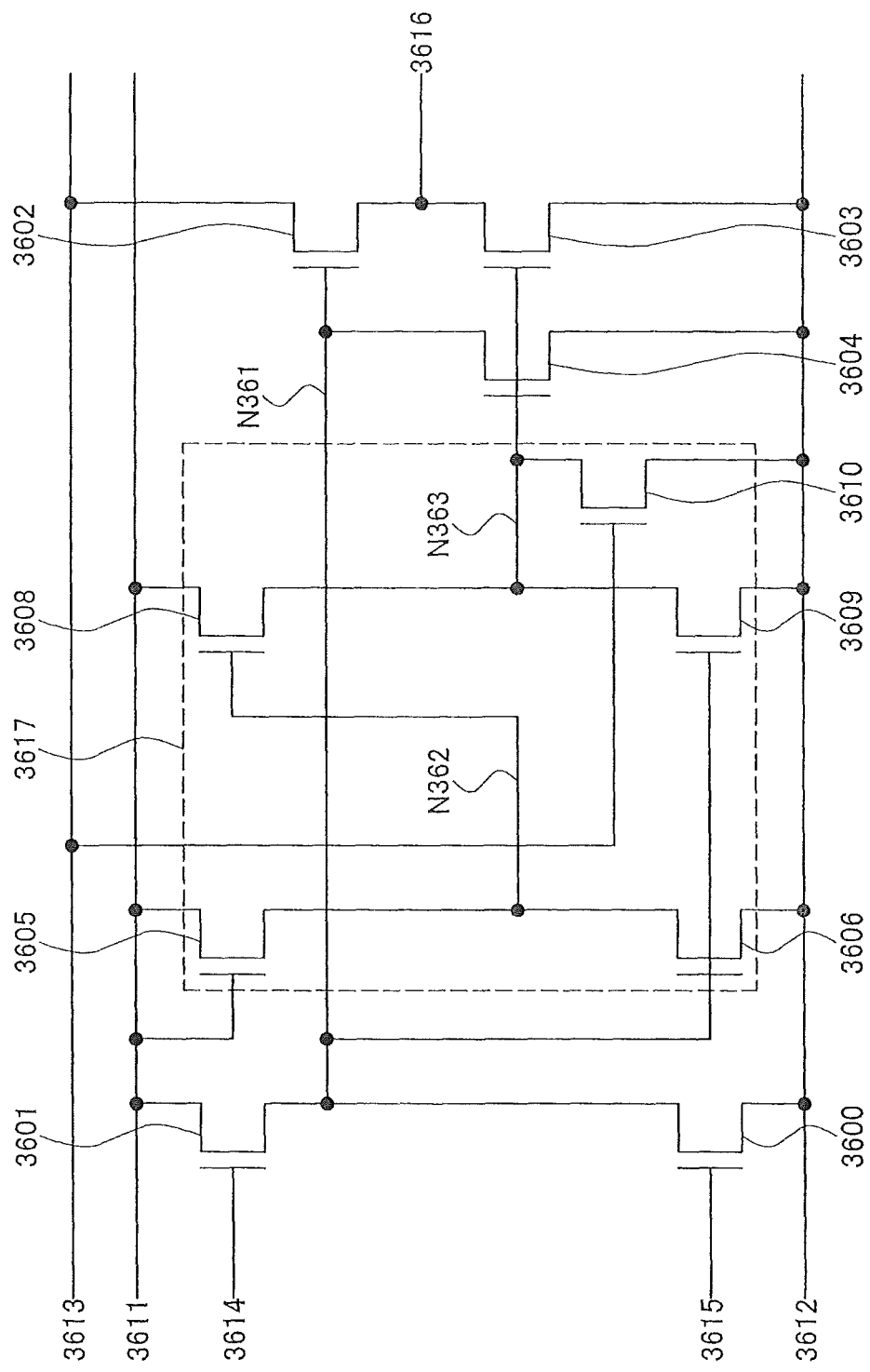
FIG. 39 illustrates Embodiment Mode 6.

Note that as shown in FIG. 39, the transistor 3607 is not necessarily provided.

Figure 40:
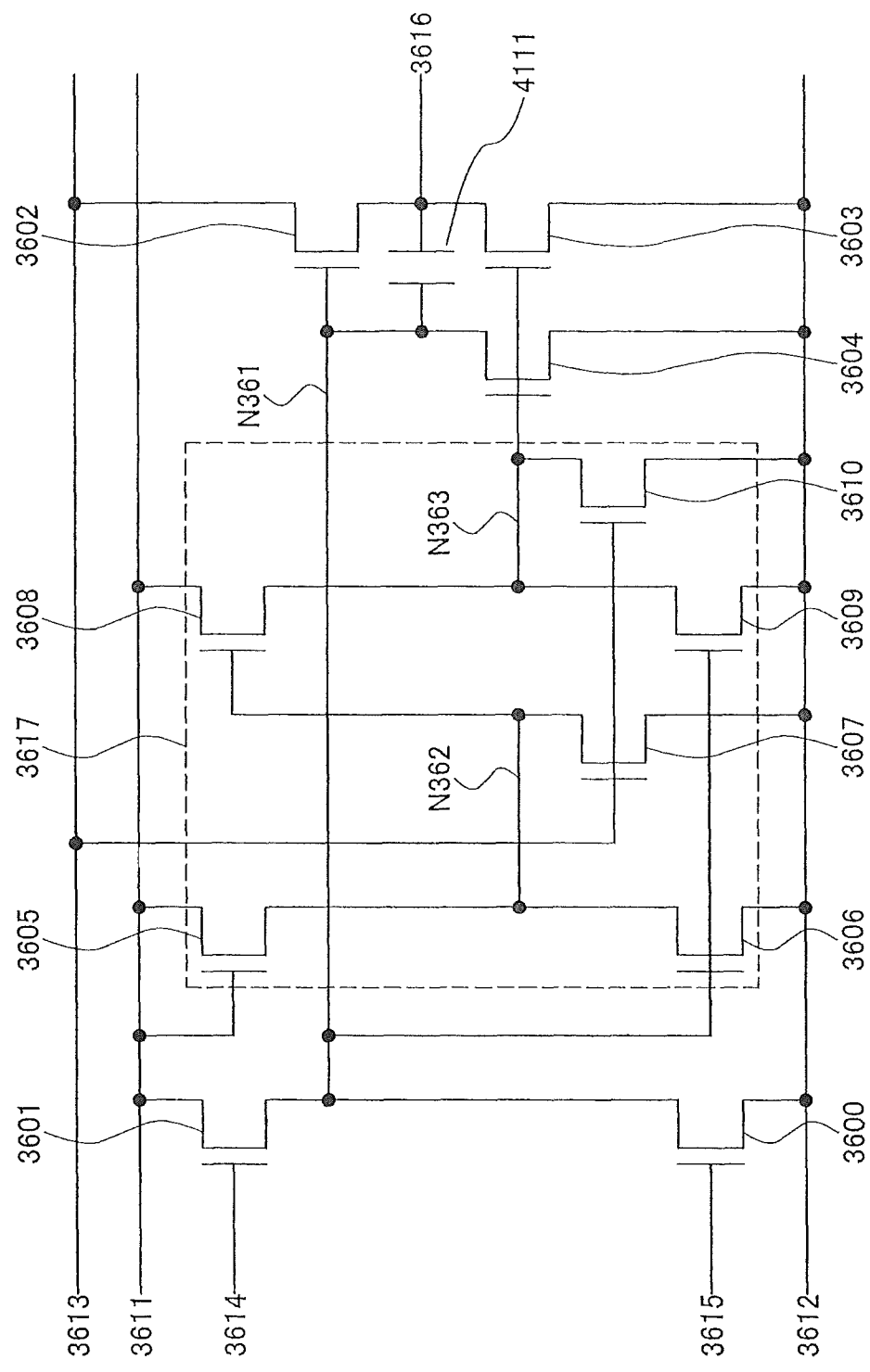
FIG. 40 illustrates Embodiment Mode 6.

Note that as shown in FIG. 40, a capacitor 4111 may be provided between the gate (the node N361) and the second terminal (the wiring 3616) of the transistor 3602. This is because the potential of the node N361 and the potential of the wiring 3616 are raised by the bootstrap operation in the period T2, so that the flip-flop circuit can easily perform the bootstrap operation by proving the capacitor 4111.

Note that it is only necessary that the transistor 3601 make the node N361 into a floating state in the period T1 so that the potential of the node N361 becomes an H level. Therefore, even when the first terminal of the transistor 3601 is connected to the wiring 3614, the transistor 3601 can make the node N361 into a floating state so that the potential of the node N361 becomes an H level.

Figure 48:
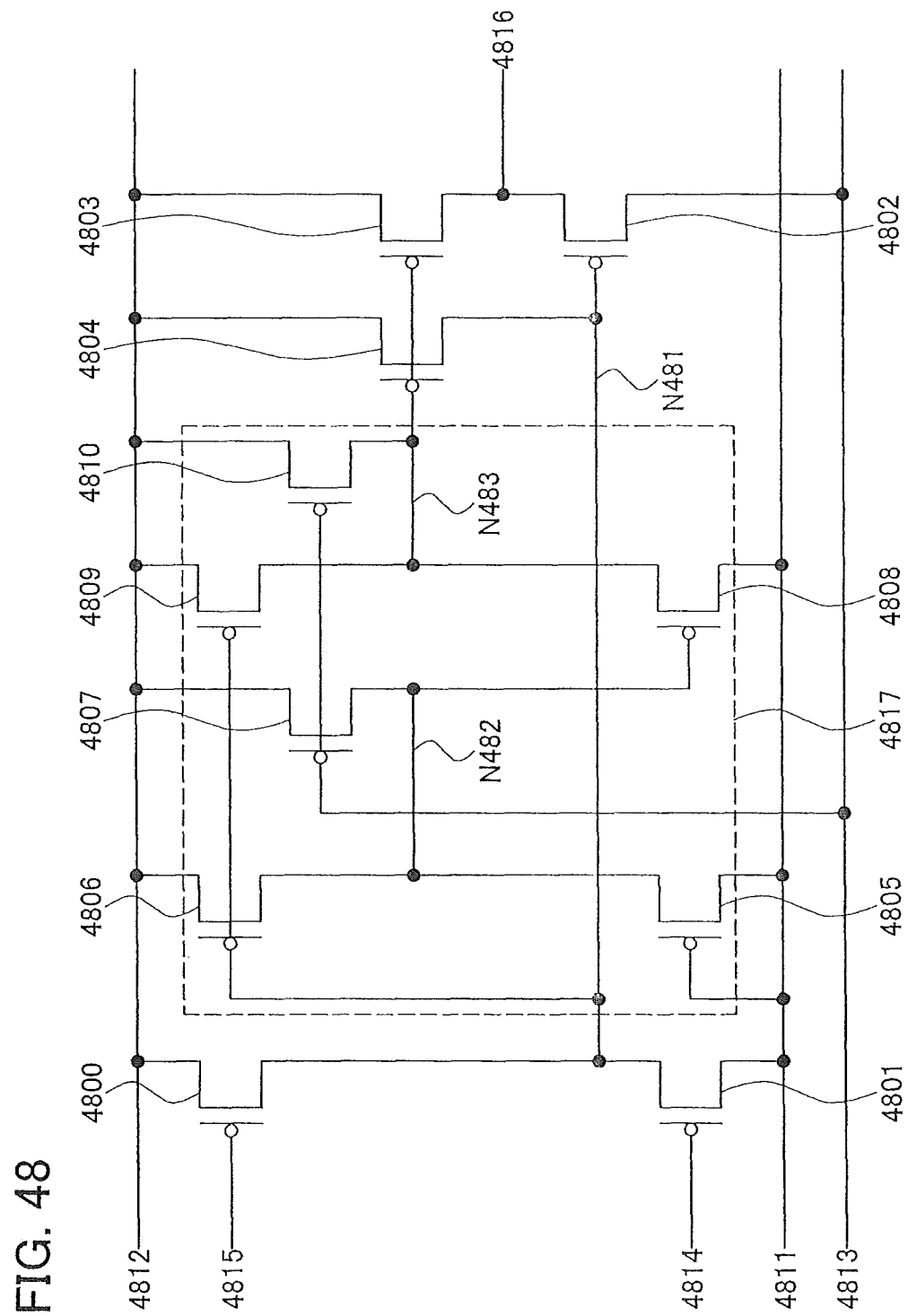
FIG. 48 illustrates Embodiment Mode 6.

Next, the case is described in which the flip-flop circuit shown in FIG. 36 is constructed from P-channel transistors, with reference to FIG. 48.

FIG. 48 is an example of a flip-flop circuit to which the basic circuit in FIG. 17A described in Embodiment Mode 2 is applied. The flip-flop circuit in FIG. 48 includes a transistor 4800, transistor 4801, a transistor 4802, a transistor 4803, a transistor 4804, a transistor 4805, a transistor 4806, a transistor 4807, a transistor 4808, a transistor 4809, and a transistor 4810.

Note that the transistor 4805 corresponds to the transistor 1701 in FIG. 17A, the transistor 4807 corresponds to the transistor 1702 in FIG. 17A, the transistor 4806 corresponds to the transistor 1703 in FIG. 17A, the transistor 4808 corresponds to the transistor 1704 in FIG. 17A, the transistor 4810 corresponds to the transistor 1705 in FIG. 17A, and the transistor 4809 corresponds to the transistor 1706 in FIG. 17A. In addition, the transistor 4803 and the transistor 4804 correspond to the transistor 1707 in FIG. 17A.

Connection relations of the flip-flop circuit in FIG. 48 are described. Note that a node of a second terminal of the transistor 4801, a second terminal of the transistor 4800, a gate of the transistor 4806, a second terminal of the transistor 4804, and a gate of the transistor 4802 is denoted by N481. In addition, a node of a second terminal of the transistor 4805, a second terminal of the transistor 4806, a second terminal of the transistor 4807, and a gate of the transistor 4808 is denoted by N482. Further, a node of a second terminal of the transistor 4809, a second terminal of the transistor 4808, a second terminal of the transistor 4810, a gate of the transistor 4803, and a gate of the transistor 4804 is denoted by N483.

A gate of the transistor 4801 is connected to a wiring 4814, a first terminal of the transistor 4801 is connected to a wiring 4811, and the second terminal of the transistor 4801 is connected to the node N481. A gate of the transistor 4800 is connected to a wiring 4815, a first terminal of the transistor 4800 is connected to a wiring 4812, and the second terminal of the transistor 4800 is connected to the node N481. The gate of the transistor 4806 is connected to the node N481, a first terminal of the transistor 4806 is connected to the wiring 4812, and the second terminal of the transistor 4806 is connected to the node N482. A gate of the transistor 4805 is connected to the wiring 4811, a first terminal of the transistor 4805 is connected to the wiring 4811, and the second terminal of the transistor 4805 is connected to the node N482. A gate of the transistor 4807 is connected to a wiring 4813, a first terminal of the transistor 4807 is connected to the wiring 4812, and the second terminal of the transistor 4807 is connected to the node N482. The gate of the transistor 4808 is connected to the node N482, a first terminal of the transistor 4808 is connected to the wiring 4811, and the second terminal of the transistor 4808 is connected to the node N483. A gate of the transistor 4809 is connected to the node N481, a first terminal of the transistor 4809 is connected to the wiring 4812, and the second terminal of the transistor 4809 is connected to the node N483. A gate of the transistor 4810 is connected to the wiring 4813; a first terminal of the transistor 4810 is connected to the wiring 4812, and the second terminal of the transistor 4810 is connected to the node N483. The gate of the transistor 4804 is connected to the node N483, a first terminal of the transistor 4804 is connected to the wiring 4812, and the second terminal of the transistor 4804 is connected to the node N481. The gate of the transistor 4803 is connected to the node N483, a first terminal of the transistor 4803 is connected to the wiring 4812, and a second terminal of the transistor 4803 is connected to a wiring 4816. The gate of the transistor 4802 is connected to the node N481, a first terminal of the transistor 4802 is connected to the wiring 4813, and a second terminal of the transistor 4802 is connected to the wiring 4816.

In addition, each of the transistors 4800 to 4810 is a P-channel transistor.

Accordingly, since the flip-flop circuit in FIG. 48 can be formed by using only P-channel transistors, a step of forming N-channel transistors is not necessary. Thus, in the flip-flop circuit in FIG. 48, a manufacturing process can be simplified, so that manufacturing cost can be reduced and a yield can be improved.

In addition, the power supply potential VDD is supplied to the wiring 4812 and the power supply potential VSS is supplied to the wiring 4811. Note that the power supply potential VDD is higher than the power supply potential VSS. Note also that a digital signal, an analog signal, or the like may be supplied to each of the wiring 4811 and the wiring 4812, or another power supply potential may be supplied thereto.

In addition, a signal is supplied to each of the wiring 4813, the wiring 4814, and the wiring 4815. Note that the signal supplied to each of the wiring 4813, the wiring 4814, and the wiring 4815 is a binary digital signal. Note also that the power supply potential VDD, the power supply potential VSS, or another power supply potential may be supplied to each of the wiring 4813, the wiring 4814, and the wiring 4815. Alternatively, an analog signal may be supplied to each of the wiring 4813, the wiring 4814, and the wiring 4815.

Next, operations of the flip-flop circuit shown in FIG. 48 are described with reference to FIG. 49.

Figure 49:
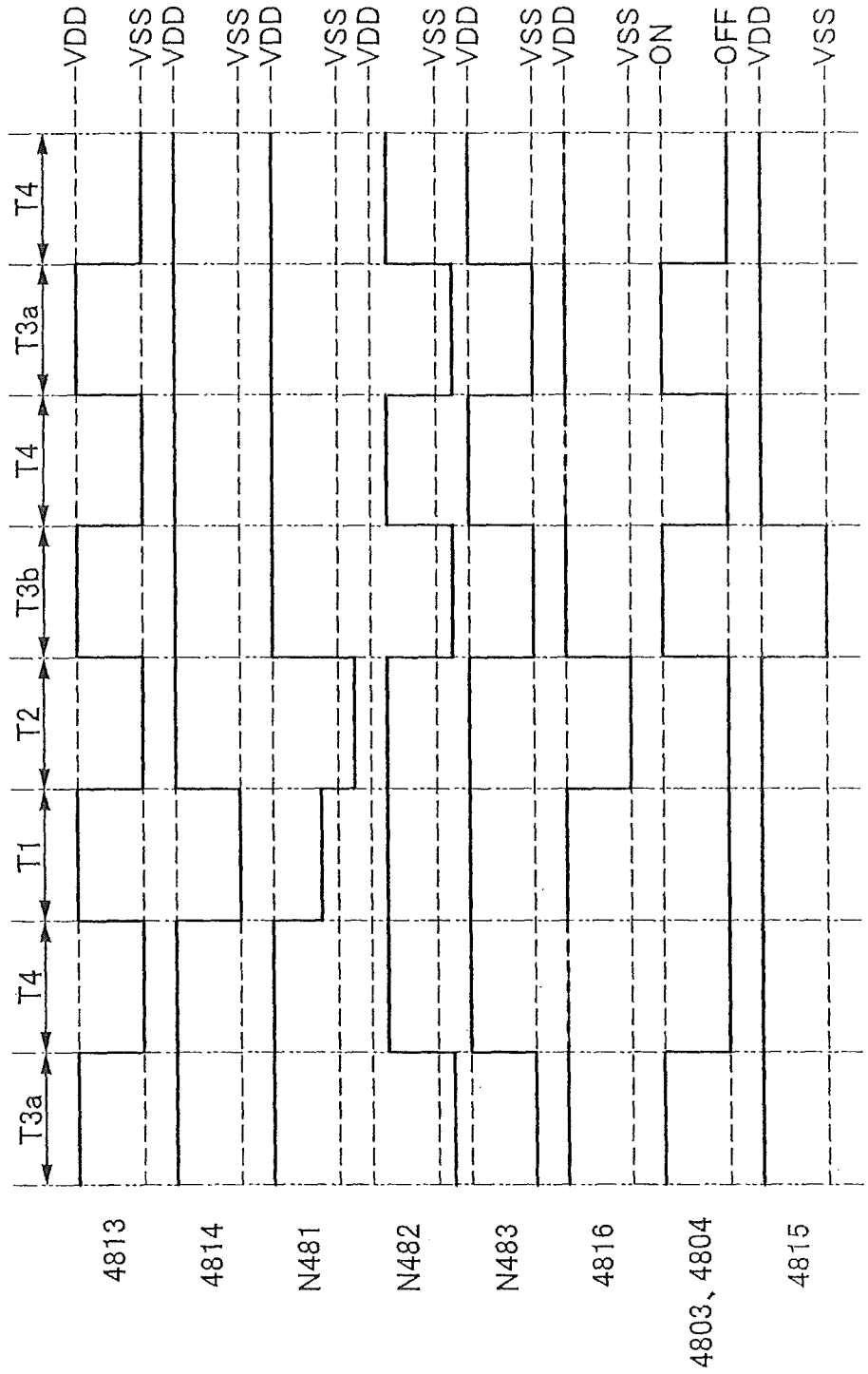
FIG. 49 illustrates Embodiment Mode 6.

FIG. 49 is an example of a timing chart of the flip-flop circuit shown in FIG. 48. The timing chart in FIG. 49 shows a potential of the wiring 4813, a potential of the wiring 4814, a potential of the node N481, a potential of the node N482, a potential of the node N483, a potential of the wiring 4816, a relation of on/off of the transistor 4803 and the transistor 4804, and a potential of the wiring 4815.

The timing chart in FIG. 48 is described by dividing the whole period into periods T1 to T4. In addition, the period T3 is described by dividing the whole period into a period T3*a* and a period T3*b*.

Note that the period T3*a* and the period T4 are sequentially repeated in the periods other than the periods T1, T2, and T3*b*.

First, an operation in the period T1 is described. In the period T1, an H-level signal is supplied to the wiring 4813, an L-level signal is supplied to the wiring 4814, and an H-level signal is supplied to the wiring 4815.

Accordingly, the transistor 4801 is turned on, and the transistors 4800, 4807, and 4810 are turned off. At this time, the power supply potential VSS is supplied to the node N481 through the transistor 4801, so that the potential of the node N481 decreases. In addition, the transistor 4806 and the transistor 4809 are turned on by the decrease in the potential of the node N481, so that the potential of the node N482 and the potential of the node N483 rise. Further, the transistor 4808 is turned off by the rise in the potential of the node N482. Moreover, the transistor 4803 and the transistor 4804 are turned off by the rise in the potential of the node N483.

Here, the decrease in the potential of the node N481 continues until the transistor 4801 is turned off. The transistor 4801 is turned off when the potential of the node N481 becomes the sum of the power supply potential VSS and the absolute value of a threshold voltage Vth4801 of the transistor 4801 (VSS+|Vth4801|). Therefore, the potential of the node N481 becomes VSS+|Vth4801|, so that the node N481 becomes a floating state.

Therefore, the transistor 4802 is turned on. In addition, since the H-level signal of the wiring 4813 is supplied to the wiring 4816, the potential of the wiring 4816 becomes equal to the power supply potential VDD.

Next, an operation in the period T2 is described. In the period T2, an L-level signal is supplied to the wiring 4813, an H-level signal is supplied to the wiring 4814, and an H-level signal is supplied to the wiring 4815.

Accordingly, the transistor 4801 is turned off, the transistor 4800 is kept off, and the transistor 4807 and the transistor 4810 are turned on. At this time, the node N481 is in a floating state, and the potential of the node N481 is kept at VSS+|Vth4801|. In addition, the potential of the node N482 remains at an H level because the transistor 4806 and the transistor 4807 are on. Further, the potential of the node N483 remains at an H level because the transistor 4809 and the transistor 4810 are on. Thus, since the node N483 is at the H level, the transistor 4803 and the transistor 4804 are kept off.

Here, the node N481 is in a floating state and kept at an L level. In addition, since the node N481 is kept at the L level, the transistor 4802 is kept on. Further, since the L-level signal of the wiring 4813 is supplied to the wiring 4816, the potential of the wiring 4816 decreases. Therefore, the potential of the node N481 becomes equal to or lower than a value obtained by subtracting the absolute value of a threshold voltage Vth4802 of the transistor 4802 from the power supply potential VSS (VSS−|Vth4802|) by a bootstrap operation, so that the potential of the wiring 4816 becomes equal to the power supply potential VSS.

Next, an operation in the period T3b is described. In the period T3b, an H-level signal is supplied to the wiring 4813, an H-level signal is supplied to the wiring 4814, and an L-level signal is supplied to the wiring 4815.

Accordingly, the transistor 4801 is kept off, the transistor 4800 is turned on, and the transistor 4807 and the transistor 4810 are turned off. At this time, the power supply potential VDD is supplied to the node N481 through the transistor 4800, so that the potential of the node N481 rises. In addition, the transistor 4806 and the transistor 4807 are turned off by the rise in the potential of the node N481. Therefore, the potential of the node N482 and the potential of the node N483 are decreased by a bootstrap operation. The potential of the node N482 decreases to a value equal to or lower than a value obtained by subtracting the absolute value of a threshold voltage Vth4808 of the transistor 4808 from the power supply potential VSS (VSS−|Vth4808|). The potential of the node N483 decreases to the power supply potential VSS, Therefore, the transistor 4803 and the transistor 4804 are turned on by the decrease in the potential of the node N483.

In addition, the transistor 4802 is turned off by the rise in the potential of the node N481. Therefore, since the power supply potential VDD is supplied to the wiring 4816 through the transistor 4803, the potential of the wiring 4816 becomes equal to the power supply potential VDD.

Next, an operation in the period T4 is described. In the period T4, an L-level signal is supplied to the wiring 4813, an H-level signal is supplied to the wiring 4814, and an H-level signal is supplied to the wiring 4815.

Accordingly, the transistor 4801 is kept off, the transistor 4800 is turned off, and the transistor 4807 and the transistor 4810 are turned on. At this time, the node N481 is in a floating state, and the potential of the node N481 is kept at the power supply potential VDD. Thus, the transistor 4802, the transistor 4806, and the transistor 4809 are kept off. In addition, the potential of the node N482 becomes an H level because the power supply potential VDD is supplied thereto through the transistor 4807. Therefore, the transistor 4808 is turned off. Further, the potential of the node N483 becomes an H level because the power supply potential VDD is supplied thereto through the transistor 4810. Therefore, the transistor 4803 and the transistor 4804 are turned off.

Therefore, the wiring 4816 becomes a floating state, and the potential of the wiring 4816 is kept equal to the power supply potential VDD.

Next, an operation in the period T3a is described. In the period T3a, an H-level signal is supplied to the wiring 4813, an H-level signal is supplied to the wiring 4814, and an H-level signal is supplied to the wiring 4815.

Accordingly, the transistor 4801 and the transistor 4800 are kept off, and the transistor 4807 and the transistor 4810 are turned off. At this time, the node N481 is in a floating state, and the potential of the node N481 is kept at the H level. Thus, the transistor 4802, the transistor 4806, and the transistor 4809 are kept off. Therefore, the potential of the node N482 and the potential of the node N483 are decreased by a bootstrap operation. The potential of the node N482 decreases to be equal to or lower than the value obtained by subtracting the absolute value of the threshold voltage Vth4808 of the transistor 4808 from the power supply potential VSS (VSS−|Vth4808|). The potential of the node N483 decreases to the power supply potential VSS. Therefore, the transistor 4803 and the transistor 4804 are turned on by the decrease in the potential of the node N483.

Further, since the power supply potential VDD is supplied to the wiring 4816 through the transistor 4803, the potential of the wiring 4816 is kept equal to the power supply potential VDD.

By the above-described operations, the flip-flop circuit in FIG. 48 keeps the node N481 at an L level to be in a floating state in the period T1. In the period T2, the flip-flop circuit in FIG. 48 sets the potential of the node N481 equal to or lower than VSS−|Vth4802| by the bootstrap operation, so that the potential of the wiring 4816 is made equal to the power supply potential VSS.

Further, in the period T3a, the flip-flop circuit in FIG. 48 turns on the transistor 4803 and the transistor 4804, and supplies the power supply potential VDD to the wiring 4816 and the node N481. In the period T4, the flip-flop circuit in FIG. 48 turns off the transistor 4803 and the transistor 4804.

Therefore, since the flip-flop circuit in FIG. 48 sequentially turns on the transistor 4803 and the transistor 4804, it can suppress characteristic deterioration of the transistor 4803 and the transistor 4804, so that the potential of each of the node N481 and the wiring 4816 can be stably kept equal to the power supply potential VDD.

In addition, the flip-flop circuit in FIG. 48 can set the potential of the node N483 equal to the power supply potential VSS in the periods 13a and T3b. Therefore, even when characteristics of the transistor 4803 and the transistor 4804 deteriorate, the flip-flop circuit in FIG. 48 can be operated under a wide range of operating conditions.

In addition, the flip-flop circuit in FIG. 48 does not include a transistor which is on in all of the periods T1 to T4. That is, the flip-flop circuit in FIG. 48 does not include a transistor which is always or almost always on. Accordingly, the flip-flop circuit in FIG. 48 can suppress characteristic deterioration of a transistor and a threshold voltage shift due to the characteristic deterioration.

Note that the transistors 4801 to 4810 have functions which are similar to those of the transistors 3601 to 3610.

Note that a two-input NAND circuit in which the node N481 and the wiring 4813 correspond to an input terminal and the node N483 corresponds to an output terminal is constructed from the transistors 4805 to 4810.

Figure 50:
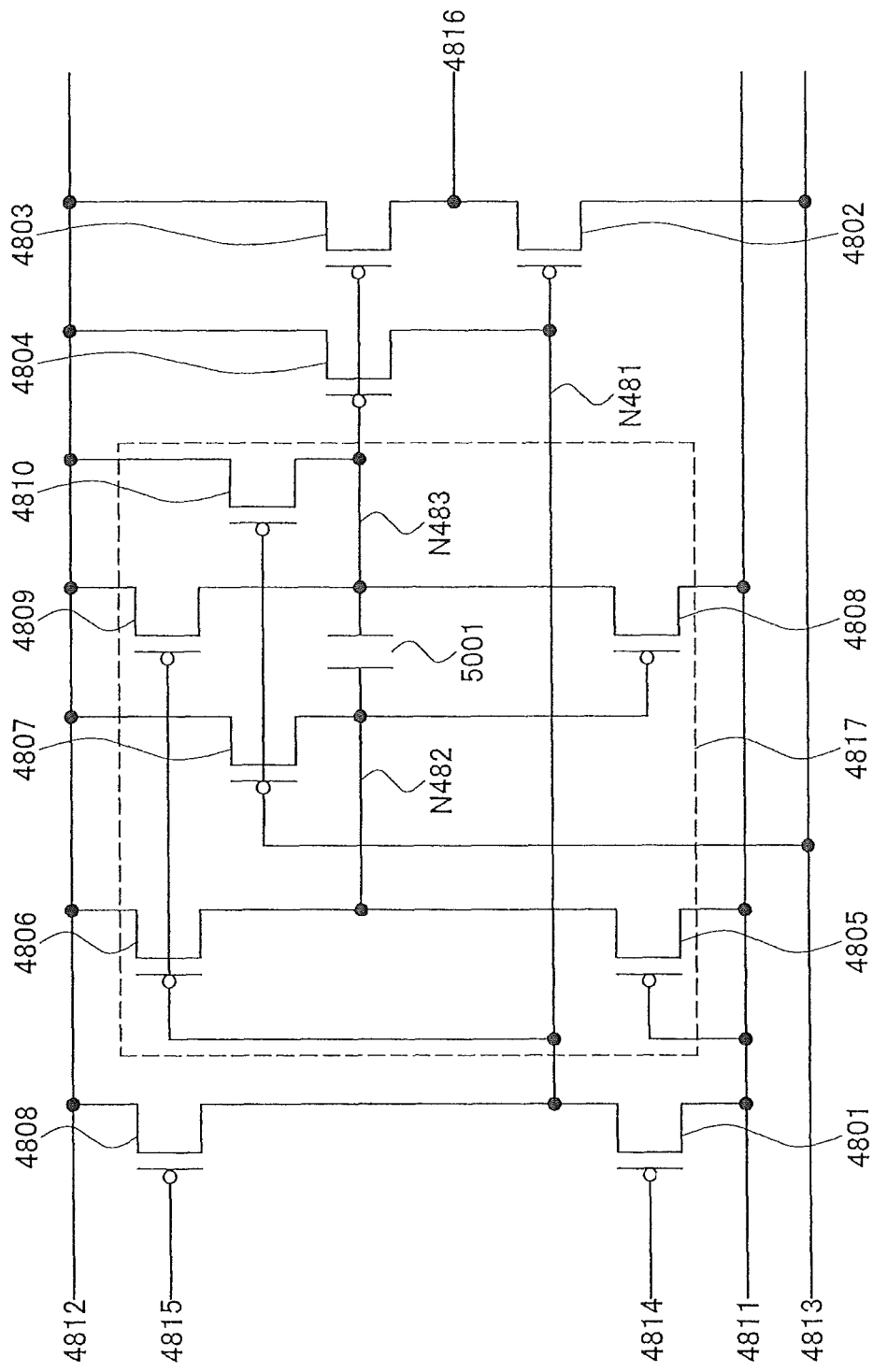
FIG. 50 illustrates Embodiment Mode 6.

Note that as shown in FIG. 50, a capacitor 5001 may be provided between the gate (the node N482) and the second terminal (the node N483) of the transistor 4808. This is because the potential of the node N482 and the potential of the node N483 are decreased by the bootstrap operation in the periods T3a and T3b, so that the flip-flop circuit can easily perform the bootstrap operation by proving the capacitor 5001.

Figure 51:
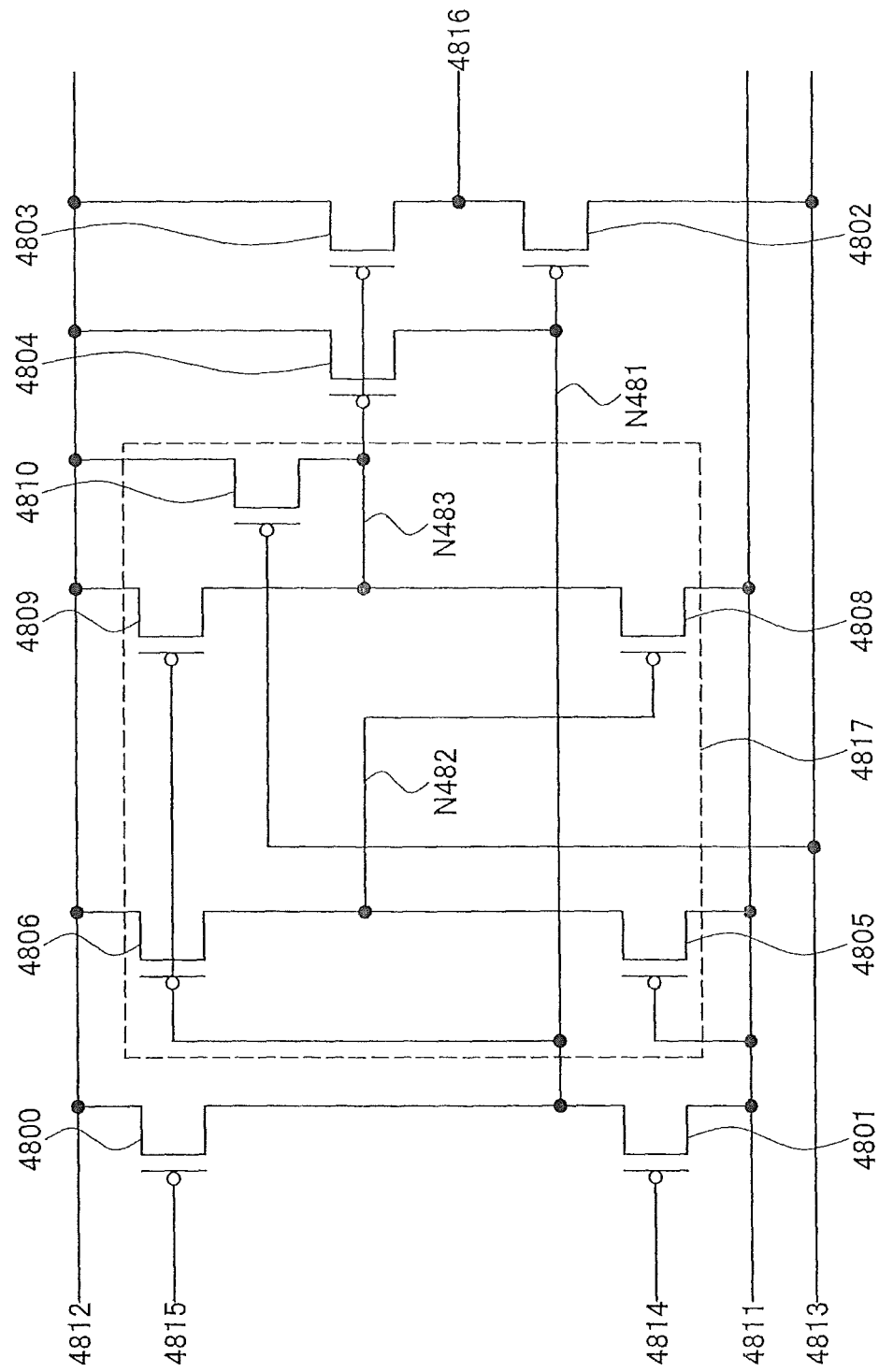
FIG. 51 illustrates Embodiment Mode 6.

Note that as shown in FIG. 51, the transistor 4807 is not necessarily provided.

Figure 52:
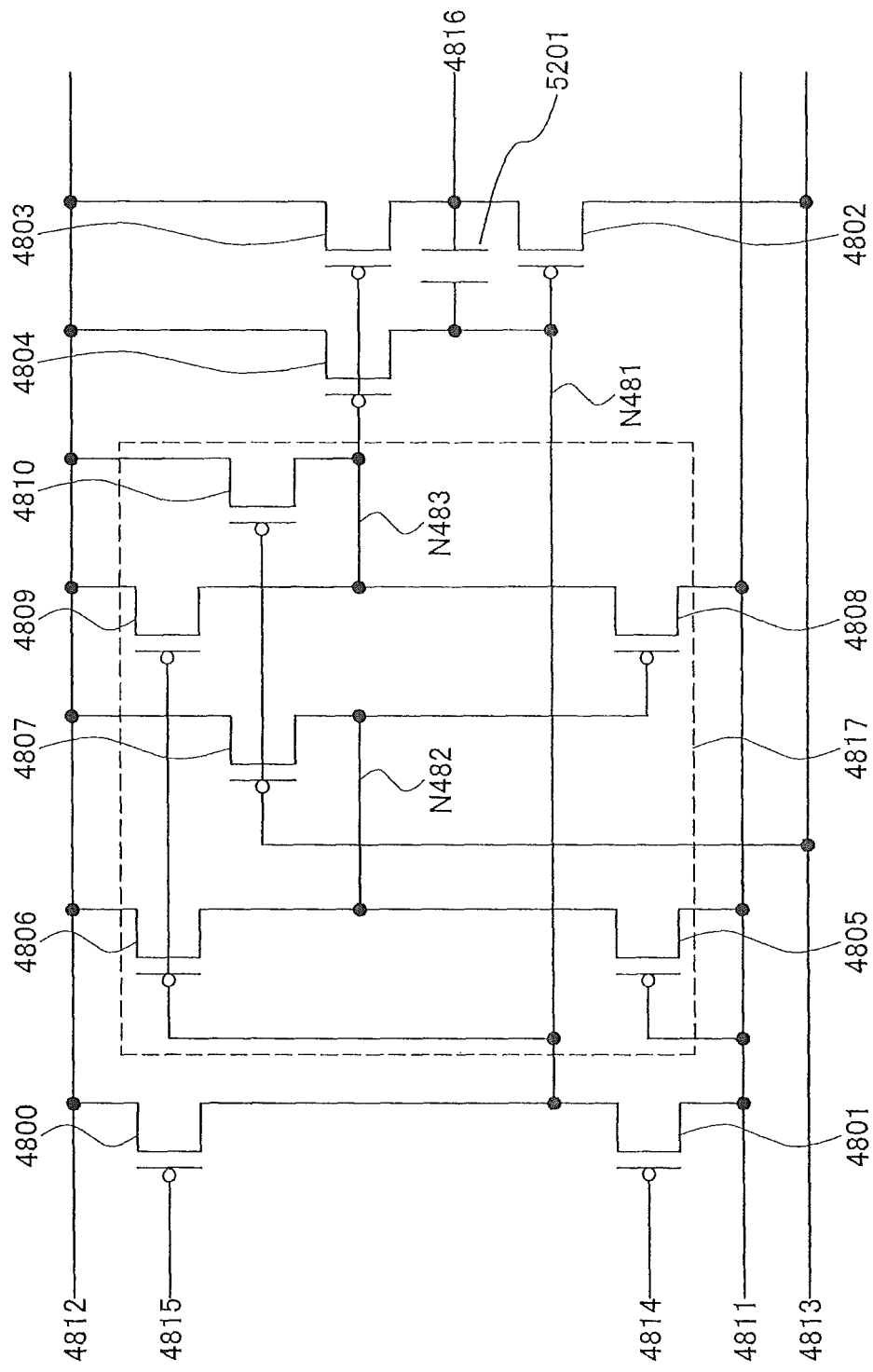
FIG. 52 illustrates Embodiment Mode 6.

Note that as shown in FIG. 52, a capacitor 5201 may be provided between the gate (the node N481) and the second terminal (the wiring 4816) of the transistor 4802. This is because the potential of the node N481 and the potential of the wiring 4816 are raised by the bootstrap operation in the period T2, so that the flip-flop circuit can easily perform the bootstrap operation by proving the capacitor 5201.

Note that it is only necessary that the transistor 4801 make the node N481 into a floating state in the period T1 so that the potential of the node N481 becomes an L level. Therefore, even when the first terminal of the transistor 4801 is connected to the wiring 4814, the transistor 4801 can set the node N481 into a floating state so that the potential of the node N481 becomes an L level.

Note that this embodiment mode can be freely combined with any description in other embodiment modes in this specification. Further, parts of the description in this embodiment mode can be combined with one another.

Embodiment Mode 7

Figure 56:
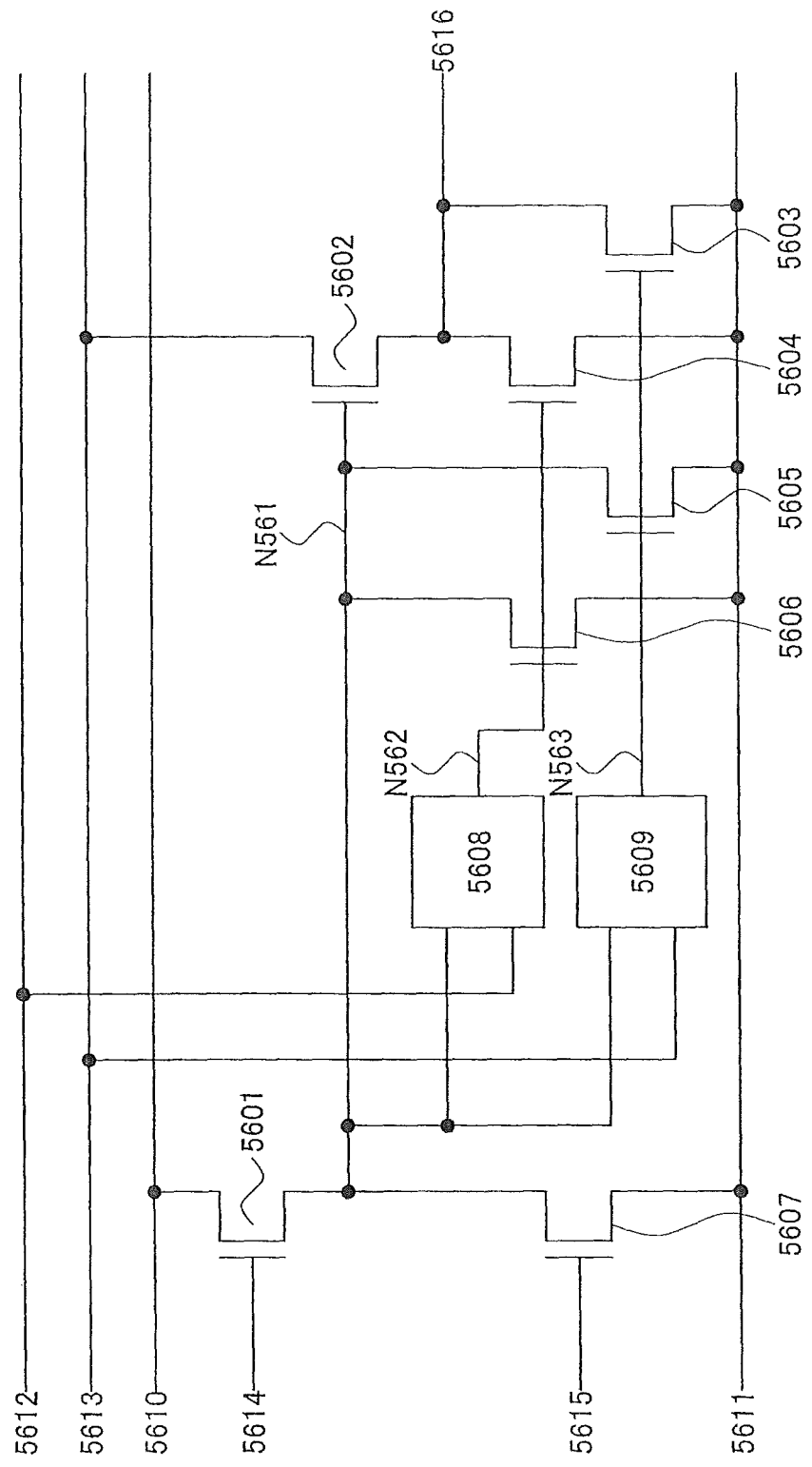
FIG. 56 illustrates Embodiment Mode 7.

In this embodiment mode, the case is described in which the basic circuit described in Embodiment Mode 4 is applied to a flip-flop circuit, with reference to FIG. 56.

FIG. 56 is an example of a flip-flop circuit to which the basic circuit in FIG. 25A described in Embodiment Mode 4 is applied. The flip-flop circuit in FIG. 56 includes a transistor 5601, a transistor 5602, a transistor 5603, a transistor 5604, a transistor 5605, a transistor 5606, a transistor 5607, a transistor 5608, a circuit 5608, and a circuit 5609.

Note that as the circuit 5608 and the circuit 5609, the NOR circuit 2715 in FIG. 27 and the NOR circuit 3617 in FIG. 36 can be used.

Connection relations of the flip-flop circuit in FIG. 56 are described. Note that a node of a second terminal of the transistor 5601, a second terminal of the transistor 5607, a second terminal of the transistor 5605, a second terminal of the transistor 5606, and a gate of the transistor 5602 is denoted by N561. In addition, a node of a gate of the transistor 5604 and a gate of the transistor 5606 is denoted by N562. Further, a node of a gate of the transistor 5603 and a gate of the transistor 5605 is denoted by N563.

A gate of the transistor 5601 is connected to a wiring 5614, a first terminal of the transistor 5601 is connected to a wiring 5610, and the second terminal of the transistor 5601 is connected to the node N561. A gate of the transistor 5607 is connected to a wiring 5615, a first terminal of the transistor 5607 is connected to a wiring 5611, and the second terminal of the transistor 5607 is connected to the node N561. Two input terminals of the circuit 5608 are connected to the node N561 and a wiring 5612, respectively, and an output terminal of the circuit 5608 is connected to the node N562. Two input terminals of the circuit 5609 are connected to the node N561 and a wiring 5613, respectively, and an output terminal of the circuit 5609 is connected to the node N563. The gate of the transistor 5606 is connected to the node N562, a first terminal of the transistor 5606 is connected to the wiring 5611, and the second terminal of the transistor 5606 is connected to the node N561. The gate of the transistor 5605 is connected to the node N563, a first terminal of the transistor 5605 is connected to the wiring 5611, and the second terminal of the transistor 5605 is connected to the node N561. The gate of the transistor 5604 is connected to the node N562, a first terminal of the transistor 5604 is connected to the wiring 5611, and a second terminal of the transistor 5604 is connected to a wiring 5616. The gate of the transistor 5603 is connected to the node N563, a first terminal of the transistor 5603 is connected to the wiring 5611, and a second terminal of the transistor 5603 is connected to the wiring 5616. The gate of the transistor 5602 is connected to the node N561, a first terminal of the transistor 5602 is connected to the wiring 5613, and a second terminal of the transistor 5602 is connected to the wiring 5616.

In addition, each of the transistors 5601 to 5607 is an N-channel transistor. Each of transistors included in the circuit 5608 and the circuit 5609 is also an N-channel transistor.

Accordingly, since the flip-flop circuit in FIG. 56 can be formed by using only N-channel transistors, amorphous silicon can be used for a semiconductor layer of the flip-flop circuit in FIG. 56. Thus, a manufacturing process can be simplified, so that manufacturing cost can be reduced and a yield can be improved. In addition, a semiconductor device such as a large display panel can also be formed. Further, when polysilicon or single crystalline silicon is used for the semiconductor layer of the flip-flop circuit in FIG. 56, the manufacturing process can be simplified.

In addition, the power supply potential VDD is supplied to the wiring 5610 and the power supply potential VSS is supplied to the wiring 5611. Note that the power supply potential VDD is higher than the power supply potential VSS. Note also that a digital signal, an analog signal, or the like may be supplied to each of the wiring 5610 and the wiring 5611, or another power supply potential may be supplied thereto.

In addition, a signal is supplied to each of the wiring 5612, the wiring 5613, the wiring 5614, and the wiring 5615. Note that the signal supplied to each of the wiring 5612, the wiring 5613, the wiring 5614, and the wiring 5615 is a binary digital signal. Note also that the power supply potential VDD, the power supply potential VSS, or another power supply potential may be supplied to each of the wiring 5612, the wiring 5613, the wiring 5614, and the wiring 5615. Alternatively, an analog signal may be supplied to each of the wiring 5612, the wiring 5613, the wiring 5614, and the wiring 5615.

Next, operations of the flip-flop circuit shown in FIG. 56 are described with reference to FIG. 57.

Figure 57:
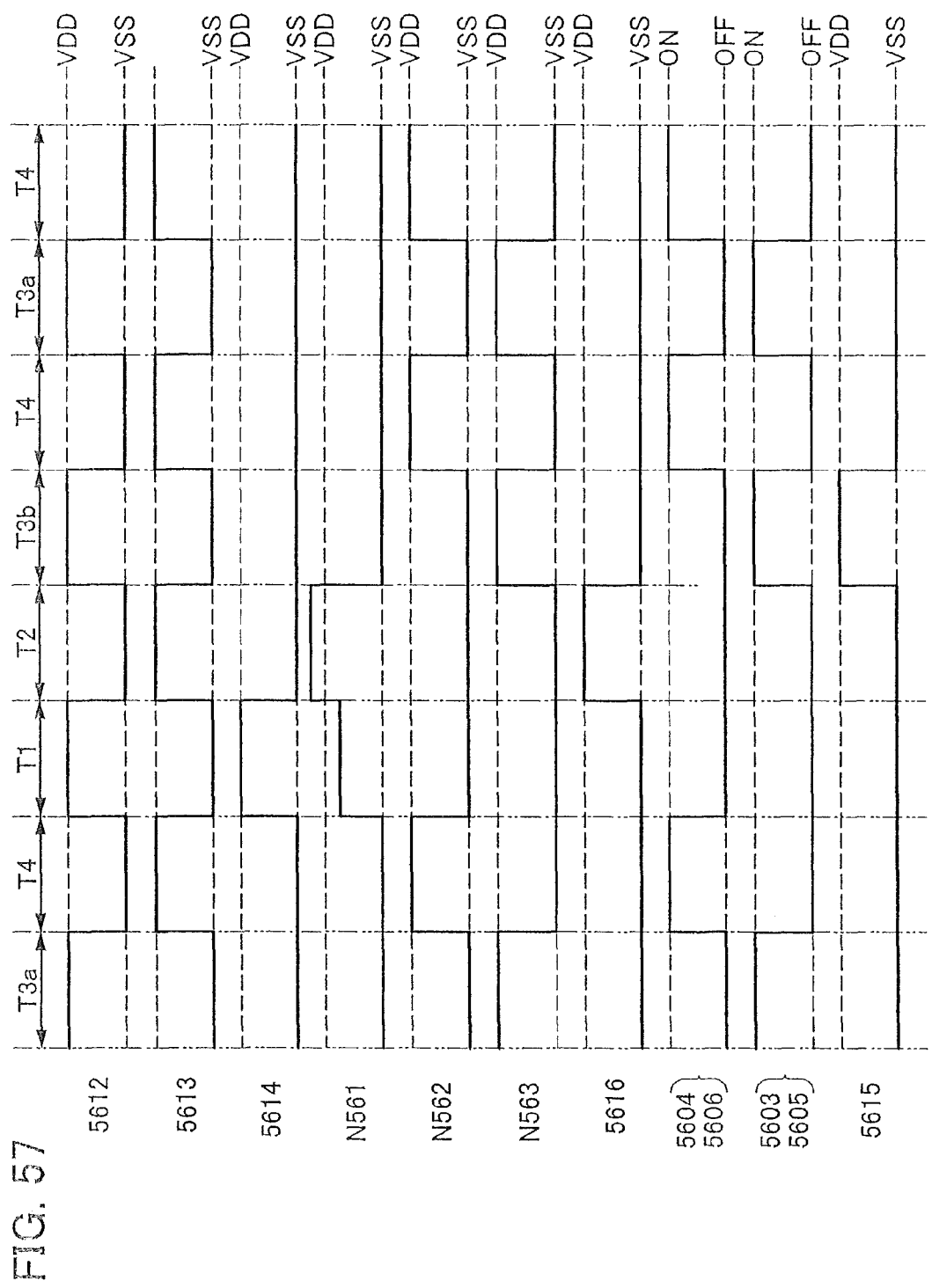
FIG. 57 illustrates Embodiment Mode 7.

FIG. 57 is an example of a timing chart of the flip-flop circuit shown in FIG. 56. The timing chart in FIG. 57 shows a potential of the wiring 5612, a potential of the wiring 5613, a potential of the wiring 5614, a potential of the node N561, a potential of the node N562, a potential of the node N563, a potential of the wiring 5616, a relation of on/off of the transistor 5604 and the transistor 5606, a relation of on/off of the transistor 5603 and the transistor 5605, and a potential of the wiring 5615.

The timing chart in FIG. 57 is described by dividing the whole period into periods T1 to T4. In addition, the period T3 is described by dividing the whole period into a period T3a and a period T3b.

Note that the period T3a and the period T4 are sequentially repeated in the periods other than the periods T1, T2, and T3b.

First, an operation in the period T1 is described. In the period T1, an H-level signal is supplied to the wiring 5612, an L-level signal is supplied to the wiring 5613, an H-level signal is supplied to the wiring 5614, and an L-level signal is supplied to the wiring 5615.

Accordingly, the transistor 5601 is turned on and the transistor 5607 is turned off. At this time, the power supply potential VDD is supplied to the node N561 through the transistor 5601, so that the potential of the node N561 rises. Therefore, the circuit 5608 outputs an L-level signal to the node N562, and the transistor 5604 and the transistor 5606 are turned off. In addition, the circuit 5609 outputs an L-level signal to the node N563, and the transistor 5603 and the transistor 5605 are turned off.

Note that rise in the potential of the node N561 continues until the transistor 5601 is turned off. The transistor 5601 is turned off when the potential of the node N561 becomes a value obtained by subtracting a threshold voltage Vth5601 of the transistor 5601 from the power supply potential VDD (VDD−Vth5601). Therefore, the potential of the node N561 becomes VDD−Vth5601, and the node N561 becomes a floating state.

Therefore, the transistor 5602 is turned on. Since the L-level signal of the wiring 5613 is supplied to the wiring 5616 through the transistor 5602, the potential of the wiring 5616 becomes equal to the power supply potential VSS.

Next, an operation in the period T2 is described. In the period T2, an L-level signal is supplied to the wiring 5612, an H-level signal is supplied to the wiring 5613, an L-level signal is supplied to the wiring 5614, and an L-level signal is supplied to the wiring 5615.

Accordingly, the transistor 5601 is turned off and the transistor 5607 is kept off. At this time, the node N561 is kept at VDD−Vth5601. Thus, the Circuit 5608 outputs an L-level signal to the node N562, and the transistor 5604 and the transistor 5606 are kept off. In addition, the circuit 5609 outputs an L-level signal to the node N563, and the transistor 5603 and the transistor 5605 are kept off.

Note that since an H-level signal is supplied to the wiring 5613, the potential of the wiring 5616 starts to rise. Therefore, the potential of the node N561 becomes equal to or higher than the sum of the power supply potential VDD and a threshold voltage Vth5602 of the transistor 5602 (VDD+Vth5602) by a bootstrap operation. Thus, the potential of the wiring 5616 rises to be equal to the power supply potential VDD.

Next, an operation in the period T3b is described. In the period T3b, an H-level signal is supplied to the wiring 5612, an L-level signal is supplied to the wiring 5613, an L-level signal is supplied to the wiring 5614, and an H-level signal is supplied to the wiring 5615.

Accordingly, the transistor 5601 is turned off and the transistor 5607 is turned on. Since the power supply potential VSS is supplied to the node N561 through the transistor 5607, the potential of the node N561 decreases. Thus, the circuit 5608 outputs an L-level signal to the node N562, and the transistor 5604 and the transistor 5606 are kept off. In addition, the circuit 5609 outputs an H-level signal to the node N563, and the transistor 5603 and the transistor 5605 are turned on.

Note that since the node N561 becomes an L level, the transistor 5602 is turned off. Since the power supply potential VSS is supplied to the wiring 5616 through the transistor 5603, the potential of the wiring 5616 is kept equal to the power supply potential VSS.

Next, an operation in the period T4 is described. In the period T4, an L-level signal is supplied to the wiring 5612, an H-level signal is supplied to the wiring 5613, an L-level signal is supplied to the wiring 5614, and an L-level signal is supplied to the wiring 5615.

Accordingly, the transistor 5601 is kept off and the transistor 5607 is turned off. The potential of the node N561 is kept at the L level. Thus, the circuit 5608 outputs an H-level signal to the node N562, and the transistor 5604 and the transistor 5606 are turned on. In addition, the circuit 5609 outputs an L-level signal to the node N563, and the transistor 5603 and the transistor 5605 are turned off.

Note that since the node N561 is kept at the L level, the transistor 5602 is turned off. Since the power supply potential VSS is supplied to the wiring 5616 through the transistor 5604, the potential of the wiring 5616 is kept equal to the power supply potential VSS.

Next, an operation in the period T3a is described. In the period T3a, an H-level signal is supplied to the wiring 5612, an L-level signal is supplied to the wiring 5613, an L-level signal is supplied to the wiring 5614, and an H-level signal is supplied to the wiring 5615.

Accordingly, the transistor 5601 is turned off and the transistor 5607 is turned on. The potential of the node N561 is kept at the L level. Thus, the circuit 5608 outputs an L-level signal to the node N562, and the transistor 5604 and the transistor 5606 are turned off. In addition, the circuit 5609 outputs an H-level signal to the node N563, and the transistor 5603 and the transistor 5605 are turned on.

Note that since the node N561 is kept at the L level, the transistor 5602 is turned off. Since the power supply potential VSS is supplied to the wiring 5616 through the transistor 5603, the potential of the wiring 5616 is kept equal to the power supply potential VSS.

By the above-described operations, the flip-flop circuit in FIG. 56 keeps the node N561 at an H level to be in a floating state in the period T1. In the period T2, the flip-flop circuit in FIG. 56 sets the potential of the node N561 equal to or higher than VDD+Vth5602 by the bootstrap operation, so that the potential of the wiring 5616 is made equal to the power supply potential VDD.

In addition, the transistor 5603 is turned on, and the power supply potential VSS is supplied to the wiring 5616 in the period T3*a*. Further, the transistor 5604 is turned on, and the power supply potential VSS is supplied to the wiring 5616 in the period T4. Therefore, the flip-flop circuit in FIG. 56 can always supply the power supply potential VSS to the wiring 5616 in the periods T3*a* and T4.

In the period T3*b*, the transistor 5605 is turned on and the power supply potential VSS is supplied to the node N561. Further, in the period T4, the transistor 5606 is turned on, and the power supply potential VSS is supplied to the node N561. Therefore, the flip-flop circuit in FIG. 56 can always supply the power supply potential VSS to the node N561 in the periods T3*b* and T4.

In addition, the flip-flop circuit in FIG. 56 does not include a transistor which is on in all of the periods T1 to T4. That is, the flip-flop circuit in FIG. 56 does not include a transistor which is always or almost always on. Accordingly, the flip-flop circuit in FIG. 56 can suppress characteristic deterioration of a transistor and a threshold voltage shift due to the characteristic deterioration.

Further, the characteristics of a transistor which is formed of amorphous silicon easily deteriorate. Therefore, when the transistor included in the flip-flop circuit in FIG. 56 is formed using amorphous silicon, not only can the advantages such as a reduction in manufacturing cost and improvement in a yield be obtained, but also the problem of the characteristic deterioration of the transistor can be solved.

Here, the functions of the transistors 5601 to 5607 are described. The transistor 5601 has a function of a switch which selects whether to connect the wiring 5610 and the node N561 in accordance with the potential of the wiring 5614. The transistor 5602 has a function of a switch which selects whether to connect the wiring 5613 and the wiring 5616 in accordance with the potential of the node N561. The transistor 5603 has a function of a switch which selects whether to connect the wiring 5611 and the wiring 5616 in accordance with the potential of the node N563. The transistor 5604 has a function of a switch which selects whether to connect the wiring 5611 and the wiring 5616 in accordance with the potential of the node N562. The transistor 5605 has a function of a switch which selects whether to connect the wiring 5611 and the node N561 in accordance with the potential of the node N563. The transistor 5606 has a function of a switch which selects whether to connect the wiring 5611 and the node N561 in accordance with the potential of the node N562. The transistor 5607 has a function of a switch which selects whether to connect the wiring 5611 and the node N561 in accordance with the potential of the wiring 5615.

Figure 58:
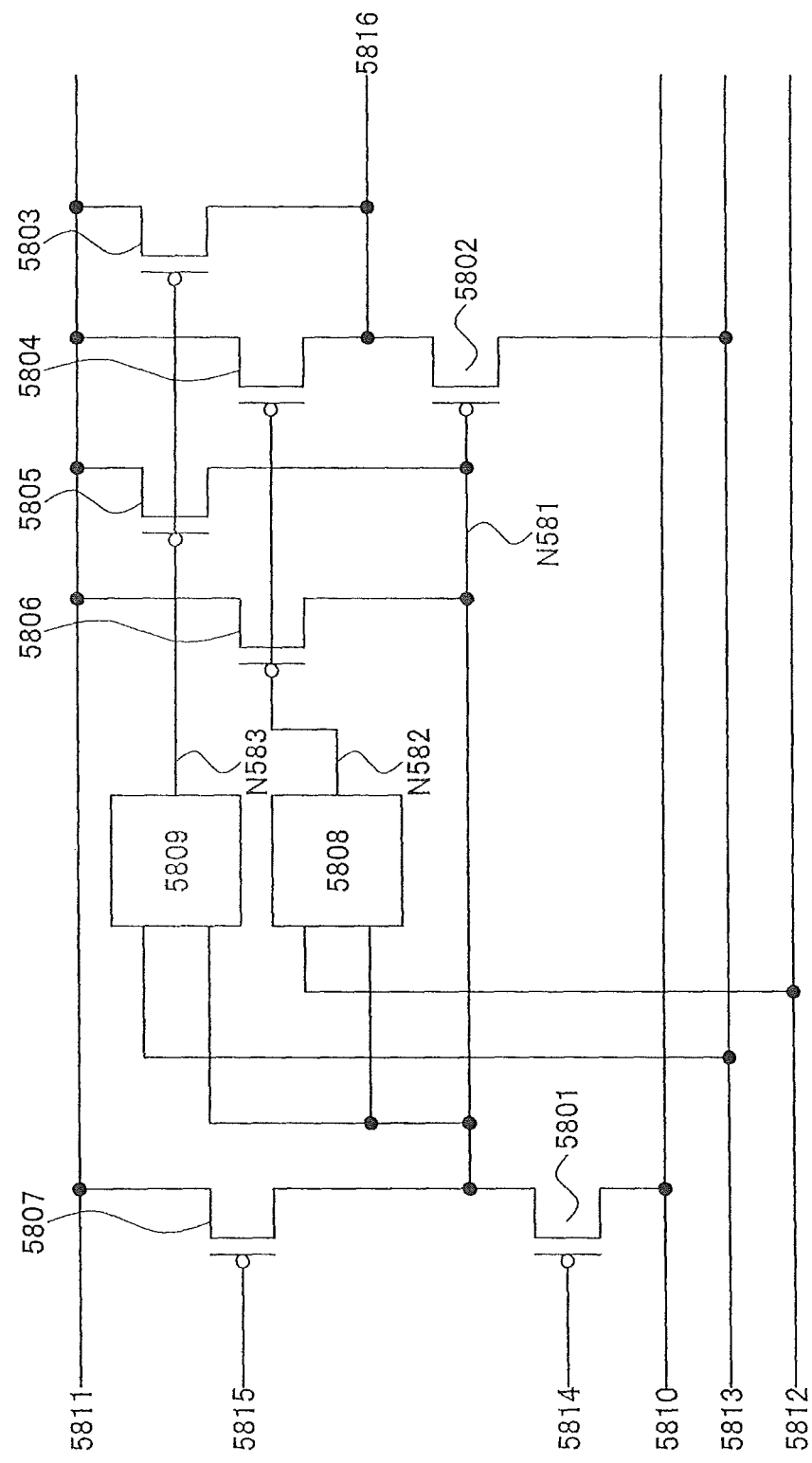
FIG. 58 illustrates Embodiment Mode 7.

Next, the case is described in which the flip-flop circuit shown in FIG. 56 is constructed from P-channel transistors, with reference to FIG. 58.

FIG. 58 is an example of a flip-flop circuit to which the basic circuit in FIG. 26A described in Embodiment Mode 4 is applied. The flip-flop circuit in FIG. 58 includes a transistor 5801, a transistor 5802, a transistor 5803, a transistor 5804, a transistor 5805, a transistor 5806, a transistor 5807, a circuit 5808, and a circuit 5809.

Note that as the circuit 5808 and the circuit 5809, the NAND circuit 4415 in FIG. 44 and the NAND circuit 4817 in FIG. 48 can be used.

Connection relations of the flip-flop circuit in FIG. 58 are described. Note that a node of a second terminal of the transistor 5801, a second terminal of the transistor 5807, a second terminal of the transistor 5805, a second terminal of the transistor 5806, and a gate of the transistor 5802 is denoted by N581. In addition, a node of a gate of the transistor 5804 and a gate of the transistor 5806 is denoted by N582. Further, a node of a gate of the transistor 5803 and a gate of the transistor 5805 is denoted by N563.

A gate of the transistor 5801 is connected to a wiring 5814, a first terminal of the transistor 5801 is connected to a wiring 5810, and the second terminal of the transistor 5801 is connected to the node N581. A gate of the transistor 5807 is connected to a wiring 5815, a first terminal of the transistor 5807 is connected to a wiring 5811, and the second terminal of the transistor 5807 is connected to the node N581. Two input terminals of the circuit 5808 are connected to the node N581 and a wiring 5812, respectively, and an output terminal of the circuit 5808 is connected to the node N582. Two input terminals of the circuit 5809 are connected to the node N581 and a wiring 5813, respectively, and an output terminal of the circuit 5809 is connected to the node N583. The gate of the transistor 5806 is connected to the node N582, a first terminal of the transistor 5806 is connected to the wiring 5811, and the second terminal of the transistor 5806 is connected to the node N581. The gate of the transistor 5805 is connected to the node N583, a first terminal of the transistor 5805 is connected to the wiring 5811, and the second terminal of the transistor 5805 is connected to the node N581. The gate of the transistor 5804 is connected to the node N582, a first terminal of the transistor 5804 is connected to the wiring 5811, and a second terminal of the transistor 5804 is connected to a wiring 5816. The gate of the transistor 5803 is connected to the node N583, a first terminal of the transistor 5803 is connected to the wiring 5811, and a second terminal of the transistor 5803 is connected to the wiring 5816. The gate of the transistor 5802 is connected to the node N581, a first terminal of the transistor 5802 is connected to the wiring 5813, and a second terminal of the transistor 5802 is connected to the wiring 5816.

In addition, each of the transistors 5801 to 5807 is a P-channel transistor. Each of transistors included in the circuit 5808 and the circuit 5809 is also a P-channel transistor.

Accordingly, since the flip-flop circuit in FIG. 58 can be formed by using only P-channel transistors, a step of forming N-channel transistors is not necessary. Thus, in the flip-flop circuit in FIG. 58, a manufacturing process can be simplified, so that manufacturing cost can be reduced and a yield can be improved.

In addition, the power supply potential VDD is supplied to the wiring 5811 and the power supply potential VSS is supplied to the wiring 5810. Note that the power supply potential VDD is higher than the power supply potential VSS. Note also that a digital signal, an analog signal, or the like may be supplied to each of the wiring 5810 and the wiring 5811, or another power supply potential may be supplied thereto.

In addition, a signal is supplied to each of the wirings 5812 to 5815. Note that the signal supplied to each of the wirings 5812 to 5815 is a binary digital signal. Note also that the power supply potential VDD, the power supply potential VSS, or another power supply potential may be supplied to each of the wirings 5812 to 5815. Alternatively, an analog signal may be supplied to each of the wirings 5812 to 5815.

Next, operations of the flip-flop circuit shown in FIG. 58 are described with reference to FIG. 59.

Figure 59:
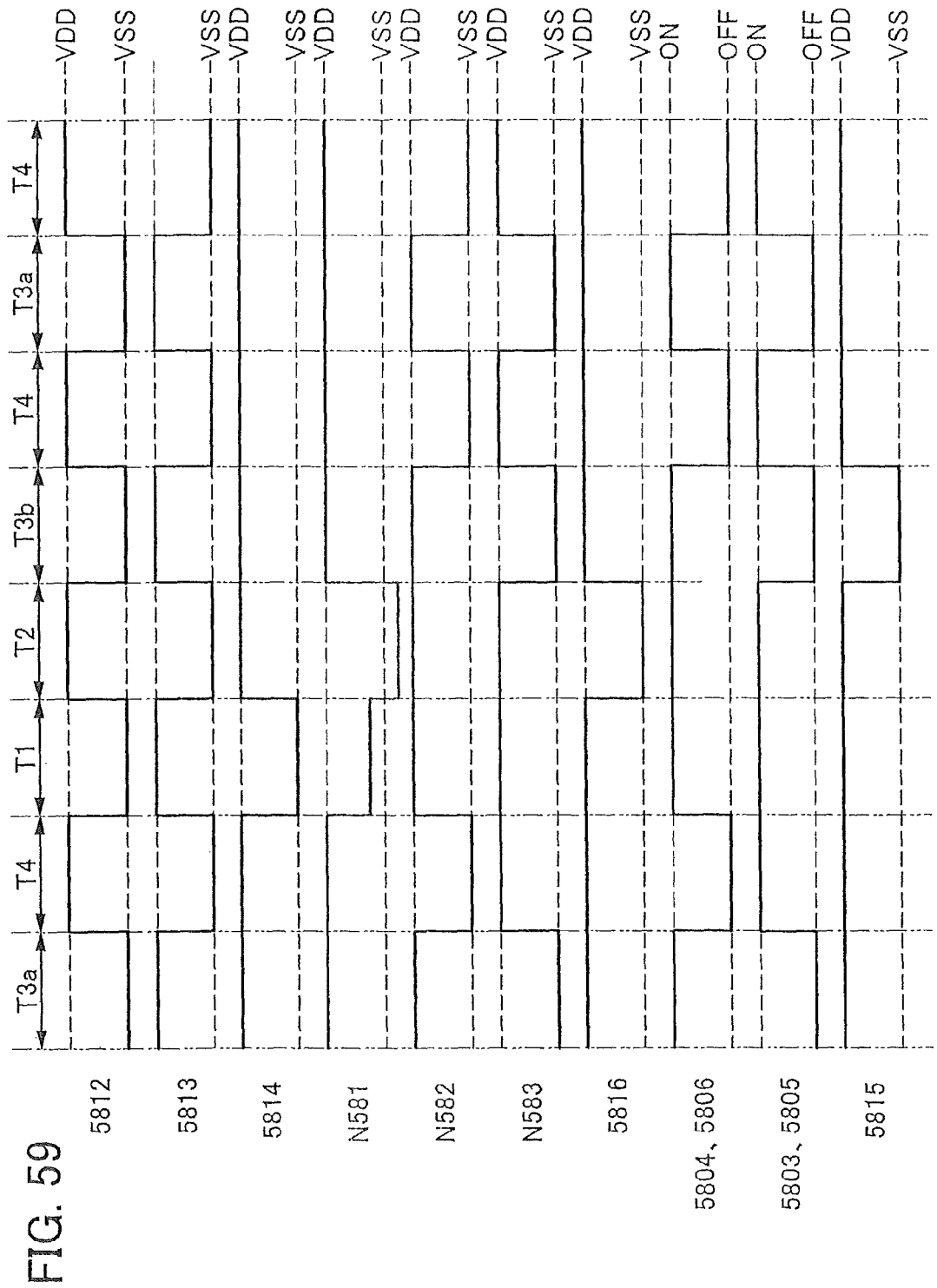
FIG. 59 illustrates Embodiment Mode 7.

FIG. 59 is an example of a timing chart of the flip-flop circuit shown in FIG. 58. The timing chart in FIG. 59 shows a potential of the wiring 5812, a potential of the wiring 5813, a potential of the wiring 5814, a potential of the node N581, a potential of the node N582, a potential of the node N583, a potential of the wiring 5816, a relation of on/off of the transistor 5804 and the transistor 5806, a relation of on/off of the transistor 5803 and the transistor 5805, and a potential of the wiring 5815.

The timing chart in FIG. 59 is described by dividing the whole period into periods T1 to T4. In addition, the period T3 is described by dividing the whole period into a period T3a and a period T3b.

Note that the period T3a and the period T4 are sequentially repeated in the periods other than the periods T1, T2, and T3b.

First, an operation in the period T1 is described. In the period T1, an L-level signal is supplied to the wiring 5812, an H-level signal is supplied to the wiring 5813, an L-level signal is supplied to the wiring 5814, and an H-level signal is supplied to the wiring 5815.

Accordingly, the transistor 5801 is turned on and the transistor 5807 is turned off. At this time, the power supply potential VSS is supplied to the node N581 through the transistor 5801, so that the potential of the node N581 decreases. Therefore, the circuit 5808 outputs an H-level signal to the node N582, and the transistor 5804 and the transistor 5806 are turned off. In addition, the circuit 5809 outputs an H-level signal to the node N583, and the transistor 5803 and the transistor 5805 are turned off.

Note that decrease in the potential of the node N581 continues until the transistor 5801 is turned off. The transistor 5801 is turned off when the potential of the node N581 becomes equal to the sum of the power supply potential VSS and the absolute value of a threshold voltage Vth5801 of the transistor 5801 (VSS+|Vth5801|). Therefore, the potential of the node N581 becomes VSS+|Vth5801|, and the node N581 becomes a floating state.

Therefore, the transistor 5802 is turned on. Since the H-level signal of the wiring 5813 is supplied to the wiring 5816 through the transistor 5802, the potential of the wiring 5816 becomes equal to the power supply potential VDD.

Next, an operation in the period T2 is described. In the period T2, an H-level signal is supplied to the wiring 5812, an L-level signal is supplied to the wiring 5813, an H-level signal is supplied to the wiring 5814, and an H-level signal is supplied to the wiring 5815.

Accordingly, the transistor 5801 is turned off and the transistor 5807 is kept off. At this time, the potential of the node N581 is kept at VSS+|Vth5801|. Thus, the circuit 5808 outputs an H-level signal to the node N582, and the transistor 5804 and the transistor 5806 are kept off. In addition, the circuit 5809 outputs an H-level signal to the node N583, and the transistor 5803 and the transistor 5805 are kept off.

Note that since an L-level signal is supplied to the wiring 5813, the potential of the wiring 5816 starts to decrease. Therefore, the potential of the node N581 becomes equal to or lower than a value obtained by subtracting the absolute value of a threshold voltage Vth5802 of the transistor 5802 from the power supply potential VSS (VSS−|Vth5802|) by a bootstrap operation. Thus, the potential of the wiring 5816 decreases to be equal to the power supply potential VSS.

Next, an operation in the period T3b is described. In the period T3b, an L-level signal is supplied to the wiring 5812, an H-level signal is supplied to the wiring 5813, an H-level signal is supplied to the wiring 5814, and an L-level signal is supplied to the wiring 5815.

Accordingly, the transistor 5801 is turned off and the transistor 5807 is turned on. Since the power supply potential VDD is supplied to the node N581 through the transistor 5807, the potential of the node N561 rises. Thus, the circuit 5808 outputs an H-level signal to the node N582, and the transistor 5804 and the transistor 5806 are kept off. In addition, the circuit 5809 outputs an L-level signal to the node N583, and the transistor 5803 and the transistor 5805 are turned on.

Note that since the node N581 becomes an H level, the transistor 5802 is turned off. Since the power supply potential VDD is supplied to the wiring 5816 through the transistor 5803, the potential of the wiring 5816 becomes equal to the power supply potential VDD.

Next, an operation in the period T4 is described. In the period T4, an H-level signal is supplied to the wiring 5812, an L-level signal is supplied to the wiring 5813, an H-level signal is supplied to the wiring 5814, and an H-level signal is supplied to the wiring 5815.

Accordingly, the transistor 5801 is kept off and the transistor 5807 is turned off. The potential of the node N581 is kept at the H level. Thus, the circuit 5808 outputs an L-level signal to the node N582, and the transistor 5804 and the transistor 5806 are turned on. In addition, the circuit 5809 outputs an H-level signal to the node N583, and the transistor 5803 and the transistor 5805 are turned off.

Note that since the node N581 is kept at the H level, the transistor 5802 is turned off. Since the power supply potential VDD is supplied to the wiring 5816 through the transistor 5804, the potential of the wiring 5816 is kept equal to the power supply potential VDD.

Next, an operation in the period T3a is described. In the period T3a, an L-level signal is supplied to the wiring 5812, an H-level signal is supplied to the wiring 5813, an H-level signal is supplied to the wiring 5814, and an H-level signal is supplied to the wiring 5815.

Accordingly, the transistor 5801 is turned off and the transistor 5807 is turned off. The potential of the node N581 is kept at the H level. Thus, the circuit 5808 outputs an H-level signal to the node N582, and the transistor 5804 and the transistor 5806 are turned off. In addition, the circuit 5809 outputs an L-level signal to the node N583, and the transistor 5803 and the transistor 5805 are turned on.

Note that since the node N581 is kept at the H level, the transistor 5802 is turned off. Since the power supply potential VDD is supplied to the wiring 5816 through the transistor 5803, the potential of the wiring 5816 is kept equal to the power supply potential VDD.

By the above-described operations, the flip-flop circuit in FIG. 58 keeps the node N581 at an L level to be in a floating state in the period T1. In the period T2, the flip-flop circuit in FIG. 58 sets the potential of the node N581 equal to or lower than VSS−|Vth5802| by the bootstrap operation, so that the potential of the wiring 5816 is made equal to the power supply potential VSS.

In addition, the transistor 5803 is turned on, and the power supply potential VDD is supplied to the wiring 5816 in the period T3a. Further, the transistor 5804 is turned on, and the power supply potential VDD is supplied to the wiring 5816 in the period T4. Therefore, the flip-flop circuit in FIG. 58 can always supply the power supply potential VDD to the wiring 5816 in the periods T3a and T4.

In addition, the transistor 5805 is turned on, and the power supply potential VDD is supplied to the node N581 in the period T3b. Further, the transistor 5806 is turned on, and the power supply potential VDD is supplied to the node N581 in the period T4. Therefore, the flip-flop circuit in FIG. 58 can always supply the power supply potential VDD to the node N581 in the periods T3b and T4.

In addition, the flip-flop circuit in FIG. 58 does not include a transistor which is on in all of the periods T1 to T4. That is, the flip-flop circuit in FIG. 58 does not include a transistor which is always or almost always on. Accordingly, the flip-flop circuit in FIG. 58 can suppress characteristic deterioration of a transistor and a threshold voltage shift due to the characteristic deterioration.

Note that the transistors 5801 to 5807 have functions which are similar to those of the transistors 5601 to 5607.

Note that this embodiment mode can be freely combined with any description in other embodiment modes in this specification. Further, parts of the description in this embodiment mode can be combined with one another.

Embodiment Mode 8

Figure 60:
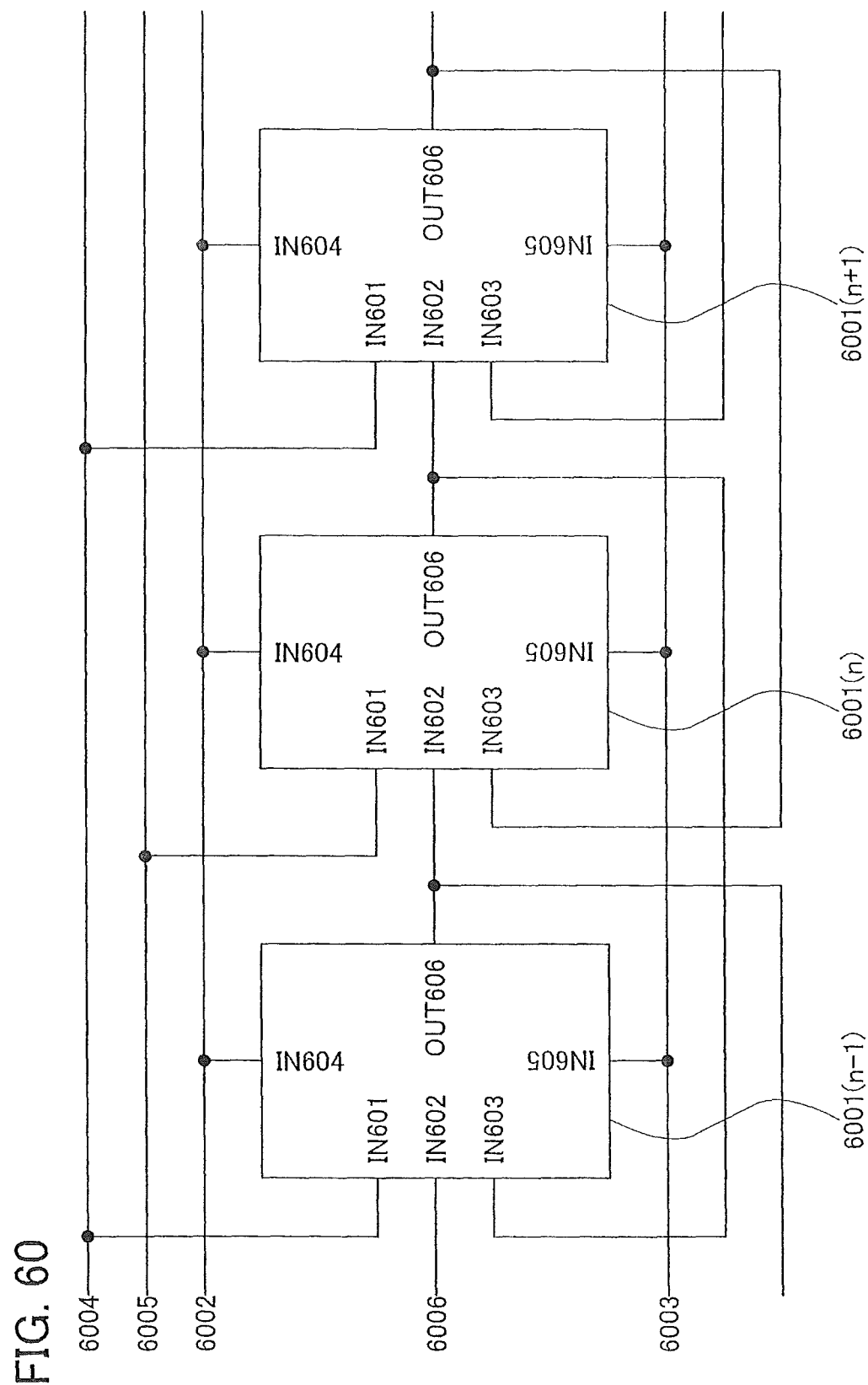
FIG. 60 illustrates Embodiment Mode 8.

This embodiment mode will describe a shift register which employs the flip-flop circuits described in Embodiment Modes 5 and 6, with reference to FIG. 60.

FIG. 60 shows an example of a shift register which employs the flip-flop circuits described in Embodiment Modes 5 and 6. The shift register in FIG. 60 includes a plurality of flip-flop circuits 6001.

Note that the flip-flop circuits 6001 are similar to those shown in Embodiment Modes 5 and 6.

In FIG. 60, a flip-flop circuit 6001($n$−1) of an (n−1)th stage, a flip-flop circuit 6001($n$) of an n-th stage, and a flip-flop circuit 6001($n$+1) of an (n+1)th stage are shown. Note that n is an even number. Note also that input terminals IN601 of the flip-flop circuits in the even-numbered stages are connected to a wiring 6005, and input terminals IN601 of the flip-flop circuits in the odd-numbered stages are connected to a wiring 6004.

Note that the input terminals IN 601 are connected to each of the wiring 2711 in FIG. 27, the wiring 3613 in FIG. 36, the wiring 4411 in FIG. 44, and the wiring 4813 in FIG. 48. Input terminals IN 602 are connected to each of the wiring 2712 in FIG. 27, the wiring 3614 in FIG. 36, the wiring 4412 in FIG. 44, and the wiring 4814 in FIG. 48. Input terminals IN 603 are connected to each of the wiring 2713 in FIG. 27, the wiring 3615 in FIG. 36, the wiring 4413 in FIG. 44, and the wiring 4815 in FIG. 48. Input terminals IN 604 are connected to each of the wiring 2709 in FIG. 27, the wiring 3611 in FIG. 36, the wiring 4410 in FIG. 44, and the wiring 4812 in FIG. 48. Input terminals IN 605 are connected to each of the wiring 2710 in FIG. 27, the wiring 3612 in FIG. 36, the wiring 4409 in FIG. 44, and the wiring 4812 in FIG. 48. Output terminals IN 606 are connected to each of the wiring 2714 in FIG. 27, the wiring 3616 in FIG. 36, the wiring 4414 in FIG. 44, and the wiring 4816 in FIG. 48.

The power supply potential VDD is supplied to a wiring 6002, and the power supply potential VSS is supplied to a wiring 6003. Note that the power supply potential VDD is higher than the power supply potential VSS. However, digital signals, analog signals, other power supply potentials or the like may be supplied to the wiring 6002 and the wiring 6003.

Signals are supplied to the wiring 6004, the wiring 6005, and a wiring 6006. Note that the signal supplied to each of the wiring 6004, the wiring 6005, and the wiring 6006 is a binary digital signal. However, the power supply potential VDD, the power supply potential VSS, or another power supply potential may be supplied to each of the wiring 6004, the wiring 6005, and the wiring 6006. Alternatively, an analog signal may be supplied to each of the wiring 6004, the wiring 6005, and the wiring 6006.

Note that an output signal of the flip-flop circuit 6001 of an (n−2)th stage is supplied to the wiring 6006.

Next, an operation of the shift register shown in FIG. 60 will be described with reference to a timing chart in FIG. 61.

Figure 61:
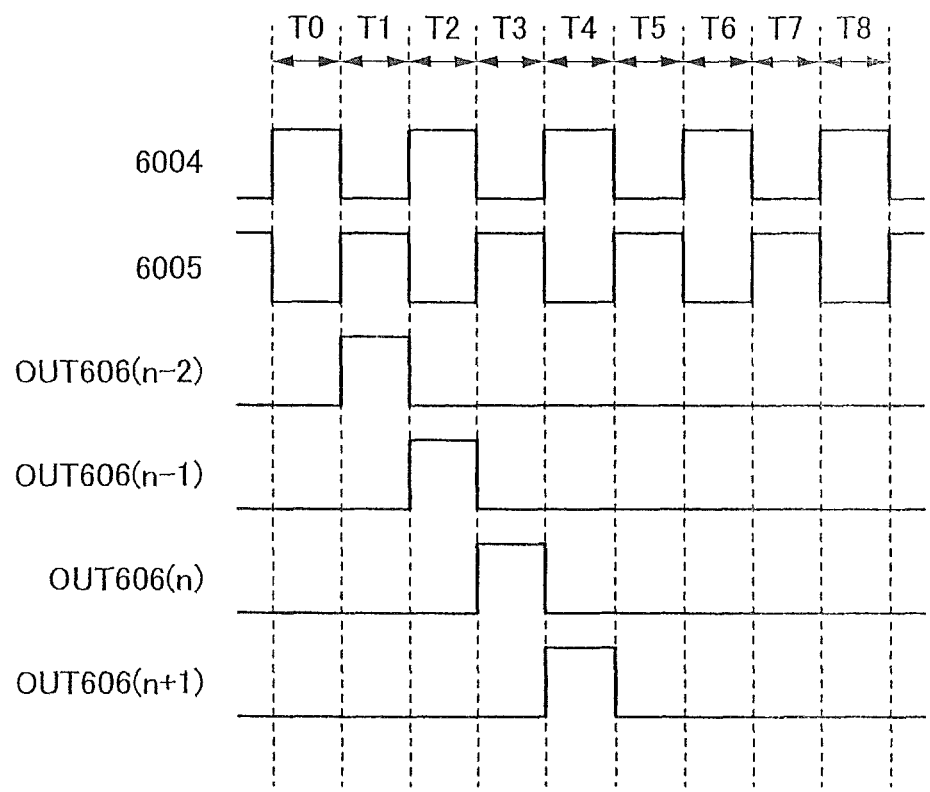
FIG. 61 illustrates Embodiment Mode 8.

FIG. 61 shows an example of a timing chart of the shift register shown in FIG. 60. The timing chart in FIG. 61 shows a potential of the wiring 6004, a potential of the wiring 6005, a potential of an output terminal OUT606($n$−2), a potential of an output terminal OUT606($n$−1), a potential of an output terminal OUT606($n$), and a potential of an output terminal OUT606($n$+1).

Note that the timing chart in FIG. 61 shows the case where the flip-flop circuits 6001 are constructed from N-channel transistors. When the flip-flop circuits 6001 are constructed from P-channel transistors, it is only necessary to invert H-level signals and L-level signals.

Note that the timing chart in FIG. 61 will be described by dividing the whole period into a period T1 to a period T8.

First, an operation in the period T1 is described. In the period T1, the flip-flop circuit 6001($n$−1) performs the operation in the period T1 shown in Embodiment Modes 5 and 6; the flip-flop circuit 6001($n$) performs the operation in the period T4 shown in Embodiment Modes 5 and 6; and the flip-flop circuit 6001($n$+1) performs the operation in the period T3a shown in Embodiment Modes 5 and 6.

Next, an operation in the period T2 is described. In the period T2, the flip-flop circuit 6001($n$−1) performs the operation in the period T2 shown in Embodiment Modes 5 and 6; the flip-flop circuit 6001($n$) performs the operation in the period T1 shown in Embodiment Modes 5 and 6; and the flip-flop circuit 6001($n$+1) performs the operation in the period T4 shown in Embodiment Modes 5 and 6.

Therefore, an H-level signal is output from the output terminal OUT606 of the flip-flop circuit 6001($n$−1).

Next, an operation in the period T3 is described. In the period T3, the flip-flop circuit 6001($n$−1) performs the operation in the period T3b shown in Embodiment Modes 5 and 6; the flip-flop circuit 6001($n$) performs the operation in the period T2 shown in Embodiment Modes 5 and 6; and the flip-flop circuit 6001($n$+1) performs the operation in the period T1 shown in Embodiment Modes 5 and 6.

Therefore, an H-level signal is output from the output terminal OUT606 of the flip-flop circuit 6001($n$).

Next, an operation in the period T4 is described. In the period T4, the flip-flop circuit 6001($n$−1) performs the operation in the period T4 shown in Embodiment Modes 5 and 6; the flip-flop circuit 6001($n$) performs the operation in the period T3b shown in Embodiment Modes 5 and 6; and the flip-flop circuit 6001($n$+1) performs the operation in the period T2 shown in Embodiment Modes 5 and 6.

Therefore, an H-level signal is output from the output terminal OUT606 of the flip-flop circuit 6001($n$+1).

Next, an operation in the period T5 is described. In the period T5, the flip-flop circuit 6001($n$−1) performs the operation in the period T3a shown in Embodiment Modes 5 and 6; the flip-flop circuit 6001($n$) performs the operation in the period T4 shown in Embodiment Modes 5 and 6; and the flip-flop circuit 6001($n$+1) performs the operation in the period T3b shown in Embodiment Modes 5 and 6.

Next, an operation in the period T6 is described. In the period T6, the flip-flop circuit 6001($n$−1) performs the operation in the period T4 shown in Embodiment Modes 5 and 6; the flip-flop circuit 6001($n$) performs the operation in the period T3a shown in Embodiment Modes 5 and 6; and the flip-flop circuit 6001(n+1) performs the operation in the period T4 shown in Embodiment Modes 5 and 6.

Next, an operation in the period T7 is described. In the period T7, the flip-flop circuit 6001(n−1) performs the operation in the period T3a shown in Embodiment Modes 5 and 6; the flip-flop circuit 6001(n) performs the operation in the period T4 shown in Embodiment Modes 5 and 6; and the flip-flop circuit 6001(n+1) performs the operation in the period T3a shown in Embodiment Modes 5 and 6.

Next, an operation in the period T8 is described. In the period T8, the flip-flop circuit 6001(n−1) performs the operation in the period T4 shown in Embodiment Modes 5 and 6; the flip-flop circuit 6001(n) performs the operation in the period T3a shown in Embodiment Modes 5 and 6; and the flip-flop circuit 6001(n+1) performs the operation in the period T4 shown in Embodiment Modes 5 and 6.

In this manner, when the flip-flop circuits shown in Embodiment Modes 5 and 6 are used for the shift register shown in FIG. 60, all of the transistors included in the shift register can be either N-channel type or P-channel type.

In addition, since all of the transistors included in the shift register shown in FIG. 60 can be N-channel transistors, amorphous silicon can be used for a semiconductor layer, which leads to a simplified manufacturing process. Therefore, reduction in manufacturing cost and improvement in a yield can be achieved. Further, a large display panel can be formed. In addition, when the shift register shown in FIG. 60 is used for a semiconductor device, the semiconductor device can have a long operating life even when amorphous silicon whose characteristics will easily deteriorate is used.

The characteristics of a transistor which is formed of amorphous silicon easily deteriorate. Therefore, when the transistors included in the shift register in FIG. 60 are formed using amorphous silicon, not only can the advantages such as a reduction in manufacturing cost and improvement in a yield be obtained, but also the problem of the characteristic deterioration of the transistors can be solved.

Note that this embodiment mode can be freely combined with any description in other embodiment modes in this specification. Further, parts of the description in this embodiment mode can be combined with one another.

Embodiment Mode 9

Figure 62:
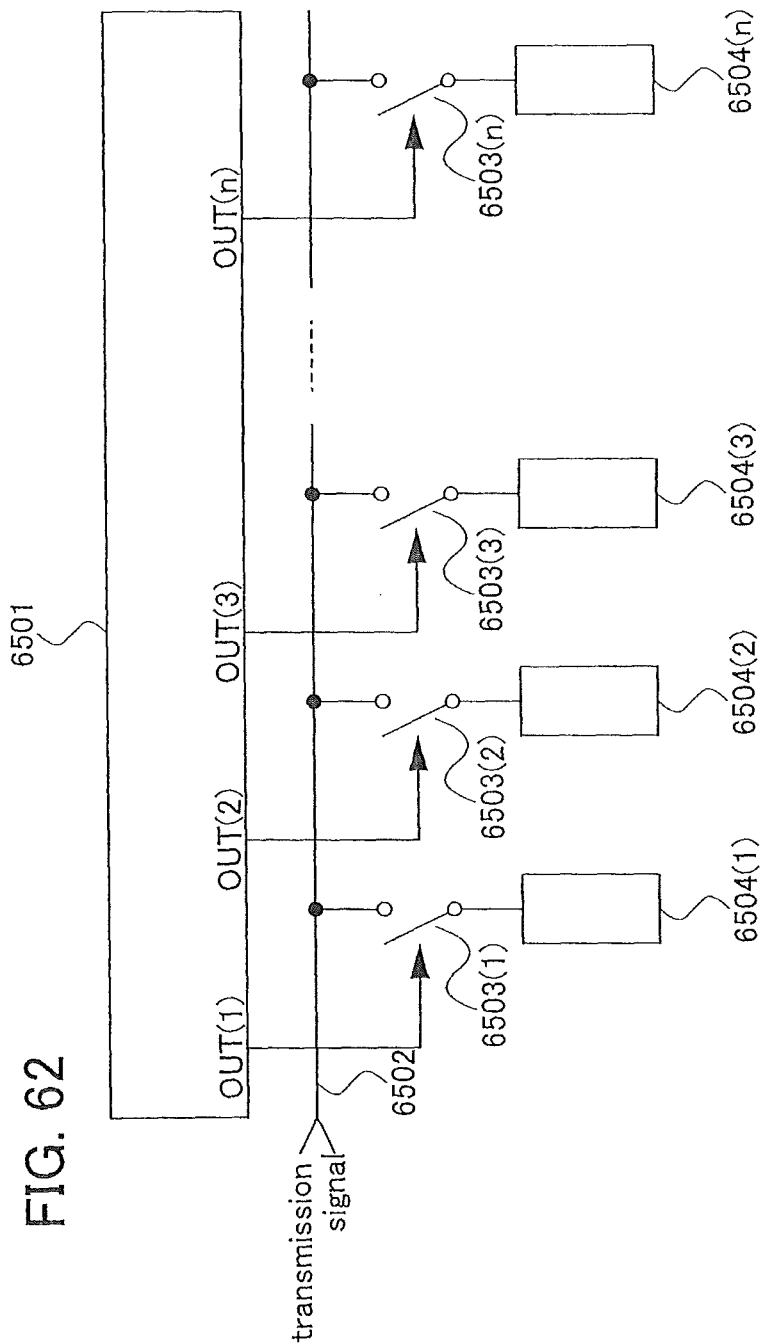
FIG. 62 illustrates Embodiment Mode 9.

This embodiment mode will describe a source driver which employs the shift register described in Embodiment Mode 8, with reference to FIG. 62.

A circuit shown in FIG. 62 is an example of a circuit configuration which employs the shift register shown in Embodiment Mode 8.

The circuit shown in FIG. 62 includes a shift register 6501 and a plurality of switches 6503. In addition, the shift register 6501 has a plurality of output terminals OUT.

In FIG. 62, switches 6503, loads 6504, and the output terminals OUT of a first stage, a second stage, a third stage, and an n-th stage are shown. In addition, n is a natural number not less than two.

The shift register 6501 is similar to that shown in Embodiment Mode 8.

As shown in the circuit in FIG. 62, a wiring 6502 is connected to the loads 6504 through the switches 6503. In addition, the switches 6503 are controlled by the shift register 6501.

In addition, a transmission signal is supplied to the wiring 6502. The transmission signal may be either current or voltage.

Note that a plurality of control signals and various power supply potentials are supplied to the shift register 6501, though not shown.

Next, an operation of the circuit shown in FIG. 62 is described.

The shift register 6501 sequentially outputs H-level signals or L-level signals from an output terminal OUT (1) of the first stage. At the same time, the switches 6503 are sequentially turned on from the first stage. Then, transmission signals are sequentially supplied to the loads 6504 through the switches 6503 from the first stage.

Note that when H-level signals are sequentially output from the output terminal OUT (1) of the first stage, N-channel transistors are used as the switches 6503. On the other hand, when L-level signals are sequentially output from the output terminal OUT (1) of the first stage, P-channel transistors are used as the switches 6503.

In the circuit in FIG. 62, when transmission signals are changed at on/off timing of the switches 6503, different voltages or currents can be supplied to the plurality of loads 6504.

Here, the functions of the shift register 6501 and the switches 6503 are described.

The shift register 6501 has a function of outputting signals which select whether to turn on or off the switches 6503. In addition, the shift register 6501 is similar to that shown in Embodiment Mode 8.

Each switch 6503 has a function of selecting whether to connect the wiring 6502 to the load 6504.

In this manner, when the shift register shown in Embodiment Mode 8 is used for the circuit shown in FIG. 62, as described above, all of the transistors included in the circuit can be either N-channel type or P-channel type.

Note that in the circuit in FIG. 62, on/off of one switch is controlled by only one output signal of the shift register. However, on/off of a plurality of switches may be controlled by one output signal of the shift register. Thus, a configuration is described in which on/off of three switches is controlled by one output signal of the shift register, with reference to FIG. 63.

Figure 63:
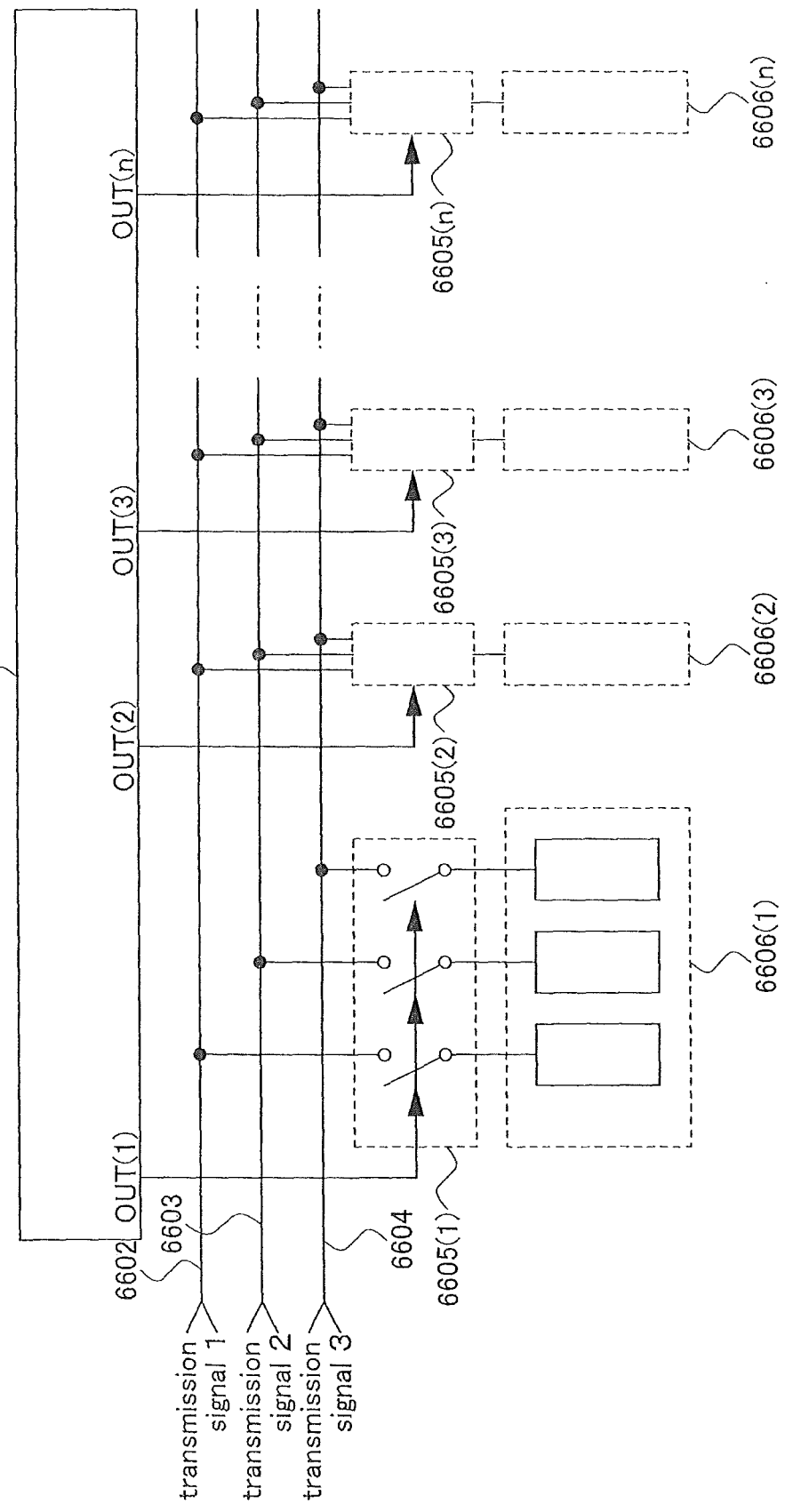
FIG. 63 illustrates Embodiment Mode 9.

The circuit shown in FIG. 63 includes a shift register 6601 and a plurality of switch groups 6605. The shift register 6601 has a plurality of output terminals OUT. Each of the switch groups 6605 has three switches. In addition, each of load groups 6606 has three loads.

In FIG. 63, the switch groups 6605, the load groups 6606, and the output terminals OUT of a first stage, a second stage, a third stage, and an n-th stage are shown. In addition, n is a natural number not less than two.

The shift register 6601 is similar to that shown in Embodiment Mode 8.

As shown in the circuit in FIG. 63, a wiring 6602, a wiring 6603, and a wiring 6604 are connected to the three loads included in each load group 6606 through the three switches included in each switch group 6605. In addition, the three switches included in each switch group 6605 are controlled by the shift register 6601.

A transmission signal 1 is supplied to the wiring 6602, a transmission signal 2 is supplied to the wiring 6603, and a transmission signal 3 is supplied to the wiring 6604. The transmission signals 1, 2, and 3 may be either current or voltage.

Note that a plurality of control signals and various power supply potentials are supplied to the shift register 6601, though not shown.

Next, an operation of the circuit shown in FIG. 63 is described.

The shift register 6601 sequentially outputs H-level signals or L-level signals from an output terminal OUT (1) of the first stage. At the same time, the three switches included in each switch group 6605 are turned on at the same timing, sequentially from the first stage. Then, the transmission signals 1, 2, and 3 are sequentially supplied to the loads included in each load group 6606 through the switch group 6505 from the first stage.

Note that when H-level signals are sequentially output from the output terminal OUT (1) of the first stage of the shift register 6601, N-channel transistors are used as the switches included in the switch groups 6605. On the other hand, when L-level signals are sequentially output from the output terminal OUT (1) of the first stage of the shift register 6601, P-channel transistors are used as the switches included in the switch groups 6605.

In the circuit in FIG. 63, when the transmission signals 1, 2, and 3 are changed at on/off timing of the switches included in each switch group 6605, different voltages or currents can be supplied to the loads included in each load group 6606.

Here, the functions of the shift register 6601 and the switch groups 6605 are described.

The shift register 6601 has a function of outputting signals which select whether to turn on or off the switches included in the switch groups 6605 at the same time. In addition, the shift register 6601 is similar to that shown in Embodiment Mode 8.

Each switch group 6605 has a function of selecting whether to connect the wiring 6602, the wiring 6603, and the wiring 6604 to the load group 6606.

In this manner, in the circuit shown in FIG. 63, on/off of a plurality of switches can be controlled by using one output signal of the shift register 6601. In addition, as described above, when the shift register in Embodiment Mode 8 is used, all of the transistors included in the circuit can be either ht-channel type or P-channel type.

Figure 64:
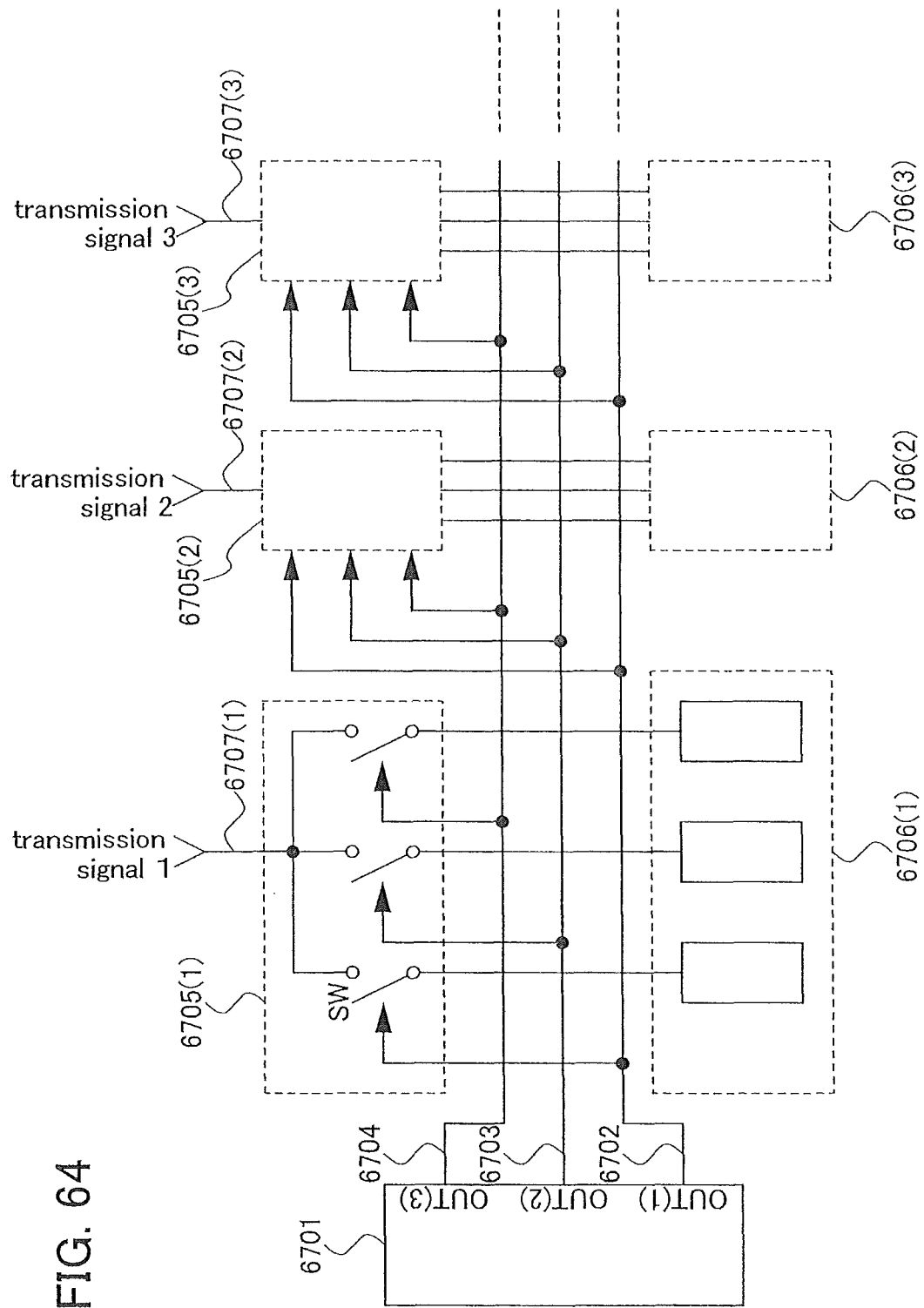
FIG. 64 illustrates Embodiment Mode 9.

Here, another configuration which can employ the shift register shown in Embodiment Mode 8, which differs from those shown in FIGS. 62 and 63 is described, with reference to FIG. 64.

The circuit shown in FIG. 64 includes a shift register 6701 and a plurality of switch groups 6705. The shift register 6701 has three output terminals OUT. Each of the switch groups 6705 has three switches. In addition, each of load groups 6706 has three loads.

In FIG. 64, the switch groups 6705 and the load groups 6706 of a first stage, a second stage, a third stage, and an n-th stage are shown.

The shift register 6701 is the same as that shown in Embodiment Mode 8.

As shown in the circuit in FIG. 64, a plurality of wirings 6707 are each connected to the three loads included in each load group 6706 through the three switches included in each switch group 6705. In addition, the three switches included in each switch group 6705 are controlled by the shift register 6701.

An output signal from an output terminal OUT(1) of the first stage of the shift register 6701 is supplied to a wiring 6702. An output signal from an output terminal OUT(2) of the second stage of the shift register 6701 is supplied to a wiring 6703. An output signal from an output terminal OUT(3) of the third stage of the shift register 6701 is supplied to a wiring 6704.

In addition, a transmission signal 1 is supplied to a wiring 6707(1) of the first stage, a transmission signal 2 is supplied to a wiring 6707(2) of the second stage, and a transmission signal 3 is supplied to a wiring 6707(3) of the third stage. The transmission signals 1, 2, and 3 may be either current or voltage.

Note that a plurality of control signals and various power supply potentials are supplied to the shift register 6701, though not shown.

Next, an operation of the circuit shown in FIG. 64 is described.

The shift register 6701 sequentially outputs H-level signals or L-level signals from an output terminal OUT (1) of the first stage. At the same time, the switches included in each switch group 6705 are turned on one by one, sequentially from the first stage. Therefore, one transmission signal is sequentially supplied to the loads included in each load group 6706.

Note that when H-level signals are sequentially output from the output terminal OUT (1) of the first stage of the shift register 6701, N-channel transistors are used as the switches included in the switch groups 6705. On the other hand, when L-level signals are sequentially output from the output terminal OUT (1) of the first stage of the shift register 6701, P-channel transistors are used as the switches included in the switch groups 6705.

In the circuit in FIG. 64, when each transmission signal is changed at on/off timing of the switches included in each switch group 6705, different voltages or currents can be supplied to the loads included in each load group 6706.

In this manner, in the circuit shown in FIG. 64, the number of transmission signals can be reduced by supplying one transmission signal to a plurality of loads. In FIG. 64, the number of transmission signals can be reduced to ⅓ because three switches are provided in each switch group.

In addition, as described above, when the shift register in Embodiment Mode 8 is used, all of the transistors included in the circuit can be either N-channel type or P-channel type.

Note that this embodiment mode can be freely combined with any description in other embodiment modes in this specification. Further, parts of the description in this embodiment mode can be combined with one another.

Embodiment Mode 10

This embodiment mode will describe a layout diagram of the flip-flop circuit described in Embodiment Mode 3, with reference to FIG. 65.

FIG. 65 is a layout diagram of the flip-flop circuit shown in FIG. 27. Note that the layout diagram of the flip-flop circuit shown in FIG. 65 shows the case where a polycrystalline semiconductor (polysilicon) is used for a semiconductor layer of transistors. In addition, the case will be described with reference to FIG. 65 in which a semiconductor layer 6801, a gate electrode layer 6802, and a wiring layer 6803 are formed.

In the layout diagram of the flip-flop circuit in FIG. 65, transistors 2701 to 2708 are arranged.

Note that in the layout diagram of the flip-flop circuit in FIG. 65, the transistor 2705 has a dual-gate structure.

A wiring 2709 is disposed between each transistor and wirings 2711a and 2711b. This is because, signals supplied to the wirings 2711a and 2711b could be noise, which in turn could adversely affect the operation of each transistor. Therefore, by disposing the wiring 2709 between each transistor and the wirings 2711a and 2711b, noise can be suppressed.

Next, FIG. 66 shows a layout diagram of a flip-flop circuit in which an amorphous semiconductor (amorphous silicon) is used.

Note that the wiring 2709 is disposed between each transistor and the wirings 2711*a* and 2711*b*. This is because, signals supplied to the wirings 2711*a* and 2711*b* could be noise, which in turn could adversely affect the operation of each transistor. Therefore, by disposing the wiring 2709 between each transistor and the wirings 2711*a* and 2711*b*, noise can be suppressed.

Note that this embodiment mode can be freely combined with any description in other embodiment modes in this specification. Further, parts of the description in this embodiment mode can be combined with one another.

Embodiment Mode 11

Figure 75A:
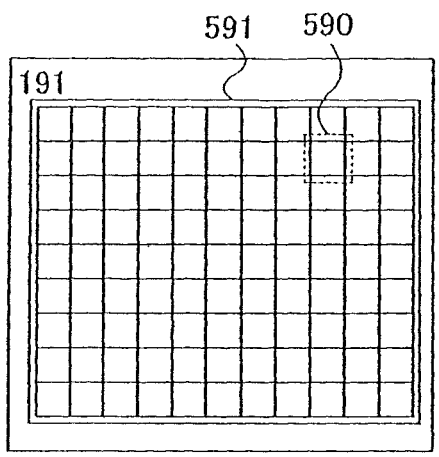
FIGS. 75A and 75B illustrate Embodiment Mode 11.
Figure 75B:
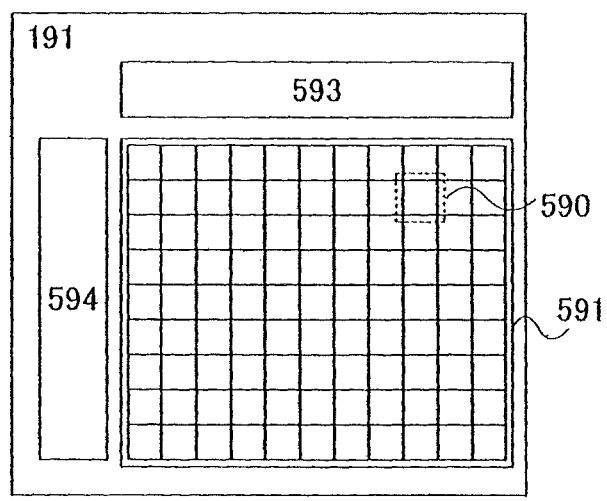

This embodiment mode will describe an example of a panel in which a plurality of pixels are formed, with reference to FIGS. 75A and 75B. In FIG. 75A, a panel 191 includes a pixel portion 591 where a plurality of pixels 590 are arranged in matrix. The pixel portion 591 can have an active matrix arrangement in which a switching element such as a thin film transistor is disposed in each pixel 590. As a display medium provided in the pixel 590, a light-emitting element such as an electroluminescence element or a liquid crystal element can be used.

Note that as shown in FIG. 75B, driver circuits for driving the pixel portion 591 may be provided over the same substrate as the pixel portion 591. In FIG. 75B, portions that are the same as those in FIG. 75A are denoted by the same reference numerals as those in FIG. 75A, and their description will be omitted. In FIG. 75B, a source driver 593 and a gate driver 594 are shown as the driver circuits. Note that the invention is not limited to this, and another driver circuit may be provided in addition to the source driver 593 and the gate driver 594. Alternatively, the driver circuits may be formed using a different substrate and mounted on the substrate where the pixel portion 591 is formed. For example, the pixel portion 591 may be formed with thin film transistors using a glass substrate, and the driver circuits may be formed using single crystalline substrates so that the IC chips may be connected to the glass substrate by COG (Chip On Glass). Alternatively, the IC chips may be connected to the glass substrate by TAB (Tape Automated Bonding) or by using a printed board.

The driver circuits may be formed over the same substrate as the pixel portion 591, using thin film transistors that are formed through the same process as the thin film transistors included in the pixels 590. A channel formation region of each thin film transistor may be formed using either a polycrystalline semiconductor or an amorphous semiconductor.

Note that this embodiment mode can be freely combined with any description in other embodiment modes in this specification. Further, parts of the description in this embodiment mode can be combined with one another.

Embodiment Mode 12

Figure 76A:
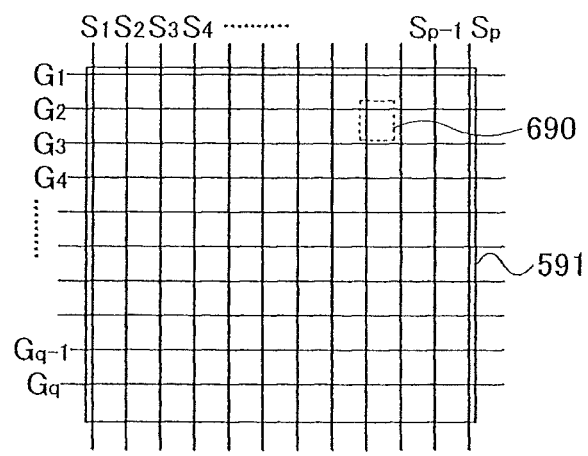
FIGS. 76A and 76B illustrate Embodiment Mode 12.

FIG. 76A shows a configuration example of the pixel portion 591 shown in FIGS. 75A and 75B (hereinafter referred to as a first pixel configuration). The pixel portion 591 includes a plurality of source signal lines S1 to Sp (p is a natural number), a plurality of scan lines G1 to Gq (q is a natural number) provided so as to intersect the plurality of source signal lines S1 to Sp, and a pixel 690 provided at each intersection of the source signal lines S1 to Sp and the scan lines G1 to Gq.

Figure 76B:
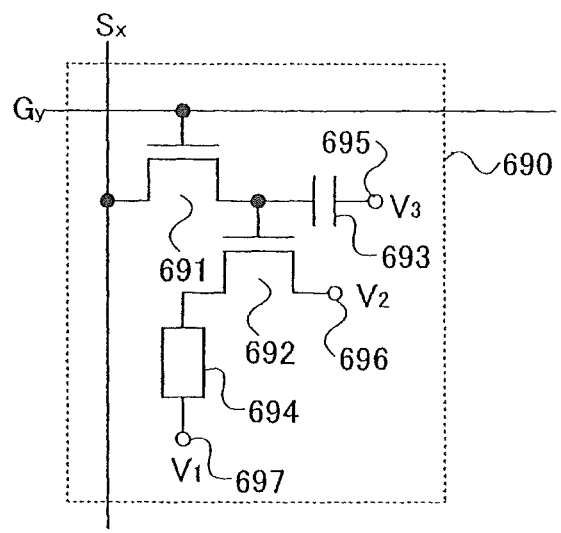

FIG. 76B shows a configuration of the pixel 690 in FIG. 76A. In FIG. 76B, the pixel 690, which is formed at the intersection of one source line Sx (x is a natural number not greater than p) among the plurality of source signal lines S1 to Sp and one scan line Gy (y is a natural number not greater than q) among the plurality of scan lines G1 to Gy, is shown. The pixel 690 includes a first transistor 691, a second transistor 692, a capacitor 693, and a light-emitting element 694. Note that this embodiment mode shows an example where the light-emitting element 694 has a pair of electrodes and emits light with a current flowed between the pair of electrodes. In addition, parasitic capacitance of the second transistor 692 or the like can be actively utilized as the capacitor 693. The first transistor 691 and the second transistor 692 may be either N-channel transistors or P-channel transistors. As the transistors included in the pixel 690, thin film transistors can be used.

A gate of the first transistor 691 is connected to the scan line Gy, one of a source and a drain of the first transistor 691 is connected to the source signal line Sx, and the other is connected to a gate of the second transistor 692 and one of electrodes of the capacitor 693. The other electrode of the capacitor 693 is connected to a terminal 695 which is supplied with a potential V3. One of a source and a drain of the second transistor 692 is connected to one of electrodes of the light-emitting element 694 and the other is connected to a terminal 696 which is supplied with a potential V2. The other electrode of the light-emitting element 694 is connected to a terminal 697 which is supplied with a potential V1.

A display method of the pixel portion 591 shown in FIGS. 76A and 76B is described.

One of the plurality of scan lines G1 to Gq is selected. While the scan line is selected, video signals are input to all of the plurality of source signal lines S1 to Sp. In this manner, video signals are input into one row of pixels in the pixel portion 591. By sequentially selecting the plurality of scan lines G1 to Gq and performing a similar operation, video signals are input into all of the pixels 690 in the pixel portion 591.

The operation of the pixel 690, which receives a video signal from one source signal line Sx among the plurality of source signal lines S1 to Sp upon selection of one scan line Gy among the plurality of scan lines G1 to Gq, will be described. When the scan line Gy is selected, the first transistor 691 is turned on. An "on" state of a transistor means a source and a drain thereof are connected, while an "off" state of a transistor means a source and a drain thereof are not connected. When the first transistor 691 is turned on a video signal input to the source signal line Sx is input to the gate of the second transistor 692 through the first transistor 691. On/off states of the second transistor 692 are selected based on the video signal input. When an on-state of the second transistor 692 is selected, the drain current of the second transistor 692 flows into the light-emitting element 694 so that the light-emitting element 694 emits light.

The potential V2 and the potential V3 have a potential difference which is kept at a constant level when the second transistor 692 is on. The potential V2 and the potential V3 may also have the same level. When the potential V2 and the potential V3 are set at the same level, the terminal 695 and the tem final 696 may be connected to the same wiring. The potential V1 and the potential V2 are set to have a predetermined potential difference when the light-emitting element 694 is selected to emit light. In this manner, a current is flowed into the light-emitting element 694 so that the light-emitting element 694 emits light.

Note that the wirings and electrodes are formed using one or more elements selected from among aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or alloy material containing one or more of such elements (e.g., indium tin oxide (ITO), indium zinc oxide (IZO), indium tin oxide doped with silicon oxide (ITSO), zinc oxide (ZnO), aluminum neodymium (Al—Nd), or magnesium silver (Mg—Ag)); a substance obtained by combining such compounds; or the like. Alternatively, a compound of the above-described material and silicon (silicide) (e.g., aluminum silicon, molybdenum silicon, or nickel silicide) or a compound of the above-described material and nitride (e.g., titanium nitride, tantalum nitride, molybdenum nitride, or the like) can be used. Note that silicon (Si) may contain an N-type impurity (e.g., phosphorus) or a P-type impurity (e.g., boron) in large quantities. When silicon contains such an impurity, conductivity is improved or silicon behaves in a manner similar to normal conductors; therefore, it can be easily utilized as wirings or electrodes. Silicon may have any of a single crystalline state, a polycrystalline state (polysilicon), and an amorphous state (amorphous silicon). When single crystalline silicon or polycrystalline silicon is used, resistance can be lowered. When amorphous silicon is used, a manufacturing process can be simplified. Note that when aluminum or silver which has high conductivity is used, a signal delay can be reduced. Further, since aluminum and silver can be easily etched, they can be easily patterned and thus fine processing is possible. Note also that when copper which has high conductivity is used, a signal delay can be reduced. It is also preferable to use molybdenum because it does not cause problems such as defects of materials even when it contacts silicon or an oxide semiconductor such as ITO or IZO; it can be easily patterned and etched; and it has high heat resistance. It is also preferable to use titanium because it does not cause problems such as defects of materials even when it contacts silicon or an oxide semiconductor such as ITO or IZO; it can be easily patterned and etched; and it has high heat resistance. It is also preferable to use tungsten or neodymium which has high heat resistance. In particular, it is preferable to use an alloy of neodymium and aluminum because heat resistance is improved and aluminum can hardly have hillocks. It is also preferable to use silicon because it can be formed at the same time as a semiconductor layer of a transistor and also has high heat resistance. Note also that indium tin oxide (ITO), indium zinc oxide (IZO), indium tin oxide doped with silicon oxide (ITSO), zinc oxide (ZnO), and silicon (Si) have light-transmitting properties; therefore, they can be used for a portion to transmit light, which is preferable. For example, such materials can be used as a pixel electrode or a common electrode.

Note that the wirings and electrodes can be formed to have either a single-layer structure or a multi-layer structure. When a single-layer structure is employed, a manufacturing process can be simplified and also the manufacturing time and cost can be reduced. When a multi-layer structure is employed, on the other hand, advantages of each material can be effectively utilized while disadvantages of each material can be reduced, thereby wirings and electrodes with high performance can be formed. For example, when a multi-layer structure is formed so as to contain a low-resistance material (e.g., aluminum), resistance of a wiring can be lowered. In addition, when a multi-layer structure is formed so as to contain a high heat-resistance material, such as a stacked-layer structure where a low heat-resistance material which has advantages is sandwiched between high heat-resistance materials, heat resistance of a wiring or an electrode as a whole can be increased. For example, it is preferable to form a stacked-layer structure where a layer containing aluminum is sandwiched between layers containing molybdenum or titanium. In addition, when a wiring or an electrode has a portion having a direct contact with another wiring, electrode, or the like which is made of a different material, they may adversely affect each other. For example, there is a case where one material is mixed into another material, thereby the properties of the materials change, which in turn hinders the original object or causes problems during manufacture so that the normal manufacture cannot be conducted. In such a case, the problems can be solved by sandwiching a layer between other layers or covering a layer with another layer. For example, in order to contact indium tin oxide (ITO) and aluminum with each other, it is preferable to sandwich titanium or molybdenum between them. In addition, in order to contact silicon and aluminum with each other, it is preferable to sandwich titanium or molybdenum between them.

Note that this embodiment mode can be freely combined with any description in other embodiment modes in this specification. Further, parts of the description in this embodiment mode can be combined with one another.

Embodiment Mode 13

Figure 77A:
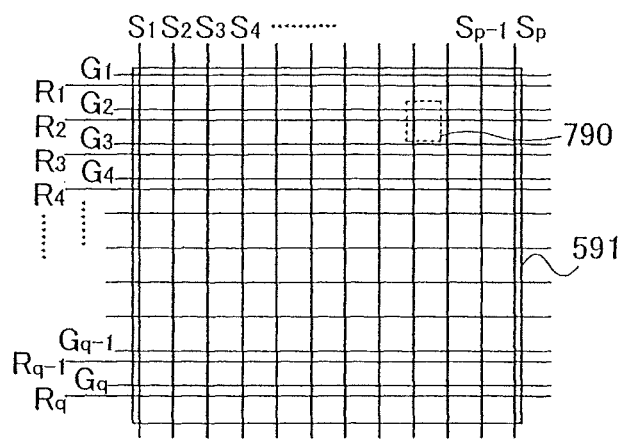
FIGS. 77A to 77C illustrate Embodiment Mode 13.

FIG. 77A shows a configuration example of the pixel portion 591 shown in FIGS. 75A and 75B. FIG. 77A shows a configuration (hereinafter referred to as a second pixel configuration) which differs from the first pixel configuration shown in Embodiment Mode 12. The pixel portion 591 includes a plurality of source signal lines S1 to Sp (p is a natural number); a plurality of scan lines G1 to Gq (q is a natural number) and a plurality of scan lines R1 to Rq which are provided so as to intersect the plurality of source signal lines S1 to Sp; and a pixel 790 provided at each intersection of the source signal lines S1 to Sp, the scan lines G1 to Gq, and the scan lines R1 to Rq.

Figure 77B:
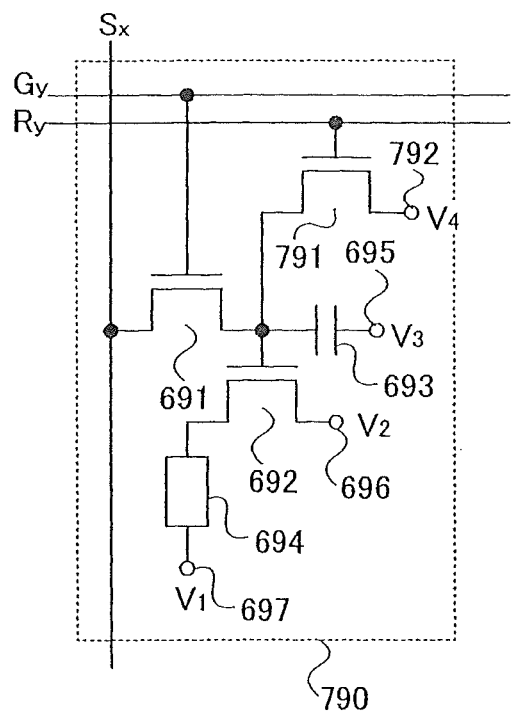

FIG. 77B shows a configuration of the pixel 790 in FIG. 77A. In FIG. 77B, the pixel 790, which is formed at the intersection of one source line Sx (x is a natural number not greater than p) among the plurality of source signal lines S1 to Sp, one scan line Gy (y is a natural number not greater than q) among the plurality of scan lines G1 to Gq, and one scan line Ry among the plurality of scan lines R1 to Rq, is shown. Note that in the pixel with the configuration shown in FIG. 77B, portions that are the same as those in FIG. 76B are denoted by the same reference numerals as those in FIG. 76B, and their description will be omitted. FIG. 77B differs from FIG. 76B in that it has a third transistor 791. The third transistor 791 may be either an N-channel transistor or a P-channel transistor. As the transistors included in the pixel 790, thin film transistors can be used.

A gate of the third transistor 791 is connected to the scan line Ry, one of a source and a drain of the third transistor 791 is connected to a gate of the second transistor 692 and one of electrodes of the capacitor 693, and the other is connected to a terminal 792 which is supplied with a potential V4.

A display method of the pixel portion 591 shown in FIG. 77A and FIG. 77B is described.

A method for lighting the light-emitting element 694 is the same as that described in Embodiment Mode 12. In the pixel with the configuration shown in FIGS. 77A and 77B, the light-emitting element 694 in the pixel 790 can be made not to emit light regardless of a video signal input from the source signal line Sx by providing the scan line Ry and the third transistor 791. The light-emitting time of the light-emitting element 694 in the pixel 790 can be set by a signal input to the scan line Ry. Thus, a light-emitting period, which is shorter than the period in which all of the scan lines G1 to Gq are sequentially selected, can be set. In this manner, short sub-frame periods can be set when performing display by a time-division gray scale method, and therefore, high gray scales can be expressed.

It is only necessary that the potential V4 be set at a level which can turn off the second transistor 692 when the third transistor 791 is turned on. For example, when the third transistor 791 is turned on, the potential V4 can be set to have the same level as the potential V3. By setting the potentials V3 and V4 at the same level, charges held in the capacitor 693 can be released and a voltage between the source and the gate of the second transistor 692 can be set at zero so that the second transistor 692 can be turned off. Note that in order to set the potential V3 and the potential V4 at the same level, the terminal 695 and the terminal 792 may be connected to the same wiring.

Note that the position of the third transistor 791 is not limited to the one shown in FIG. 77B. For example, the third transistor 791 may be disposed in series with the second transistor 692. In such a configuration, by turning off the third transistor 791 by a signal input to the scan line Ry, a current flow into the light-emitting element 694 can be blocked so that the light-emitting element 694 does not emit light.

Figure 77C:
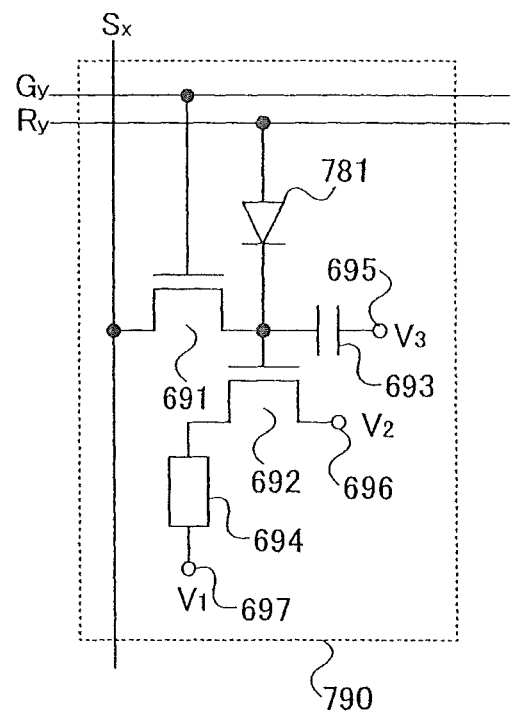

The third transistor 791 shown in FIG. 77B can be replaced with a diode. FIG. 77C shows a pixel configuration where the third transistor 791 is replaced with a diode. Note that in FIG. 77C, portions that are the same as those in FIG. 77B are denoted by the same reference numerals as those in FIG. 77B, and their description will be omitted. One of electrodes of a diode 781 is connected to the scan line Ry and the other electrode is connected to the gate of the second transistor 692 and one of the electrodes of the capacitor 693.

The diode 781 delivers a current in the direction from one electrode to the other electrode. A P-channel transistor is used as the second transistor 692. By increasing the potential of one of the electrodes of the diode 781, the gate potential of the second transistor 692 can be increased so that the second transistor 692 can be turned off.

Although FIG. 77C shows the configuration where the diode 781 delivers a current in the direction from one electrode connected to the scan line Ry to the other electrode connected to the gate of the second transistor 692, and a P-channel transistor is used as the second transistor 692, the invention is not limited to this. It is also possible to employ a configuration where the diode 781 delivers a current in the direction from the electrode connected to the gate of the second transistor 692 to the electrode connected to the scan line Ry, and an N-channel transistor is used as the second transistor 692. When the second transistor 692 is an N-channel transistor, the second transistor 692 can be turned off by dropping the potential of one of the electrodes of the diode 781 so that the gate potential of the second transistor 692 is dropped.

As the diode 781, a diode-connected transistor may be employed. A diode-connected transistor means a transistor having a drain and a gate connected together. As the diode-connected transistor, either a P-channel transistor or an N-channel transistor may be used.

Note that this embodiment mode can be freely combined with any description in other embodiment modes in this specification. Further, parts of the description in this embodiment mode can be combined with one another.

Embodiment Mode 14

Figure 78A:
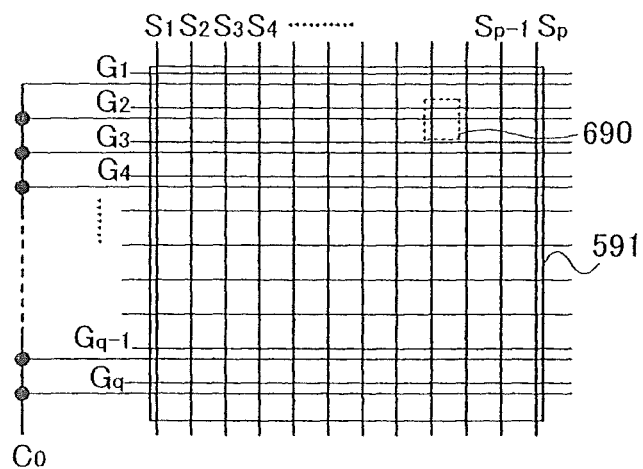
FIGS. 78A and 78B illustrate Embodiment Mode 14.

FIG. 78A shows a configuration example (hereinafter referred to as a third pixel configuration) of the pixel portion 591 shown in FIGS. 75A and 75B. The pixel portion 591 includes a plurality of source signal lines S1 to Sp (p is a natural number), a plurality of scan lines G1 to Gq (q is a natural number) provided so as to intersect the plurality of source signal lines S1 to Sp, and a pixel 690 provided at each intersection of the source signal lines S1 to Sp and the scan lines G1 to Gq.

Figure 78B:
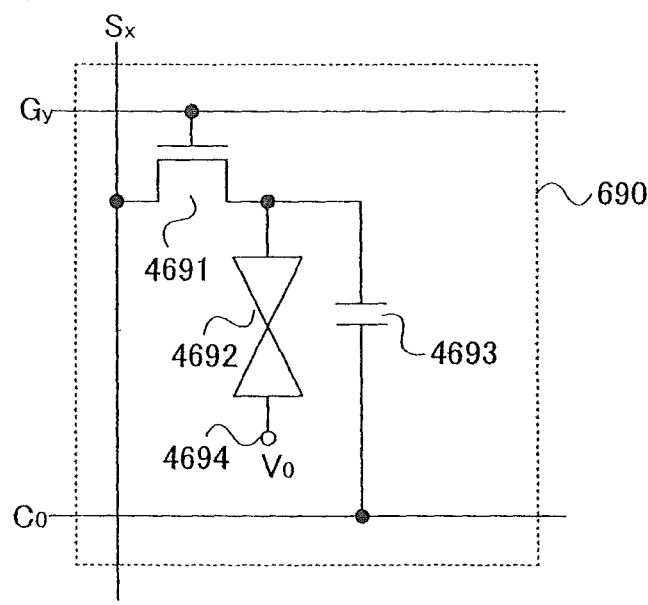

FIG. 78B shows a configuration of the pixel 690 in FIG. 78A. In FIG. 78B, the pixel 690, which is formed at the intersection of one source line Sx (x is a natural number not greater than p) among the plurality of source signal lines S1 to Sp and one scan line Gy (y is a natural number not greater than q) among the plurality of scan lines G1 to Gq, is shown. In addition, a capacitive line C0 is provided corresponding to each row. The pixel 690 includes a transistor 4691, a liquid crystal element 4692, and a capacitor 4693. The transistor 4691 may be either an N-channel transistor or a P-channel transistor. As the transistor included in the pixel 690, a thin film transistor can be used.

A gate of the transistor 4691 is connected to the scan line Gy, one of a source and a drain of the transistor 4691 is connected to the source signal line Sx, and the other is connected to one of electrodes of the liquid crystal element 4692 and one of electrodes of the capacitor 4693. The other electrode of the liquid crystal element 4692 is connected to a terminal 4694 which is supplied with a potential V0. The other electrode of the capacitor 4693 is connected to the capacitive line C0. The capacitive line C0 is supplied with the same potential as the potential V0 which is supplied to the terminal 4694.

A display method of the pixel portion 591 shown in FIG. 78A and FIG. 78B is described.

One of the scan lines G1 to Gq is selected. While the scan line is selected, video signals are input to all of the plurality of source signal lines S1 to Sp. In this manner, video signals are input into one row of pixels in the pixel portion 591. By sequentially selecting the plurality of scan lines G1 to Gq and performing a similar operation, video signals are input into all of the pixels 690 in the pixel portion 591.

The operation of the pixel 690, which receives a video signal from one source signal line Sx among the plurality of source signal lines S1 to Sp upon selection of one scan line Gy among the plurality of scan lines G1 to Gq, will be described. When the scan line Gy is selected, the transistor 4691 is turned on. An "on" state of a transistor means a source and a drain thereof are connected, while an "off" state of a transistor means a source and a drain thereof are not connected. When the transistor 4691 is turned on, a video signal input to the source signal line Sx is input to one of the electrodes of the liquid crystal element 4692 and one of the electrodes of the capacitor 4693 through the transistor 4691. In this manner, a voltage (which corresponds to a potential difference between the potential of the input video signal and the potential V0 at the terminal 4694) is applied between the pair of electrodes of the liquid crystal element 4692, thereby the transmittance of the liquid crystal element 4692 changes.

Note that this embodiment mode can be freely combined with any description in other embodiment modes in this specification. Further, parts of the description in this embodiment mode can be combined with one another.

Embodiment Mode 15

Figure 67A:
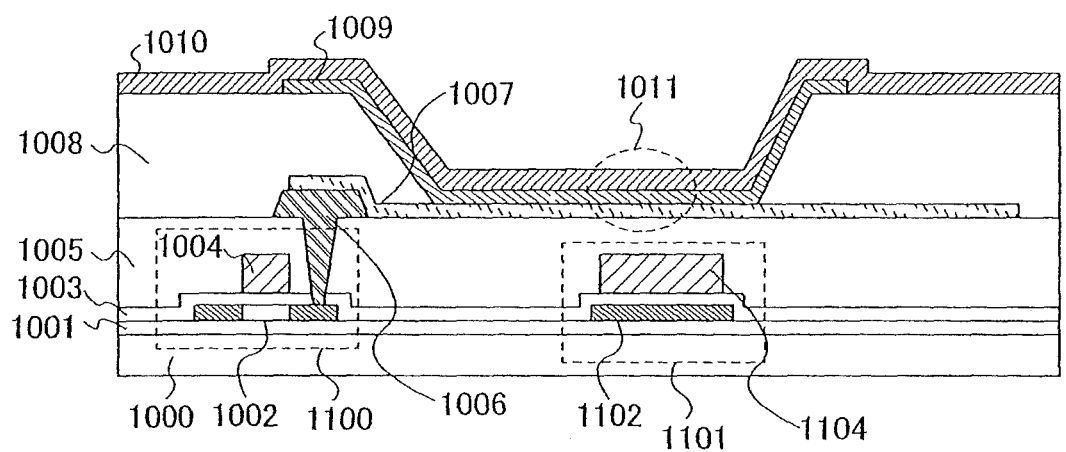
FIGS. 67A and 67B illustrate Embodiment Mode 15.
Figure 67B:
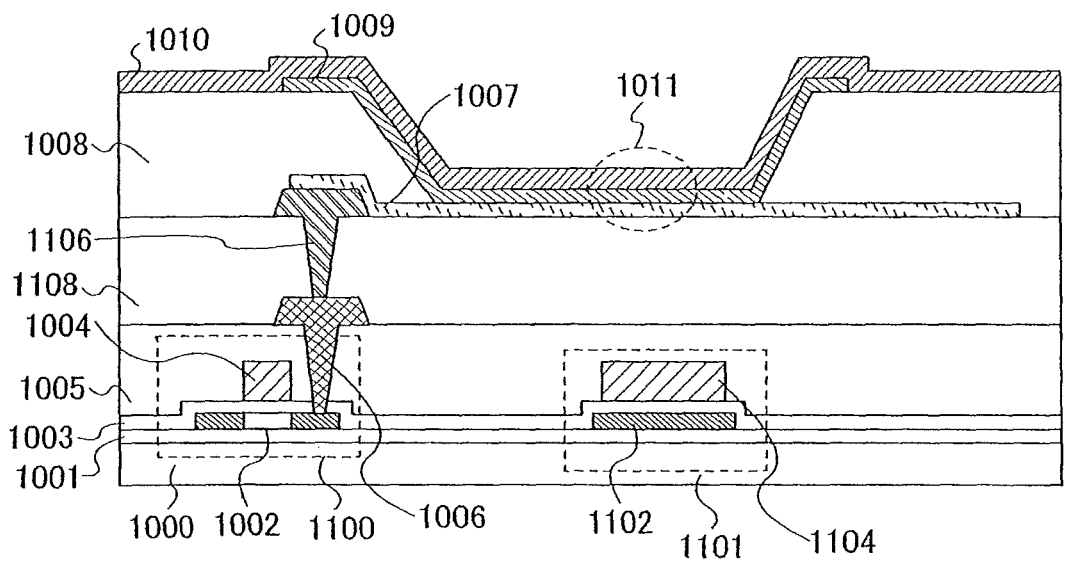

In this embodiment mode, an example where pixels are actually formed is described. FIG. 67A and FIG. 67B are cross-sectional views of a pixel of the panel described in Embodiment Modes 12 and 13. Here, an example is shown where a TFT is used as a switching element disposed in the pixel and a light-emitting element is used as a display medium disposed in the pixel.

In FIGS. 67A and 67B, reference numeral 1000 denotes a substrate, 1001 denotes a base film, 1002 denotes a semiconductor layer, 1102 denotes a semiconductor layer, 1003 denotes a first insulating film, 1004 denotes a gate electrode, 1104 denotes an electrode, 1005 denotes a second insulating film, 1006 denotes an electrode, 1007 denotes a first electrode, 1008 denotes a third insulating film, 1009 denotes a light-emitting layer, and 1010 denotes a second electrode. Reference numeral 1100 denotes a TFT, 1011 denotes a light-emitting element, and 1101 denotes a capacitor. In FIGS. 67A and 67B, the TFT 1100 and the capacitor 1101 are shown as typical examples of the elements included in the pixel. The structure of FIG. 67A is described first.

As the substrate 1000, a glass substrate made of barium borosilicate glass, alumino borosilicate glass, or the like; a quartz substrate; a ceramic substrate; or the like can be used. Alternatively, a metal substrate including stainless steel or a semiconductor substrate each having an insulating film formed on its surface can be used. A substrate made of a flexible synthetic resin such as plastic can also be used. The surface of the substrate 1000 may be planarized by polishing, e.g., a CMP method.

As the base film 1001, an insulating film made of silicon oxide, silicon nitride, silicon nitride oxide, or the like can be used. By providing the base film 1001, an alkaline metal such as Na or an alkaline earth metal contained in the substrate 1000 can be prevented from diffusing into the semiconductor layer 1002, which would otherwise adversely affect the characteristics of the 1100. Although the base film 1001 in FIGS. 67A and 67B has a single-layer structure, a plurality of layers of two or more layers can be used. Note that when there is little concern about the diffusion of impurities in the case of using a quartz substrate, for example, the base film 1001 is not necessarily provided.

As the semiconductor layer 1002 and the semiconductor layer 1102, a crystalline semiconductor film or an amorphous semiconductor film which has been processed into a predetermined shape can be used. A crystalline semiconductor film can be obtained by crystallizing an amorphous semiconductor film. As a crystallization method, a laser crystallization method, a thermal crystallization method using RTA or an annealing furnace, a thermal crystallization method using a metal element which promotes crystallization, or the like can be used. The semiconductor layer 1002 includes a channel formation region and a pair of impurity regions doped with an impurity element which imparts a conductivity type. Note that impurity regions which are doped with an impurity element at a low concentration (LDD regions) may also be provided between the channel formation region and the pair of impurity regions. The semiconductor layer 1102 can have a structure in which the whole region is doped with impurity elements which impart conductivity types.

As the first insulating film 1003, silicon oxide, silicon nitride, silicon nitride oxide, or the like can be used and either a single layer or stacked layers of a plurality of films can be used.

Note that a film containing hydrogen may also be used as the first insulating film 1003 so that the semiconductor layer 1002 can be hydrogenated.

For the gate electrode 1004 and the electrode 1104, an element selected from among Ta, W, Ti, Mo, Al, Cu, Cr, and Nd, or an alloy or compound containing a plurality of such elements can be used. Further, the gate electrode 1004 and the electrode 1104 can be formed to have either a single-layer structure or a stacked-layer structure of the above-described materials.

The TFT 1100 includes the semiconductor layer 1002, the gate electrode 1004, and the first insulating film 1003 between the semiconductor layer 1002 and the gate electrode 1004. Although FIGS. 67A and 67B show only the TFT 1100 connected to the first electrode 1007 of the light-emitting element 1011 as the TFT which forms the pixel, a structure having a plurality of I's may also be employed. In addition, although the TFT 1100 is illustrated as a top-gate transistor in this embodiment mode, it is also possible to employ a bottom-gate transistor having a gate electrode below a semiconductor layer, or a dual-gate transistor having gate electrodes above and below a semiconductor layer.

The capacitor 1101 is formed from the first insulating film 1003 as a dielectric, and the semiconductor layer 1102 and the electrode 1104 which are opposite each other with the first insulating film 1003 interposed therebetween, as a pair of electrodes. Note that although FIGS. 67A and 67B show examples where the capacitor included in the pixel has the semiconductor layer 1102, which is formed at the same time as the semiconductor layer 1002 of the TFT 1100, as one of the pair of electrodes and also has the electrode 1104, which is formed at the same time as the gate electrode 1004 of the TFT 1100, as the other electrode, the invention is not limited to this structure.

As the second insulating film 1005, either a single layer or stacked layers of an inorganic insulating film or an organic insulating film can be used. As an inorganic insulating film, a silicon oxide film formed by a CVD method, a silicon oxide film formed by a SOG (Spin On Glass) method, or the like can be used. As an organic insulating film, a film made of polyimide, polyamide, BCB (benzocyclobutene), acrylic, a positive photosensitive organic resin, a negative photosensitive organic resin, or the like can be used.

In addition, for the second insulating film 1005, a material having a skeletal structure with the bond of silicon (Si) and oxygen (O) can be used. As a substituent of this material, an organic group containing at least hydrogen (e.g., an alkyl group or an aryl group) is used. Alternatively, a fluoro group may be used as the substituent. As a further alternative, both a fluoro group and an organic group containing at least hydrogen may be used as the substituent.

Note that the surface of the second insulating film 1005 may be nitrided by high-density plasma treatment. High-density plasma is generated by using high-frequency microwaves, e.g., 2.45 GHz. Note that as the high-density plasma, plasma which has an electron density of not less than $10^{11}$ $cm^{-3}$ and an electron temperature of 0.2 to 2.0 eV, inclusive (preferably, 0.5 to 1.5 eV, inclusive) is used. When such high-density plasma with a low electron temperature is used, kinetic energy of activated species can be low. Therefore, it is possible to form a film which suffers little plasma damage and has less defects than a film formed by the conventional plasma treatment. In the high-density plasma treatment, the substrate 1000 is set at temperatures in the range of 350 to 450° C. In addition, in an apparatus for generating high-density plasma, the distance between an antenna which generates microwaves and the substrate 1000 is set at 20 to 80 mm, inclusive (preferably, 20 to 60 mm, inclusive).

The surface of the second insulating film 1005 is nitrided by the above high-density plasma treatment under an atmosphere containing nitrogen ($N_2$) and a rare gas (which includes at least one of He, N; Ar, Kr, and Xe); an atmosphere containing nitrogen, hydrogen ($H_2$), and a rare gas; or an atmosphere containing $NH_3$ and a rare gas. In the surface of the second insulating film 1005 funned by high-density plasma nitridation treatment, an element such as H, He, Ne, Ar, Kr, or Xe is mixed. For example, a silicon oxide film or a silicon oxynitride film is used as the second insulating film 1005, and the surface of the film is treated with high-density plasma so that a silicon nitride film is formed. The semiconductor layer 1002 of the TFT 1100 may be hydrogenated by using the hydrogen contained in the thusly formed silicon nitride film. Note that the hydrogenation treatment may be combined with the above-described hydrogenation treatment which uses hydrogen contained in the first insulating film 1003.

Note that the second insulating film 1005 may be formed by depositing another insulating film over the nitride film which is formed by the above high-density plasma treatment.

The electrode 1006 can be formed using an element selected from among Al, W, Mo, Ti, Pt, Cu, Ta, Au, and Mn, or an alloy containing a plurality of elements selected from among Al, Ni, C, W, Mo, Ti, Pt, Cu, Ta, Au, and Mn. Further, the electrode 1006 can be formed to have either a single-layer structure or a stacked-layer structure of the above-described materials.

One or both of the first electrode 1007 and the second electrode 1010 can be formed as a transparent electrode. For the transparent electrode, indium oxide containing tungsten oxide (IWO), indium oxide containing tungsten oxide and zinc oxide (IWZO), indium oxide containing titanium oxide (MO), indium tin oxide containing titanium oxide (ITTiO), or the like can be used. Needless to say, indium tin oxide (ITO), indium zinc oxide (IZO), indium tin oxide doped with silicon oxide (ITSO), or the like can also be used.

A light-emitting element can be categorized as a light-emitting element which emits light with a DC voltage applied thereto (hereinafter referred to as a DC-drive light-emitting element) or a light-emitting element which emits light with an AC voltage applied thereto (hereinafter referred to as an AC-drive light-emitting element).

A DC-drive light-emitting element is preferably formed to have a plurality of layers having different functions such as a hole injection/transport layer, a light-emitting layer, and an electron injection/transport layer.

The hole injection/transport layer is preferably formed with a composite material of an organic compound material having a hole transport property and an inorganic compound material which exhibits an electron accepting property with respect to the organic compound material. By employing such a structure, many hole carriers are generated in the organic compound which inherently has few carriers, thereby quite an excellent hole injection/transport property can be obtained. By such an effect, driving voltage can be lowered than that in the conventional technique. Further, since the hole injecting/transport layer can be formed to be thick without causing an increase in driving voltage, short circuit of the light-emitting element due to dust or the like can be suppressed.

As an organic compound material having a hole transport property, there are, for example, 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N-bis(3-methylphenyl)-1,1'-biphenyl-4,4'-diamine (abbreviation: TPD); 4,4'-bis[N-(1-naphthyl)-N-phenylamino]biphenyl (abbreviation: NPB); and the like. However, the invention is not limited to these.

As an inorganic compound material which exhibits an electron accepting property, there are titanium oxide, zirconium oxide, vanadium oxide, molybdenum oxide, tungsten oxide, rhenium oxide, ruthenium oxide, zinc oxide, and the like. In particular, vanadium oxide, molybdenum oxide, tungsten oxide, and rhenium oxide are preferable because they can be deposited in vacuum, and are easy to be handled.

The electron injection/transport layer is formed with an organic compound material having an electron transport property. Specifically, there are tris(8-quinolinolato)aluminum (abbreviation: $Alq_3$); tris(4-methyl-8-quinolinolato) aluminum (abbreviation: $Almq_3$); and the like. However, the invention is not limited to these.

In the DC-drive light-emitting element, a light-emitting layer can be formed using, for example, 9,10-di(2-naphthyl) anthracene (abbreviation: DNA); 9,10-di(2-naphthyl)-2-tert-butylanthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-[p-(dimethylamino)styryl]-4H-pyran (abbreviation: DCM1); 4-(dicyanomethylene)-2-methyl-6-[2-(julolidin-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Alternatively, the following compounds capable of generating phosphorescence can be used: bis[2-(4',6'-difluorophenyl) pyridinato-N,$C^{2'}$]iridium(picolinate) (abbreviation: Flrpic); bis{2-[3',5'-bis(trifluoromethyl)phenyl]pyridinato-N, $C^{2'}$}iridium(picolinate) (abbreviation: Ir(CF$_3$ppy)$_2$(pic)); tris(2-phenylpyridinato-N,$C^{2'}$)iridium (abbreviation: Ir(ppy)$_3$); bis(2-phenylpyridinato-N,$C^{2'}$)iridium(acetylacetonate) (abbreviation: Ir(ppy)$_2$(acac)); bis[2-(2'-thienyl) pyridinato-N,$C^{2'}$]iridium(acetylacetonate) (abbreviation: Ir(thp)$_2$(acac)); bis(2-phenylquinolinato-N,$C^{2'}$)iridium (acetylacetonate) (abbreviation: Ir(pq)$^2$(acac)); bis[2-(2'-benzothienyl)pyridinato-N,$C^{3'}$]iridium(acetylacetonate) (abbreviation: Ir(btp)$_2$(acac)); and the like.

Alternatively, as a high molecular electroluminescent material which can be used for forming the light-emitting layer, polyparaphenylene vinylene, polyparaphenylene, polythiophene, or polyfluorene can be used.

The other of the first electrode 1007 and the second electrode 1010 may be formed with a material which does not transmit light. For example, alkaline metals such as Li and Cs, alkaline earth metals such as Mg, Ca, and Sr, alloys containing these (Mg:Ag, Al:Li, and Mg:In), compounds of these ($CaF_2$ and calcium nitride), or rare earth metals such as Yb and Er can be used.

The third insulating film 1008 can be formed using a similar material to the second insulating film 1005. The third insulating film 1008 is formed around the first electrode 1007 so as to cover the ends of the first electrode 1007, and has a function of separating the light-emitting layers 1009 of adjacent pixels.

The light-emitting layer 1009 has a single layer or a plurality of layers. When the light-emitting layer 1009 has a plurality of layers, these layers can be divided into a hole injection layer, a hole transport layer, a light-emitting layer, an electron transport layer, an electron injection layer, and the like in terms of the carrier transport properties. Note that the boundary of each layer is not necessarily clear, and there may be cases where the boundary cannot be distinguished clearly because the material which forms each layer is partially mixed into the adjacent layer. Each layer may be formed with an organic material or an inorganic material. As for an organic material, either a high molecular material or a low molecular material can be used.

The light-emitting element 1011 includes the light-emitting layer 1009 and the first electrode 1007 and the second electrode 1010 which overlap with each other with the light-emitting layer 1009 interposed therebetween. One of the first electrode 1007 and the second electrode 1010 corresponds to an anode and the other corresponds to a cathode. When a forward voltage which is higher than the threshold voltage of the light-emitting element 1011 is applied between the anode and the cathode of the light-emitting element 1011, a current flows form the anode to the cathode so that the light-emitting element 1011 emits light.

On the other hand, the AC-drive light-emitting element has a double-insulator structure in which a light-emitting layer which is interposed between two insulating films is further interposed between a pair of electrodes. Light emission can be obtained by applying an AC voltage between the pair of electrodes. As a material of the light-emitting layer of the AC-drive light-emitting element, ZnS, SrS, $BaAl_2S_4$, or the like can be used. As a material of the insulating films which interpose the light-emitting layer therebetween, $Ta_2O_5$, $SiO_2$, $Y_2O_3$, $BaTiO_3$, $SrTiO_3$, silicon nitride, or the like can be used.

The structure of FIG. 67B is described. Note that portions that are the same as those in FIG. 67A are denoted by the same reference numerals as those in FIG. 67A, and their description will be omitted.

FIG. 67B shows a structure where an insulating film 1108 is provided between the second insulating film 1005 and the third insulating film 1008. The electrode 1006 and the first electrode 1007 are connected to each other with an electrode 1106 in a contact hole provided in the insulating film 1108.

Note that the electrode 1106 is not necessarily provided. That is, the first electrode 1007 may be directly connected to the electrode 1006 without the use of the electrode 1106. In that case, the step of forming the electrode 1106 can be omitted so that the cost can be reduced.

When the first electrode 1007 is directly connected to the electrode 1006 without the use of the electrode 1106, the coverage of the electrode 1006 with the first electrode 1007 could be poor depending on the material or method for forming the first electrode 1007, and the electrode 1006 could break. In view of such circumstance, it is advantageous, as shown in FIG. 67B, to connect the electrode 1006 and the first electrode 1007 to each other with the electrode 1106 in the contact hole that is provided in the insulating film 1108.

The insulating film 1108 can have a similar structure to the second insulating film 1005. The electrode 1106 can have a similar structure to the electrode 1006.

Note that this embodiment mode can be freely combined with any description in other embodiment modes in this specification. Further, parts of the description in this embodiment mode can be combined with one another.

Embodiment Mode 16

Figure 68:
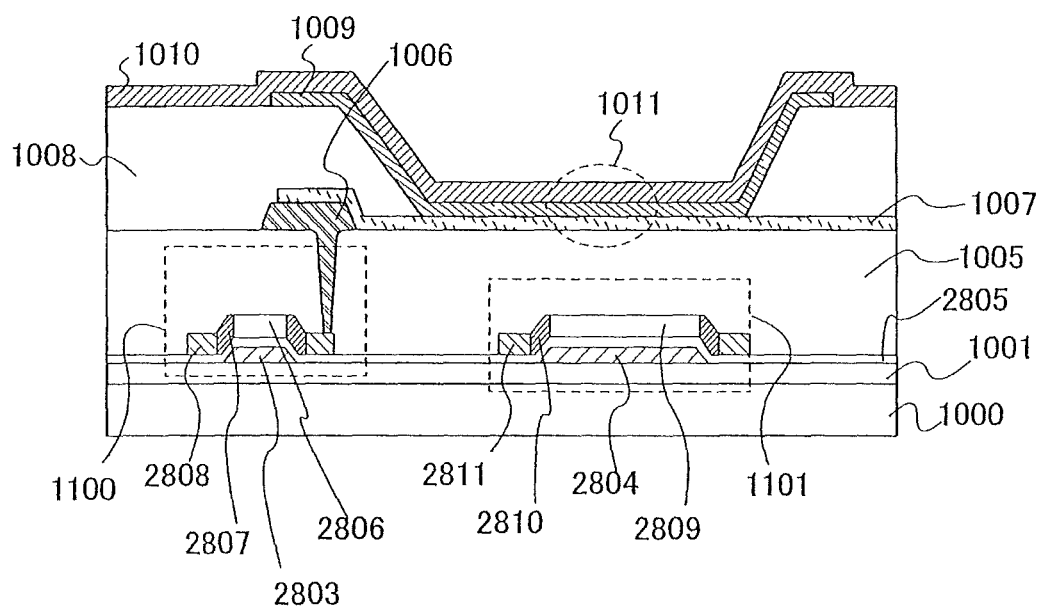
FIG. 68 illustrates Embodiment Mode 16.

In this embodiment mode, an example where pixels are actually formed is described. FIG. 68 is a cross-sectional view of a pixel of the panel which is described in Embodiment Modes 11 to 14. Here, an example is shown where a TFT is used as a switching element disposed in the pixel and a light-emitting element is used as a display medium disposed in the pixel. Note that portions that are the same as those in FIGS. 67A and 67B shown in Embodiment Mode 15 are denoted by the same reference numerals as those in FIGS. 67A and 67B, and their description will be omitted.

The pixel shown in FIG. 68 differs from FIG. 67A shown in Embodiment Mode 15 in the structures of the TFT 1100 and the capacitor 1101. FIG. 68 shows an example where a bottom-gate TFT is used as the TFT 1100. The TNT 1100 includes a gate electrode 2803; a semiconductor layer which includes a channel formation region 2806, LDD regions 2807, and impurity regions 2808; and a first insulating film 2805 between the gate electrode 2803 and the semiconductor layer. The first insulating film 2805 functions as a gate insulating film of the TFT 1100. The impurity regions 2808 function as a source region and a drain region of the TFT 1100.

The capacitor 1101 is formed from the first insulating film 2805 as a dielectric, and a semiconductor layer and an electrode 2804 which are opposite each other with the first insulating film 2805 interposed therebetween, as a pair of electrodes. The semiconductor layer includes a channel formation region 2809, LDD regions 2810, and impurity regions 2811. Note that FIG. 68 shows an example where the capacitor included in the pixel has the semiconductor layer, which is formed at the same time as the semiconductor layer functioning as an active layer of the TFT 1100, as one of the pair of electrodes and also has the electrode 2804, which is formed at the same time as the gate electrode 2803 of the TFT 1100, as the other electrode; however, the invention is not limited to this structure.

For the semiconductor layer including the channel formation region 2806, the LDD regions 2807, and the impurity regions 2808, and the semiconductor layer including the channel formation region 2809, the LDD regions 2810, and the impurity regions 2811, materials similar to those of the semiconductor layer 1002 and the semiconductor layer 1102 in FIGS. 67A and 67B can be used. For the gate electrode 2803 and the electrode 2804, a material similar to that of the gate electrode 1004 in FIGS. 67A and 67B can be used.

The channel formation region 2806 and the channel formation region 2809 may be doped with an impurity element which imparts a conductivity type.

Note that this embodiment mode can be freely combined with any description in other embodiment modes in this specification. Further, parts of the description in this embodiment mode can be combined with one another.

Embodiment Mode 17

Figure 69A:
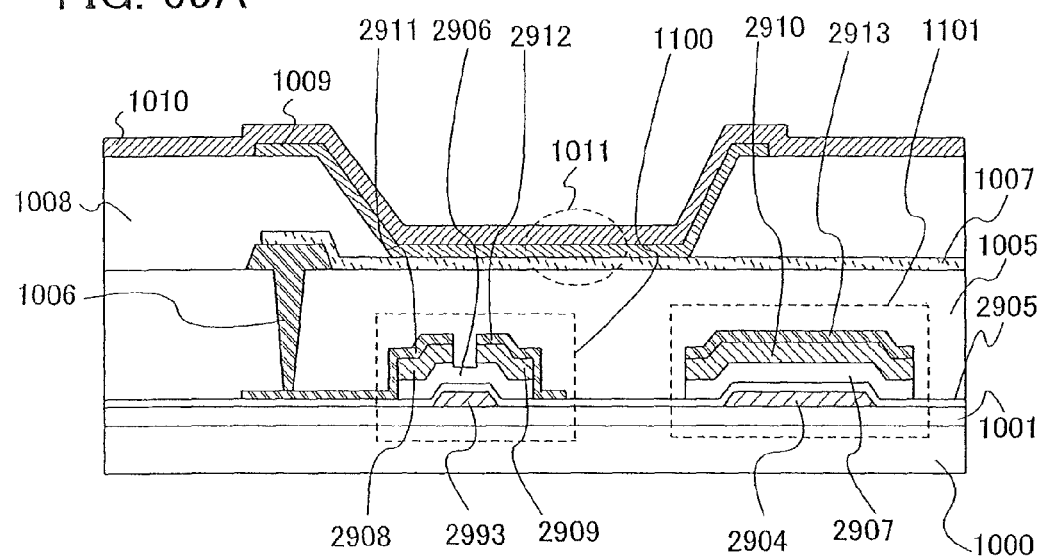
FIGS. 69A and 69B illustrate Embodiment Mode 17.
Figure 69B:
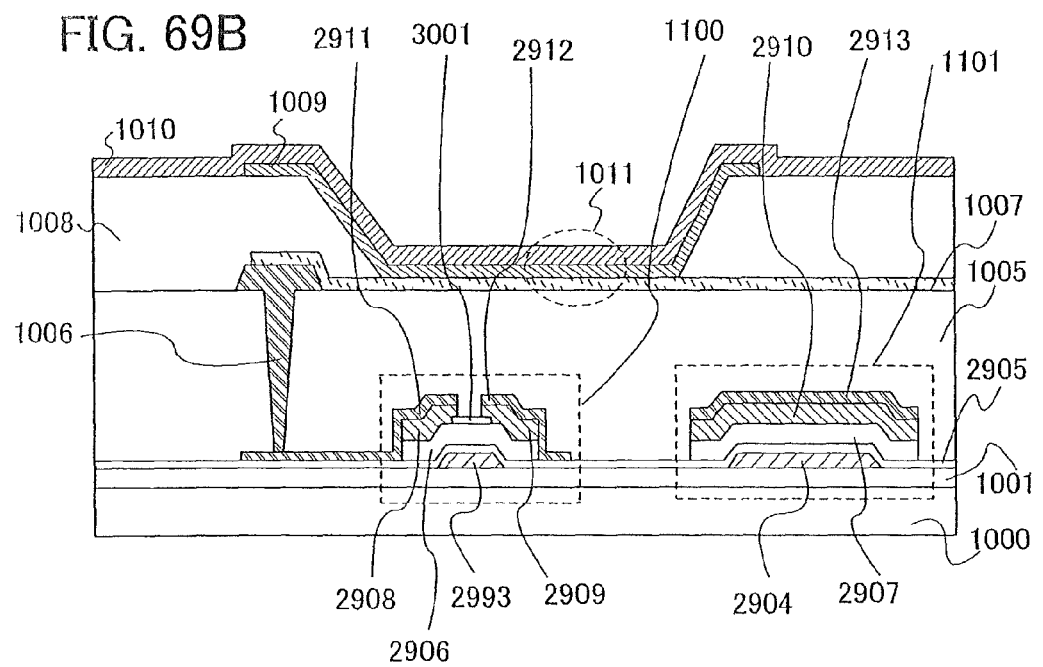

In this embodiment mode, an example where pixels are actually formed is described. FIGS. 69A and 69B are cross-sectional views of a pixel of the panel which is described in Embodiment Modes 13 and 14. Here, an example is shown where a TFT is used as a switching element disposed in the pixel and a light-emitting element is used as a display medium disposed in the pixel. Note that portions that are the same as those in FIGS. 67A and 67B shown in Embodiment Mode 15 are denoted by the same reference numerals as those in FIGS. 67A and 67B, and their description will be omitted.

The pixels shown in FIGS. 69A and 69B differ from FIG. 67A shown in Embodiment Mode 15 in the structures of the TFT 1100 and the capacitor 1101. FIG. 69A shows an example where a bottom-gate TFT with a channel-etched structure is used as the TFT 1100. FIG. 69B shows an example where a bottom-gate TFT with a channel-protective structure is used as the TFT 1100. The TFT 1100 with the channel-protective structure shown in FIG. 69B differs from the I' 1100 with the channel-etched structure shown in FIG. 69A in that an insulator 3001 serving as an etching mask is provided over a region of the semiconductor layer 2906 in which a channel is formed.

In FIGS. 69A and 69B, the TFT 1100 includes a gate electrode 2993, a first insulating film 2905 over the gate electrode 2993, a semiconductor layer 2906 over the first insulating film 2905, and N-type semiconductor layers 2908 and 2909 over the semiconductor layer 2906. The first insulating film 2905 functions as a gate insulating film of the TFT 1100. The N-type semiconductor layers 2908 and 2909 function as a source and a drain of the TFT 1100. Electrodes 2911 and 2912 are formed over the N-type semiconductor layers 2908 and 2909, respectively. One end of the electrode 2911 extends to a region where the semiconductor layer 2906 is not formed, and in that region, the electrode 1006 is formed in contact with the top portion of the electrode 2911.

The capacitor 1101 is formed from the first insulating film 2905 as a dielectric; an electrode 2904 as one of the electrodes; and a semiconductor layer 2907 which is opposite the electrode 2904 with the first insulating film 2905 interposed therebetween, an N-type semiconductor layer 2910 over the semiconductor layer 2907, and an electrode 2913 over the N-type semiconductor layer 2910 as the other electrode. The electrode 2904 can be formed at the same time as the gate electrode 2993. The semiconductor layer 2907 can be formed at the same time as the semiconductor layer 2906. The N-type semiconductor layer 2910 can be formed at the same time as the N-type semiconductor layers 2908 and 2909. The electrode 2913 can be formed at the same time as the electrodes 2911 and 2912.

For the gate electrode 2993 and the electrode 2904, a material similar to that of the gate electrode 1004 in FIGS. 67A and 67B can be used. For the semiconductor layers 2906 and 2907, amorphous semiconductor films can be used. For the first insulating film 2905, a material similar to that of the first insulating film 1003 in FIGS. 67A and 67B can be used. For the electrodes 2911, 2912, and 2913, a material similar to that of the electrode 1006 can be used. For the N-type semiconductor layers 2910, 2908, and 2909, semiconductor films containing N-type impurity elements can be used.

Note that this embodiment mode can be freely combined with any description in other embodiment modes in this specification. Further, parts of the description in this embodiment mode can be combined with one another.

Embodiment Mode 18

Figure 70A:
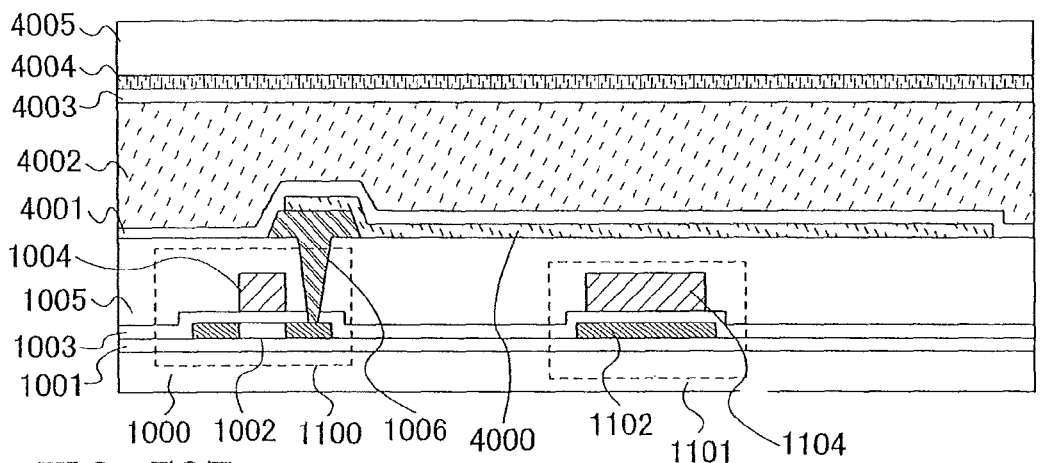
FIGS. 70A to 70C illustrate Embodiment Mode 18.
Figure 70B:
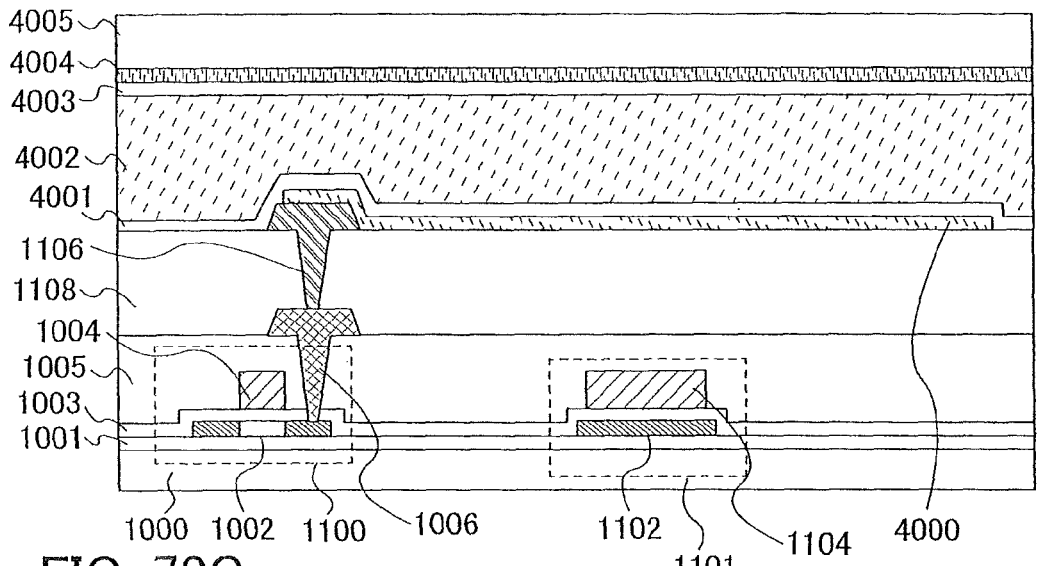
Figure 70C:
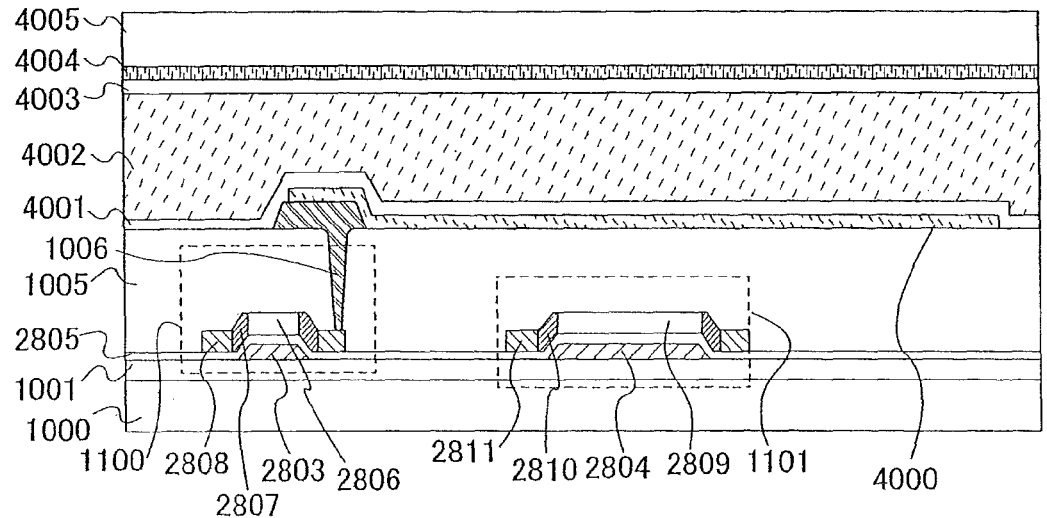

In this embodiment mode, an example where pixels are actually formed is described. FIGS. 70A to 70C are cross-sectional views of a pixel of the panel which is described in Embodiment Mode 14. Here, an example is shown where a TFT is used as a switching element disposed in the pixel and a liquid crystal element is used as a display medium disposed in the pixel.

The pixels shown in FIGS. 70A, 70B, and 70C each show a structure where a liquid crystal element is provided instead of the light-emitting element 1011 in the structures shown in FIGS. 67A and 67B of Embodiment Mode 15 and the structure shown in FIG. 68 of Embodiment Mode 16. Portions that are the same as those in FIGS. 67A, 67B, and 68 are denoted by the same reference numerals as those in FIGS. 67A, 67B, and 68, and their description will be omitted.

The liquid crystal element includes a first electrode 4000, an alignment film 4001 formed over the first electrode 4000, a liquid crystal layer 4002, an alignment film 4003, and a second electrode 4004. When a voltage is applied between the first electrode 4000 and the second electrode 4004, orientation of liquid crystals changes, thereby the transmittance of the liquid crystal element changes. The second electrode 4004 and the alignment film 4003 are formed on a counter substrate 4005.

One or both of the first electrode 4000 and the second electrode 4004 can be formed as a transparent electrode. For the transparent electrode, indium oxide containing tungsten oxide (IWO), indium oxide containing tungsten oxide and zinc oxide (IWZO), indium oxide containing titanium oxide (ITiO), indium tin oxide containing titanium oxide (ITTiO), or the like can be used. Needless to say, indium tin oxide (ITO), indium zinc oxide (IZO), indium tin oxide doped with silicon oxide (ITSO), or the like can also be used. The other of the first electrode 4000 and the second electrode 4004 may be formed with a material which does not transmit light. For example, alkaline metals such as Li and Cs, alkaline earth metals such as Mg, Ca, and Sr, alloys containing these (Mg:Ag, and Mg:In), compounds of these ($CaF_2$ and calcium nitride), rare earth metals such as Yb and Er can be used.

For the liquid crystal layer 4002, known liquid crystals can be freely used. For example, ferroelectric liquid crystals or antiferroelectric liquid crystals can be used for the liquid crystal layer 4002. In addition, as a driving method of the liquid crystals, a TN (Twisted Nematic) mode, an MVA (Multi-domain Vertical Alignment) mode, an ASM (Axially Symmetric aligned Micro-cell) mode, an OCB (Optical Compensated Bend) mode, or the like can be freely used.

Although this embodiment mode has illustrated the example where a pair of electrodes (the first electrode 4000 and the second electrode 4004) which apply a voltage to the liquid crystal layer 4002 are formed on different substrates, the invention is not limited to this. The second electrode 4004 may be formed on the substrate 1000. Then, an IPS (In-Plane-Switching) mode may be used as the driving method of the liquid crystals. In addition, one or both of the alignment film 4001 and the alignment film 4003 may be omitted depending on the material of the liquid crystal layer 4002.

Note that this embodiment mode can be freely combined with any description in other embodiment modes in this specification. Further, parts of the description in this embodiment mode can be combined with one another.

Embodiment Mode 19

Figure 71A:
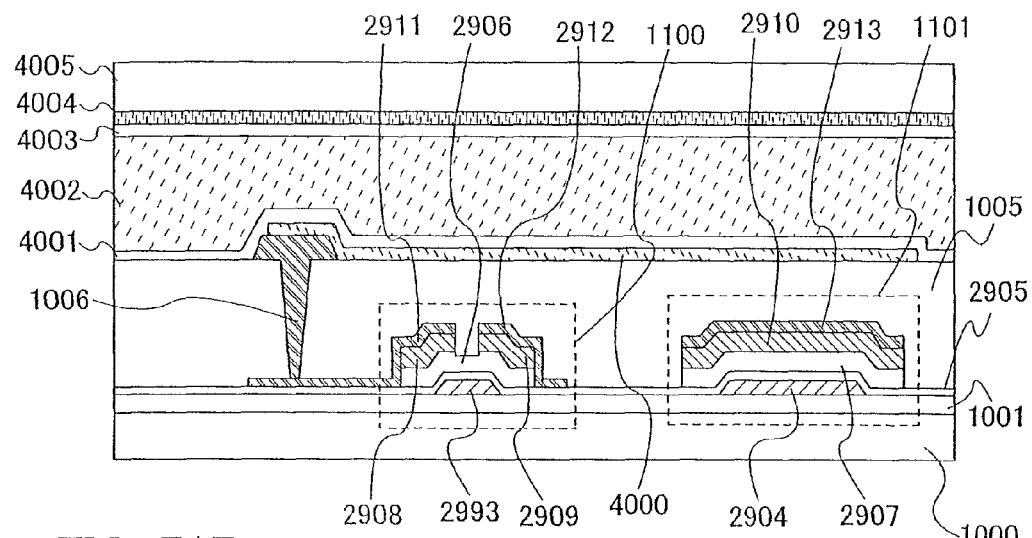
FIGS. 71A and 71B illustrate Embodiment Mode 19.
Figure 71B:
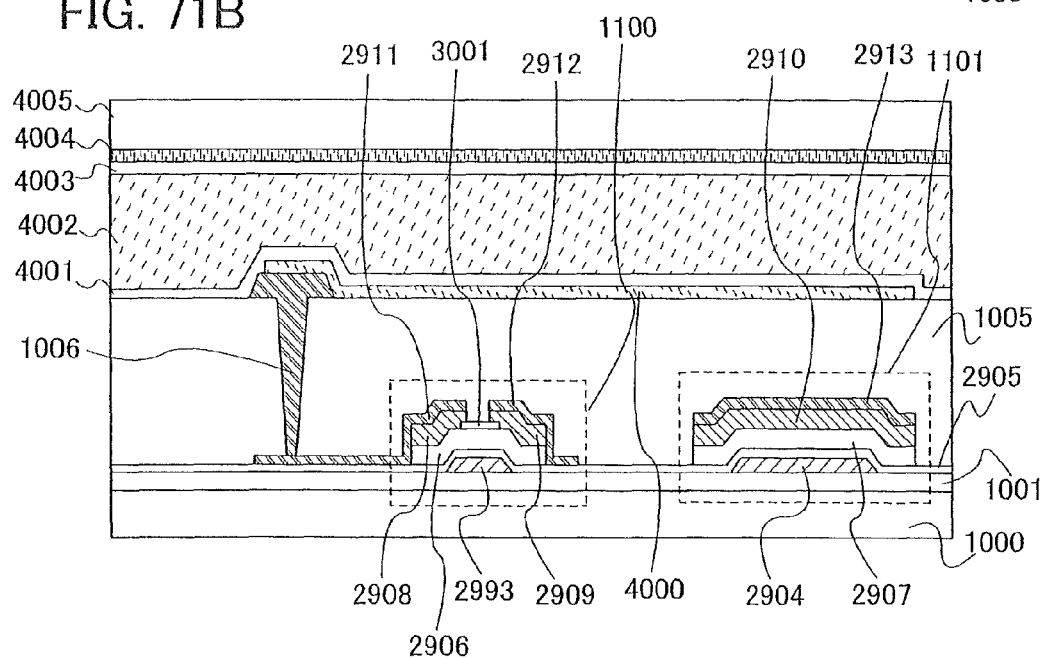

In this embodiment mode, an example where pixels are actually formed is described. FIGS. 71A and 71B are cross-sectional views of a pixel of the panel which is described in Embodiment Mode 14. Here, an example is shown where a TFT is used as a switching element disposed in the pixel and a liquid crystal element is used as a display medium disposed in the pixel.

The pixels shown in FIGS. 71A and 71B each show a structure where a liquid crystal element is provided instead of the light-emitting element 1011 in the structures shown in FIGS. 69A and 69B of Embodiment Mode 17. Portions that are the same as those in FIGS. 69A and 69B are denoted by the same reference numerals as those in FIGS. 69A and 69B, and their description will be omitted. In addition, the structure of the liquid crystal element and the like are similar to the structures shown in FIGS. 70A to 70C of Embodiment Mode 17; therefore, their description will be omitted.

Note that this embodiment mode can be freely combined with any description in other embodiment modes in this specification. Further, parts of the description in this embodiment mode can be combined with one another.

Embodiment Mode 20

Figure 72A:
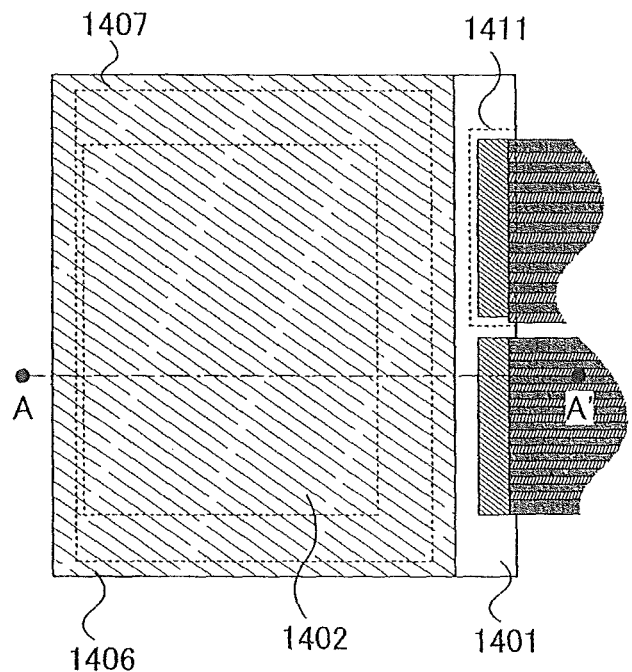
FIGS. 72A to 72C illustrate Embodiment Mode 20.
Figure 72B:
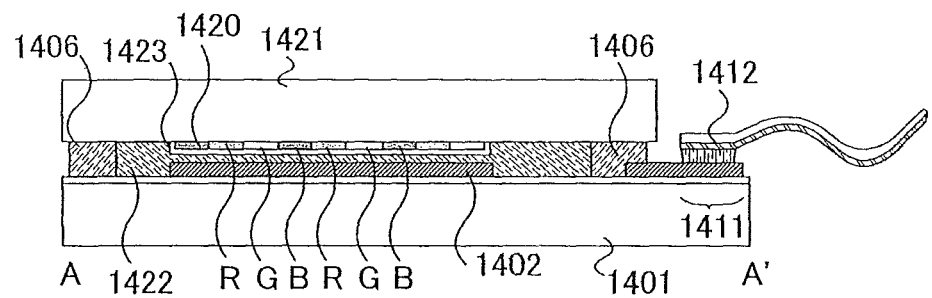
Figure 72C:
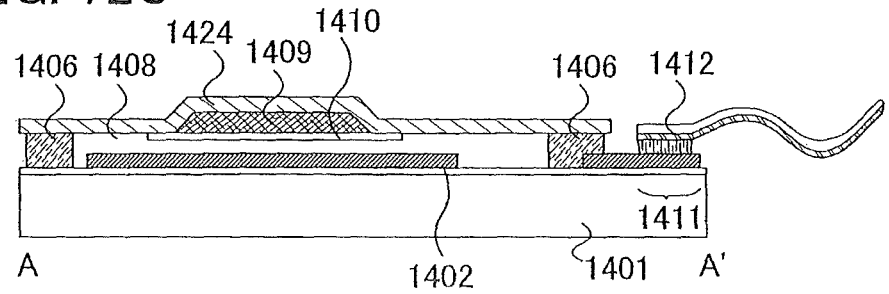

This embodiment mode will describe a structure where a substrate over which pixels are formed is sealed. FIG. 72A is a top view of a panel formed by sealing a substrate over which pixels are formed, and FIGS. 72B and 72C are cross-sectional views along a line A-A' of FIG. 72A. FIGS. 72B and 72C show examples where sealing is performed by using different methods.

In FIGS. 72A to 72C, a pixel portion 1402 having a plurality of pixels is disposed over a substrate 1401, a sealant 1406 is provided so as to surround the pixel portion 1402, and a sealant 1407 is attached to the substrate 1401. For the structure of the pixels, the structure shown in Embodiment Mode 16, 17, or 18 can be used.

In the display panel in FIG. 72B, the sealant 1407 corresponds to a counter substrate 1421. The counter substrate 1421 which is transparent is attached to the substrate 1401, using the sealant 1406 as an adhesive layer. A hermetically sealed space 1422 is formed by the substrate 1401, the counter substrate 1421, and the sealant 1406. The counter substrate 1421 is provided with color filters 1420 and a protective film 1423 for protecting the color filters. Light emitted from light-emitting elements provided in the pixel portion 1402 is emitted outside through the color filters 1420. The hermetically sealed space 1422 is filled with an inert resin, liquid, or the like. Note that as a resin for filling the hermetically sealed space 1422, a light-transmissive resin in which an absorbent is dispersed may be used. Alternatively, the same material may be used for the sealant 1406 and the material for filling the hermetically sealed space 1422, so that the attachment of the counter substrate 1421 and the sealing of the pixel portion 1402 can be conducted at the same time.

In the display panel shown in FIG. 72C, the sealant 1407 corresponds to a sealant 1424. The sealant 1424 is attached to the substrate 1401 using the sealant 1406 as an adhesive layer. A hermetically sealed space 1408 is formed by the substrate 1401, the sealant 1406, and the sealant 1424. The sealant 1424 is provided with an absorbent 1409 in its recessed portion in advance, and inside the hermetically sealed space 1408, the absorbent 1409 functions to keep a clean atmosphere by adsorbing moisture, oxygen, or the like and suppress deterioration of light-emitting elements. The recessed portion is covered with a finely meshed covering material 1410, and the covering material 1410 transmits air and moisture but does not transmit the absorbent 1409. The hermetically sealed space 1408 may be filled with a rare gas such as nitrogen or argon or with an inert resin or liquid.

On the substrate 1401, an input terminal portion 1411 for transmitting signals to the pixel portion 1402 and the like are provided. Signals such as video signals are transmitted to the input terminal portion 1411 through an FPC (Flexible Printed Circuit) 1412. At the input terminal portion 1411, wirings formed on the substrate 1401 and wirings provided in the FPC (Flexible Printed Circuit) 1412 are electrically connected to each other with a resin in which conductors are dispersed (an anisotropic conductive rein: ACF).

Driver circuits for inputting signals to the pixel portion 1402 may be formed over the same substrate 1401 as the pixel portion 1402. Alternatively, the driver circuits for inputting signals to the pixel portion 1402 may be formed on IC chips, and the IC chips may be connected to the substrate 1401 by COG (Chip On Glass), or the IC chips may be disposed on the substrate 1401 by TAB (Tape Automated Bonding) or by using a printed board.

Note that this embodiment mode can be freely combined with any description in other embodiment modes in this specification. Further, parts of the description in this embodiment mode can be combined with one another.

Embodiment Mode 21

The invention can be applied to a display module in which circuits for inputting signals to a panel are mounted on the panel.

Figure 73:
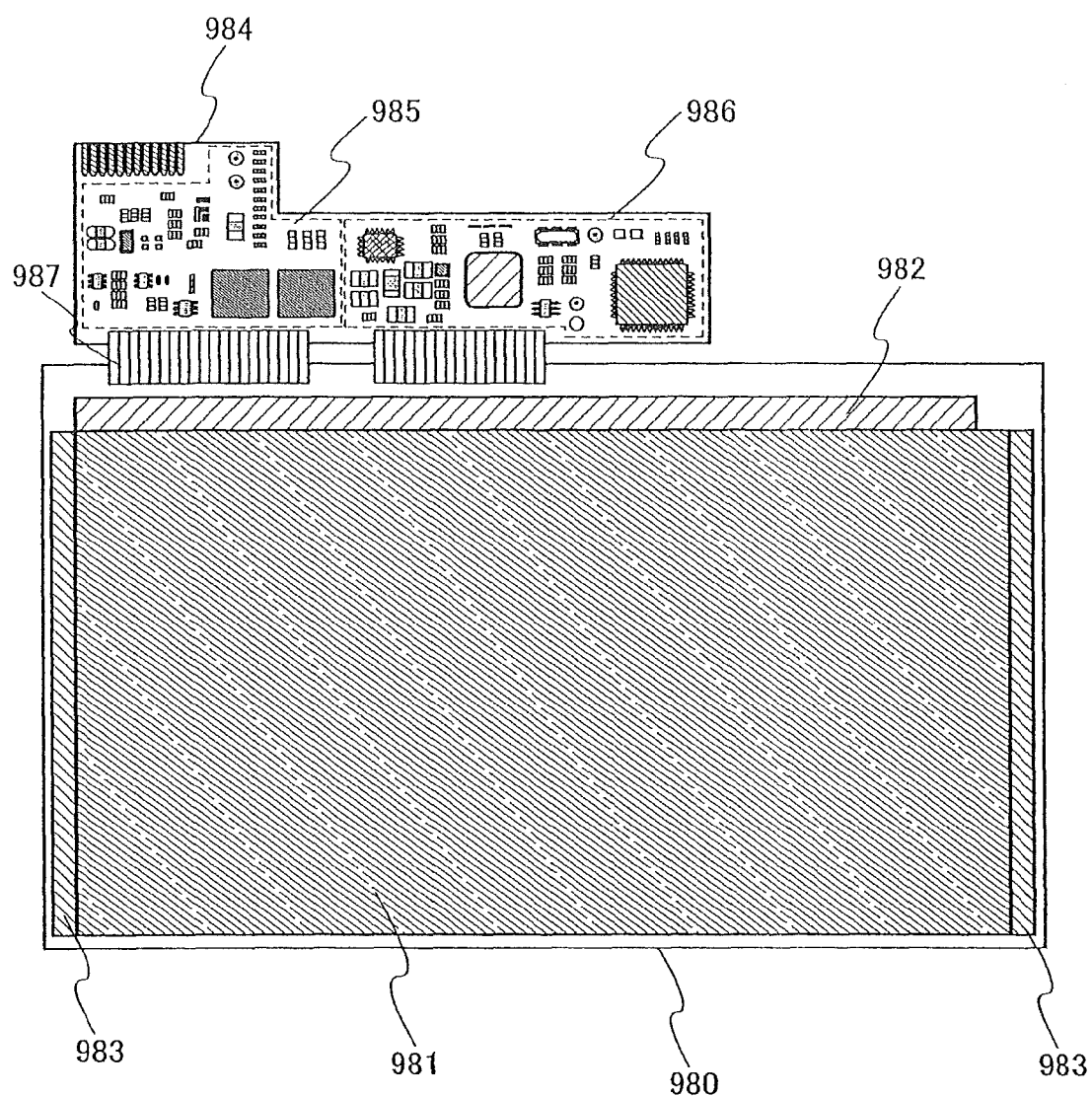
FIG. 73 illustrates Embodiment Mode 21.

FIG. 73 shows a display module combining a panel 980 and a circuit board 984. Although FIG. 73 shows an example where a controller circuit 985, a signal divider circuit 986, and the like are formed over the circuit board 984, the circuits formed over the circuit board 984 are not limited to these. Any circuits which can generate signals for controlling the panel may be formed.

Signals output from the circuits formed over the circuit board 984 are input to the panel 980 through a connection wiring 987.

The panel 980 includes a pixel portion 981, a source driver 982, and a gate driver 983. The panel 980 can have a configuration that is similar to any of those shown in Embodiment Modes 11 to 14. Although FIG. 73 shows an example where the source driver 982 and the gate driver 983 are formed over the same substrate as the pixel portion 981, the display module of the invention is not limited to this. Only the gate driver 983 may be formed over the same substrate as the pixel portion 981, while the source driver 982 may be formed over the circuit board. Alternatively, both of the source driver 982 and the gate driver 983 may be formed over the circuit board.

Display portions of various electronic devices can be formed by using such a display module.

Note that this embodiment mode can be freely combined with any description in other embodiment modes in this specification. Further, parts of the description in this embodiment mode can be combined with one another.

Embodiment Mode 22

The invention can be applied to various electronic devices. Examples of electronic devices include cameras (e.g., video cameras or digital cameras), projectors, head mounted displays (e.g., goggle displays), navigation systems, car stereos, personal computers, game machines, portable information terminals (e.g., mobile computers, mobile phones, or electronic books), image reproducing devices provided with recording media, and the like. As an example of image reproducing devices provided with recording media, there is a device which reproduces the content of a recording medium such as a digital versatile disc (DVD) and has a display for displaying the reproduced image, or the like. FIGS. 74A to 74D exemplarily illustrate such electronic devices.

Figure 74A:
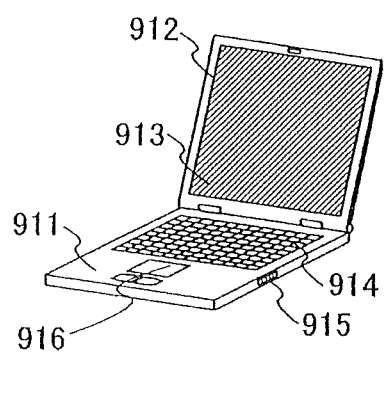
FIGS. 74A to 74D illustrate Embodiment Mode 22.

FIG. 74A shows a laptop personal computer, which includes a main body 911, a housing 912, a display portion 913, a keyboard 914, an external connection port 915, a pointing device 916, and the like. The invention is applied to the display portion 913. By using the invention, power consumption of the display portion can be reduced.

Figure 74B:
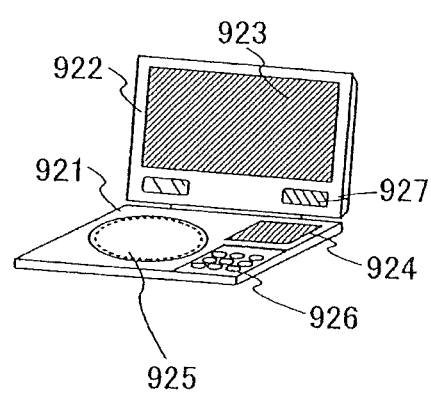

FIG. 74B shows an image reproducing device provided with a recording medium (specifically, a DVD player), which includes a main body 921, a housing 922, a first display portion 923, a second display portion 924, a recording medium (e.g., DVD) reading portion 925, operating keys 926, speaker portions 927, and the like. The first display portion 923 mainly displays image data, while the second display portion 924 mainly displays text data. The invention is applied to the first display portion 923 and the second display portion 924. By using the invention, power consumption of the display portion can be reduced.

Figure 74C:
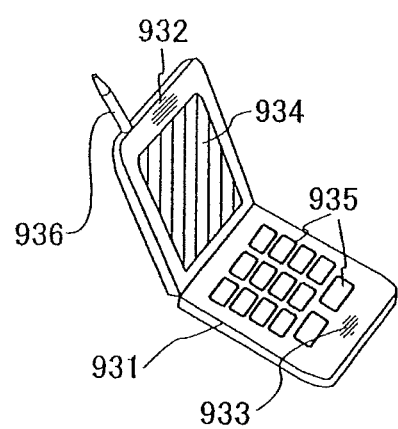

FIG. 74C shows a mobile phone, which includes a main body 931, an audio output portion 932, an audio input portion 933, a display portion 934, operating switches 935, an antenna 936, and the like. The invention is applied to the display portion 934. By using the invention, power consumption of the display portion can be reduced.

Figure 74D:
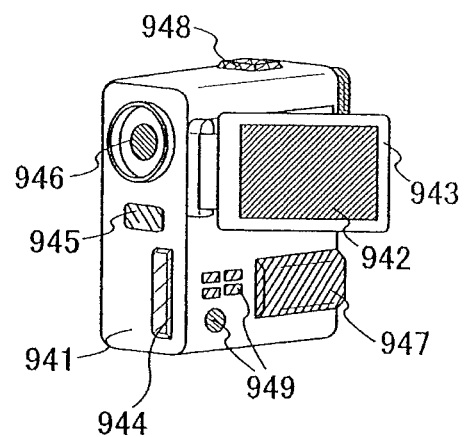

FIG. 74D shows a camera, which includes a main body 941, a display portion 942, a housing 943, an external connection port 944, a remote controller receiving portion 945, an image receiving portion 946, a battery 947, an audio input portion 948, operating keys 949, and the like. The invention is applied to the display portion 942. By using the invention, power consumption of the display portion can be reduced.

Note that this embodiment mode can be freely combined with any description in other embodiment modes in this specification. Further, parts of the description in this embodiment mode can be combined with one another.

Embodiment Mode 23

This embodiment mode will describe examples where a display device with the pixel configuration of the invention is applied to a display portion of a display panel, with reference to the drawings. A display panel whose display portion has a display device with the pixel configuration of the invention can be incorporated in a moving object, a building, or the like.

Figure 41A:
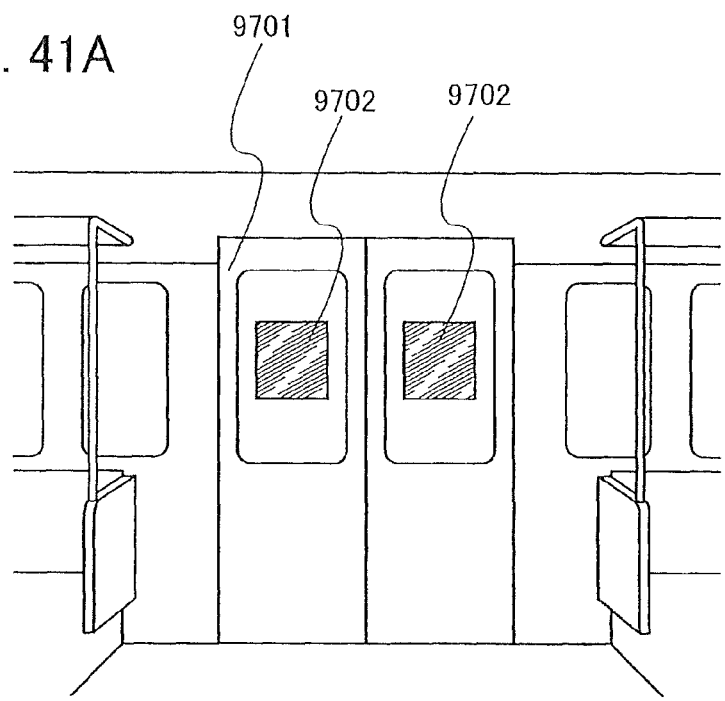
FIGS. 41A and 41B illustrate Embodiment Mode 23.
Figure 41B:
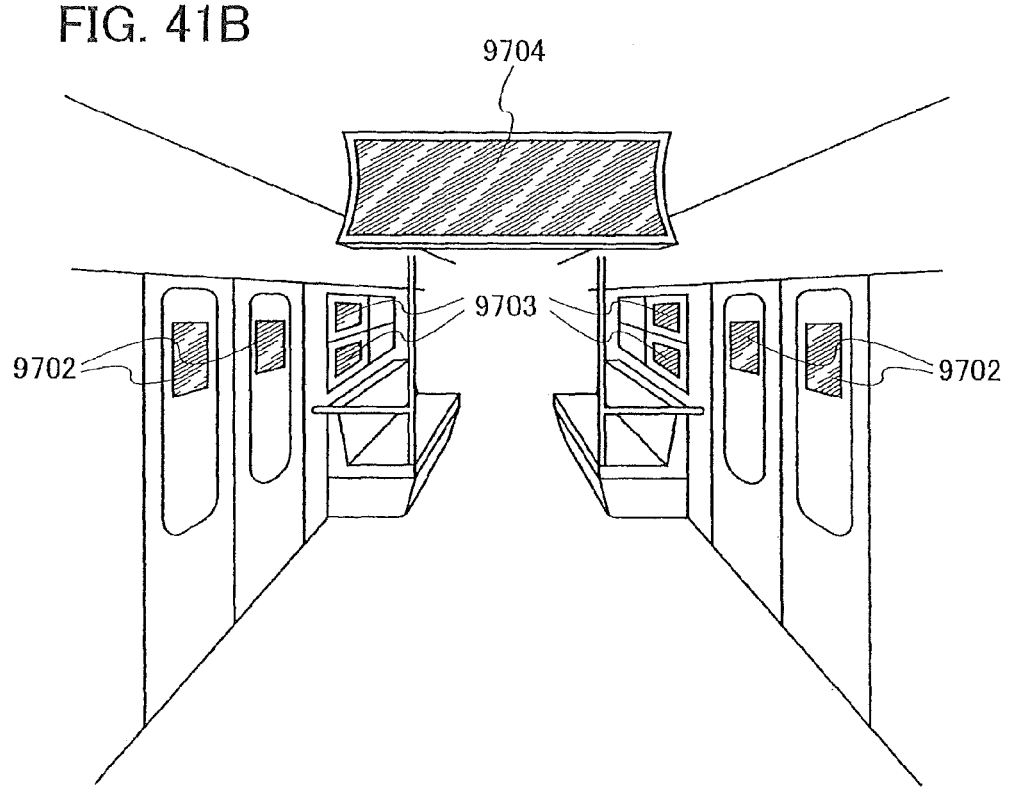

FIGS. 41A and 41B each show a moving object incorporating a display device, as an exemplary display panel whose display portion has a display device with the pixel configuration of the invention. FIG. 41A shows a display panel 9702 which is attached to a glass door in a train car body 9701, as an exemplary moving object incorporating a display device. The display panel 9702 shown in FIG. 41A whose display portion has a display device with the pixel configuration of the invention can easily switch images displayed on the display portion in response to external signals. Therefore, images on the display panel can be periodically switched in accordance with the time cycle through which passengers' ages or sex vary, thereby more efficient advertising effects can be expected.

Note that the position for setting the display panel whose display portion has a display device with the pixel configuration of the invention is not limited to a glass door of a train car body as shown in FIG. 41A, and thus the display panel can be provided anywhere by changing the shape of the panel. FIG. 41B shows an example thereof.

FIG. 41B shows an interior view of a train car body. In FIG. 41B, display panels 9703 attached to glass windows and a display panel 9704 hung on the ceiling are shown in addition to the display panels 9702 attached to the glass doors shown in FIG. 41A. The display panels 9703 having the pixel configuration of the invention have self-luminous display elements. Therefore, by displaying advertisement images in rush hours, while displaying no images in off-peak hours, outside views can be seen by passengers through the train windows. In addition, the display panel 9704 having the pixel configuration of the invention can be flexibly bent by providing self-luminous display elements and switching elements such as organic transistors over a film-form substrate, and images can be displayed on the display panel 9704 by driving the self-luminous display elements.

Figure 42:
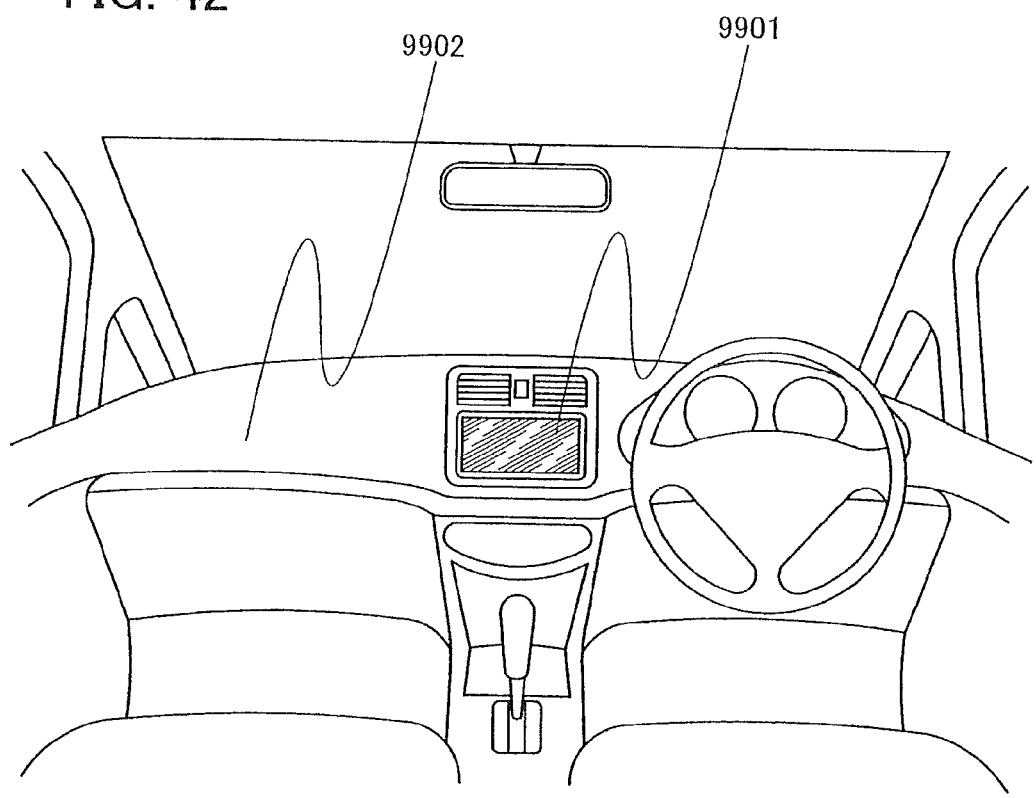
FIG. 42 illustrates Embodiment Mode 23.

Another example where a display panel whose display portion has a display device with the pixel configuration of the invention is applied to a moving object incorporating a display device is described, with reference to FIG. 42.

FIG. 42 shows a moving object incorporating a display device, as an exemplary display panel whose display portion has a display device with the pixel configuration of the invention. FIG. 42 shows a display panel 9901 which is incorporated in a body 9902 of a car, as an exemplary moving object incorporating a display device. The display panel 9901 shown in FIG. 42 whose display portion has a display device with the pixel configuration of the invention is incorporated in the body of the car, and displays information on the operation of the car or information input from outside of the car on an on-demand basis. Further, it has a navigation function to a destination of the car.

Note that the position for setting the display panel whose display portion has a display device with the pixel configuration of the invention is not limited to a front portion of a car body as shown in FIG. 42, and thus the display panel can be provided anywhere such as glass windows or doors by changing the shape of the panel.

Figure 43A:
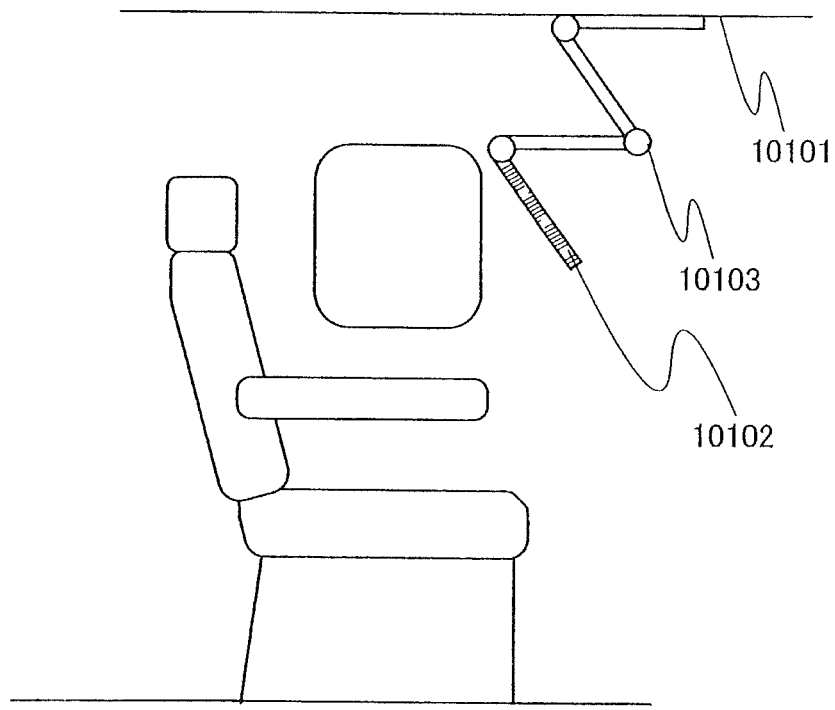
FIGS. 43A and 43B illustrate Embodiment Mode 23.
Figure 43B:
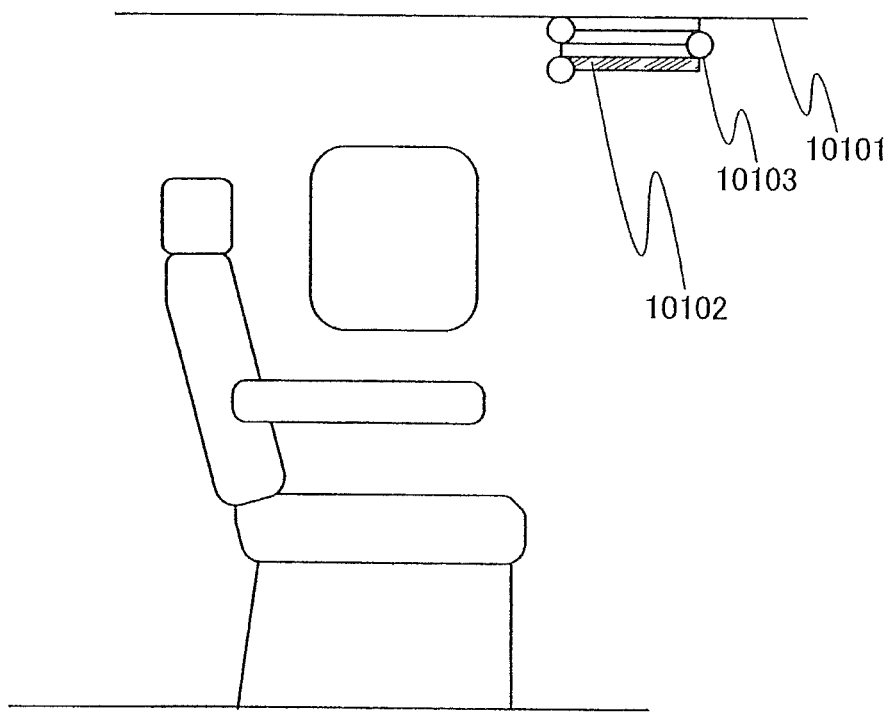

Another example where a display panel whose display portion has a display device with the pixel configuration of the invention is applied to a moving object incorporating a display device is described, with reference to FIGS. 43A and 43B.

FIGS. 43A and 43B each show a moving object incorporating a display device, as an exemplary display panel whose display portion has a display device with the pixel configuration of the invention. FIG. 43A shows a display panel 10102 which is incorporated in a part of the ceiling above the passenger's seat inside an airplane body 10101, as an exemplary moving object incorporating a display device. The display panel 10102 shown in FIG. 43A whose display portion has a display device with the pixel configuration of the invention is fixed to the airplane body 10101 with a hinge portion 10103, so that passengers can see the display panel 10102 with the help of a telescopic motion of the hinge portion 10103. The display panel 10102 has a function of displaying information as well as a function of an advertisement or amusement means with the operation of passengers. In addition, by storing the display panel 10102 in the airplane body 10101 by folding the hinge portion 10103 back on the ceiling as shown in FIG. 43B, safety during the airplane's takeoff and landing can be secured. Note that by lighting display elements of the display panel in an emergency, the display panel can be also utilized as a guide light.

Note that the position for setting the display panel whose display portion has a display device with the pixel configuration of the invention is not limited to the ceiling of the airplane body 10101 shown in FIGS. 43A and 43B, and thus the display panel can be provided anywhere such as seats or doors by changing the shape of the panel. For example, the display panel may be set on the backside of a seat so that a passenger on the rear seat can operate and view the display panel.

Although this embodiment mode has illustrated a train car body, a car body, and an airplane body as exemplary moving objects, the invention is not limited to these, and the invention can be applied to motorbikes, four-wheeled vehicles (including cars, buses, and the like), trains (including monorails, railroads, and the like), ships and vessels, and the like. By employing a display panel whose display portion has the pixel configuration of the invention, reduction in size and power consumption of the display panel can be achieved, and a moving object having a display medium which can operate excellently can be provided. In particular, since images that are displayed on a plurality of display panels incorporated in a moving object can be switched all at once, the invention is quite advantageous in that it can be applied to advertising media for unspecified number of customers, or information display boards in an emergency.

Figure 53:
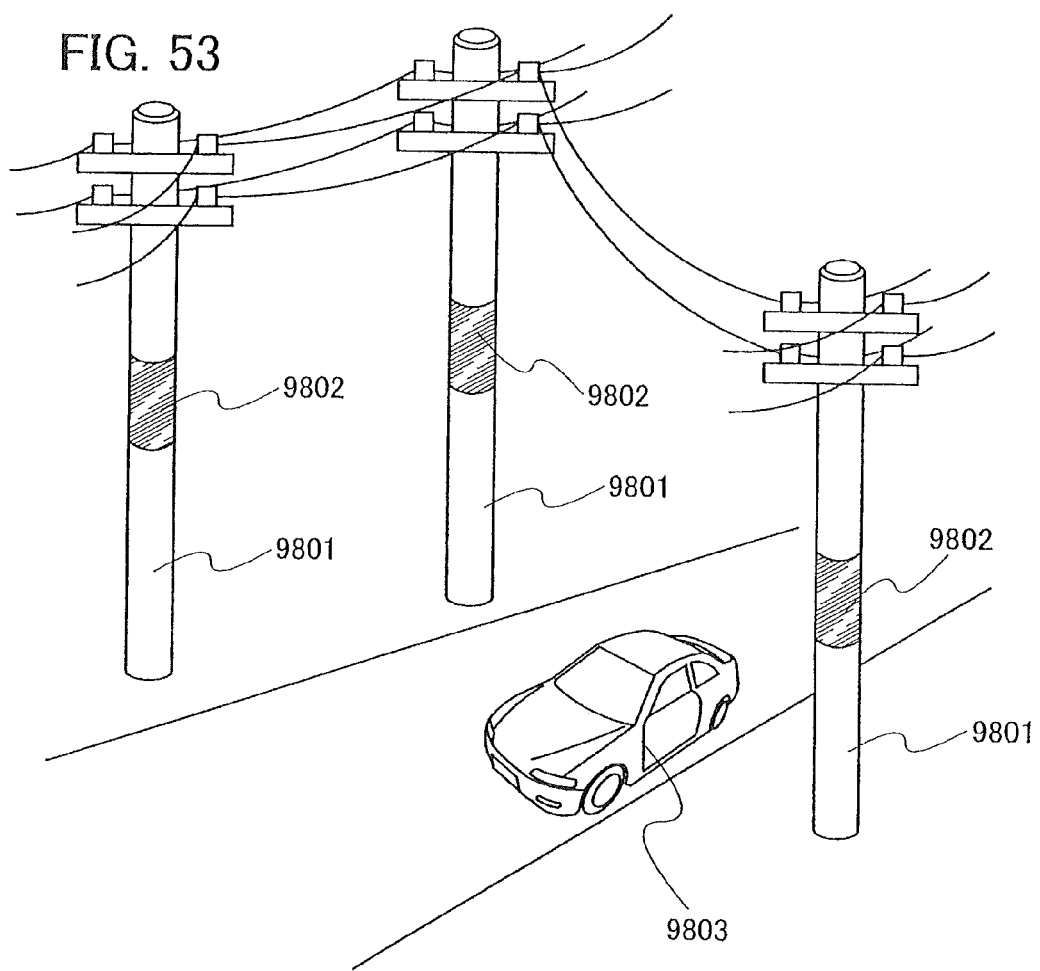
FIG. 53 illustrates Embodiment Mode 23.

An example where a display panel whose display portion has a display device with the pixel configuration of the invention is applied to a structure is described, with reference to FIG. 53.

FIG. 53 illustrates an example where a flexible display panel is formed by providing self-luminous display elements and switching elements such as organic transistors over a film-form substrate, and images can be displayed on the display panel by driving the self-luminous display elements, as an exemplary display panel whose display portion has a display device with the pixel configuration of the invention. In FIG. 53, a display panel is provided on a curved surface of an outside columnar object such as a telephone pole as a structure, and specifically, shown here is a structure where display panels 9802 are attached to telephone poles 9801 which are columnar objects.

The display panels 9802 shown in FIG. 53 are positioned at about a half height of the telephone poles, so as to be higher than the eye level of humans. When the display panels are viewed from a moving object 9803, images on the display panels 9802 can be recognized. By displaying the same images on the display panels 9802 that are provided on the outside telephone poles which stand together in large numbers, viewers can recognize the displayed information or advertisement. The display panels 9802 provided on the telephone poles 9801 in FIG. 53 can easily display the same images by using external signals; therefore, quite efficient information display and advertising effects can be expected. In addition, when self-luminous display elements are provided as the display elements in the display panel of the invention, the display panel can be effectively used as a highly visible display medium even at night.

Another example where a display panel whose display portion has a display device with the pixel configuration of the invention is applied to a structure is described with reference to FIG. 54, which differs from FIG. 53.

Figure 54:
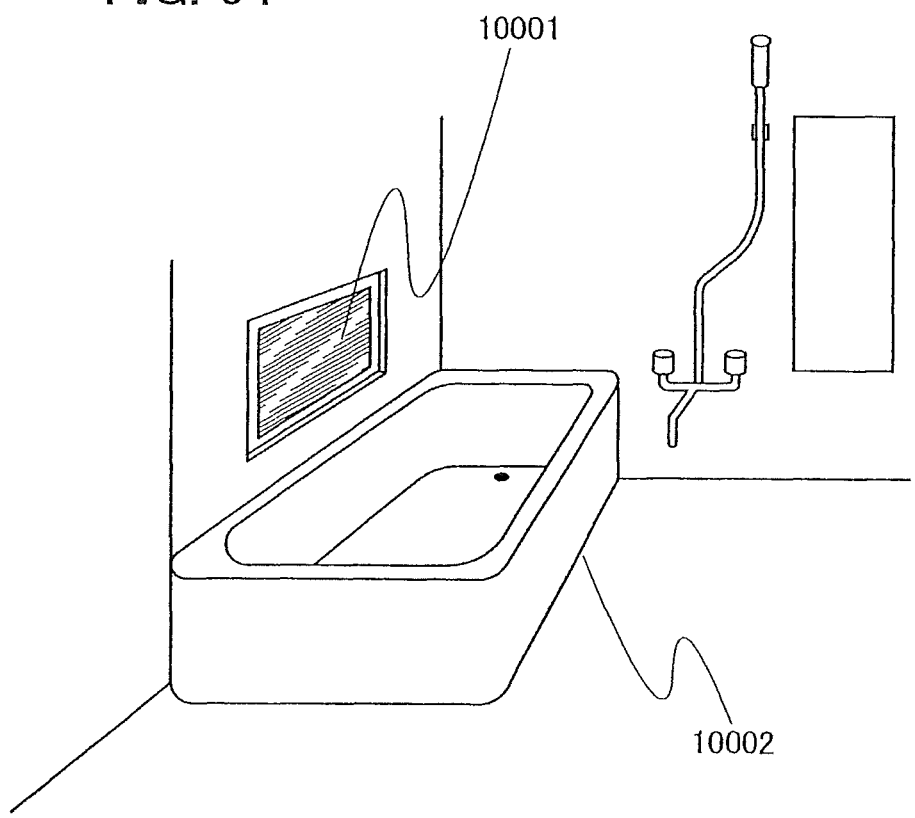
FIG. 54 illustrates Embodiment Mode 23.

FIG. 54 shows another application example of a display panel whose display portion has a display device with the pixel configuration of the invention. In FIG. 54, an example of a display panel 10001 which is incorporated in the sidewall of a prefabricated bath unit 10002 is shown. The display panel 10001 shown in FIG. 54 whose display portion has a display device with the pixel configuration of the invention is incorporated in the prefabricated bath unit 10002, so that a bather can view the display panel 10001. The display panel 10001 has a function of displaying information as well as a function of an advertisement or amusement means with the operation of a bather.

The position for setting the display panel whose display portion has a display device with the pixel configuration of the invention is not limited to the sidewall of the prefabricated bath unit 10002 shown in FIG. 54, and thus the display panel can be provided anywhere by changing the shape of the panel. For example, the display panel can be incorporated in a part of a mirror or a bathtub.

Figure 55:
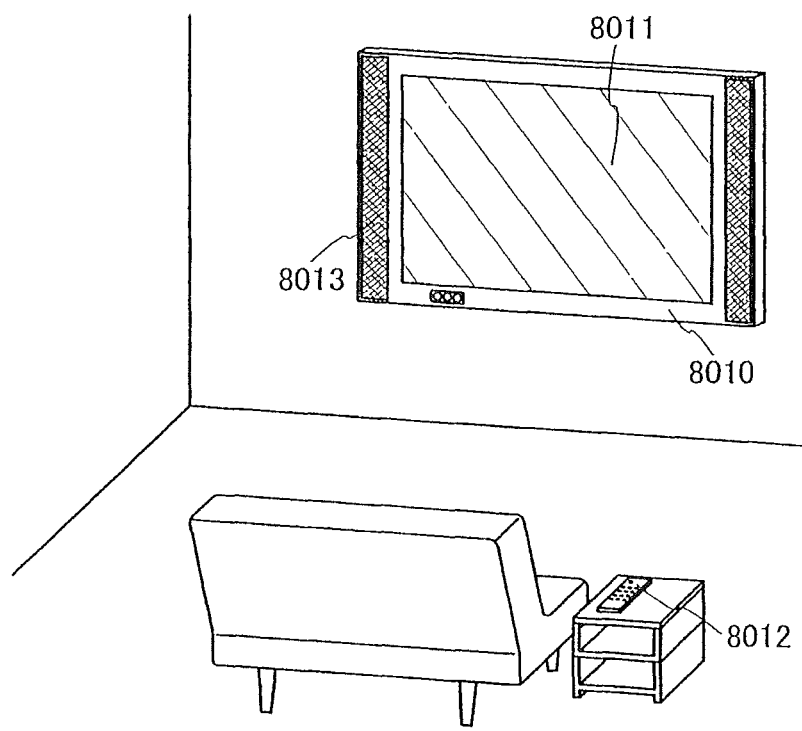
FIG. 55 illustrates Embodiment Mode 23.

FIG. 55 shows an example where a television set having a large display portion is provided in a building. FIG. 55 includes a housing 8010, a display portion 8011, a remote controlling device 8012 which is an operating portion, a speaker portion 8013, and the like. A display panel whose display portion has a display device with the pixel configuration of the invention is applied to the manufacture of the display portion 8011. The television set in FIG. 55 is incorporated in a building as a wall-hanging television set, and can be set without requiring a large space.

Although this embodiment mode has illustrated a telephone pole as a columnar object, a prefabricated bath unit, and the like as exemplary structures, the invention is not limited to these, and can be applied to any structures which can incorporate a display device. By using a display device whose display portion has the pixel configuration of the invention, reduction in size and power consumption of the display device can be achieved, and a moving object or a structure having a display medium which can operate excellently can be provided.

Note that this embodiment mode can be freely combined with any description in other embodiment modes in this specification. Further, parts of the description in this embodiment mode can be combined with one another.

The present application is based on Japanese Priority application No. 2006-155472 filed on Jun. 2, 2006 with the Japanese Patent Office, the entire contents of which are hereby incorporated by reference.

What is claimed is:
1. A semiconductor device comprising:
   a first transistor, a second transistor, a third transistor, a fourth transistor, a fifth transistor, a sixth transistor, a seventh transistor, an eighth transistor and a ninth transistor;
   wherein a gate of the first transistor, one of a source and a drain of the first transistor and one of a source and a drain of the fourth transistor are electrically connected to a first wiring,
   wherein one of a source and a drain of the second transistor, one of a source and a drain of the third transistor, one of a source and a drain of the sixth transistor, one of a source and a drain of the seventh transistor, and one of a source and a drain of the ninth transistor are electrically connected to a second wiring,
   wherein the other of the source and the drain of the first transistor, the other of the source and the drain of the second transistor and a gate of the fourth transistor are electrically connected to one another,
   wherein a gate of the second transistor, a gate of the third transistor, one of a source and a drain of the fifth transistor, the other of the source and the drain of the sixth transistor, the other of the source and the drain of the seventh transistor and a gate of the eighth transistor are electrically connected to one another, wherein the other of the source and the drain of the third transistor, the other of the source and the drain of the fourth transistor, a gate the seventh transistor, and a gate of the ninth transistor are electrically connected to one another, wherein one of a source and a drain of the eighth transistor is electrically connected to a third wiring, wherein the other of the source and the drain of the ninth transistor is electrically connected to the other of the source and the drain of the eighth transistor, and wherein a ratio of a channel width to a channel length of the second transistor is higher than a ratio of a channel width to a channel length of the first transistor.

2. The semiconductor device according to claim 1, wherein the first to ninth transistors have the same conductivity type.

3. The semiconductor device according to claim 1, wherein the other of the source and the drain of the fifth transistor is electrically connected to the first wiring.

4. The semiconductor device according to claim 1, further comprising a tenth transistor and an eleventh transistor,
wherein a gate of the tenth transistor is electrically connected to the third wiring, one of a source and a drain of the tenth transistor is electrically connected to the second wiring, and the other of the source and the drain of the tenth transistor is electrically connected to the gate of the fourth transistor, and wherein a gate of the eleventh transistor is electrically connected to the gate of the tenth transistor, one of a source and a drain of the eleventh transistor is electrically connected to the second wiring, and the other of the source and the drain of the eleventh transistor is electrically connected to the gate of the seventh transistor.

5. The semiconductor device according to claim 1,
wherein each of the first to ninth transistors includes a semiconductor material, and
wherein the semiconductor material is one selected from the group consisting of Si, ZnO, InGaZnO, SiGe and GaAs.

6. A display device comprising:
a pixel comprising a display element, and
a driver circuit comprising a first transistor, a second transistor, a third transistor, a fourth transistor, a fifth transistor, a sixth transistor, a seventh transistor, an eighth transistor and a ninth transistor;
wherein a gate of the first transistor, one of a source and a drain of the first transistor and one of a source and a drain of the fourth transistor are electrically connected to a first wiring,
wherein one of a source and a drain of the second transistor, one of a source and a drain of the third transistor, one of a source and a drain of the sixth transistor, one of a source and a drain of the seventh transistor, and one of a source and a drain of the ninth transistor are electrically connected to a second wiring,
wherein the other of the source and the drain of the first transistor, the other of the source and the drain of the second transistor and a gate of the fourth transistor are electrically connected to one another, wherein a gate of the second transistor, a gate of the third transistor, one of a source and a drain of the fifth transistor, the other of the source and the drain of the sixth transistor, the other of the source and the drain of the seventh transistor, and a gate of the eighth transistor are electrically connected to one another, wherein the other of the source and the drain of the third transistor, the other of the source and the drain of the fourth transistor, a gate the seventh transistor, and a gate of the ninth transistor are electrically connected to one another, wherein one of a source and a drain of the eighth transistor is electrically connected to a third wiring, wherein the other of the source and the drain of the ninth transistor is electrically connected to the other of the source and the drain of the eighth transistor, and wherein a ratio of a channel width to a channel length of the second transistor is higher than a ratio of a channel width to a channel length of the first transistor.

7. The display device according to claim 6, wherein the display element is a light-emitting element.

8. The display device according to claim 6, wherein the display element is a liquid crystal element.

9. The display device according to claim 6, wherein the first to ninth transistors have the same conductivity type.

10. The display device according to claim 6, wherein the other of the source and the drain of the fifth transistor is electrically connected to the first wiring.

11. The display device according to claim 6, further comprising a tenth transistor and an eleventh transistor,
wherein a gate of the tenth transistor is electrically connected to the third wiring, one of a source and a drain of the tenth transistor is electrically connected to the second wiring, and the other of the source and the drain of the tenth transistor is electrically connected to the gate of the fourth transistor, and wherein a gate of the eleventh transistor is electrically connected to the gate of the tenth transistor, one of a source and a drain of the eleventh transistor is electrically connected to the second wiring, and the other of the source and the drain of the eleventh transistor is electrically connected to the gate of the seventh transistor.

12. The display device according to claim 6,
wherein each of the first to ninth transistors includes a semiconductor material, and
wherein the semiconductor material is one selected from the group consisting of Si, ZnO, InGaZnO, SiGe and GaAs.

13. A display module comprising:
the display device according to claim 6; and
an FPC electrically connected to the display device.

14. An electronic device comprising the display module according to claim 13.

* * * * *

UNITED STATES PATENT AND TRADEMARK OFFICE
CERTIFICATE OF CORRECTION

Page 1 of 2

PATENT NO. : 9,461,071 B2
APPLICATION NO. : 14/967458
DATED : October 4, 2016
INVENTOR(S) : Atsushi Umezaki It is certified that error appears in the above-identified patent and that said Letters Patent is hereby corrected as shown below:

In the Specification

Column 6, Line 19, replace "SOT" with --SOI--;

Column 6, Line 46, replace "SOT" with --SOI--;

Column 8, Line 3, after "R," insert --G,--;

Column 18, Line 5, replace "Agate" with --A gate--;

Column 19, Line 16, after "off" replace ":" with --.--;

Column 27, Line 44, after "Accordingly" replace ";" with --,--;

Column 29, Line 37, replace "mod;" with --mode,--;

Column 31, Line 13, replace "17" with --T7--;

Column 40, Line 10, after "VSS+|Vth4401|" insert --.--;

Column 42, Line 65, after "N362" replace "," with --.--;

Column 43, Line 5, after "N363" replace "," with --.--;

Column 48, Line 11, after "4813" replace ";" with --,--;

Column 50, Line 5, after "VSS" replace "," with --.--;

Column 51, Line 9, replace "13*a*" with --T3*a*--;

Signed and Sealed this
Ninth Day of May, 2017

Michelle K. Lee
*Director of the United States Patent and Trademark Office*

Column 53, Line 63, replace "Circuit" with --circuit--;

Column 56, Line 13, after "5811" replace ";" with --,--;

Column 63, Line 37, replace "ht channel" with --N-channel--;

Column 66, Line 49, after "on" insert --,--;

Column 66, Line 62, replace "tem final" with --terminal--;

Column 70, Line 23, replace "CO" with --C0--;

Column 71, Line 43, before "1100." insert --TFT--;

Column 72, Line 2, after "used" insert --,--;

Column 72, Line 21, replace "T's" with --TFTs--;

Column 73, Line 11, replace "N;" with --Ne,--;

Column 73, Line 13, replace "funned" with --formed--;

Column 73, Line 43, replace "(MO)," with --(ITi0),--;

Column 74, Lines 8-9, replace "-N,N-" with -- -N,N'- --;

Column 74, Line 43, replace "Flrpic" with --FIrpic--;

Column 74, Line 49, replace "-N,C$^2$'" with -- -N,C$^{3'}$--;

Column 76, Line 19, replace "TNT" with --TFT--;

Column 77, Line 13, replace "T'" with --TFT--;

Column 78, Line 35, after "Mg:Ag," insert --Al:Li,--; and

Column 81, Line 57, after "panel" delete ".".